US011453734B2

(12) United States Patent
Kamimura et al.

(10) Patent No.: US 11,453,734 B2
(45) Date of Patent: Sep. 27, 2022

(54) TREATMENT LIQUID AND PATTERN FORMING METHOD

(71) Applicant: FUJIFILM Corporation, Tokyo (JP)

(72) Inventors: Tetsuya Kamimura, Shizuoka (JP); Michihiro Shirakawa, Shizuoka (JP); Tadashi Oomatsu, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 118 days.

(21) Appl. No.: 16/396,786

(22) Filed: Apr. 29, 2019

(65) Prior Publication Data

US 2019/0258168 A1  Aug. 22, 2019

Related U.S. Application Data

(63) Continuation of application No. PCT/JP2017/040007, filed on Nov. 7, 2017.

(30) Foreign Application Priority Data

Nov. 7, 2016 (JP) .............................. JP2016-217544
Mar. 17, 2017 (JP) .............................. JP2017-053363
Nov. 2, 2017 (JP) .............................. JP2017-212893

(51) Int. Cl.
| | |
|---|---|
| *G03F 7/038* | (2006.01) |
| *C08F 212/14* | (2006.01) |
| *C08F 220/16* | (2006.01) |
| *G03F 7/039* | (2006.01) |
| *G03F 7/16* | (2006.01) |
| *G03F 7/20* | (2006.01) |
| *G03F 7/30* | (2006.01) |
| *G03F 7/32* | (2006.01) |
| *G03F 7/38* | (2006.01) |
| *G03F 7/075* | (2006.01) |
| *H01L 21/027* | (2006.01) |
| *C08F 220/28* | (2006.01) |
| *C08F 220/36* | (2006.01) |
| *C08F 220/18* | (2006.01) |

(52) U.S. Cl.
CPC .......... *C08F 212/24* (2020.02); *C08F 220/16* (2013.01); *C08F 220/1807* (2020.02); *C08F 220/283* (2020.02); *C08F 220/365* (2020.02); *G03F 7/038* (2013.01); *G03F 7/039* (2013.01); *G03F 7/0392* (2013.01); *G03F 7/0397* (2013.01); *G03F 7/0758* (2013.01); *G03F 7/168* (2013.01); *G03F 7/2004* (2013.01); *G03F 7/2006* (2013.01); *G03F 7/3021* (2013.01); *G03F 7/325* (2013.01); *G03F 7/38* (2013.01); *H01L 21/027* (2013.01); *C08F 220/1809* (2020.02); *C08F 220/1811* (2020.02); *C08F 220/1812* (2020.02); *C08F 220/1818* (2020.02); *C08F 220/281* (2020.02); *C08F 220/282* (2020.02)

(58) Field of Classification Search
CPC ...... G03F 7/038; G03F 7/0382; G03F 7/2006; G03F 7/2004; G03F 7/325; G03F 7/32
See application file for complete search history.

(56) References Cited

U.S. PATENT DOCUMENTS

| | | | |
|---|---|---|---|
| 8,980,536 B2 | 3/2015 | Bae et al. | |
| 9,551,935 B2 | 1/2017 | Kato et al. | |
| 9,746,771 B2 | 8/2017 | Kamochi et al. | |
| 2004/0204328 A1* | 10/2004 | Zhang | ...................... G03F 7/091 510/175 |
| 2007/0084792 A1* | 4/2007 | Mullee | ...................... B01J 47/00 210/638 |

(Continued)

FOREIGN PATENT DOCUMENTS

| | | |
|---|---|---|
| JP | 2000250229 | 9/2000 |
| JP | 2008281980 | 11/2008 |

(Continued)

OTHER PUBLICATIONS

"International Search Report (Form PCT/ISA/210) of PCT/JP2017/040007," dated Feb. 6, 2018, with English translation thereof, pp. 1-7.

(Continued)

*Primary Examiner* — Daborah Chacko-Davis
(74) *Attorney, Agent, or Firm* — JCIPRNET

(57) ABSTRACT

An object of the present invention is to provide a treatment liquid for patterning a resist film and a pattern forming method, each of which can accomplish suppression of generation of defects on a pattern and reduction in bridge defects of the pattern at the same time. The pattern forming method of an embodiment of the present invention is a pattern forming method by forming a resist film on a substrate using a resist composition including at least a resin whose polarity increases by the action of an acid, a photoacid generator, and a solvent, exposing the resist film, and then treating the exposed resist film with a treatment liquid to form a pattern, in which the treatment liquid includes two or more organic solvents, a boiling point of at least one organic solvent of the two or more organic solvents is 120° C. to 155° C., a content of the organic solvent having a boiling point of 120° C. to 155° C. is 45% by mass or more with respect to the total mass of the treatment liquid, and a difference between the boiling point of the organic solvent having the highest boiling point and the boiling point of the organic solvent having the lowest boiling point among the two or more organic solvents is less than 49° C.

24 Claims, 2 Drawing Sheets

(56) References Cited

U.S. PATENT DOCUMENTS

| | | | |
|---|---|---|---|
| 2013/0011785 A1* | 1/2013 | Kato | G03F 7/325 |
| | | | 430/270.1 |
| 2017/0184973 A1 | 6/2017 | Yamanaka | |
| 2017/0285482 A1 | 10/2017 | Tsuchihashi et al. | |
| 2017/0322490 A1 | 11/2017 | Hatakeyama et al. | |

FOREIGN PATENT DOCUMENTS

| | | |
|---|---|---|
| JP | 2009025708 | 2/2009 |
| JP | 2011221509 | 11/2011 |
| JP | 2012181523 | 9/2012 |
| JP | 2015194674 | 11/2015 |
| WO | 2016052393 | 4/2016 |
| WO | 2016104565 | 6/2016 |
| WO | 2016136538 | 9/2016 |

OTHER PUBLICATIONS

"Written Opinion of the International Searching Authority (Form PCT/ISA/237) of PCT/JP2017/040007," dated Feb. 6, 2018, with English translation thereof, pp. 1-11.

"Office Action of Japan Counterpart Application", dated Jun. 16, 2020, with English translation, p. 1-p. 8.

* cited by examiner

TREATMENT LIQUID AND PATTERN FORMING METHOD

CROSS-REFERENCE TO RELATED APPLICATIONS

This application is a Continuation of PCT International Application No. PCT/JP2017/040007 filed on Nov. 7, 2017, which claims priority under 35 U.S.C. § 119(a) to Japanese Patent Application No. 2016-217544 filed on Nov. 7, 2016, Japanese Patent Application No. 2017-053363 filed on Mar. 17, 2017 and Japanese Patent Application No. 2017-212893 filed on Nov. 2, 2017. Each of the above applications is hereby expressly incorporated by reference, in its entirety, into the present application.

BACKGROUND OF THE INVENTION

1. Field of the Invention

The present invention relates to a treatment liquid for patterning a resist film and a pattern forming method.

More specifically, the present invention relates to a treatment liquid which is used in a process for manufacturing a semiconductor such as an integrated circuit (IC), the manufacture of a circuit board for a liquid crystal, a thermal head, or the like, and other lithographic processes for photofabrication processes, and the like; and a pattern forming method.

2. Description of the Related Art

In the related art, in a process for manufacturing a semiconductor device such as an integrated circuit (IC) and a large scale integrated circuit (LSI), microfabrication by lithography using a resist composition has been carried out. In recent years, ultrafine pattern formation in a sub-micron region and a quarter-micron region has been required, in accordance with realization of high integration of integrated circuits. In such a circumstance, exposure wavelength has a tendency to become shorter, such as from a g-ray to an i-ray, and further to KrF excimer laser light. Further, development of lithography using electron beams, X-rays, or extreme ultraviolet (EUV) rays, in addition to the excimer laser light, is also now progressing.

In such the lithography, after forming a film using a resist composition (also referred to as an actinic ray-sensitive or radiation-sensitive resin composition or a chemically amplified resist composition), the film thus obtained has been developed with a developer, or the film thus developed has been rinsed with a rinsing liquid.

For example, JP2012-181523A discloses that an organic treatment liquid containing a mixture of a first organic solvent and a second organic solvent, selected from a ketone-based solvent and an ester-based solvent, is used as a developer.

SUMMARY OF THE INVENTION

In recent years, in accordance with realization of high integration of integrated circuits, formation of a fine pattern using a resist composition (actinic ray-sensitive or radiation-sensitive resin composition) has been required. In such the formation of a fine pattern, even small defects give an influence on semiconductor chip operations, and therefore, there is a demand for a developer and/or a rinsing liquid, that does not generate defects.

In addition, in recent years, characteristics required for a pattern formed from the actinic ray-sensitive or radiation-sensitive resin composition are increasingly demanded, and in particular, a further reduction in bridge defects are demanded.

However, in the present circumstances, any of treatment liquids such as a developer and a rinsing liquid, which can accomplish less-defect performance and reduction in bridge defects in a fine pattern at the same time, has not been known yet.

The present invention has been made in consideration of the above viewpoints, and has an object to provide a treatment liquid for patterning a resist film and a pattern forming method, each of which can accomplish suppression of generation of defects on a pattern and reduction in bridge defects of the pattern at the same time.

The present inventors have conducted extensive studies on the above objects, and as a result, have discovered that resist residues can be reduced and a desired effect is obtained by using an organic treatment liquid including a combination of a plurality of at least two or more organic solvents having a difference in boiling points in a specific range.

More specifically, the present inventors have discovered that the objects can be accomplished by the following configurations.

[1] A pattern forming method comprising:
forming a resist film on a substrate using a resist composition including at least a resin whose polarity increases by the action of an acid, a photoacid generator, and a solvent;
exposing the resist film; and
treating the exposed resist film with a treatment liquid to form a pattern,
in which the treatment liquid includes two or more organic solvents,
a boiling point of at least one organic solvent of the two or more organic solvents is 120° C. to 155° C.,
a content of the organic solvent having a boiling point of 120° C. to 155° C. is 45% by mass or more with respect to the total mass of the treatment liquid, and
a difference between the boiling point of the organic solvent having the highest boiling point and the boiling point of the organic solvent having the lowest boiling point among the two or more organic solvents is less than 49° C.

[2] The pattern forming method as described in [1],
in which an SP value of at least one organic solvent of the two or more organic solvents is 17.0 to 18.2 MPa$^{1/2}$.

[3] The pattern forming method as described in [1] or [2],
in which at least one organic solvent of the two or more organic solvents is an ester-based solvent.

[4] The pattern forming method as described in [3],
in which the ester-based solvent is selected from the group consisting of butyl acetate, amyl acetate, isoamyl acetate, 2-methylbutyl acetate, 1-methylbutyl acetate, hexyl acetate, pentyl propionate, hexyl propionate, heptyl propionate, isobutyl isobutanoate, and butyl butanoate.

[5] The pattern forming method as described in any one of [1] to [4],
in which at least one organic solvent of the two or more organic solvents is a ketone-based solvent.

[6] The pattern forming method as described in [5],
in which the ketone-based solvent is a ketone-based solvent having 5 to 9 carbon atoms.

[7] The pattern forming method as described in any one of [1] to [6],
in which the treatment liquid is used as a developer or a rinsing liquid.

[8] The pattern forming method as described in any one of [1] to [7], in which the exposure is performed using KrF excimer laser or ArF excimer laser.

[9] The pattern-forming method as described in any one of [1] to [7], in which the exposure is performed using EUV laser.

[10] The pattern forming method as described in any one of [1] to [9], in which a content of an organic compound having a boiling point of 300° C. or higher in the treatment liquid is 0.001 to 30.0 ppm by mass.

[11] The pattern forming method as described in any one of [1] to [10], in which a moisture content of the treatment liquid is 500 ppm by mass or less.

[12] A treatment liquid for use in the pattern forming method as described in any one of [1] to [11], in which the treatment liquid includes two or more organic solvents, a boiling point of at least one organic solvent of the two or more organic solvents is 120° C. to 155° C., a content of the organic solvent having a boiling point of 120° C. to 155° C. is 45% by mass or more with respect to the total mass of the treatment liquid, and a difference between the boiling point of the organic solvent having the highest boiling point and the boiling point of the organic solvent having the lowest boiling point among the two or more organic solvents is less than 49° C.

[13] The treatment liquid as described in [12], in which an SP value of at least one organic solvent of the two or more organic solvents is 17.0 to 18.2 $MPa^{1/2}$.

[14] The treatment liquid as described in [12] or [13], in which at least one organic solvent of the two or more organic solvents is an ester-based solvent.

[15] The treatment liquid as described in [12] or [13], in which at least one organic solvent of the two or more organic solvents is a ketone-based solvent.

[16] The treatment liquid as described in any one of [12] to [15], in which a content of an organic compound having a boiling point of 300° C. or higher is 0.001 to 30.0 ppm by mass.

[17] The treatment liquid as described in any one of [12] to [16], in which a moisture content is 500 ppm by mass or less.

[18] The treatment liquid as described in any one of [12] to [17], in which a content of a metal component containing an element selected from the group consisting of Fe, Cr, Ni, Cu, Zn, and Pb is 0.001 to 50 ppt by mass with respect to the total mass of the treatment liquid.

[19] The treatment liquid as described in any one of [12] to [18], which is purified through at least one of a distilling step or a filtering step.

According to the present invention, it is possible to provide a treatment liquid for patterning a resist film and a pattern forming method, each of which can accomplish suppression of generation of defects on a pattern and reduction in bridge defects of the pattern at the same time.

DESCRIPTION OF THE PREFERRED EMBODIMENTS

Figure 1:
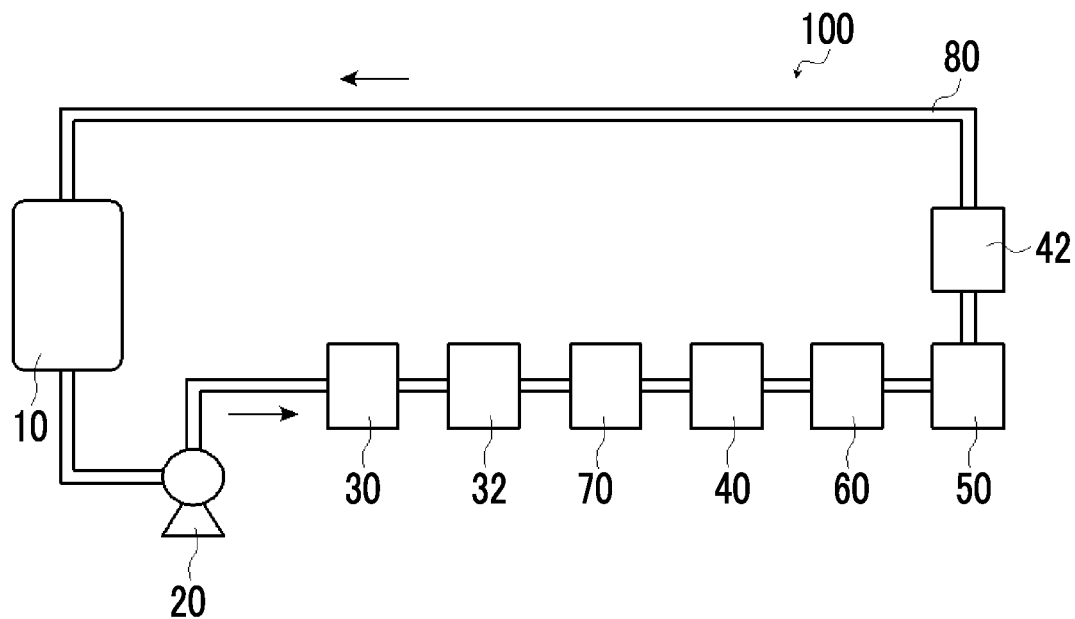
FIG. 1 is a schematic view showing an organic solvent purifying device used in the section of Examples.

Hereinbelow, the present invention will be described in detail.

Description of configuration requirements described below may be made on the basis of representative embodiments of the present invention in some cases, but the present invention is not limited to such embodiments.

Furthermore, in the present specification, the numerical value ranges shown using "to" mean ranges including the numerical values indicated before and after "to" as the lower limit value and the upper limit value, respectively.

Moreover, in the present specification, the boiling point refers to a boiling point at a normal pressure (that is, 1 atm=1013.25 hPa).

Incidentally, in the present specification, "ppm" means "parts-per-million ($10^{-6}$)", "ppb" means "parts-per-billion ($10^{-9}$)" and "ppt" means "parts-per-trillion ($10^{-12}$)".

In addition, "radiation" in the present specification means, for example, far ultraviolet rays typified by a bright line spectrum of a mercury lamp and excimer laser, extreme ultraviolet rays (EUV light), X-rays, electron beams, or the like. Further, "light" in the present invention means actinic rays or radiation. Incidentally, unless otherwise specified, "exposure" in the present specification includes not only exposure to a mercury lamp, far ultraviolet rays typified by excimer laser, X-rays, extreme ultraviolet rays (EUV light), or the like but also exposure using lithography with particle beams such as electron beams and ion beams.

[Treatment Liquid]

The treatment liquid of an embodiment of the present invention is a treatment liquid for patterning a resist film, which is used for subjecting a resist film obtained from a resist composition to at least one of development or washing (rinsing) and contains an organic solvent.

Furthermore, the treatment liquid of the embodiment of the present invention may include various additives and a trace amount of impurities, as described later, but preferably includes an organic solvent as a main component. Further, an organic solvent content as the main component is intended to be 98.0% or more with respect to the total amount of the treatment liquid, and the content is preferably 99.0% or more, and more preferably 99.9% or more.

The treatment liquid of the embodiment of the present invention includes two or more organic solvent. Further, the boiling point of at least one kind of organic solvent of two or more organic solvents is 120° C. to 155° C., and the difference between the boiling point of the organic solvent having the highest boiling point and the boiling point of the organic solvent having the lowest boiling point among the two or more organic solvents is less than 49° C.

By the treatment liquid of the embodiment of the present invention, it is possible to accomplish suppression of generation of defects on a pattern and reduction in bridge defects of the pattern at the same time. Details of the reason are not still clear, but is presumed to be as follows.

In a case where sparingly soluble components included in the resist are not sufficiently removed by a developing treatment and/or a rinsing treatment, they become residues or defects.

With regard to this problem, it is presumed that by using a treatment liquid including a plurality of organic solvents as a treatment liquid such as a developer and a rinsing liquid upon formation of a pattern, it is possible to enhance the solubility of the resin which causes residues and suppress the re-adhering, and it is possible to suppress the generation of residues on the pattern. In addition, by reducing the difference in the boiling points among the plurality of organic solvents used in this case to a temperature less than 49° C., it is possible to suppress a change in the composition of the treatment liquid during drying and prevent the re-adhering of the dissolved residue components, thereby forming a pattern with high quality.

On the other hand, in a case where the difference in the boiling points of the plurality of organic solvents is 49° C. or higher, it is presumed that in a situation where there occurs a difference in drying points of the plurality of organic solvents occurs during spin drying after the treatment, and thus, the organic solvent having a high boiling point during the later drying remains at a high concentration, the solubility of the resin that is efficiently solvated and stably dissolved by the effect of the plurality of organic solvents mixed is lowered, some of the resins are precipitated and become re-adhering components, and as a result, residues remain on a pattern and become development residues or scum, thus causing defects. In addition, it is also presumed that by a change in the composition of the treatment liquid in the step of drying the treatment liquid, the affinity between the treatment liquid and the resin is changed, resulting in bridge defects.

Furthermore, as the defects, there are defects caused by metal particles (particularly nano-sized metal particles), in addition to the above-mentioned resin. Specifically, metal particles in the state of being covered with the resin and dispersed remain as components that are difficult to be removed by a removing means such as filtering remain, and become residues (defects) on the pattern concave portion after patterning. In a case where such defects are present, there is a concern of effects on the subsequent step.

In contrast, in a case of using the treatment liquid of the embodiment of the present invention, even for the residual defects caused by the metal particles covered with the resin, a solubility by the plurality of organic solvents can also be similarly secured by a developing treatment and/or a rinsing treatment, and thus, a pattern with high quality can be formed while reducing the defects.

On the other hand, in a case where a developing treatment or a rinsing treatment is performed under a condition where the difference in the boiling points among the plurality of organic solvents is 49° C. or higher, it is presumed that the solubility of the resin efficiently solvated and stably dissolved by the effect of the mixed organic solvents is lowered, and thus, the solubility of the metal particles covered with some of the resins is lowered, leading to insolubility, in a situation where the organic solvent having a high boiling point during the later drying remains at a high concentration due to the difference in the drying points among the plurality of organic solvents. Thus, the metal particles become as re-adhering components and remain on the pattern concave portion as residual components, resulting in defects.

Furthermore, by adjusting a solubility parameter (SP) value of at least one organic solvent of at least two or more organic solvents constituting the treatment liquid in the embodiment of the present invention to 17.0 to 18.2 MPa$^{1/2}$, a contrast of the solubility with the resin can be further secured, and thus, a more excellent effect is obtained.

In addition, in view that the effect of the present invention is more excellent, it is preferable that the treatment liquid includes an organic solvent (preferably an ester-based solvent or a ketone-based solvent) having a boiling point of 120° C. to 155° C. and an SP value of 17.0 to 18.2 MPa$^{1/2}$.

The types of the organic solvent will be described in the later paragraphs, but the treatment liquid preferably includes a ketone-based solvent or an ester-based solvent having an SP value of 17.0 to 18.2 MPa$^{1/2}$, and the treatment liquid more preferably includes at least an ester-based solvent having an SP value of 17.0 to 18.2 MPa$^{1/2}$.

By adjusting the SP value to be in the range, it is possible to further improve the lithography performance and the suppression of defects caused by development residues or scum.

Further, the boiling point of at least one organic solvent of at least two or more organic solvents constituting the treatment liquid in the embodiment of the present invention is 120° C. to 155° C. Further, the content of the organic solvent having a boiling point of 120° C. to 155° C. is 45% by mass or more with respect to the total mass of the treatment liquid. In a case where the boiling point of the organic solvent contained in a large amount in the treatment liquid is lower than 120° C., the distribution of the treatment liquid dried in the outer peripheral direction on the wafer surface after the treatment is increased and line width distribution due to the deviation of the drying timing occurs, which is thus problematic. On the other hand, in a case where the boiling point of the organic solvent contained in a large amount in the treatment liquid is higher than 155° C., the treatment liquid on the wafer surface after the treatment is more slowly dried and a pattern collapse due to an increase in the amount of the residual solvent occurs, which is thus problematic.

In addition, a difference between the boiling point of the organic solvent having the highest boiling point and the boiling point of the organic solvent having the lowest boiling point of at least two or more organic solvents constituting the treatment liquid in the embodiment of the present invention is less than 49° C., and in view that the effect of the present invention is more excellent, the difference is preferably less than 35° C., and more preferably less than 25° C. The lower limit is not particularly limited, but is 1° C. or more in many cases.

Moreover, the SP value of the present invention is a value calculated using the Fedors method described in "Properties of Polymers, 2$^{nd}$ edition, published in 1976". Further, the unit of the SP value is MPa$^{1/2}$ unless otherwise specified.

The treatment liquid of the embodiment of the present invention is typically used as a developer and/or a rinsing liquid. The treatment liquid contains an organic solvent, and preferably contains an antioxidant and/or a surfactant.

Hereinafter, the organic solvent will be first described, and the antioxidant and the surfactant which can be included in the treatment liquid will be described later.

As specific examples of the organic solvent used, any of a plurality of organic solvents can be selected from a group of organic solvents which will be described later, having a range of SP values and a range of boiling points in predetermined ranges. Examples of the organic solvent include a ketone-based solvent, an ester-based solvent, an alcohol-based solvent, an amide-based solvent, an ether-based solvent, and a hydrocarbon-based solvent.

Examples of the hydrocarbon-based solvent are shown below. In the numbers in the parentheses, the numerical values on the left side represent SP values and the numerical values with temperature units on the right side represent boiling points. Incidentally, in a case where only one numerical value is described in the parenthesis, the numerical value represents the SP value.

Examples of the hydrocarbon-based solvent include aliphatic hydrocarbon-based solvents such as octane (15.5, 125° C.), nonane (15.7, 151° C.), decane (15.8, 174° C.), undecane (16.0, 196° C.), decane (16.1, 216° C.), 2,2,4-trimethylpentane (14.3, 105° C.), 2,2,3-trimethylhexane (14.6), isohexane (14.4), isoheptane (14.8), isooctane (15.1), isodecane (15.5), isododecane (14.7), and isohexadecane (15.0); and unsaturated hydrocarbon-based solvents chain (provided that the above-mentioned values represent cases where the first position of the carbon chain is substituted with a double bond) such as octene (15.6, 113° C.), nonene (15.8, 136° C.), decene (16.0, 159° C.), undecene (16.1, 182° C.), and dodecene (16.2, 205° C.).

Furthermore, other examples of the hydrocarbon-based solvent include aliphatic hydrocarbon-based solvents such as cyclohexane (17.5, 88° C.), cycloheptane (17.5, 115° C.) and cyclooctane (17.5, 142° C.); and aromatic hydrocarbon-based solvent such as toluene (18.7, 113° C.), xylene (18.6, 144° C.), ethylbenzene (18.5), propylbenzene (18.4), 1-methyl-4-propylbenzene (18.4), diethylbenzene (18.4), and trimethylbenzene (18.6).

The number of the double bonds and the triple bonds contained in the unsaturated hydrocarbon-based solvent is not particularly limited, and the double bonds and the triple bonds contained in the unsaturated hydrocarbon-based solvent may be contained in any of positions in the hydrocarbon chain. Further, in a case where the unsaturated hydrocarbon-based solvent has a double bond, cis isomers and trans isomers may coexist.

The aliphatic hydrocarbon-based solvent which is a hydrocarbon-based solvent may be a mixture of compounds having the same number of carbon atoms and different structures as long as the SP values are within the ranges. For example, in a case where decane is used as the aliphatic hydrocarbon-based solvent, 2-methylnonane (15.5), 2,2-dimethyloctane (15.2), 4-ethyloctane (15.5), and the like, which are compounds having the same number of carbon atoms and different structures, may be included in the aliphatic hydrocarbon-based solvent.

Furthermore, only one kind or a plurality of kinds of the compounds having the same number of carbon atoms and different structures may be included.

Examples of the ether-based solvent are shown below. In the numbers in the parentheses, the numerical values on the left side represent SP values and the numerical values with temperature units on the right side represent boiling points. Incidentally, in a case where only one numerical value is described in the parenthesis, the numerical value represents the SP value.

Examples of the ether-based solvent include acyclic aliphatic ether-based solvents such as dipentyl ether (16.2, 178° C.), dibutyl ether (15.9, 142° C.), and dipropyl ether (15.5, 86° C.); and acyclic aliphatic ether-based solvents having a branched alkyl group, such as di-2-ethyl hexyl ether (15.9, 314° C.), diisopentyl ether (15.6, 176° C.), diisobutyl ether (15.2, 131° C.), diisopropyl ether (14.6, 85° C.), diisohexyl ether (15.6, 218° C.), ethyl isopentyl ether (15.4, 108° C.), propyl isopentyl ether (15.6, 131° C.), methyl isobutyl ether (14.7 60° C.), ethyl isobutyl ether (15.1, 83° C.), propyl isobutyl ether (15.4, 105° C.), and ethyl isopropyl ether (14.7, 62° C.). Further, other examples of the ether-based solvent include aromatic ether-based solvents such as anisole (19.2) and phenethol (19.0); and alicyclic ether-based solvents such as tetrahydrofuran (18.4), tetrahydropyran (18.2), and 1,4-dioxane.

The ester-based solvent refers to a solvent having an ester group in a molecule thereof, the ketone-based solvent refers to a solvent having a ketone group in a molecule thereof, the alcohol-based solvent refers to a solvent having an alcoholic hydroxyl group in a molecule thereof, the amide-based solvent refers to a solvent having an amide group in a molecule thereof, and the ether-based solvent refers to a solvent having an ether bond in a molecule thereof. Among those, a solvent having a plurality of kinds of functional groups in one molecule thereof, but in this case, the solvent is intended to correspond to any of solvents including the functional groups contained in the above-mentioned solvent. For example, diethylene glycol monomethyl ether is intended to correspond to any of the alcohol-based solvent and the ether-based solvent among the solvents.

Examples of the ether-based solvent are shown below. In the numbers in the parentheses, the numerical values on the left side represent SP values and the numerical values with temperature units on the right side represent boiling points. Incidentally, in a case where only one numerical value is described in the parenthesis, the numerical value represents the SP value.

Examples of the ester-based solvent include ethyl acetate (17.9, 77.1° C.), butyl acetate (17.8, 126° C.), isobutyl acetate (17.4, 118° C.), amyl acetate (pentyl acetate) (17.8, 142° C.), propyl acetate (17.8), isopropyl acetate (17.4, 89° C.), isoamyl acetate (isopentyl acetate, 3-methylbutyl acetate) (17.4, 142° C.), 2-methylbutyl acetate (17.4, 138° C.), 1-methylbutyl acetate (17.4, 137° C.), hexyl acetate (17.8, 170° C.), heptyl acetate (17.7, 192° C.), octyl acetate (17.7, 211° C.), methoxyethyl acetate (18.3, 158° C.), ethoxyethyl acetate (18.2, 156° C.), propylene glycol monomethyl ether acetate (PGMEA; alternative name: 1-methoxy-2-acetoxypropane) (17.9, 145° C.), ethylene glycol monoethyl ether acetate (18.2, 145° C.), ethylene glycol monopropyl ether acetate (18.2), ethylene glycol monobutyl ether acetate (18.1), ethylene glycol monophenyl ether acetate (18.4, 245° C.), diethylene glycol monomethyl ether acetate (18.5), diethylene glycol monopropyl ether acetate (18.4), diethylene glycol monoethyl ether acetate (18.4), diethylene glycol monophenyl ether acetate (20.4), diethylene glycol monobutyl ether acetate (18.3), 2-methoxybutyl acetate (17.8), 3-methoxybutyl acetate (17.8), 4-methoxybutyl acetate (18.2), 3-methyl-3-methoxybutyl acetate (17.5), 3-ethyl-3-methoxybutyl acetate (18.1), propylene glycol monoethyl ether acetate (17.8), propylene glycol monopropyl ether acetate (17.8), 2-ethoxybutyl acetate (17.8), 4-ethoxybutyl acetate (18.1), 4-propoxybutyl acetate (18.1), 2-methoxypentyl acetate (17.8), 3-methoxypentyl acetate (17.8), 4-methoxypentyl acetate (17.8), propylene glycol diacetate (19.6), methyl formate (21.0), ethyl formate (20.2), butyl formate (19.4), propyl formate (19.7), ethyl lactate (24.4), butyl lactate (23.0), propyl lactate (23.6), ethylmethyl carbonate (18.5), methylpropyl carbonate (18.3), methylbutyl carbonate (18.2), methyl pyruvate (21.6), ethyl pyruvate (21.1), propyl pyruvate (20.7), butyl pyruvate (20.3), methyl acetoacetate (21.1), ethyl acetoacetate (20.7), methyl propionate (17.9), ethyl propionate (17.8, 99° C.), propyl propionate (17.8), isopropyl propionate (17.4), butyl propionate (17.8), pentyl propionate (17.8, 169° C.), hexyl propionate (17.7), heptyl propionate (17.7), butyl butanoate (17.8), isopropyl butanoate (17.4), isobutyl butanoate (17.4, 165° C.), pentyl butanoate (17.7), hexyl butanoate (17.7), propyl pentanoate (17.8), isopropyl pentanoate (17.4), butyl pentanoate (17.7), pentyl pentanoate (17.7), ethyl hexanoate (17.8), propyl hexanoate (17.7), butyl hexanoate (17.7), isobutyl hexanoate (17.5), methyl heptanoate (17.8), ethyl heptanoate (17.7), propyl heptanoate (17.7), cyclohexyl acetate (19.7), cycloheptyl acetate (19.5), 2-ethylhexyl acetate (17.5), and cyclopentyl propionate (26.3).

Among those, butyl acetate (17.8), amyl acetate (17.8), isoamyl acetate (17.4), 2-methylbutyl acetate (17.4), 1-methylbutyl acetate (17.4), hexyl acetate (17.8), pentyl propionate (17.8), hexyl propionate (17.7), heptyl propionate (17.7), butyl butanoate (17.8), or isobutyl isobutanoate (17.1) is preferable, and isoamyl acetate (17.4) is more preferable, from the viewpoint that the effect of the present invention is more excellent.

Examples of the ketone-based solvent are shown below. In the numbers in the parentheses, the numerical values on the left side represent SP values and the numerical values with temperature units on the right side represent boiling points. Incidentally, in a case where only one numerical value is described in the parenthesis, the numerical value represents the SP value.

Examples of the ketone-based solvent include 2-octanone (18.0), 3-octanone (18.0), 4-octanone (18.0), 2-nonanone (18.0), 3-nonanone (18.0), 4-nonanone (18.0), 5-nonanone (18.0), 2-heptanone (18.1, 151° C.), 3-heptanone (18.1), 4-heptanone (18.1, 144° C.), 2-hexanone (18.2, 127° C.), 3-hexanone (18.2, 117° C.), diisobutyl ketone (17.4, 156° C.), diisopentyl ketone (17.4, 208° C.), diisohexyl ketone (17.4), diisoheptyl ketone (17.4), ethyl isobutyl ketone (17.7, 116° C.), methyl isopentyl ketone (17.7, 144° C.), ethyl isopentyl ketone (17.7), propyl isopentyl ketone (17.7), propyl isobutyl ketone (17.7), 3-methyl-2-butanone (17.8), 3,3-dimethyl-2-butanone (17.3), cyclohexanone (20.0, 156° C.), cyclopentanone (20.5, 128° C.), 3-methylcyclohexanone (19.4, 163° C.), 4-methylcyclohexanone (19.4, 163° C.), phenylacetone (21.2, 216° C.), methyl ethyl ketone (18.4, 79° C.), methyl isobutyl ketone (17.8, 116° C.), acetyl acetone (21.7, 140° C.), acetonyl acetone (21.2, 191° C.), diacetonyl alcohol (23.9, 166° C.), acetyl methyl carbinol (26.3, 148° C.), acetophenone (21.6, 202° C.), isophorone (17.6, 215° C.), propylene carbonate (23.6, 240° C.), and γ-butyrolactone (23.8, 202° C.).

Among those, cyclohexanone (20.0, 156° C.), 2-octanone (18.0), 3-octanone (18.0), 4-octanone (18.0), 2-nonanone (18.0), 3-nonanone (18.0), 4-nonanone (18.0), 5-nonanone (18.0), 2-heptanone (18.1), 3-heptanone (18.1), 4-heptanone (18.1), or diisobutyl ketone (17.4) is preferable, cyclohexanone (20.0), 2-octanone (18.0), diisobutyl ketone (17.4), 2-heptanone (18.1), 3-heptanone (18.1), 4-heptanone (18.1), or 5-nonanone (18.0) is more preferable, and 2-heptanone (18.1) or diisobutyl ketone (17.4) is still more preferable, from the viewpoint that the effect of the present invention is more excellent. In a case where the ketone-based solvent has 5 to 9 carbon atoms as described above, the effect of the present invention is noticeably obtained.

Examples of the alcohol-based solvent are shown below. In the numbers in the parentheses, the numerical values on the left side represent SP values and the numerical values with temperature units on the right side represent boiling points. Incidentally, in a case where only one numerical value is described in the parenthesis, the numerical value represents the SP value.

Examples of the alcohol-based solvent include alcohols (monovalent alcohols) such as ethanol (25.7, 78.4° C.), 1-propanol (24.2, 78.4° C.), isopropanol (23.7, 82.6° C.), 1-butanol (23.2, 117° C.), 2-butanol (22.7, 99° C.), 3-methyl-1-butanol (22.0, 132° C.), tert-butyl alcohol (22.3, 82° C.), 1-pentanol (22.4, 131° C.), 2-pentanol (22.0, 119° C.), 1-hexanol (21.9, 157° C.), 1-heptanol (21.4, 159° C.) 1-octanol (21.0, 174° C.), 1-decanol (20.5, 233° C.), 2-hexanol (21.5), 2-heptanol (21.1, 159° C.), 2-octanol (20.7, 174° C.), 3-hexanol (21.5), 3-heptanol (21.1, 156° C.), 3-octanol (20.7, 174° C.), 4-octanol (20.7, 174° C.), 3-methyl-3-pentanol (21.2), cyclopentanol (24.5), 2,3-dimethyl-2-butanol (20.8), 3,3-dimethyl-2-butanol (20.8), 2-methyl-2-pentanol (21.2), 2-methyl-3-pentanol (20.1), 3-methyl-2-pentanol (20.1), 4-methyl-2-pentanol (21.2), cyclohexanol (23.6), 5-methyl-2-hexanol (20.8) 4-methyl-2-hexanol (20.8), 4,5-dimethyl-2-hexanol (20.2), 6-methyl-2-heptanol (20.5), 7-methyl-2-octanol (20.2), 8-methyl-2-nonanol (20.0), 9-methyl-2-decanol (19.8) and 3-methoxy-1-butanol (22.3);

glycol-based solvents such as ethylene glycol (36.5, 197° C.), diethylene glycol (30.6, 244° C.), and triethylene glycol (27.8, 287° C.); and hydroxyl group-containing glycol ether-based solvents such as ethylene glycol monomethyl ether (24.5, 124° C.), propylene glycol monomethyl ether (PGME; alternative name: 1-methoxy-2-propanol) (23.0, 121° C.), diethylene glycol monomethyl ether (23.0, 194° C.), triethylene glycol monoethyl ether (21.7), 3-methoxy-3-methylbutanol (21.5, 174° C.), ethylene glycol monoethyl ether (23.5), ethylene glycol monopropyl ether (22.7, 151° C.), ethylene glycol monobutyl ether (22.1), propylene glycol monoethyl ether (22.3), propylene glycol monopropyl ether (21.8), propylene glycol monobutyl ether (21.4) and propylene glycol monophenyl ether (24.2).

Examples of the amide-based solvent are shown below. In the numbers in the parentheses, the numerical values on the left side represent SP values and the numerical values with temperature units on the right side represent boiling points. Incidentally, in a case where only one numerical value is described in the parenthesis, the numerical value represents the SP value.

Examples of the amide-based solvent include N-methyl-2-pyrrolidone (22.2, 202° C.), N,N-dimethylacetamide (18.7, 166° C.), N,N-dimethylpropioamide (18.5), and N,N-dimethylformamide (21.2, 153° C.).

The content of each solvent with respect to two or more organic solvents contained in the treatment liquid of the embodiment of the present invention is not particularly limited, but the content of the organic solvent having a boiling point of 120° C. to 155° C. (hereinafter also simply referred to as a "first organic solvent") is 45% by mass or more with respect to the total mass of the treatment liquid. Among those, the content is preferably 45% to 100% by mass, and more preferably 50% to 90% by mass.

Furthermore, the content of the organic solvent used in combination with the first organic solvent is usually 5% by mass or more and less than 55% by mass in many cases, and preferably 10% by mass or more and less than 50% by mass, with respect to the total mass of the treatment liquid.

The mass ratio of the organic solvent to be used in combination with the first organic solvent (the content of the first organic solvent/the total content of the organic solvent and the first organic solvent to be used in combination therewith) is not particularly limited, but is preferably from 1 to 9, and more preferably more than 1 and 3 or less.

Among the above-mentioned organic solvents, preferred combinations of the organic solvents are exemplified as follows. That is, a combination of one selected from the group consisting of butyl acetate, isoamyl acetate, 1-methylbutyl acetate, propylene glycol monomethyl ether acetate, and 2-heptanone and one selected from the group consisting of 1-hexanol, propylene glycol monomethyl ether acetate, propylene glycol monomethyl ether, cyclohexanone and 2-heptanone as an organic solvent to be used in combination is preferable. Further, as a third organic solvent to be used further in combination with such combination, for example, dibutyl ether, nonane, or decane is preferable.

Furthermore, in a case where the third organic solvent is used, the content of the third organic solvent is usually 1% by mass or more and less than 50% by mass in many cases, preferably 3% by mass or more and less than 40% by mass, and more preferably 5% by mass or more and less than 30% by mass, with respect to the total mass of the treatment liquid.

Furthermore, it is preferable that the treatment liquid of the embodiment of the present invention includes an ester-based solvent having a boiling point of 120° C. to 155° C. (hereinafter also simply referred to as a "specific ester-based solvent") or a ketone-based solvent having a boiling point of 120° C. to 155° C. (hereinafter also simply referred to as a "specific ketone-based solvent") as the first organic solvent.

The total content of the specific ester-based solvent and the specific ketone-based solvent in the treatment liquid of the embodiment of the present invention is preferably 60% by mass or more, more preferably 70% by mass or more, and still more preferably 80% by mass or more, with respect to the total mass of the treatment liquid, in view that the effect of the present invention is more excellent.

As described above, the treatment liquid of the embodiment of the present invention may be used for both of a developer and a rinsing liquid, but is preferably used for the developer.

In a case where the treatment liquid of the embodiment of the present invention is used as a rinsing liquid in the formation of a pattern, the developer is not particularly limited, but the treatment liquid of the embodiment of the present invention, or a developer (particularly preferably an ester-based solvent) that can be used in combination with the treatment liquid of the embodiment of the present invention, which will be described later is preferably used. Further, in a case where the treatment liquid of the embodiment of the present invention is used as the developer in the formation of a pattern, the rinsing liquid is not particularly limited, but treatment liquid of the embodiment of the present invention, or a rinsing liquid that can be used in combination with the treatment liquid of the embodiment of the present invention, which will be described later, is preferably used.

The moisture content of the treatment liquid of the embodiment of the present invention is more preferably 500 ppm by mass or less, still more preferably 300 ppm by mass or less, and particularly preferably 150 ppm by mass or less, from the viewpoint of the profile after processing in a case where the side of the substrate is processed using a resist pattern formed after a developing treatment or a rinsing treatment as an etching mask.

Specifically, by adjusting the moisture content to 500 ppm or less, the pattern roughness after etching can be further improved, and correspondingly, the pattern resolution can be further improved. A mechanism for improving the pattern roughness after etching is not clear, but it is presumed that in a case where the moisture content of the treatment liquid such as a developer and a rinsing liquid in the developing treatment or the rinsing treatment is low, it is possible to uniformly maintain the solubility of the resist resin components to be dissolved in the treatment liquid, which can cause reduction in the deviation of release properties of the resist. Further, it is assumed that in a case where the moisture content of the treatment liquid is low, the resin components that are hydrophilic are hardly dissolved in the treatment liquid, therefore, the resin components that are hydrophilic are suppressed from re-adhering onto the resist resin film during the developing, rinsing, or drying treatment, and accordingly, the pattern profile becomes better, and as a result, the roughness after etching becomes better.

In addition, in another mechanism, in a case where the moisture content in the treatment liquid is low, the moisture in the treatment liquid is suppressed from interacting with the hydrophilic resin components in the resist resin forming a pattern during the developing treatment or the rinsing treatment, and accordingly, a uniform domain is formed and as a result, the roughness after etching is supposed to be better.

The moisture content of the treatment liquid of the embodiment of the present invention is preferably 5 ppm by mass or more. With this moisture content, it is possible to reduce changes in physical properties such as defects after etching, an effect on roughness, and electrical properties of the substrate material due to migration to an underlying layer, and the like. Details of the mechanism are not clear, but by incorporating an extremely trace amount of the moisture into the treatment liquid, inorganic impurities (ionic components and hydrophilic inorganic particle components) unevenly distributed on the resist resin pattern or the surface layer of the resist underlying film which will be subjected to a treatment can be incorporated into the treatment liquid and removed. As a result, it is assumed that changes in physical properties such as defects after etching, an effect on roughness, and electrical properties of the substrate material due to migration to an underlying layer, and the like can be reduced.

Hereinafter, the developer or the rinsing liquid which can be used in combination with the treatment liquid of the embodiment of the present invention will be described in detail.

<Developer which can be Used in Combination with Treatment Liquid of Embodiment of Present Invention, or Organic Solvent Used in Developer>

Hereinafter, the developer which can be used in combination with the treatment liquid of the embodiment of the present invention (hereinafter also simply referred to as "a developer for use in combination") or an organic solvent which is used for the developer for use in combination will be specifically described.

The vapor pressure of the organic solvent used in the developer for use in combination (the total vapor pressure in the case of a mixed solvent) is preferably 5 kPa or less, more preferably 3 kPa or less, and still more preferably 2 kPa or less, at 20° C. By adjusting the vapor pressure of the organic solvent to 5 kPa or less, the evaporation of the developer for use in combination on a substrate or in a developing cup is suppressed, the temperature uniformity in the wafer surface is improved, and as a result, the dimensional uniformity within a wafer surface is improved.

As the organic solvent for use in the developer for use in combination, various organic solvents are widely used, but examples thereof include solvents such as an ester-based solvent, a ketone-based solvent, an alcohol-based solvent, an amide-based solvent, an ether-based solvent, and a hydrocarbon-based solvent.

In particular, a developer containing at least one solvent selected from a ketone-based solvent, an ester-based solvent, an alcohol-based solvent, or an ether-based solvent is preferable.

Examples of the ester-based solvent include methyl acetate, ethyl acetate, butyl acetate, isobutyl acetate, propyl acetate, isopropyl acetate, amyl acetate (pentyl acetate), isoamyl acetate (isopentyl acetate, 3-methylbutyl acetate), 2-methylbutyl acetate, 1-methylbutyl acetate, hexyl acetate, isohexyl acetate, heptyl acetate, octyl acetate, ethyl methoxyacetate, ethyl ethoxyacetate, propylene glycol monomethyl ether acetate (PGMEA; alternative name: 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol propyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, butyl propionate, pentyl propionate, hexyl propionate, heptyl propionate, butyl butanoate, butyl isobutanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among those, butyl acetate, amyl acetate, isoamyl acetate, 2-methylbutyl acetate, 1-methylbutyl acetate, hexyl acetate, pentyl propionate, hexyl propionate, heptyl propionate, or butyl butanoate is preferable, and isoamyl acetate is more preferable.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and γ-butyrolactone, and among these, 2-heptanone is preferable.

Examples of the alcohol-based solvent include alcohols (monovalent alcohols) such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonal, 9-methyl-2-decanol, and 3-methoxy-1-butanol; glycol-based solvents such as ethylene glycol, diethylene glycol, and triethylene glycol, and glycol ether-based solvents having a hydroxyl group, such as ethylene glycol monomethyl ether, propylene glycol monomethyl ether (PGME; alternative name: 1-methoxy-2-propanol), diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether. Among those, the glycol ether-based solvents are preferable.

Examples of the ether-based solvent include, in addition to the glycol ether-based solvents having a hydroxyl group, glycol ether-based solvents having no hydroxyl group, such as propylene glycol dimethyl ether, propylene glycol diethyl ether, diethylene glycol dimethyl ether, and diethylene glycol diethyl ether; aromatic ether solvents such as anisole and phenetole; and dioxane, tetrahydrofuran, tetrahydropyran, perfluoro-2-butyl tetrahydrofuran, perfluoro tetrahydrofuran, 1,4-dioxane, and isopropyl ether. Among those, the glycol ether-based solvents or the aromatic ether-based solvents such as anisole are preferable.

Examples of the amide-based solvent include N-methyl-2-pyrrolidone, N,N-dimethylacetamide, N,N-dimethylformamide, hexamethylphosphoric amide, and 1,3-dimethyl-2-imidazolidinone.

Examples of the hydrocarbon-based solvent include aliphatic hydrocarbon-based solvents such as pentane, hexane, octane, nonane, decane, dodecane, undecane, hexadecane, 2,2,4-trimethylpentane, 2,2,3-trimethylhexane, perfluorohexane, and perfluoroheptane; and aromatic hydrocarbon-based solvents such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene.

In addition, as the hydrocarbon-based solvent, an unsaturated hydrocarbon-based solvent can also be used, and examples thereof include unsaturated hydrocarbon-based solvents such as octene, nonene, decene, undecene, dodecene, and hexadecene. The number of double bonds and triple bonds contained in the unsaturated hydrocarbon-based solvent is not particularly limited. Further, the double bonds and the triple bonds contained in the unsaturated hydrocarbon-based solvent may be present at any positions of a hydrocarbon chain. In addition, in a case where the unsaturated hydrocarbon-based solvent has a double bond, cis isomers and trans isomers may coexist.

Moreover, the aliphatic hydrocarbon-based solvent which is the hydrocarbon-based solvent may be a mixture of compounds having the same number of carbon atoms and different structures. For example, in a case where decane is used as the aliphatic hydrocarbon-based solvent, the aliphatic hydrocarbon-based solvent may include compounds having the same number of carbon atoms and different structures such as 2-methylnonane, 2,2-dimethyloctane, 4-ethyloctane, and isooctane.

In addition, as the compounds having the same number of carbon atoms and different structures, one kind may be included, and a plurality of kinds may be included.

In a case where extreme ultraviolet (EUV) light or electron beams (EB) are used in an exposing step which will be described below, an ester-based solvent having 6 or more carbon atoms (preferably 6 to 14 carbon atoms, more preferably 6 to 12 carbon atoms, and still more preferably 6 to 10 carbon atoms) and having 2 or less heteroatoms is preferable as the developer for use in combination from the viewpoint that the swelling of a resist film can be suppressed.

The heteroatom of the ester-based solvent is an atom other than a carbon atom and a hydrogen atom, and examples thereof include an oxygen atom, a nitrogen atom, and a sulfur atom. The number of heteroatoms is preferably 2 or less.

As a preferred example of the ester-based solvent having 6 or more carbon atoms and 2 or less heteroatom, at least one selected from butyl acetate, amyl acetate, isoamyl acetate, 2-methylbutyl acetate, 1-methylbutyl acetate, hexyl acetate, pentyl propionate, hexyl propionate, heptyl propionate, butyl butanoate, and butyl isobutanoate is preferable, and isoamyl acetate or butyl isobutanoate is more preferable.

In a case where extreme ultraviolet (EUV) light or electron beams (EB) are used in an exposing step which will be described below, a mixed solvent of the ester-based solvent and the hydrocarbon-based solvent or a mixed solvent of the ketone-based solvent and the hydrocarbon-based solvent may be used, instead of the ester-based solvent having 6 or more carbon atoms and having 2 or less heteroatoms, as the developer for use in combination. Even in this case, the use of the solvents is effective for suppression of the swelling of a resist film.

In a case where the ester-based solvent and the hydrocarbon-based solvent are used in combination, it is preferable that isoamyl acetate is used as the ester-based solvent. In addition, a saturated hydrocarbon-based solvent (for example, octane, nonane, decane, dodecane, undecane, and hexadecane) is preferable as the hydrocarbon-based solvent from the viewpoint of adjusting the solubility of a resist film.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, 2,5-dimethyl-4-hexanone, cyclohexanone, methylcyclohexanone, phenylacetone, methyl ethyl ketone, methyl isobutyl ketone, acetylacetone, acetonyl acetone, ionone, diacetonyl alcohol, acetyl carbinol, acetophenone, methyl naphthyl ketone, isophorone, and propylene carbonate. Among those, diisobutyl ketone or 2,5-dimethyl-4-hexanone is preferable.

In a case where the above-mentioned mixed solvent is used, the content of the hydrocarbon-based solvent depends on the solvent solubility of a resist film. Therefore, the content of the hydrocarbon-based solvent is not particularly limited, and may be appropriately adjusted to be a necessary content.

A plurality of the above-mentioned organic solvents may be mixed, or the solvent may be used in combination with an organic solvent other than the above-mentioned solvents or with water. Here, in order to sufficiently exhibit the effects of the present invention, the moisture content of the developer for use in combination is preferably less than 10% by mass, and the developer for use in combination more preferably substantially does not contain moisture.

The concentration of the organic solvent (a sum total content in a case where a plurality of solvents are mixed together) in the developer for use in combination is preferably 50% by mass or more, more preferably 50% to 100% by mass, still preferably 85% to 100% by mass, and particularly preferably 95% to 100% by mass. Among those, a case where the developer for use in combination is formed of substantially only an organic solvent is the most preferable. Moreover, a case of being formed of substantially only an organic solvent is intended to include a case where trace amounts of a surfactant, an antioxidant, a stabilizer, an anti-foaming agent, and the like are contained.

As the organic solvent used as the developer for use in combination, an ester-based solvent is preferable. As the ester-based solvent, a solvent represented by General Formula (S1) or a solvent represented by General Formula (S2) which will be described later is preferable, the solvent represented by General Formula (S1) is more preferable, alkyl acetate is still more preferable, and butyl acetate, amyl acetate (pentyl acetate), or isoamyl acetate (isopentyl acetate) is particularly preferable.

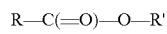 General Formula (S1)

In General Formula (S1), R and R' each independently represent a hydrogen atom, an alkyl group, a cycloalkyl group, an alkoxy group, an alkoxycarbonyl group, a carboxyl group, a hydroxyl group, a cyano group, or a halogen atom. R and R' may be bonded to each other to form a ring.

The number of carbon atoms in the alkyl group, the alkoxy group, and the alkoxycarbonyl group represented by R and R' is preferably 1 to 15, and the number of carbon atoms in the cycloalkyl group represented by R and R' is preferably 3 to 15.

As R and R', a hydrogen atom or an alkyl group is preferable. The alkyl group, the cycloalkyl group, the alkoxy group, and the alkoxycarbonyl group for R and R', and a ring which is formed by R and R' being bonded to each other may be substituted with a hydroxyl group, a group (for example, an acyl group, an aldehyde group, or an alkoxycarbonyl group) including a carbonyl group, a cyano group, or the like.

Examples of the solvent represented by General Formula (S1) include methyl acetate, butyl acetate, ethyl acetate, isopropyl acetate, amyl acetate, isoamyl acetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, and ethyl 2-hydroxypropionate.

Among those, it is preferable that R and R' are each an unsubstituted alkyl group.

As the solvent represented by General Formula (S1), alkyl acetate is preferable, butyl acetate, amyl acetate (pentyl acetate), or isoamyl acetate (isopentyl acetate) is more preferable, and isoamyl acetate is still more preferable.

The solvent represented by General Formula (S1) may be used in combination with one or more other organic solvents. The solvent for use in combination is not particularly limited as long as it can be mixed with the solvent represented by General Formula (S1) without being separated therefrom, and the solvent represented by General Formula (S1) may be used in mixture with a solvent selected from the group consisting of other ester-based solvents, ketone-based solvents, alcohol-based solvents, amide-based solvents, ether-based solvents, and hydrocarbon-based solvents. As the solvent for use in combination, one or more kinds may be used, but one kind is preferable from the viewpoint of obtaining stable performance. In a case where a mixture of the solvent represented by General Formula (S1) and one solvent for use in combination is used, the mixing ratio of the solvent represented by General Formula (S1) to the solvent for use in combination is preferably 20:80 to 99:1, more preferably 50:50 to 97:3, still more preferably 60:40 to 95:5, and particularly preferably 60:40 to 90:10 in terms of a mass ratio.

Incidentally, two or more solvents represented by General Formula (S1) may be used in combination with each other.

As the organic solvent used in the developer for use in combination, a glycol ether-based solvent may be used. As the glycol ether-based solvent, a solvent represented by General Formula (S2) may be used.

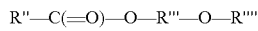  General Formula (S2)

In General Formula (S2),

R" and R"" each independently represent a hydrogen atom, an alkyl group, a cycloalkyl group, an alkoxy group, an alkoxycarbonyl group, a carboxyl group, a hydroxyl group, a cyano group, or a halogen atom. R" and R"" may be bonded to each other to form a ring.

R" and R"" are each preferably a hydrogen atom or an alkyl group. The number of carbon atoms in the alkyl group, the alkoxy group, and the alkoxycarbonyl group for R" and R"" is preferably 1 to 15, and the number of carbon atoms in the cycloalkyl group represented by R" and R"" is preferably 3 to 15.

R'" represents an alkylene group or a cycloalkylene group. R'" is preferably an alkylene group. The number of carbon atoms in the alkylene group for R'" is preferably 1 to 10, and the number of carbon atoms in the cycloalkylene group is preferably 3 to 10.

The alkyl group, the cycloalkyl group, the alkoxy group, or the alkoxycarbonyl group for R" and R"", the alkylene group or the cycloalkylene group for R'", and a ring which is formed by R" and R"" being bonded to each other may be substituted with a hydroxyl group, a group (for example, an acyl group, an aldehyde group, and an alkoxycarbonyl group) including a carbonyl group, a cyano group, or the like.

In General Formula (S2), the alkylene group for R'" may have an ether bond in an alkylene chain.

Examples of the solvent represented by General Formula (S2) include propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monophenyl ether acetate, diethylene glycol monobutyl ether acetate, diethylene glycol monoethyl ether acetate, propylene glycol monoethyl ether acetate, propylene glycol monopropyl ether acetate, methyl-3-methoxypropionate, ethyl-3-methoxypropionate, ethyl-3-ethoxypropionate, propyl-3-methoxypropionate, ethyl methoxyacetate, ethyl ethoxyacetate, 2-methoxy butyl acetate, 3-methoxy butyl acetate, 4-methoxy butyl acetate, 3-methyl-3-methoxy butyl acetate, 3-ethyl-3-methoxy butyl acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, and 4-methyl-4-methoxy pentyl acetate, with propylene glycol monomethyl ether acetate being preferable.

Among those, it is preferable that R" and R"" are each an unsubstituted alkyl group, and R'" is an unsubstituted alkylene group, it is more preferable that R" and R"" are each a methyl group or an ethyl group, and it is still more preferable that R" and R"" are each a methyl group.

The solvent represented by General Formula (S2) may be used in combination with one or more other organic solvents. The solvent for use in combination in such a case is not particularly limited as long as it can be mixed with the solvent represented by General Formula (S2) without being separated therefrom. The solvent represented by General Formula (S2) may be used in mixture with a solvent selected from the group consisting of other ester-based solvents, ketone-based solvents, alcohol-based solvents, amide-based solvents, ether-based solvents, and hydrocarbon-based solvents. As the solvent for use in combination, one or more kinds may be used, but one kind is preferably used from the viewpoint of obtaining stable performance. In a case where a mixture of the solvent represented by General Formula (S2) and one solvent for use in combination is used, the mixing ratio of the solvent represented by General Formula (S2) to the solvent for use in combination is preferably 20:80 to 99:1, more preferably 50:50 to 97:3, still more preferably 60:40 to 95:5, and particularly preferably 60:40 to 90:10 in terms of a mass ratio.

Incidentally, two or more solvents represented by General Formula (S2) may be used in combination with each other.

In addition, suitable examples of the organic solvent used in the developer for use in combination also include an ether-based solvent.

Examples of the ether-based solvent include the above-mentioned ether-based solvents, and among these, an ether-based solvent having one or more aromatic rings is preferable, a solvent represented by General Formula (S3) is more preferable, and anisole is still more preferable.

  (S3)

In General Formula (S3),

Rs represents an alkyl group. As the alkyl group, an alkyl group having 1 to 4 carbon atoms is preferable, a methyl group or an ethyl group is more preferable, and a methyl group is still more preferable.

As the organic solvent included in the developer for use in combination, an organic solvent used in a resist composition which will be described later can be used.

<Rinsing Liquid which can be Used in Combination with Treatment Liquid of Embodiment of Present Invention, or Organic Solvent Used in Rinsing Liquid>

Hereinafter, a rinsing liquid which can be used in combination with the treatment liquid of the embodiment of the present invention (hereinafter also simply referred to as "a rinsing liquid for use in combination") or an organic solvent which is used for the rinsing liquid for use in combination will be specifically described.

The vapor pressure of the organic solvent used in the rinsing liquid (in the case of a mixed solvent, the total vapor pressure) is preferably 0.05 to 5 kPa, more preferably 0.1 to 5 kPa, and still more preferably 0.12 to 3 kPa, at 20° C. By adjusting the vapor pressure of the rinsing liquid for use in combination to 0.05 kPa to 5 kPa, the temperature uniformity in the wafer surface is improved, the swelling caused by the penetration of the rinsing liquid is also suppressed, and thus, the dimensional uniformity within a wafer surface is improved.

As the organic solvent included in the rinsing liquid for use in combination, various organic solvents are used, but at least one organic solvent selected from the group consisting of a hydrocarbon-based solvent, a ketone-based solvent, an ester-based solvent, an alcohol-based solvent, an amide-based solvent, and an ether-based solvent is preferable.

Specific examples of these organic solvents are the same as those of the organic solvent described above for the developer.

In a case where extreme ultraviolet (EUV) light or electron beams (EB) are used in an exposing step which will be described later, as the organic solvent included in the rinsing liquid for use in combination, a hydrocarbon-based solvent is preferable, and an aliphatic hydrocarbon-based solvent is more preferable, among the above-mentioned organic solvents. As the aliphatic hydrocarbon-based solvent used in the rinsing liquid for use in combination, from the viewpoint of further improving the effects, an aliphatic hydrocarbon-based solvent having 5 or more carbon atoms (for example, pentane, hexane, octane, decane, undecane, dodecane, and hexadecane) is preferable, an aliphatic hydrocarbon-based solvent having 8 or more carbon atoms is more preferable, and an aliphatic hydrocarbon-based solvent having 10 or more carbon atoms is still more preferable.

Incidentally, the upper limit value of the number of carbon atoms in the aliphatic hydrocarbon-based solvent is not particularly limited, and for example, is 16 or less, preferably 14 or less, and more preferably 12 or less.

Among the aliphatic hydrocarbon-based solvents, decane, undecane, or dodecane is particularly preferable, and undecane is the most preferable.

In addition, as the hydrocarbon-based solvent included in the rinsing liquid for use in combination, an unsaturated hydrocarbon-based solvent can be used, and examples thereof include unsaturated hydrocarbon-based solvents such as octene, nonene, decene, undecene, dodecene, and hexadecene. The number of double bonds or triple bonds in the unsaturated hydrocarbon-based solvent is not particularly limited. Further, the double bonds and the triple bonds contained in the unsaturated hydrocarbon-based solvent may be present at any positions of a hydrocarbon chain. In addition, in a case where the unsaturated hydrocarbon-based solvent has a double bond, cis isomers and trans isomers may coexist.

By using the hydrocarbon-based solvent (in particular, the aliphatic hydrocarbon-based solvent) as the organic solvent included in the rinsing liquid for use in combination, a small amount of the developer permeating into the developed resist film is rinsed, the swelling is further suppressed, and thus, an effect of suppressing pattern collapse is further exhibited.

In addition, as the organic solvent included in the rinsing liquid for use in combination, a mixed solvent of the ester-based solvent and the hydrocarbon-based solvent or a mixed solvent of the ketone-based solvent and the hydrocarbon-based solvent may be used. It is preferable that the mixed solvent includes a hydrocarbon-based solvent as a major component.

Furthermore, from the viewpoint that the ester-based solvent and the ketone-based solvent are particularly effective for reducing the residues after development, at least one selected from the group consisting of the ester-based solvent and the ketone-based solvent may be used as the organic solvent included in the rinsing liquid for use in combination.

In a case where the rinsing liquid for use in combination contains at least one selected from the group consisting of the ester-based solvent and the ketone-based solvent, it is preferable that the rinsing liquid contains at least one solvent selected from the group consisting of butyl acetate, isopentyl acetate (isoamyl acetate), n-pentyl acetate, ethyl-3-ethoxypropionate (EEP), and 2-heptanone as a major component, and it is more preferable that the rinsing liquid contains at least one solvent selected from the group consisting of butyl acetate and 2-heptanone as a major component.

In addition, in a case where the rinsing liquid for use in combination contains at least one selected from the group consisting of the ester-based solvent and the ketone-based solvent, it is preferable that the rinsing liquid contains a solvent selected from the group consisting of an ester-based solvent, a glycol ether-based solvent, a ketone-based solvent, and an alcohol-based solvent as a minor component, and it is more preferable that the rinsing liquid contains a solvent selected from the group consisting of propylene glycol monomethyl ether acetate (PGMEA), propylene glycol monomethyl ether (PGME), ethyl acetate, ethyl lactate, 3-methyl methoxypropionate, cyclohexanone, methyl ethyl ketone, γ-butyrolactone, propanol, 3-methoxy-1-butanol, N-methylpyrrolidone, and propylene carbonate.

Among those, in a case where an ester-based solvent is used as the organic solvent, it is preferable that two or more ester-based solvents are used in a view that the effects are further exhibited. Specific examples of the case include a case where an ester-based solvent (preferably butyl acetate) is used as a major component and another ester-based solvent having a different chemical structure (preferably propylene glycol monomethyl ether acetate (PGMEA)) is used as a minor component.

In addition, in a case where an ester-based solvent is used as the organic solvent, a glycol ether-based solvent may be used, in addition to an ester-based solvent (one kind or two or more kinds), from the viewpoint of further exhibiting the effects. Specific examples of the case include a case where an ester-based solvent (preferably butyl acetate) is used as a major component and a glycol ether-based solvent (preferably propylene glycol monomethyl ether (PGME)) is used as a minor component.

In a case where a ketone-based solvent is used as the organic solvent, an ester-based solvent and/or a glycol ether-based solvent may also be used, in addition to the (one kind or two or more kinds of) ketone-based solvent, in a view that the effects are further exhibited. Specific examples of the case include a case where a ketone-based solvent (preferably 2-heptanone) is used as a major component and an ester-based solvent (preferably, propylene glycol monomethyl ether acetate (PGMEA)) and/or a glycol ether-based solvent (preferably propylene glycol monomethyl ether (PGME)) is used as a minor component.

Here, the above-mentioned "major component" indicates that the content of the component is 50% to 100% by mass, preferably 70% to 100% by mass, more preferably 80% to 100% by mass, still more preferably 90% to 100% by mass, and particularly preferably 95% to 100% by mass, with respect to the total mass of the organic solvent.

In addition, in a case where the minor component is contained, the content of the minor component is preferably 0.1% to 20% by mass, more preferably 0.5% to 10% by mass, and still more preferably 1% to 5% by mass, with respect to the total mass (100% by mass) of the major component.

A plurality of the organic solvents may be mixed, or the solvent may be used in combination with an organic solvent other than the above-mentioned solvents. The solvent may also be mixed with water, but the moisture content in the rinsing liquid for use in combination is preferably 60% by mass or less, more preferably 30% by mass or less, still more preferably 10% by mass or less, and most preferably 5% by mass or less. By adjusting the moisture content to 60% by mass or less, excellent rinsing characteristics can be obtained.

Hereinafter, various additives which can be included in the treatment liquid of the embodiment of the present invention will be described in detail. Various additives shown below may certainly be included in the above-mentioned developer for use in combination and/or rinsing liquid for use in combination, which can be used in combination with the treatment liquid of the embodiment of the present invention.

<Surfactant>

It is preferable that the treatment liquid contains a surfactant, which improves the wettability for a resist film and allows the developing treatment and/or the rinsing treatment to proceed more effectively.

Examples of the surfactant include the same ones as the surfactant used in the resist composition which will be described later.

The content of the surfactant is usually 0.001% to 5% by mass, preferably 0.005% to 2% by mass, and still more preferably 0.01% to 0.5% by mass, with respect to the total mass of the treatment liquid.

Examples of the fluorine-based and/or the silicon-based surfactants include the surfactants described in paragraph [0276] of US2008/0248425A, for example, F-TOP EF301 and EF303 (manufactured by Shin Akita Chemical Co., Ltd.), FLUORAD FC430, 431, and 4430 (manufactured by Sumitomo 3M Ltd.), MEGAFACE F171, F173, F176, F189, F113, F110, F177, F120, and R08 (manufactured by DIC Corporation), SURFLON S-382, SC101, 102, 103, 104, 105, and 106 (manufactured by Asahi Glass Co., Ltd.), TROYSOL S-366 (manufactured by Troy Corporation), GF-300 and GF-150 (manufactured by Toagosei Co., Ltd.), SURFLON S-393 (manufactured by AGC Seimi Chemical Co., Ltd.), F-TOP EF121, EF122A, EF122B, RF122C, EF125M, EF135M, EF351, EF352, EF801, EF802, and EF601 (manufactured by Gemco Inc.), PF636, PF656, PF6320, and PF6520 (manufactured by OMNOVA Corp.), and FTX-204G, 208G, 218G, 230G, 204D, 208D, 212D, 218D, and 222D (manufactured by Neos Co., Ltd.). Further, a Polysiloxane Polymer KP-341 (manufactured by Shin-Etsu Chemical Co., Ltd.) can also be exemplified as the silicon-based surfactant.

In addition, in addition to the known surfactants as shown above, a surfactant using a polymer having a fluoro aliphatic group derived from a fluoro aliphatic compound produced by a telomerization method (also referred to as a telomer method) or an oligomerization method (also referred to as an oligomer method) can also be exemplified. The fluoro aliphatic compound can be synthesized by the method described in JP2002-090991A.

Examples of a surfactant corresponding to the above surfactant include MEGAFAC F-178, F-470, F-473, F-475, F-476, and F-472 (manufactured by Dainippon Ink and Chemicals Inc.), a copolymer of acrylate (or methacrylate) having a $C_6F_{13}$ group and (poly(oxyalkylene))acrylate (or methacrylate), and a copolymer of acrylate (or methacrylate) having a $C_3F_7$ group, (poly(oxyethylene))acrylate (or methacrylate), and (poly(oxypropylene))acrylate (or methacrylate).

In addition, a surfactant other than the fluorine-based and/or silicon-based surfactants described in [0280] of US2008/0248425A can be used in the present invention. Further, the following surfactants can also be suitably used.

[2-1] Anionic Surfactant

Examples of the anionic surfactant include alkyl sulfuric acid esters, alkylsulfonic acid, alkylbenzenesulfonic acid, alkylnaphthalenesulfonic acid, alkyldiphenylethersulfonic acid, polyoxyethylene alkyl ether carboxylic acid, polyoxyethylene alkyl ether acetic acid, polyoxyethylene alkyl ether propionic acid, polyoxyethylene alkyl ether sulfuric acid, polyoxyethylene aryl ether acetic acid, polyoxyethylene aryl ether propionic acid, polyoxyethylene aryl ether sulfuric acid, and salts thereof.

Among those, alkyl sulfuric acid ester, polyoxyethyleneary1 ether sulfuric acid, or polyoxyethylene alkyl ether sulfuric acid is preferable, and polyoxyethylene aryl ether sulfuric acid is more preferable.

[2-2] Nonionic Surfactant

Examples of the nonionic surfactant include a polyalkylene oxide alkylphenyl ether-based surfactant, a polyalkylene oxide alkyl ether-based surfactant, a block polymer-based surfactant including polyethylene oxide and polypropylene oxide, a polyoxyalkylene distyrenated phenyl ether-based surfactant, a polyalkylene tribenzylphenyl ether-based surfactant, and an acetylene polyalkylene oxide-based surfactant.

[2-3] Cationic Surfactant

Examples of the cationic surfactant include a quaternary ammonium salt-based surfactant and an alkylpyridinium-based surfactant.

Examples of the quaternary ammonium salt-based surfactant include tetramethylammonium chloride, tetrabutylammonium chloride, dodecyldimethylbenzylainmonium chloride, alkyltrimethylammonium chloride, octyltrimethylammonium chloride, decyltrimethylammonium chloride, dodecyltrimethylammonium chloride, tetradecyltrimethylammonium chloride, cetyltrimethylammonium chloride, and stearyltrimethylammonium chloride. Among those, dodecyldimethylbenzylammonium chloride is preferable.

These surfactants may be used alone or in combination of several kinds thereof.

<Antioxidant>

It is preferable that the treatment liquid contains an antioxidant, which can suppress the generation of an oxidant over time and further lower the content of the oxidant.

Known antioxidants may be used as the antioxidant, but in a case where the antioxidant is used for semiconductor applications, an amine-based antioxidant or a phenol-based antioxidant is preferable.

Examples of the amine-based antioxidant include a naphthylamine-based antioxidant such as 1-naphthylamine, phenyl-1-naphthylamine, p-octylphenyl-1-naphthylamine, p-nonylphenyl-1-naphthylamine, p-dodecylphenyl-1-naphthylamine, and phenyl-2-naphthylamine; a phenylenediamine-based antioxidant such as N,N'-diisopropyl-p-phenylenediamine, N,N'-diisobutyl-p-phenylenediamine, N,N'-diphenyl-p-phenylenediamine, N,N'-di-β-naphthyl-p-phenylenediamine, N-phenyl-N'-isopropyl-p-phenylenediamine, N-cyclohexyl-N'-phenyl-p-phenylenediamine, N-1,3-dimethylbutyl-N'-phenyl-p-phenylenediamine, dioctyl-p-phenylenediamine, phenylhexyl-p-phenylenediamine, and phenyloctyl-p-phenylenediamine; a diphenylamine-based antioxidant such as dipyridylamine, diphenylamine, p,p'-di-n-butyldiphenylamine, p,p'-di-t-butyldiphenylamine, p,p'-di-t-pentyldiphenylamine, p,p'-dioctyldiphenylamine, p,p'-dinonyldiphenylamine, p,p'-didecyldiphenylamine, p,p'-didodecyldiphenylamine, p,p'-distyryldiphenylamine, p,p'-dimethoxydiphenylamine, 4,4'-bis(4-α,α-dimethylbenzoyl) diphenylamine, p-isopropoxydiphenylamine, and dipyridyl amine; and a phenothiazine-based antioxidant such as phenothiazine, N-methylphenothiazine, N-ethylphenothiazine, 3,7-dioctylphenothiazine, phenothiazine carboxylic acid ester, and phenoselenazine.

Examples of the phenol-based antioxidant include 2,6-ditertiarybutylphenol (tertiary butyl is hereinafter simply referred to as t-butyl), 2,6-di-t-butyl-p-cresol, 2,6-di-t-butyl-4-methylphenol, 2,6-di-t-butyl-4-ethylphenol, 2,4-dimethyl-6-t-butylphenol, 4,4'-methylenebis(2,6-di-t-butylphenol), 4,4'-bis(2,6-di-t-butylphenol), 4,4'-bis(2-methyl-6-t-butylphenol), 2,2'-methylenebis(4-methyl-6-t-butylphenol), 2,2'-methylenebis(4-ethyl-6-t-butylphenol), 4,4'-butylidenebis(3-methyl-6-t-butylphenol), 4,4'-isopropylidenebis(2,6-di-t-butylphenol), 2,2'-methylenebis(4-methyl-6-cyclohexylphenol), 2,2'-methylenebis(4-methyl-6-nonylphenol), 2,2'-isobutylidenebis(4,6-dimethylphenol), 2,6-bis(2'-hydroxy-3'-t-butyl-5'-methylbenzyl)-4-methylphenol, 3-t-butyl-4-hydroxyanisole, 2-t-butyl-4-hydroxyanisole, octyl 3-(4-hydroxy-3,5-di-t-butylphenyl)propionate, stearyl 3-(4-hydroxy-3,5-di-t-butylphenyl)propionate, oleyl 3-(4-hydroxy-3,5-di-t-butylphenyl)propionate, dodecyl 3-(4-hydroxy-3,5-di-t-butylphenyl)propionate, decyl 3-(4-hydroxy-3,5-di-t-butylphenyl)propionate, tetrakis {3-(4-hydroxy-3,5-di-t-butylphenyl)propionyloxymethyl}methane, 3-(4-hydroxy-3,5-di-t-butylphenyl)propionic acid glycerin monoester, an ester of 3-(4-hydroxy-3,5-di-t-butylphenyl) propionic acid and glycerin monooleyl ether, 3-(4-hydroxy-3,5-di-t-butylphenyl)propionic acid butylene glycol diester, 2,6-di-t-butyl-α-dimethylamino-p-cresol, 2,6-di-t-butyl-4-(N,N'-dimethylaminomethylphenol), tris {(3,5-di-t-butyl-4-hydroxyphenyl)propionyloxyethyl}isocyanurate, tris(3,5-di-t-butyl-4-hydroxyphenyl)isocyanurate, 1,3,5-tris(3,5-di-t-butyl-4-hydroxybenzyl)isocyanurate, 1,3,5-tris(4-t-butyl-3-hydroxy-2,6-dimethylbenzyl)isocyanurate, N,N'-hexamethylene bis(3,5-di-t-butyl-4-hydroxyhydrocinnamate), 3,9-bis[1,1-dimethyl-2-{β-(3-t-butyl-4-hydroxy-5-methylphenyl)propionyloxy}ethyl]-2,4,8,10-tetraoxaspiro[5,5]undecane, 1,1,3-tris(2-methyl-4-hydroxy-5-t-butylphenyl)butane, 1,3,5-trimethyl-2,4,6-tris(3,5-di-t-butyl-4-hydroxybenzyl)benzene, and bis{3,3'-bis-(4'-hydroxy-3'-t-butylphenyl)butyric acid}glycol ester.

The content of the antioxidant is not particularly limited, but is preferably 0.0001% to 1% by mass, more preferably 0.0001% to 0.1% by mass, and still more preferably 0.0001% to 0.01% by mass, with respect to the total mass of the treatment liquid. In a case where the content of the antioxidant is 0.0001% by mass or more, a more excellent antioxidant effect is obtained, and in a case where the content of the antioxidant is 1% by mass or less, there is a tendency that generation of the residues after development-rinsing can be suppressed.

<Basic Compound>

It is preferable that the treatment liquid of the embodiment of the present invention contains a basic compound. Specific examples of the basic compound include the compounds exemplified as a basic compound (E) which can be included in an actinic ray-sensitive or radiation-sensitive resin composition which will be described later.

Among the basic compounds which can be included in the treatment liquid of the embodiment of the present invention, the following nitrogen-containing compound is preferable.

In the case where the nitrogen-containing compound is included in the developer, the nitrogen-containing compound can interact with a polar group generated in a resist film by the action of an acid to further improve the insolubility of the exposed area in an organic solvent. Here, the interaction between the nitrogen-containing compound and the polar group is an action in which the nitrogen-containing compound and the polar group react to form a salt, an ionic bond, or the like.

The nitrogen-containing compound is preferably a compound represented by Formula (1).

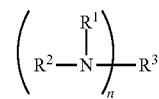

In Formula (1), $R^1$ and $R^2$ each independently represent a hydrogen atom, a hydroxyl group, a formyl group, an alkoxy group, an alkoxycarbonyl group, a chained hydrocarbon group having 1 to 30 carbon atoms, an alicyclic hydrocarbon group having 3 to 30 carbon atoms, an aromatic hydrocarbon group having 6 to 14 carbon atoms, or a group formed by a combination of two or more of these groups. $R^3$ is a hydrogen atom, a hydroxyl group, a formyl group, an alkoxy group, an alkoxycarbonyl group, an n-valent chained hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by a combination of two or more of these groups. n is an integer of 1 or more. However, in a case where n is 2 or more, a plurality of $R^1$'s and $R^2$'s may be respectively the same or different from one another. In addition, any two of $R^1$ to $R^3$, taken together with the nitrogen atom to which each is bonded, may form a ring structure.

Examples of the chained hydrocarbon group having 1 to 30 carbon atoms, represented by $R^1$ and $R^2$, include a methyl group, an ethyl group, an n-propyl group, an i-propyl group, an n-butyl group, a 2-methylpropyl group, a 1-methylpropyl group, and a t-butyl group.

Examples of the alicyclic hydrocarbon group having 3 to 30 carbon atoms, represented by $R^1$ and $R^2$, include a cyclopropyl group, a cyclopentyl group, a cyclohexyl group, an adamantyl group, and a norbornyl group.

Examples of the aromatic hydrocarbon group having 6 to 14 carbon atoms, represented by $R^1$ and $R^2$, include a phenyl group, a tolyl group, and a naphthyl group.

Examples of the group formed by a combination of two or more of those groups represented by $R^1$ and $R^2$ include aralkyl groups having 6 to 12 carbon atoms, such as a benzyl group, a phenethyl group, a naphthylmethyl group, and a naphthylethyl group.

Examples of the n-valent chained hydrocarbon group having 1 to 30 carbon atoms, represented by $R^3$, include groups formed by removing (n-1) hydrogen atoms from the same groups as those groups exemplified as the chained hydrocarbon group having 1 to 30 carbon atoms, represented by $R^1$ and $R^2$.

Examples of the alicyclic hydrocarbon group having 3 to 30 carbon atoms, represented by $R^3$, include groups formed by removing (n-1) hydrogen atoms from the same groups as those groups exemplified as the cyclic hydrocarbon group having 3 to 30 carbon atoms, represented by $R^1$ and $R^2$.

Examples of the aromatic hydrocarbon group having 6 to 14 carbon atoms, represented by $R^3$, include groups formed by removing (n-1) hydrogen atoms from the same groups as those groups exemplified as the aromatic hydrocarbon group having 6 to 14 carbon atoms, represented by $R^1$ and $R^2$.

Examples of the group formed by a combination of two or more of those groups represented by $R^3$ include groups formed by removing (n-1) hydrogen atoms from the same groups as those groups exemplified as the group formed by a combination of two or more of those groups represented by $R^1$ and $R^2$.

The groups represented by $R^1$ to $R^3$ may be substituted. Specific examples of the substituent include a methyl group, an ethyl group, a propyl group, an n-butyl group, a t-butyl group, a hydroxyl group, a carboxy group, a halogen atom, and an alkoxy group. Examples of the halogen atom include a fluorine atom, a chlorine atom, and a bromine atom. Examples of the alkoxy group include a methoxy group, an ethoxy group, a propoxy group, and a butoxy group.

Examples of the compound represented by Formula (1) include a (cyclo)alkylamine compound, a nitrogen-containing heterocyclic compound, an amide group-containing compound, and a urea compound.

Examples of the (cyclo)alkylamine compound include a compound having one nitrogen atom, a compound having two nitrogen atoms, and a compound having three or more nitrogen atoms.

Examples of the (cyclo)alkylamine compound having one nitrogen atom include mono(cyclo)alkylamines such as n-hexylamine, n-heptylamine, n-octylamine, n-nonylamine, 1-aminodecane, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; substituted alkylamines such as triethanolamine; and aromatic amines such as aniline, N-methylaniline, N,N-dimethylaniline, 2-methylaniline, 3-methylaniline, 4-methylaniline, N,N-dibutylaniline, 4-nitro aniline, diphenylamine, triphenylamine, naphthylamine, 2,4,6-tri-tert-butyl-N-methylaniline, N-phenyldiethanolamine, 2,6-diisopropylaniline, 2-(4-aminophenyl)-2-(3-hydroxyphenyl)propane, and 2-(4-aminophenyl)-2-(4-hydroxyphenyl)propane.

Examples of the (cyclo)alkylamine compound having two nitrogen atoms include ethylenediamine, tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolidinone, 2-quinoxalinol, and N,N,N',N'-tetrakis(2-hydroxypropyl)ethylenediamine.

Examples of the (cyclo)alkylamine compound having three or more nitrogen atoms include polymers such as polyethyleneimine, polyallylamine, and 2-dimethylaminoethylacrylamide.

Examples of the nitrogen-containing heterocyclic compound include a nitrogen-containing aromatic heterocyclic compound and a nitrogen-containing aliphatic heterocyclic compound.

Examples of the nitrogen-containing aromatic heterocyclic compound include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; and pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxyquinoline, acridine, and 2,2':6',2"-terpyridine.

Examples of the nitrogen-containing aliphatic heterocyclic compound include piperazines such as piperazine and 1-(2-hydroxyethyl)piperazine; pyrazine, pyrazole, pyridazine, quinoxaline, purine, pyrrolidine, proline, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, and 1,4-diazabicyclo[2.2.2]octane.

Examples of the amide group-containing compound include N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(±)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonyl hexamethylenediamine, N,N,N',N'-tetra-t-butoxycarbonyl hexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, and tris(2-hydroxyethyl) isocyanurate.

Examples of the urea compound include urea, methylurea, 1,1-dimethylurea, 1,3-dimethylurea, 1,1,3,3-tetramethylurea, 1,3-diphenylurea, and tri-n-butylthiourea.

Among the above-mentioned nitrogen-containing compounds, a nitrogen-containing compound having an SP value of 18 or less is preferably used from the viewpoint of suppressing development defects. This is because the nitrogen-containing compound having an SP value of 18 or less has a good affinity with a rinsing liquid used in a rinsing process which will be described later, and is thus capable of suppressing the occurrence of development defects such as precipitation. Incidentally, the unit of the SP value is $(J/cm^3)^{1/2}$.

The SP value of the nitrogen-containing compound used in the present invention is calculated using the Fedors method described in "Properties of Polymers, $2^{nd}$ edition, 1976". The calculation formula used and the parameters of each substituent are shown below.

SP value (Fedors method)=[(Sum of cohesive energies of individual substituents)/(Sum of volumes of individual substituents)]$^{0.5}$

TABLE 1

| Substituent | Cohesive energy (J/mol) | Volume (cm³/mol) |
|---|---|---|
| $CH_3$ | 4,710 | 33.5 |
| $CH_2$ | 4,940 | 16.1 |
| CH | 3,430 | −1 |
| C | 1,470 | −19.2 |
| $CH_2$= | 4,310 | 28.5 |
| =CH— | 4,310 | 13.5 |

TABLE 1-continued

| Substituent | Cohesive energy (J/mol) | Volume (cm³/mol) |
|---|---|---|
| =C< | 4,310 | −5.5 |
| Ph | 31,940 | 71.4 |
| $NH_2$ | 12,560 | 19.2 |
| NH | 8,370 | 4.5 |
| N< | 4,190 | −9 |
| CN | 25,530 | 24 |
| OH | 29,800 | 10 |
| CHO | 21,350 | 22.3 |
| COOH | 27,630 | 28.5 |
| —O— | 3,350 | 3.8 |
| CO | 17,370 | 10.8 |
| COO | 18,000 | 18 |
| 5-Memebered or higher ring | 1,050 | 16 |

Fedors method substituent constants extracted (Properties of Polymers 2$^{nd}$ edition, pp. 138 to 140)

As the nitrogen-containing compound, a (cyclo)alkylamine compound or nitrogen-containing aliphatic heterocyclic compound which satisfies the above-mentioned condition (SP value) is preferable, and 1-aminodecane, di-n-octylamine, tri-n-octylamine, or tetramethylethylenediamine is more preferable. The SP values and the like of these nitrogen-containing aliphatic heterocyclic compounds are shown in the following table.

TABLE 2

| | $CH_3$ | $CH_2$ | $NH_2$ | NH | N | SP value |
|---|---|---|---|---|---|---|
| 1-Aminodecane | 1 | 9 | 1 | | | 17.7 |
| Di-n-octylamine | 2 | 14 | | 1 | | 17.1 |
| Tri-n-octylamine | 3 | 21 | | | 1 | 16.9 |
| Tetramethylenediamine | 4 | 2 | | | 2 | 15.8 |

The content of the basic compound (preferably the nitrogen-containing compound) in the treatment liquid is not particularly limited, but from the viewpoint that the effect of the present invention is more excellent, the content is preferably 10% by mass or less, and more preferably 0.5% to 5% by mass, with respect to the total amount of the treatment liquid.

In addition, in the present invention, the above-mentioned nitrogen-containing compounds may be used alone or two or more of the compounds having different chemical structures may be used in combination.

The above-mentioned treatment liquid can also be suitably applied to a non-chemically amplified resist for the purpose of, for example, solving the problems of the present application.

Examples of the non-chemically amplified resist include the following ones.

(1) A resist material in which a main chain is cut, the molecular weight decreases, and the solubility changes upon irradiation with a g-ray, a h-ray, an i-ray, KrF, ArF, EB, EUV, or the like (for example, a resist material including a copolymer of an α-chloroacrylate compound and an α-methylstyrene compound as a major component, which is described in paragraphs 0025 to 0029, and 0056 of JP2013-210411A, or paragraphs 0032 to 0036, and 0063 of US2015/0008211A).

(2) A resist material such as a hydrogen silsesquioxane resist (HSQ) and a chlorine-substituted calixarene in which a silanol condensation reaction occurs with a g-ray, a h-ray, an i-ray, KrF, ArF, EB, Buy, or the like.

(3) A resist which includes a metal complex (a complex of magnesium, chromium, manganese, iron, cobalt, nickel, copper, zinc, silver, cadmium, indium, tin, antimony, cesium, zirconium, hafnium, or the like; titanium, zirconium, or hafnium is preferable from the viewpoint of pattern formability) having an absorption to light such as a g-ray, a h-ray, an i-ray, KrF, ArF, EB, and EUV, and in which ligand disengagement or ligand exchange occurs in a case of being used in combination with a photoacid generator (for example, a resist material described in paragraphs 0017 to 0033, and 0037 to 0047 of JP2015-075500A, in paragraphs 0017 to 0032, and 0043 to 0044 of JP2012-185485A, paragraphs 0042 to 0051, and 0066 of US2012/0208125A, and the like).

In addition, the above-mentioned treatment liquid can also be suitably applied to a silicon-based resist for the purpose of, for example, solving the problems of the present application.

Examples of the silicon-based resist include the resist materials described in paragraphs 0010 to 0062 and paragraphs 0129 to 0165 of JP2008-083384A.

[Content of Organic Compound (Organic Impurities) Having Boiling Point of 300° C. or Higher]

The present inventors have found that in a case where a treatment liquid including an organic solvent containing organic impurities is applied onto a semiconductor device producing step, in particular, an organic compound having a boiling point of 300° C. or higher is not volatilized and remains in the organic impurities, which is likely to cause substrate defect failures.

In particular, as the organic compound having a boiling point of 300° C. or higher, specifically, a resin, a plasticizer, or the like included in plastic materials (for example, an O-ring) used in the members of a production device can be considered, and it is presumed that the resin, the plasticizer, or the like is eluted into the liquid at a certain point of time in the production process.

Now, as a result of studies conducted by the present inventors, it was found that in a case where the content of an organic compound having a boiling point of 300° C. or higher in the treatment liquid of the embodiment of the present invention is 0.001 to 30.0 ppm by mass (preferably 0.001 to 1.0 ppm by mass) with respect to the total mass of the treatment liquid, the defect failure of the substrate more hardly occurs (in other words, the effect suppressing ability is more excellent) upon use in a process for manufacturing a semiconductor device. Further, it is assumed that in a case where the content of the organic compound having a boiling point of 300° C. or higher is 0.001 ppm by mass or more with respect to the total mass of the treatment liquid, a trace amount of an organic compound interacts with metal particles, whereby the metal particle removing properties are improved.

Moreover, as another effect, it was found that in a case where the treatment liquid contains an organic compound having a boiling point of 300° C. or higher and the content of the organic compound is in the range, the effect of a pattern formed after the etching on roughness is decreased during a pattern transfer through etching processing of the substrate side with a use of the pattern formed after treatment as a mask. Incidentally, it was found that occurrence of roughness in the pattern can be further suppressed in a case where a treatment liquid including a plurality of organic solvents is used and the plurality of organic solvents are combined so that the difference in the boiling points among the plurality of organic solvents is decreased. A mechanism for improvement of the roughness with the organic compound having a boiling point of 300° C. or higher is not clear, but it is presumed that the components could be suppressed from adhering onto the pattern side wall during the developing treatment or the rinsing treatment, which makes it difficult for the components to remain on the surface layer portion of the resist resin after treatment, and as a result, formation of an extremely small domain including adhering materials in the slightly swollen resist resin by the treatment liquid during the treatment can be suppressed or formation of a domain of the resist resin can be suppressed, whereby occurrence of roughness due to the difference in the etching rates between the domain and the non-domain during the etching can be suppressed. In addition, a reason that occurrence of roughness can be further suppressed in a case where the difference in the boiling points among a plurality of organic solvents is small in a treatment liquid including the plurality of organic solvents is assumed to be that in the drying process after a treatment with the treatment liquid, the drying rates among the respective organic solvents become closer to each other, and thus, some of the organic solvents can be suppressed from remaining and being dried in some areas of the resist resin surface at the end of drying, whereby generation of aggregates of the organic compound having a high boiling point or formation of a domain including the resist resin can be suppressed, resulting in further reduction in the an effect on profiles such as the roughness after etching.

That is, by adjusting the content of the organic compound having a boiling point of 300° C. or higher to be in the range and adjusting the boiling points among the plurality of organic solvents to be the above-mentioned predetermined range, it is possible to suppress occurrence of the roughness after etching, or the like.

In the treatment liquid, examples of the organic compound having a boiling point of 300° C. or higher include dioctyl phthalate (DOP, a boiling point of 385° C.), diisononyl phthalate (DINP, a boiling point of 403° C.), dioctyl adipate (DOA, a boiling point of 335° C.), dibutyl phthalate (DBP, a boiling point of 340° C.), oleamide (OLA, a boiling point of 433° C.), and ethylene propylene rubber (EPDM, a boiling point of 300° C. to 450° C.).

Among those, DOP, DINP, DOA, DBP, and OLA are likely to cause defect failures of the substrate. Therefore, in a case where the contents of these organic compounds are in the range, the substrate defects failures can be further suppressed.

In addition, DOP and OLA are particularly likely to cause defect failures of the substrate. Therefore, the contents of the DOP and OLA organic compounds are all preferably 0.001 to 1.5 ppm by mass, and more preferably 0.001 to 1.0 ppm by mass.

The content of the organic compound having a boiling point of 300° C. or higher in the treatment liquid is measured by direct injection mass chromatography (DI-MS).

Examples of a method for adjusting the content of the organic compound having a boiling point of 300° C. or higher in the treatment liquid to be in the range include a method exemplified in the purifying step which will be described later.

<Metal Components (Metal Impurities) Containing Element Selected from Group Consisting of Fe, Cr, Ni, and Pb>

The content of each of the metal component containing an element selected from the group consisting of Fe, Cr, Ni, and Pb in the treatment liquid of the embodiment of the present invention is not particularly limited, but usually, it is preferably 1,000 ppt by mass or less, and in view that the effect of the present invention is more excellent, the content is preferably 0.001 to 50 ppt by mass with respect to the total mass of the treatment liquid.

The metal component is present at a certain degree in an organic solvent, through which it may be incorporated into the treatment liquid. Now, it was found that the metal component containing an element selected from the group consisting of Fe, Cr, Ni, and Pb in the treatment liquid gives a significant effect on the defect performance.

In a case where the content of the metal component containing an element selected from the group consisting of Fe, Cr, Ni, and Pb is 50 ppt by mass or less with respect to the total mass of the treatment liquid, the defect suppression ability is excellent, and in a case where the content is 1 ppt by mass or less, the defect suppressing ability is more excellent:

In a case where a plurality of the metal components containing an element selected from the group consisting of Fe, Cr, Ni, and Pb are included, the total amount thereof preferably satisfies the range.

The content of the metal impurities in the treatment liquid is measured by inductively coupled plasma mass spectrometry (ICP-MS). Further, since it is difficult to measure the content in a stock solution in a case where the content is below 1 ppt by mass, the measurement is performed after concentrating the treatment liquid, as necessary.

Examples of a method for adjusting the content of the metal impurities in the treatment liquid to be in the range include the method exemplified in the purifying step which will be described later (for example, a filter treatment using an ion exchange resin or a metal adsorption member).

(Substrate)

Examples of the "substrate" as mentioned in the present invention include a semiconductor substrate formed of a single layer and a semiconductor substrate formed of multiple layers.

A material constituting the semiconductor substrate formed of a single layer is not particularly limited, and in general, the semiconductor substrate is preferably formed of silicon, silicon germanium, Group III to V compounds such as GaAs, and any combinations thereof.

In a case of a semiconductor substrate formed of multiple layers, its configuration is not particularly limited, and the substrate may have, for example, exposed integrated circuit structures such as interconnect structures (interconnect features) such as a metal wire and a dielectric material on the semiconductor substrate such as silicon as described above. Examples of the metals and the alloys used in the interconnect structures include aluminum, aluminum alloyed with copper, copper, titanium, tantalum, cobalt, silicon, titanium nitride, tantalum nitride, and tungsten. Further, there may be layers such as an interlayer dielectric layer, a silicon oxide layer, a silicon nitride layer, a silicon carbide layer, a carbon-doped silicon oxide layer, or the like on the semiconductor substrate.

<Method for Producing Treatment Liquid>

The treatment liquid of the embodiment of the present invention is preferably subjected to the following purifying step so as to adjust the contents of the metal component, the organic compound having a boiling point of 300° C. or higher, and water to be in desired ranges.

In particular, the treatment liquid of the embodiment of the present invention is preferably a treatment liquid which has been purified through at least one of a distilling step or a filtering step.

(Purifying Step)

A purifying step may be carried out at any timing. Examples of the purifying step include the following purifying treatments I to IV.

That is, the purifying treatment I is a treatment of performing purification of raw materials used for the production of organic solvent constituting the treatment liquid before the production of the organic solvent.

Furthermore, the purifying treatment II is a treatment of performing purification of an organic solvent constituting the treatment liquid during and/or after the production of the organic solvent.

Moreover, the purifying treatment III is a treatment of performing purification of each of the components before mixing two or more kinds of organic solvents in the production of the treatment liquid.

In addition, the purifying treatment IV is a treatment of performing purification of a mixture after mixing two or more kinds of organic solvents in the production of the treatment liquid.

It is preferable to perform purification so as to obtain a desired treatment liquid, as described above. Further, the organic solvents may be individually purified and then mixed, or the respective organic solvents may be mixed and then purified. In particular, a method of blending purified organic solvents is preferable in view that the treatment liquid can be produced at a constant blend ratio of the organic solvents.

Each of the purifying treatments I to IV may be carried out once or twice or more times.

In addition, as the organic solvent to be used, a high-purity grade product (in particular, having a low content of organic impurities, metal impurities, water, or the like) can be purchased, subjected to a purifying step which will be described later, and then used.

Hereinafter, an example of the purifying step will be presented. In the following description, targets to be purified in the purifying step will be simply collectively referred to as "a liquid to be purified".

Examples of the purifying step include an aspect of performing a first ion exchange treatment for performing an ion exchange treatment of a liquid to be purified, a dehydration treatment for performing dehydration of the liquid to be purified after the first ion exchange treatment, a distillation treatment for performing distillation of the liquid to be purified after the dehydration treatment, a second ion exchange treatment for performing an ion exchange treatment of the liquid to be purified after the distillation treatment, and an organic impurity removing treatment for removing organic impurities of the liquid to be purified after the second ion exchange treatment in this order. Further, the purifying step will be described below, but the purifying method in the preparation of the treatment liquid of the embodiment of the present invention is not limited thereto. For example, the step may have an aspect of firstly performing a dehydration treatment for performing dehydration of a liquid to be purified, a distillation treatment for performing distillation of the liquid to be purified after the dehydration treatment, a first ion exchange treatment for performing an ion exchange treatment of the liquid to be purified, and an organic impurity removing treatment for removing organic impurities of the liquid to be purified after the second ion exchange treatment in this order.

Incidentally, an aspect in which various steps are carried out in the order described in Examples which will be described later may be adopted.

According to the first ion exchange treatment, it is possible to remove ion components (for example, a metal component) in the liquid to be purified.

In the first ion exchange treatment, the first ion exchange means such as an ion exchange resin is used. The ion exchange resins may be any of those having a cation exchange resin or an anion exchange resin provided on a single bed, those having a cation exchange resin and an anion exchange resin provided on a double bed, or those having a cation exchange resin and an anion exchange resin provided on a mixed bed.

Furthermore, in order to reduce the elution of moisture from the ion exchange resin, it is preferable to use a dry resin that includes moisture as least as possible as the ion exchange resin. As such a dry resin, commercially available products can be used, and examples thereof include 15JS-HG-DRY (trade name, dry cation exchange resin, a moisture content of 2% or less) and MSPS2-1 DRY (trade name, a mixed-bed resin, a moisture content of 10% or less), manufactured by Organo Corporation.

By the dehydration treatment, it is possible to remove water in the liquid to be purified. Further, in a case where zeolite which will be described later (in particular, Molecular Sieve (trade name) manufactured by Union Showa K. K., or the like) is used in the dehydration treatment, olefins can also be removed.

Examples of the dehydrating means used for the dehydration treatment include a dehydration membrane, a water adsorbent that is insoluble in the liquid to be purified, an aeration replacement device using a dry inert gas, and a heating or vacuum heating device.

In a case of using the dehydration membrane, membrane dehydration is performed by pervaporation (PV) or vapor permeation (VP). The dehydration membrane is constituted as, for example, a water-permeable membrane module. As the dehydration membrane, a membrane formed of polymers such as a polyimide-based polymer, a cellulose-based polymer, and a polyvinyl alcohol-based polymer, or inorganic materials such as zeolite can be used.

The water adsorbent is used after being added to the liquid to be purified. Examples of the water adsorbent include zeolite, diphosphorus pentaoxide, silica gel, calcium chloride, sodium sulfate, magnesium sulfate, anhydrous zinc chloride, fumed sulfuric acid, and soda lime.

According to the distillation treatment, it is possible to remove impurities eluted from the dehydration membrane, the metal component in the liquid to be purified, which is hardly removed in the first ion exchange treatment, fine particles (in a case where the metal component is a fine particle, it is also included), and water in the liquid to be purified.

The distillation means is formed of, for example, a single-stage distillation device. Although the impurities are concentrated in a distillation device or the like by a distillation treatment, it is preferable to provide a means that discharges a part of the liquid having concentrated impurities to the outside periodically or constantly in the distillation means in order to prevent some of the concentrated impurities from being flowed out.

By the second ion exchange treatment, it is possible to remove impurities in a case where the impurities accumulated within the distillation device are flowed out or to remove eluates from pipes of stainless steel (SUS) or the like, used as a liquid feeding line.

Examples of the second ion exchange means include those having a column-shaped container filled with an ion exchange resin, and an ion adsorption membrane, and the ion adsorption membrane is preferable in view of its capability of performing a treatment at a high flow rate. Examples of the ion adsorption membrane include NEOSEPTA (trade name, manufactured by ASTOM Corporation).

Each of the above-mentioned treatments is preferably performed in an inert gas atmosphere which is in a closed state and has a low potential of incorporation of water into the liquid to be purified.

Furthermore, in order to suppress the incorporation of moisture as much as possible, each of the treatments is preferably performed in an inert gas atmosphere at a dew point temperature of −70° C. or lower. Since the moisture concentration in the gas phase is 2 ppm by mass or less in the inert gas atmosphere at −70° C. or lower, and thus, there is a lower potential of incorporation of moisture into the treatment liquid (liquid to be purified).

Examples of the purifying step include a treatment for absorbing and purifying the metal component using silicon carbide, described in WO2012/043496A, in addition to the above treatment.

By the organic impurity removing treatment, it is possible to remove the organic impurities having a high boiling point, and the like (also containing organic impurities having a boiling point of 300° C. or higher) that are included in the liquid to be purified after the distillation treatment and hardly removed in the distillation treatment.

Examples of the organic impurity removing means include an organic impurity adsorption member comprising an organic impurity adsorption filter capable of adsorbing organic impurities. Further, the organic impurity adsorption member is usually constituted with the organic impurity adsorption filter and a base material for fixing the impurity adsorption filter.

In view of improving the performance for adsorbing organic impurities, the organic impurity adsorption filter having an organic substance skeleton capable of interacting with organic impurities on a surface thereof (in other words, having a surface modified with an organic substance skeleton capable of interacting with organic impurities) is preferably as the organic impurity adsorption filter. As an example of the organic substance skeleton capable of interacting with organic impurities being included on the surface, an aspect in which the organic substance skeleton capable of interacting with organic impurities is provided on the surface of a base material constituting the organic impurity adsorption filter which will be described later can be mentioned.

Examples of the organic substance skeleton capable of interacting with organic impurities include a chemical structure in which organic impurities can be trapped onto an organic impurity adsorption filter by a reaction with the organic impurities. More specifically, in a case where dioctyl phthalate, diisononyl phthalate, dioctyl adipate, or dibutyl phthalate is included as the organic impurities, examples of the organic substance skeleton include a benzene ring skeleton. Further, in a case where ethylene-propylene rubber is included as the organic impurities, examples of the organic substance skeleton include an alkylene skeleton. In addition, in a case where an n-long-chain alkyl alcohol (a structural isomer in a case of using a 1-long-chain alkyl alcohol as an organic solvent) is included as the organic impurities, examples of the organic substance skeleton include an alkyl group.

Examples of the base material (material) constituting the organic impurity adsorption filter include activated carbon-carried cellulose, diatomaceous earth, nylon, polyethylene, polypropylene, polystyrene, and a fluorine resin.

In addition, for the organic impurity removing filter, the filters having activated carbon fixed in nonwoven fabric described in JP2002-273123A and JP2013-150979A can also be used.

Furthermore, the organic impurity removing treatment is not limited to an aspect in which an organic impurity adsorption filter capable of adsorbing organic impurities as described above is used, and may have, for example, an aspect in which organic impurities are physically trapped. Organic impurities having a relatively high boiling point of 250° C. or higher coarse (for example, a compound having 8 or more carbon atoms), and thus, it is also possible to physically trap organic impurities by using a filter having a pore size of approximately 1 nm.

For example, in a case where dioctyl phthalate is included as organic impurities, the structure of dioctyl phthalate is larger than 10 Å (=1 nm). With this structure, by using an organic impurity removing filter having a pore diameter of 1 nm, dioctyl phthalate cannot pass through the pore of the filter. That is, since dioctyl phthalate is physically trapped by the filter, it is removed from the liquid to be purified. Thus, for the removal of the organic impurities, physical removal methods as well as chemical interaction can be applied. However, in this case, a filter having a pore diameter of 3 nm or more is used as a "filtering member" which will be described later, and a filter having a pore diameter of less than 3 nm is used as an "organic impurity removing filter".

Incidentally, in the present invention, 1 Å (angstrom) corresponds to 0.1 nm.

Moreover, the purifying step of the present invention may further have, for example, a purifying treatment V and a purifying treatment VI, each of which will be described later. The purifying treatment V and the purifying treatment VI may be carried out at any timing, and for example, it may be carried out after the purifying step IV is carried out.

The purifying treatment V is a filtering treatment using a metal ion adsorption member for the purpose of removing metal ions.

In addition, the purifying treatment VI is a filtering treatment for removing coarse particles.

Hereinafter, the purifying treatment V and the purifying treatment VI will be described.

In the purifying treatment VI, as an example of the metal ion removing means, filtering using a metal ion adsorption member comprising a metal ion adsorption filter can be mentioned.

The metal ion adsorption member may be configured to comprise at least one metal ion adsorption filter, or may be configured to have a plurality of metal ion adsorption filters superimposed according to a desired purification level. The metal ion adsorption member is usually configured to have the metal ion adsorption filter and a base material that fixes the metal ion adsorption filter.

The metal ion adsorption filter comprises a function of adsorbing metal ions in the liquid to be purified. In addition, the metal ion adsorption filter is preferably an ion exchangeable filter.

Here, the metal ions to be subjected to adsorption are not particularly limited, but in view that they are likely to cause defects of a semiconductor device, Fe, Cr, Ni, and Pb are preferable.

From the viewpoint that the adsorption performance of the metal ions is improved, it is preferable that the metal ion adsorption filter has an acid group on the surface. Examples of the acid group include a sulfo group and a carboxy group.

Examples of a substrate (material) constituting the metal ion adsorption filter include cellulose, diatom earth, nylon, polyethylene, polypropylene, polystyrene, and a fluorine resin.

In the purifying treatment VI, as an example of the filtering means, a filtering member comprising a filter having a diameter of a particle to be removed of 20 nm or less may be mentioned. By using the filtering member, it is possible to remove the impurities on the particles from the liquid to be purified. Here, examples of "the impurities on the particle" include particles of dirt, dust, an organic solid matter, an inorganic solid matter, or the like included as impurities in raw materials used in the production of the liquid to be purified, or particles of dirt, dust, an organic solid matter, an inorganic solid matter, or the like introduced as contaminant in the purification of the liquid to be purified, and the impurities on the particle correspond to particles that finally remain as particles without being dissolved in the liquid to be purified.

Furthermore, the "impurities on the particles" include colloidized impurities containing a metal atom. The metal atom is not particularly limited, but in a case where the content of at least one metal atom selected from the group consisting of Na, K, Ca, Fe, Cu, Mg, Mn, Li, Al, Cr, Ni, Zn, and Pb (preferably Fe, Cr, Ni, and Pb) is particularly low (for example, a case where the contents of the metal atoms in the liquid to be purified are each 1,000 ppt by mass or less), impurities containing these metal atoms are likely to be colloidized. In the metal ion adsorption member, it is likely to remove colloidized impurities. Accordingly, by using a filter having a diameter of a particle to be removed of 20 nm or less (for example, a microfiltration membrane having a pore diameter of 20 nm or less), the removal of the colloidized impurities is effectively performed.

The impurities on the particles have a size enough to be removed by a filter having a diameter of a particle to be removed of 20 nm or less, and are specifically particles having a diameter of 20 nm or more. Further, in the present specification, the impurities on the particles are referred to as "coarse particles" in some cases.

Above all, the diameter of a particle to be removed of the filter is preferably 1 to 15 nm, and more preferably 1 to 12 nm. In a case where the diameter of a particle to be removed is 15 nm or less, the impurities on finer particles can be removed, and in a case where the diameter of a particle to be removed is 1 nm or more, the filtering efficiency of the liquid to be purified is improved.

Here, the diameter of a particle to be removed means a minimum size of particles that can be removed by a filter. For example, in a case were the diameter of a particle to be removed of the filter is 20 nm, it is possible to remove particles having a diameter of 20 nm or more.

Examples of the material of the filter include nylons such as 6-nylon and 6,6-nylon, polyethylene, polypropylene, polystyrene, polyimide, polyamide-imide, and a fluorine resin.

The filtering member may further comprise a filter having a diameter of a particle to be removed of 50 nm or more (for example, a microfiltration membrane for removing fine particles having a pore diameter of 50 nm or more). In a case where in addition to the colloidized impurities, in particular, colloidized impurities containing metal atoms such as iron and aluminum, fine particles are present in a solution, the filtering efficiency of a filter having a diameter of a particle to be removed of 20 nm or less (for example, a microfiltration membrane having a pore diameter of 20 nm or less) is improved and thus, the coarse particle removal performance is further improved, by carrying out the filtration of the liquid to be purified using a filter having a diameter of a particle to be removed of 50 nm or more (for example, a microfiltration membrane for removing fine particles, having a pore diameter of 50 nm or more) before performing filtering using a filter having a diameter of a particle to be removed of 20 nm or less (for example, a microfiltration membrane having a pore diameter of 20 nm or less).

The liquid to be purified obtained through such each of the treatments can be used in the formulation of the treatment liquid according to the embodiment of the present invention or can be used as the treatment liquid according to the embodiment of the present invention as it is.

In addition, as an example of the above-mentioned purifying step, a case where the respective treatments are all performed is presented, but the present invention is not limited thereto. The respective treatments may be performed alone or in combination of a plurality of the treatments. In addition, the respective treatments may be performed once or a plurality of times.

Examples of a method for adjusting the content of the organic compound having a boiling point of 300° C. or higher, the metal component, and water in the treatment liquid to desired ranges, in addition to the purifying step, include a method of storing a raw material for an organic solvent having a boiling point of lower than 300° C., which constitutes the treatment liquid, or the solution itself into a container having a small elution of the impurities. Further, other examples of the method include a method in which the lining of an inner wall of a pipe with a fluorine-based resin is carried out so as to prevent the metal components from being eluted from the "pipe" or the like in the production of the treatment liquid.

[Container (Storage Container)]

The treatment liquid of the embodiment of the present invention can be stored, transported, and used after being filled in any container as long as the container does not have problems in corrosion properties and the like.

As the container, a container which has high cleanliness within the container and less elution of impurities in the semiconductor applications is preferable.

Examples of the usable container include, but are not limited to, "CLEAN BOTTLE" series (manufactured by Aicello Chemical Co., Ltd.) and "PURE BOTTLE" (manufactured by Kodama Plastics Co., Ltd.). The inner wall (a liquid contact part in contact with a liquid in the container) of the container is preferably formed of a non-metal material.

As the non-metal material, at least one selected from the group consisting of a polyethylene resin, a polypropylene resin, a polyethylene-polypropylene resin, a tetrafluoroethylene resin (PTFE), a tetrafluoroethylene-perfluoroalkyl vinyl ether copolymer resin (PFA), a tetrafluoroethylene-hexafluoropropylene copolymer resin (FEP), a tetrafluoroethylene-ethylene copolymer resin (ETFE), a trifluoroethylene chloride-ethylene copolymer resin (ECTFE), a polyvinylidene fluoride resin (PVDF), a trifluoroethylene chloride resin (PCTFE), and a polyvinyl fluoride resin (PVF) is preferable.

In particular, in a case where a container having an inner wall formed of a fluorine-based resin is used among those, occurrence of a problem of elution of ethylene or propylene oligomers can be suppressed, as compared with a case where a container having an inner wall formed of a polyethylene resin, a polypropylene resin, or a polyethylene-polypropylene resin.

Specific examples of such a container having an inner wall formed of a fluorine-based resin include a Fluoro-PurePFA composite drum manufactured by Entegris Inc. Inc. Further, the containers described in page 4 of JP1991-502677A (JP-H03-502677A), page 3 of WO2004/016526A, pages 9 and 16 of WO99/046309A, or the like can also be used.

Moreover, in a case of using an inner wall formed of a non-metal material, it is preferable that elution of the organic components in the non-metal material into the treatment liquid is suppressed.

Furthermore, in the inner wall of the container, quartz or a metal material (more preferably an electropolished metal material, in other words, a metal material which has been electropolished) is also preferably used, in addition to the above-mentioned non-metal material.

The metal material (in particular, a metal material used in the production of an electropolished metal material) preferably contains chromium in the amount of more than 25% by mass with respect to the total mass of the metal material, and examples of the metal material include stainless steel.

The content of chromium in the metal material is preferably 30% by mass or more with respect to the total mass of the metal material. In addition, the upper limit value of the content is not particularly limited, but generally, it is preferably 90% by mass or less.

The stainless steel is not particularly limited, and known stainless steel can be used. Among those, an alloy containing 8% by mass or more of nickel is preferable, and austenitic stainless steel containing 8% by mass or more of nickel is more preferable. Examples of the austenitic stainless steel include Steel Use Stainless (SUS) 304 (Ni content of 8% by mass, Cr content of 18% by mass), SUS 304L (Ni content of 9% by mass, Cr content of 18% by mass), SUS 316 (Ni content of 10% by mass, Cr content of 16% by mass), and SUS 316L (Ni content of 12% by mass, Cr content of 16% by mass).

A method for electropolishing the metal material is not particularly limited, and known methods can be used. Examples of the method include the methods described in paragraphs [0011] to [0014] of JP2015-227501A, paragraphs [0036] to [0042] of JP2008-264929A, or the like.

It is presumed that the metal material has a larger content of chromium in the passivation layer on the surface than the content of chromium in the parent phase by electropolishing the metal material. As a result, it is presumed that since it is difficult for the metal components to flow into the solution from the inner wall coated with the electropolished metal material, a solution having a reduced amount of metal components (metal impurities) can be obtained.

In addition, it is preferable that the metal material is buffed. The buffing method is not particularly limited, and known methods can be used. The size of the abrasive grain used to finish the buffing is not particularly limited, but is preferably #400 or less in view that the unevenness of the surface of the metal material is likely to be smaller.

Incidentally, buffing is preferably performed before the electropolishing.

In addition, the metal material may be subjected to a treatment including one of buffing, acid washing, magnetic fluid polishing, and the like or a combination of two or more thereof in a plurality of steps that are performed by changing the number of a size or the like of abrasive grains.

In the present invention, a body having the container and the treatment liquid stored in this container is referred to as a storage body for a treatment liquid in some cases.

The inside of these containers is preferably washed to before filling the treatment liquid. In a case where the liquid for use in the washing is the treatment liquid of the embodiment of the present invention as it is, a dilution of the liquid of the embodiment of the present invention, or an organic solvent included in the treatment liquid of the embodiment of the present invention, the effects of the present invention are noticeably obtained. The treatment liquid of the embodiment of the present invention may be bottled in a container such as a gallon bottle and a quart bottle after the production, transported, and stored. For the gallon bottle, glass materials may be used, or other materials may also be used.

For the purpose of preventing a change in the components in the treatment liquid during the preservation, the inside of the container may be purged with inert gas (nitrogen, argon, or the like) with a purity of 99.99995% by volume or more. In particular, a gas having a low moisture content is preferable. In addition, during the transportation or the preservation, the temperature may be a normal temperature, but may also be controlled to a temperature in the range of −20° C. to 20° C. so as to prevent deterioration.

(Clean Room)

It is preferable that all the handlings including the production of the treatment liquid of the embodiment of the present invention, the unsealing and/or the washing of a storage container, the filling of the treatment liquid, and the like, treatment analysis, and measurements are performed in clean rooms. The clean rooms preferably satisfy 14644-1 clean room standards. Further, it is preferable that the clean room satisfies any one of International Standards Organization (ISO) Class 1, ISO Class 2, ISO Class 3, or ISO Class 4, it is more preferable to satisfy either ISO Class 1 or ISO Class 2, and it is still more preferable to satisfy ISO Class 1.

In addition, all the handlings including production of the treatment liquid, the unsealing and/or the washing of a storage container, the filling of the treatment liquid, and the like, treatment analysis, and measurements in Examples which will be described later were performed in clean rooms of Class 2.

(Filtering)

The treatment liquid of the embodiment of the present invention, or the organic solvent included in the treatment liquid is preferably filtered so as to adjust the content of the organic compound having a boiling point of 300° C. or higher, the metal component, and water to desired ranges, or remove foreign matters, coarse particles, and the like.

As a filter for use in filtering, any filter which has been used in the filtering applications or the like from the related art can be used without particular limitation. Examples of the materials constituting the filter include fluorine-based resins such as polytetrafluoroethylene (PTFE), polyamide-based resins such as nylon, and polyolefin resins (including a high-density polyolefin and an ultrahigh-molecular-weight polyolefin) such as polyethylene and polypropylene (PP). Among those materials, polyamide-based resins, PTFE, and polypropylene (including high-density polypropylene) are preferable, and by using a filter formed with these materials, high-polarity foreign matters which are likely to cause particle defects can be more effectively removed, and also the amount of the metal component (metal impurities) can be more effectively reduced.

For the critical surface tension of the filter, the lower limit value is preferably 70 mN/m or more. The upper limit value is preferably 95 mN/m or less. In particular, the critical surface tension of the filter is preferably 75/m to 85 mN/m.

In addition, the value of the critical surface tension is a nominal value of a manufacturer. By using a filter having a critical surface tension in the range, the amount of the metal component (metal impurities) can be more efficiently reduced, in addition to more effective removal of high-polarity foreign matters which are likely to cause particle defects.

As a filter used for filtering, any filter which has been used in the filtering applications or the like from the related art can be used without particular limitation. Examples of the materials constituting the filter include fluorine resins such as polytetrafluoroethylene (PTFE), polyamide-based resins such as nylon, and polyolefin resins (including a high-density polyolefin and an ultrahigh-molecular-weight polyolefin) such as polyethylene and polypropylene (PP). Among those, polypropylene (including high-density polypropylene) and nylon are preferable.

The pore diameter of the filter is preferably approximately 0.001 to 1.0 μm, more preferably approximately 0.01 to 0.5 μm, and more preferably approximately 0.01 to 0.1 μm. By adjusting the pore diameter of the filter to be in the range, it is possible to reliably remove fine foreign matters included in the treatment liquid or the organic solvent included in the treatment liquid while suppressing clogging in the filtering.

In a case of using filters, different filters may be combined. At that time, the filtering with the first filter may be performed once or twice or more times. In a case where the filtering is performed twice or more times by combining different filters, the respective filters may be of the same kinds or of different kinds from each other, and are preferably of different kinds from each other. Typically, it is preferable that the first filter and the second filter have a difference in at least one of the pore diameter or the constituent materials.

The pore diameter at the second filtering or later is preferably the same as or smaller than the pore diameter at the first filtering. In addition, the first filters with different pore diameters in the above-mentioned range may be combined. Here, with regard to the pore diameters, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made P-nylon Filter (pore diameter of 0.02 μm, critical surface tension of 77 mN/m)"; (manufactured by Nihon Pall Ltd.), a high-density polyethylene-made "PE-clean filter (pore diameter of 0.02 μm)"; (manufactured by Nihon Pall Ltd.), and a high-density polyethylene-made "PE-clean filter (pore diameter of 0.01 μm)"; (manufactured by Nihon Pall Ltd.) can also be used.

Although not being particularly limited, from the viewpoint of suppressing an increase in particulate metals in the preservation of the purified treatment liquid, for example, in addition to a viewpoint that the effect of treatment liquid of the embodiment of the present invention is more excellent, a relationship between the solution used in one aspect of the present invention and the material of the filter used for filtering is a combination satisfying a relational formula of "(Ra/R0)≤1" in a case of an interaction radius (R0) in a Hansen solubility parameter (HSP) space derived from the material of a filter used for filtering and a radius (Ra) of a sphere in a Hansen space derived from the liquid included in the treatment liquid or the organic solvent included in the treatment liquid, and a treatment liquid filtered through a filter material satisfying the relational formula or an organic solvent included in the treatment liquid is preferable. The relationship preferably satisfies (Ra/R0)≤0.98, and more preferably satisfies (Ra/R0)≤0.95. The lower limit is preferably 0.5 or more, more preferably 0.6 or more, and still more preferably 0.7. A mechanism thereof is not clear, but within the range, formation of particulate metals or growth of particulate metals in the long-term preservation is suppressed.

A combination of the filter, and the treatment liquid or the organic solvent included in the treatment liquid is not particularly limited, but examples thereof include those described in US2016/0089622A.

As the second filter, a filter formed of the same materials as those of the above-mentioned first filter can be used. A filter having the same pore diameter as that of the above-mentioned first filter can be used. In a case of using the second filter having a smaller pore diameter than that of the first filter, the ratio of the pore diameter of the second filter to the pore diameter of the first filter (the pore diameter of the second filter/the pore diameter of the first filter) is preferably 0.01 to 0.99, more preferably 0.1 to 0.9, and still more preferably 0.2 to 0.9. By adjusting the pore diameter of the second filter to be in the range, fine foreign matters incorporated into the treatment liquid are more reliably removed.

Furthermore, in the present invention, in a case where the content of one or two or more metal elements selected from the group consisting of Na, K, Ca, Fe, Cu, Mg, Mn, Li, Al, Cr, Ni, Pd, and Zn with respect to the treatment liquid or the organic solvent included in the treatment liquid is particularly low (for example, a case where each of the contents of the above-mentioned metal elements is 1,000 ppt by mass or less with respect to the treatment liquid or the organic solvent included in the treatment liquid), there is a tendency that the impurities containing these metal elements are likely to be colloidized. With this tendency, it easily becomes difficult to remove the colloidized impurities from the ion adsorption membrane. Here, the present inventors have found that it is possible to remove the components of the colloidized impurities by performing purification using a microfiltration membrane having a pore diameter of 20 nm or less.

Moreover, in a case where fine particles are present in the treatment liquid or the organic solvent included in the treatment liquid in addition to the colloidal impurities (in particular, colloidized impurities containing metal elements such as iron and aluminum), the purification is preferably performed using a microfiltration membrane for removing fine particles having a pore diameter of 50 nm or more before being filtered using a microfiltration membrane having a pore diameter of 20 nm or less.

It is preferable that the treatment liquid of the embodiment of the present invention or the organic solvent included in the treatment liquid is purified using an ion adsorption means in addition to the above-described filters. It is preferable that the ion adsorption means is an ion adsorption means in which a surface of cellulose, diatom earth, nylon, polyethylene, polypropylene, polystyrene, a fluororesin, or the like is modified with either or both of an anionic group such as a sulfo group or a carboxy group and a cationic group. The ion adsorption means modified with an anionic group can remove cations such as a Na ion and a Ca ion. The ion adsorption means modified with a cationic group can remove anions such as a Cl ion, and acid components. According to the purpose, the ion adsorption means may be used in combination with either or both of an anionic group and a cationic group. The ion adsorption means may be a filter.

The filtering steps may be repeated in plural number according to the purpose.

Moreover, the filter to be used is preferably treated before filtering the treatment liquid or the organic solvent included in the treatment liquid. A liquid used for this treatment is not particularly limited, but as long as the liquid is the treatment liquid of the embodiment of the present invention as it is, a dilution of the treatment liquid of the embodiment of the present invention, or an organic solvent included in treatment liquid of the embodiment of the present invention, desired effects of the present invention are noticeably obtained.

In a case of performing the filtering, the temperature during the filtering is preferably room temperature (25° C.) or lower, more preferably 23° C. or lower, and still more preferably 20° C. or lower. Further, the temperature during the filtering is preferably 0° C. or higher, more preferably 5° C. or higher, and still more preferably 10° C. or higher.

In the filtering, particulate foreign matters or impurities can be removed, but in a case of performing the filtering at the temperature, the amounts of the particulate foreign matters or impurities dissolved in the treatment liquid or the organic solvent included in the treatment liquid are reduced, and therefore, the filtering is more efficiently performed.

In particular, it is preferable that filtering is performed at the temperature from the viewpoint of adjusting the content of the metal component (metal impurities). A mechanism therefor is not clear, but it is considered that most of the metal component (metal impurities) are present in the particulate colloidal state. It is considered that in a case of performing the filtering at the temperature, some of the metal component (metal impurities) floating in the colloidal shape are aggregated, the aggregates are thus efficiently removed by filtering, and therefore, the content of the metal component (metal impurities) is easily adjusted to a desired amount.

Since the filtration pressure gives an effect on a filtering accuracy, the pulsation upon filtering is preferably as small as possible.

In the preparation and the purification of the treatment liquid of the embodiment of the present invention or the organic solvent included in the treatment liquid, the filtration rate is not particularly limited, but from the viewpoint that the effect of the present invention is more excellent, the filtration rate is preferably 1.0 L/min/m$^2$ or more, more preferably 0.75 L/min/m$^2$ or more, and still more preferably 0.6 L/min/m$^2$ or more.

In the filter, a differential pressure resistance ensuring the filter performance (the filter is not damage) is set, and in a case where the value is high, the filtration pressure can be increased to increase the filtration rate. That is, the limit in the filtration rate usually depends on the differential pressure resistance of the filter, but usually, it is preferably 10.0 L/min/m$^2$ or less.

In the preparation and the purification of the treatment liquid of the embodiment of the present invention or the organic solvent included in the treatment liquid, the filtration pressure is preferably 0.001 to 1.0 MPa, more preferably 0.003 to 0.5 MPa, and still more preferably 0.005 to 0.3 MPa, from the viewpoint that the effect of the present invention is more excellent.

In particular, in a case where a filter having a small pore diameter is used, it is possible to increase the filtration pressure to efficiently decrease the amount of foreign matters or impurities on particles dissolved in the solution. In a case where a filter having a pore diameter of less than 20 nm is used, it is particularly preferable to adjust the filtration pressure to 0.005 to 0.3 MPa.

Moreover, in a case where the pore size of a filtering membranes is decreased, the filtration rate is decreased, but for example, by connecting a plurality of filters having the same kind of filtering membranes mounted thereon in parallel, the filtration area is expanded and the filtration pressure is lowered, whereby it is possible to compensate for the decreased filtration rate.

[Charge Eliminating Step]

In the preparation and the purification of the treatment liquid of the embodiment of the present invention or the organic solvent included in the treatment liquid, a charge eliminating step may further be included. The charge eliminating step is a step of reducing a charging potential of at least one selected from the group consisting of a raw material, a reactant, and a purified product (hereinafter referred to "a purified product and the like") by eliminating charges from the purified product and the like.

The charge eliminating method is not particularly limited and examples thereof include a known charge eliminating method. Examples of the charge eliminating method include a method in which the purifying liquid or the like is brought into contact with a conductive material.

A contact time during which the purifying liquid or the like is brought into contact with the conductive material is preferably 0.001 to 60 seconds, more preferably 0.001 to 1 seconds, and more preferably 0.01 to 0.1 seconds. Examples of the conductive material include stainless steel, gold, platinum, diamond, and glassy carbon.

Examples of a method for bringing the purifying liquid or the like into contact with the conductive material or the like include a method in which a ground mesh including a conductive material, is disposed within a conduit, and the purifying liquid or the like passes therethrough.

The charge eliminating step may carried out at any point of time from a time for supplying the raw material to a time for charging the purified product, and is preferably included prior to at least one step selected from the group consisting of a raw material supplying step, a reacting step, a liquid preparing step, a purifying step, a filtering step, and a charging step, for example. In particular, it is preferable to perform the charge eliminating step before injecting a substance to be purified into a container to be used in each of the steps. Thus, it is possible to suppress impurities derived from the container or the like from being incorporated into a purified product or the like.

[Pattern Forming Method]

The pattern forming method of an embodiment of the present invention includes a resist film forming step of forming a resist film using a resist composition (hereinafter also referred to as an "actinic ray-sensitive or radiation-sensitive resin composition"), an exposing step of exposing the resist film, and a treating step of treating the exposed resist film with the above-described treatment liquid.

According to the pattern forming method of the embodiment of the present invention, since the above-mentioned treatment liquid is used, it is possible to simultaneously suppress the occurrence of pattern collapse in a Line & Space (L/S) pattern and the occurrence of hole formation failure in a contact hole (CH) pattern.

Hereinafter, the respective steps included the pattern forming method of the embodiment of the present invention will be described. In addition, as an example of the treating step, each of a developing step and a rinsing step will be described.

<Resist Film Forming Step>

The resist film forming step is a step of forming a resist film using an actinic ray-sensitive or radiation-sensitive resin composition, and can be carried out, for example, using the following method.

In order to form the resist film (actinic ray-sensitive or radiation-sensitive resin composition film) on the substrate using the actinic ray-sensitive or radiation-sensitive resin composition, respective components described below are dissolved in a solvent to prepare an actinic ray-sensitive or radiation-sensitive resin composition, the actinic ray-sensitive or radiation-sensitive resin composition is optionally filtered through a filter and applied to the substrate. As the filter, a polytetrafluoroethylene-, polyethylene- or nylon-made filter having a pore size of preferably 0.1 microns or less, more preferably 0.05 microns or less, and still more preferably 0.03 microns or less is preferable.

The actinic ray-sensitive or radiation-sensitive resin composition is applied to the substrate (examples: a silicon- or silicon dioxide-coated substrate), which is used for manufacturing an integrated circuit element, using an appropriate coating method such as a method using a spinner. Next, the actinic ray-sensitive or radiation-sensitive resin composition is dried to form a resist film. Various undercoating films (an inorganic film, an organic film, or an antireflection film) may be formed below the resist film, as desired.

As the drying method, a method of drying and heating the composition is generally used. The heating can be performed using a means provided in a typical exposure or developing machine, and may be performed using a hot plate or the like.

The heating temperature is preferably 80° C. to 180° C., more preferably 80° C. to 150° C., still more preferably 80° C. to 140° C., and particularly preferably 80° C. to 130° C. The heating time is preferably 30 to 1,000 seconds, more preferably 60 to 800 seconds, and still more preferably 60 to 600 seconds.

The film thickness of the resist film is generally 200 nm or less, and preferably 100 nm or less.

For example, in order to resolve a 1:1 line-and-space pattern having a size of 30 nm or less, the film thickness of a resist film to be formed is preferably 50 nm or less. In a case where a resist film having a film thickness of 50 nm or less is applied to a developing step described below, pattern collapse is not likely to occur, and higher resolution performance can be obtained.

The film thickness of the resist film is preferably 15 to 45 nm. In a case where the film thickness is 15 nm or more, sufficient etching resistance is obtained. The film thickness of the resist film is more preferably is 15 to 40 nm. In a case where the film thickness is in the range, etching resistance and more excellent resolution performance can be simultaneously satisfied.

Moreover, in the pattern forming method of the embodiment of the present invention, an upper layer film (topcoat film) may be formed on the upper layer of the resist film. The upper layer film can be formed by using, for example, a composition for forming an upper layer film, which contains a hydrophobic resin, a photoacid generator, and a basic compound. The upper layer film and the composition for forming an upper layer film are the same as described later.

<Exposing Step>

The exposing step is a step of exposing the resist film and can be performed by using the following method, for example. The exposure is typically patternwise carried out.

The resist film formed as described above is irradiated with actinic rays or radiation through a predetermined mask. For irradiation of electron beams, lithography (direct lithography) performed not through a mask is common.

The actinic rays or radiation is not particularly limited, but is, for example, KrF excimer laser, ArF excimer laser, extreme ultraviolet (EUV) rays, electron beams (EB), or the like. The exposure may be liquid immersion exposure.

<Baking>

In the pattern forming method of the embodiment of the present invention, it is preferable that baking (heating) is performed after the exposing step and before the developing step. Due to the baking, a reaction of the exposed area is accelerated and the sensitivity or the pattern profile is improved.

The heating temperature is preferably 80° C. to 150° C., more preferably 80° C. to 140° C., and still more preferably 80° C. to 130° C.

The heating time is preferably 30 to 1,000 seconds, more preferably 60 to 800 seconds, and still more preferably 60 to 600 seconds.

The heating can be performed using a means comprised in a typical exposure or developing device, and may be carried out using a hot plate or the like.

<Developing Step>

The developing step is a step of developing the exposed resist film with a developer.

Examples of the developing method include a method in which a substrate is dipped in a tank filled with a developer for a certain period of time (a dip method), a method in which a developer is heaped up to the surface of a substrate by surface tension and developed by maintaining for a certain period of time (a puddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In addition, a step of stopping development while replacing the solvent with another solvent may be carried out after the developing step.

The developing time is not particularly limited as long as it is a period of time where the non-exposed area of a resin is sufficiently dissolved. The development time is usually 10 to 300 seconds and preferably 20 to 120 seconds.

The temperature of the developer is preferably 0° C. to 50° C., and more preferably 15° C. to 35° C.

As the developer used in the developing step, the above-described treatment liquid is preferable. The treatment liquid is as described above. In addition to the development using the treatment liquid, development using an alkali developer may further be carried out (so-called double development).

Furthermore, as the developer used in the developing step, the above-mentioned developer for use in combination may be used, in addition to the treatment liquid of the embodiment of the present invention.

<Rinsing Step>

The rinsing step is a step of performing washing (rinsing) with a rinsing liquid after the developing step.

In the rinsing step, the developed wafer is subjected to a washing treatment using the above-described rinsing liquid.

Examples of the washing treatment method include a method in which a rinsing liquid is continuously discharged to a substrate which is rotating at a constant rate (a rotation discharging method), a method in which a substrate is dipped in a tank filled with a rinsing liquid for a certain period of time (a dip method), and a method in which a rinsing liquid is sprayed on the surface of a substrate (a spray method). Among those, it is preferable that a washing treatment is performed using the rotation discharging mode, and the washed substrate is rotated at a rotation speed of 2,000 to 4,000 revolution per minute (rpm) to remove the rinsing liquid from the substrate.

The rinsing time is not particularly limited, and is usually 10 to 300 seconds, preferably 10 to 180 seconds, and most preferably 20 to 120 seconds.

The temperature of the rinsing liquid is preferably 0° C. to 50° C., and more preferably 15° C. to 35° C.

In addition, after the developing treatment or the rinsing treatment, a treatment of removing the developer or the rinsing liquid which adheres onto the pattern, using a supercritical fluid, may be carried out.

Incidentally, after the developing treatment, the rinsing treatment, or the treatment using the supercritical fluid, a heating treatment can be carried out so as to remove the solvent remaining in the pattern. The heating temperature is not particularly limited as long as a good resist pattern is obtained, and is usually 40° C. to 160° C. The heating temperature is preferably 50° C. to 150° C., and most preferably 50° C. to 110° C. The heating time is not particularly limited as long as a good resist pattern is obtained, but is usually 15 to 300 seconds and preferably 15 to 180 seconds.

As the rinsing liquid, the above-mentioned treatment liquid is preferably used.

Furthermore, as the rinsing liquid used in the rinsing step, the above-mentioned rinsing liquid for use in combination may be used, in addition to the treatment liquid of the embodiment of the present invention.

In the pattern forming method of the embodiment of the present invention, it is preferable that at least one of the developer or the rinsing liquid is the above-described treatment liquid, but it is particularly preferable that the rinsing liquid is the above-mentioned treatment liquid.

Moreover, in general, the developer and the rinsing liquid are stored in a waste liquid tank through a pipe after use. At this time, in a case where a hydrocarbon-based solvent is used as the rinsing liquid, the resist dissolved in the developer is precipitated, adheres to side and back surfaces of a wafer, a side surface of the pipe, and the like, and contaminates a device.

In order to solve the problems, a method of passing a solvent for dissolving a resist through the pipe again may be used. Examples of the method of passing a solvent through a pipe include a method in which a side surface, a back surface, or the like of a substrate which has been washed with the rinsing liquid is washed by passing a solvent for dissolving the resist therethrough, and a method in which a solvent for dissolving a resist passes through a pipe while being not brought into contact with the resist.

The solvent which passes through the pipe is not particularly limited as long as it can dissolve the resist, and examples thereof include the above-mentioned organic solvents used as a developer. Specific examples thereof include propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, ethyl lactate, 1-propanol, and acetone. Among those, PGMEA, PGME, or cyclohexanone is preferable.

[Actinic Ray-Sensitive or Radiation-Sensitive Resin Composition (Resist Composition)]

Next, the actinic ray-sensitive or radiation-sensitive resin composition which is preferably used in combination with the treatment liquid of the embodiment of the present invention will be described in detail.

(A) Resin

<Resin (A)>

It is preferable that an actinic ray-sensitive or radiation-sensitive resin composition which is preferably used in combination with the treatment liquid of the embodiment of the present invention preferably contains a resin (A) whose polarity increases by the action of an acid (hereinafter also referred to as a "resin (A)"). Examples of the resin (A) include a resin having a group (hereinafter also referred to as an "acid-decomposable group") that decomposes by the action of an acid in the main chain or a side chain, or both the main chain and the side chain of the resin to generate a polar group.

The acid-decomposable group preferably has a structure in which a polar group is protected with a group that decomposes by the action of an acid to leave.

Examples of the polar group include an acidic group such as a phenolic hydroxyl group, a carboxyl group, a fluorinated alcohol group (preferably a hexafluoroisopropanol group), a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

It is preferable that the resin (A) has at least (i) a repeating unit having a group that decomposes by the action of an acid to generate a carboxyl group (may further include a repeating unit having a phenolic hydroxyl group), or at least (ii) a repeating unit having a phenolic hydroxyl group.

Furthermore, in a case where the resin (A) has the repeating unit that decomposes by the action of an acid to generate a carboxyl group, the solubility in an alkali developer increases and the solubility in the organic solvent increases due to the action of an acid.

Examples of the repeating unit having a phenolic hydroxyl group contained in the resin (A) include a repeating unit represented by General Formula (I).

In the formula, $R_{41}$, $R_{42}$, and $R_{43}$ each independently represent a hydrogen atom, an alkyl group, a halogen atom, a cyano group, or an alkoxycarbonyl group, provided that $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

Ar$_4$ represents a (n+1)-valent aromatic ring group, and in a case where Ar$_4$ is bonded to R$_{42}$ to form a ring, Ar$_4$ represents a (n+2)-valent aromatic ring group.

n represents an integer of 1 to 5.

As the alkyl group of R$_{41}$, R$_{42}$, and R$_{43}$ in General Formula (I), an alkyl group having 20 or less carbon atoms, which may have a substituent, such as a methyl group, an ethyl group, a propyl group, an isopropyl group, a n-butyl group, a sec-butyl group, a hexyl group, a 2-ethylhexyl group, an octyl group, and a dodecyl group, is preferable, an alkyl group having 8 or less carbon atoms is more preferable, and an alkyl group having 3 or less carbon atoms is still more preferable.

The cycloalkyl groups of R$_{41}$, R$_{42}$, and R$_{43}$ in General Formula (I) may be monocyclic or polycyclic. Among those, a monocycloalkyl group having 3 to 8 carbon atoms, which may have a substituent, such as a cyclopropyl group, a cyclopentyl group, or a cyclohexyl group, is preferable.

Examples of the halogen atom of R$_{41}$, R$_{42}$, and R$_{43}$ in General Formula (I) include a fluorine atom, a chlorine atom, a bromine atom, and an iodine atom, with the fluorine atom being preferable.

As the alkyl group included in the alkoxycarbonyl group of R$_{41}$, R$_{42}$, and R$_{43}$ in General Formula (I), the same group as the alkyl group in R$_{41}$, R$_{42}$, and R$_{43}$ is preferable.

Preferred examples of a substituent of each of the groups include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

Ar$_4$ represents an (n+1)-valent aromatic ring group. In a case where n is 1, a divalent aromatic ring group may have a substituent, and preferred examples thereof include an arylene group having 6 to 18 carbon atoms such as a phenylene group, a tolylene group, a naphthylene group, or an anthracenylene group; and an aromatic ring group having a heterocycle, such as thiophene, furan, pyrrole, benzothiophene, benzofuran, benzopyrrole, triazine, imidazole, benzoimidazole, triazole, thiadiazole, and thiazole. These may further have a substituent.

In a case where n is an integer of 2 or more, as a specific preferred example of the (n+1)-valent aromatic ring group, a group obtained by removing arbitrary (n−1) hydrogen atoms from the specific examples of the above-described divalent aromatic ring groups is preferable.

The (n+1)-valent aromatic ring group may further have a substituent.

In a case where the concentration of the solid content of the resist composition is 4% or less, n is preferably 2 or more. With n of 2 or more, the number of polar groups per unit calibrating the polymer is improved.

As a result, it is presumed that the cohesion of the photoacid generator and the uneven distribution on the surface which are considered to cause non-uniformity are relieved, and critical dimension uniformity (CDU), the uniformity of the film thickness within the surface, and line width roughness (LWR) performance are improved.

Examples of a substituent which can be contained in the above-mentioned alkyl group, cycloalkyl group, alkoxycarbonyl group, alkylene group, and (n+1)-valent aromatic ring group include the alkyl groups exemplified by R$_{41}$, R$_{42}$, and R$_{43}$ in General Formula (I), alkoxy groups such as a methoxy group, an ethoxy group, a hydroxyethoxy group, a propoxy group, a hydroxypropoxy group, and a butoxy group; and aryl group such as a phenyl group.

As an alkyl group of R$_{64}$ in —CONR$_{64}$— (R$_{64}$ represents a hydrogen atom or an alkyl group) represented by X$_4$, an alkyl group having 20 or less carbon atoms, which may have a substituent, such as a methyl group, an ethyl group, a propyl group, an isopropyl group, a n-butyl group, a sec-butyl group, a hexyl group, a 2-ethylhexyl group, an octyl group, or a dodecyl group is preferable, and an alkyl group having 8 or less carbon atoms is more preferable.

As X$_4$, a single bond, —COO—, or —CONH— is preferable, and a single bond or —COO— is more preferable.

As the alkylene group in L$_4$, an alkylene group having 1 to 8 carbon atoms, which may have a substituent, such as a methylene group, an ethylene group, a propylene group, a butylene group, a hexylene group, and an octylene group, is preferable.

As Ar$_4$, an aromatic ring group having 6 to 18 carbon atoms, which may have a substituent, is preferable, and a benzene ring group, a naphthalene ring group, or a biphenylene ring group is more preferable.

It is preferable that the repeating unit represented by General Formula (I) comprises a hydroxystyrene structure. That is, it is preferable that Ar$_4$ is a benzene ring group.

Preferred examples of the repeating unit having a phenolic hydroxyl group contained in the resin (A) include a repeating unit represented by General Formula (p1).

(p1)

R in General Formula (p1) represents a hydrogen atom or a linear or branched alkyl group having a halogen atom or 1 to 4 carbon atoms. A plurality of R's may be the same as or different from each other. As R in General Formula (p1), a hydrogen atom is preferable.

Ar in General Formula (p1) represents an aromatic ring, and examples thereof include an aromatic hydrocarbon ring having 6 to 18 carbon atoms, which may have a substituent, such as a benzene ring, a naphthalene ring, an anthracene ring, a fluorene ring, and a phenanthrene ring; and an aromatic ring heterocycle including a heterocycle, such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, and a thiazole ring. Among those, a benzene ring is preferable.

m in General Formula (p1) represents an integer of 1 to 5, and is preferably 1.

Specific examples of the repeating unit having a phenolic hydroxyl group contained in the resin (A) are shown below, but the present invention is not limited thereto. In the formulae, a represents 1 or 2.

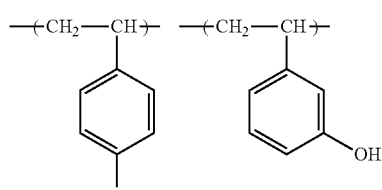
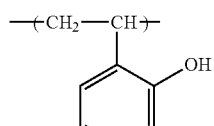
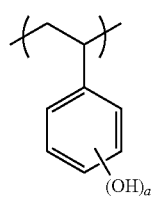
(B-1)
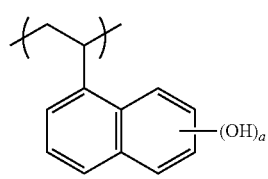
(B-2)
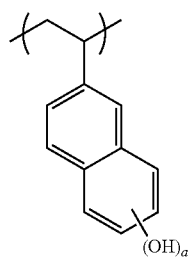
(B-3)
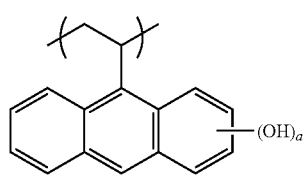
(B-4)
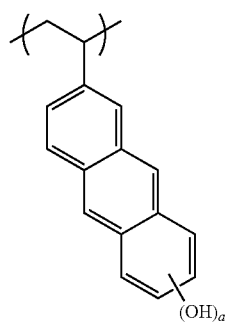
(B-5)
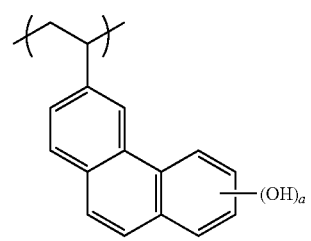
(B-6)
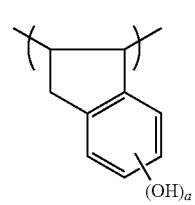
(B-7)
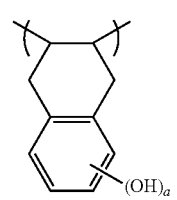
(B-8)
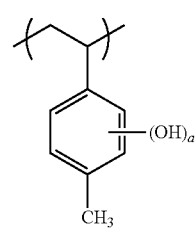
(B-9)
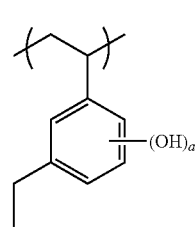
(B-10)
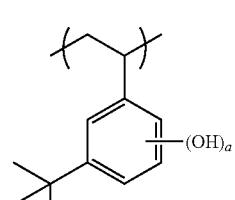
(B-11)
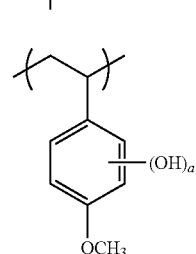
(B-12)

(B-13) 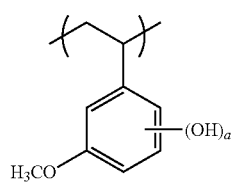
(B-14) 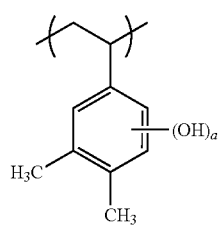
(B-15) 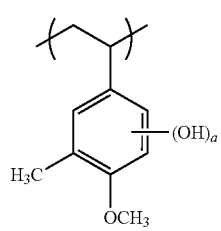
(B-16) 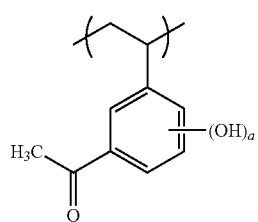
(B-17) 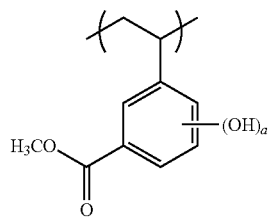
(B-18) 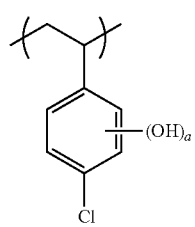
(B-19) 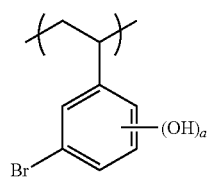
(B-20) 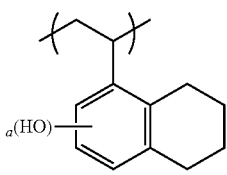
(B-21) 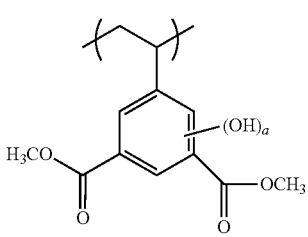
(B-22) 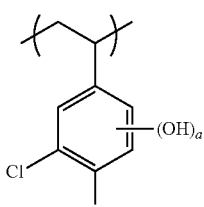
(B-23) 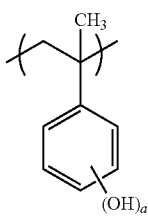
(B-24) 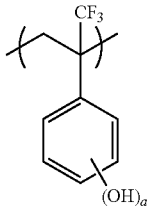
(B-25) 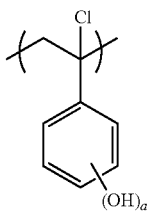
(B-26) 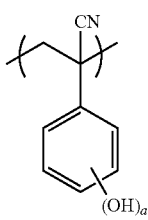

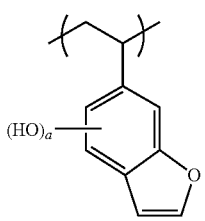
(B-27)

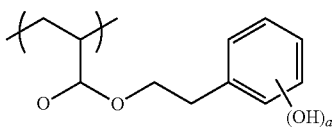
(B-34)

(B-28)

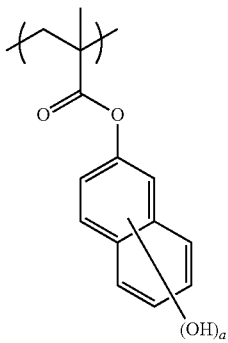
(B-35)

(B-29)

(B-36)

(B-30)

(B-31)

(B-37)

(B-32)

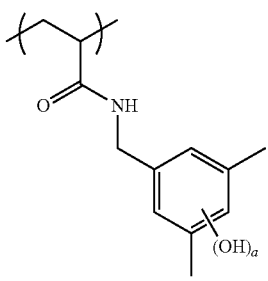
(B-38)

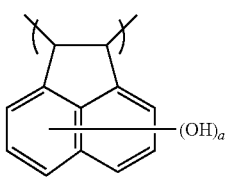
(B-33)

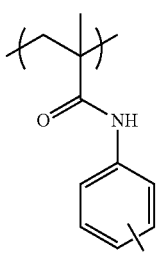

The content of the repeating unit having a phenolic hydroxyl group is preferably 0% to 50% by mole, more preferably 0% to 45% by mole, and still more preferably 0% to 40% by mole, with respect to all the repeating units of the resin (A).

The repeating unit having a group that decomposes by the action of an acid to generate a carboxyl group, which is contained in the resin (A), is a repeating unit having a group which is substituted with a group obtained by a hydrogen atom being removed from a carboxyl group due to decomposition caused by the action of an acid.

Examples of the group that leaves by an acid include —C(R$_{36}$)(R$_{37}$)(R$_{38}$), —C(R$_{36}$)(R$_{37}$)(OR$_{39}$), and —C(R$_{01}$)(R$_{02}$)(OR$_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

As the repeating unit having a group that decomposes by the action of an acid to generate a carboxyl group, which is contained in the resin (A), a repeating unit represented by General Formula (AI) is preferable.

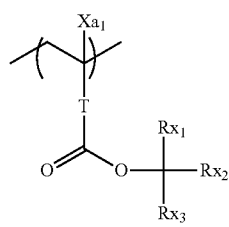

(A I)

In General Formula (AI), $Xa_1$ represents a hydrogen atom or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. In a case where all of $Rx_1$ to $Rx_3$ represent an alkyl group (linear or branched), it is preferable that at least two of $Rx_1, \ldots,$ or $Rx_3$ are a methyl group.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by —$CH_2$—$R_{11}$. $R_{11}$ represents a halogen atom (for example, a fluorine atom), a hydroxyl group, or a monovalent organic group, and examples thereof include an alkyl group having 5 or less carbon atoms and an acyl group having 5 or less carbon atoms. In particular, an alkyl group having 3 or less carbon atoms is preferable, and a methyl group is more preferable. In one aspect, $Xa_1$ is preferably a hydrogen atom, a methyl group, a trifluoromethyl group, or a hydroxymethyl group.

Examples of the divalent linking group of T include an alkylene group, a —COO—Rt- group, and a —O—Rt- group. In the formulae, Rt represents an alkylene group or a cycloalkylene group.

T is preferably a single bond or a —COO—Rt- group. Rt represents preferably an alkylene group having 1 to 5 carbon atoms, and more preferably a —$CH_2$— group, a —$(CH_2)_2$— group, or a —$(CH_2)_3$— group.

As the alkyl group of $Rx_1$ to $Rx_3$, an alkyl group having 1 to 4 carbon atoms such as a methyl group, an ethyl group, a n-propyl group, an isopropyl group, a n-butyl group, an isobutyl group, and a t-butyl group is preferable.

As the cycloalkyl group of $Rx_1$ to $Rx_3$, a monocycloalkyl group such as a cyclopentyl group and a cyclohexyl group, or a polycycloalkyl group such as a norbornyl group, a tetracyclodecanyl group, a tetracyclododecanyl group, and an adamantyl group is preferable.

As the cycloalkyl group which is formed by two of $Rx_1$ to $Rx_3$ being bonded to each other, a monocycloalkyl group such as a cyclopentyl group or a cyclohexyl group, and a polycycloalkyl group such as a norbornyl group, a tetracyclodecanyl group, a tetracyclododecanyl group, and an adamantyl group is preferable. Among those, a monocycloalkyl group having 5 or 6 carbon atoms is more preferable.

In the cycloalkyl group which is formed by two of $Rx_1$ to $Rx_3$ being bonded to each other, for example, one methylene group constituting the ring may be substituted with a heteroatom such as an oxygen atom, or a group having a heteroatom, such as a carbonyl group.

For the repeating unit represented by General Formula (AI), for example, an aspect in which $Rx_1$ is a methyl group or an ethyl group, $Rx_2$ and $Rx_3$ are bonded to each other to form the above-mentioned cycloalkyl group is preferable.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), which preferably has 8 or less carbon atoms.

As the repeating unit represented by General Formula (AI), an acid-decomposable tertiary alkyl (meth)acrylate ester-based repeating unit (a repeating unit in which $Xa_1$ represents a hydrogen atom or a methyl group, and T represents a single bond) is preferable. Among those, a repeating unit in which $Rx_1$ to $Rx_3$ each independently represent a linear or branched alkyl group is more preferable, and a repeating unit in which $Rx_1$ to $Rx_3$ each independently represent a linear alkyl group is still more preferable.

Specific examples of the repeating unit having a group that decomposes by the action of an acid to generate a carboxyl group, which is contained in the resin (A), are shown below, but the present invention is not limited thereto.

In the specific examples, Rx and $Xa_1$ represent a hydrogen atom, $CH_3$, $CF_3$, or $CH_2OH$. Rxa and Rxb each independently represent an alkyl group having 1 to 4 carbon atoms. Z represents a substituent including a polar group. In a case where Z's are present in plural number, Z's each independently represent a substituent having a polar group. p represents 0 or a positive integer. Examples of the substituent having a polar group represented by Z include a linear, branched, or cyclic alkyl group having a hydroxyl group, a cyano group, an amino group, an alkylamido group, or a sulfonamide group, and an cycloalkyl group, and the alkyl group having a hydroxyl group is preferable. As the branched alkyl group, an isopropyl group is more preferable.

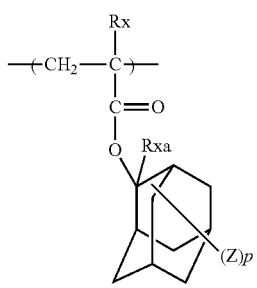

1

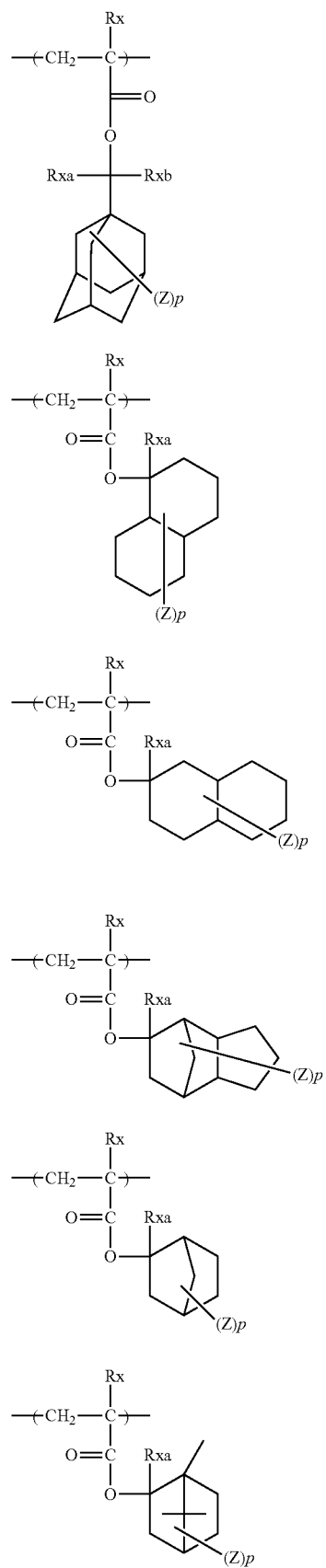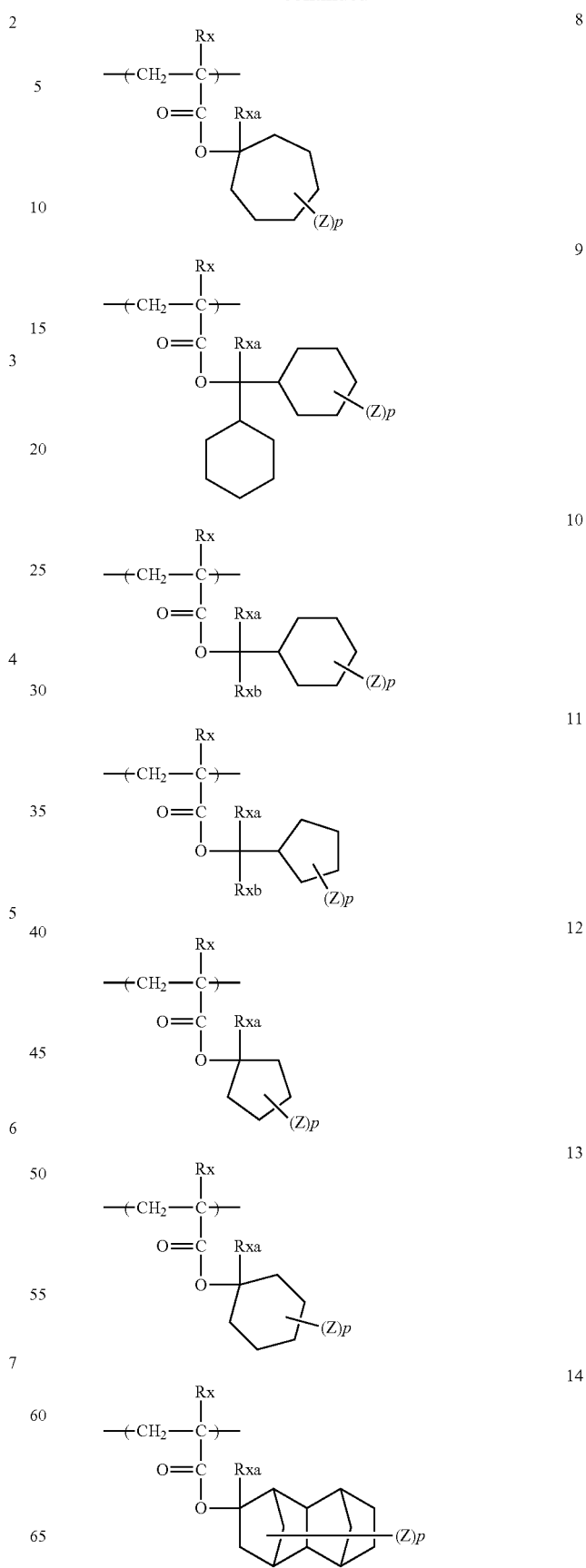

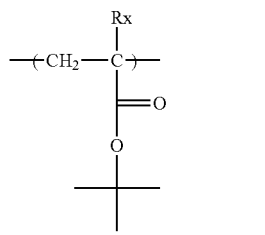

15

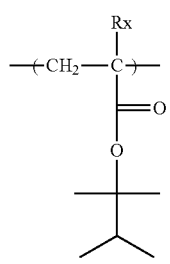

16

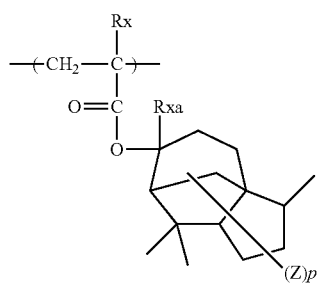

17

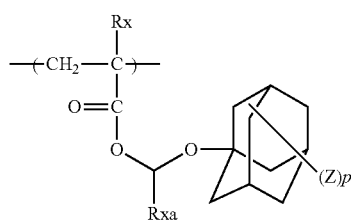

18

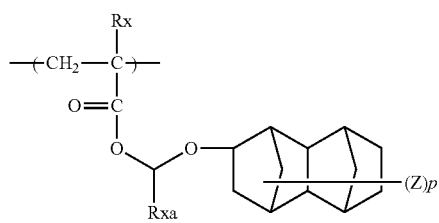

19

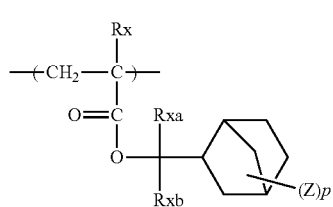

20

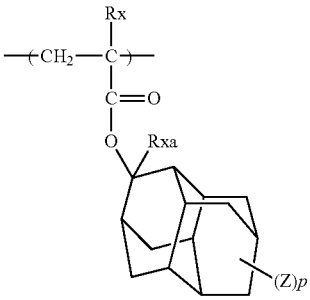

21

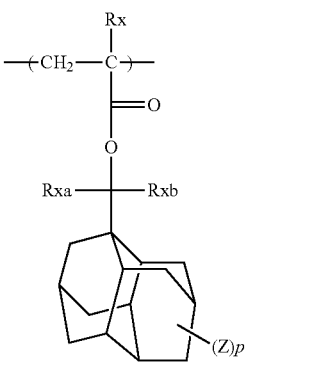

22

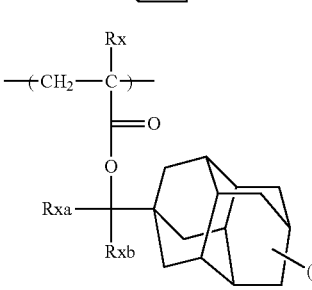

23

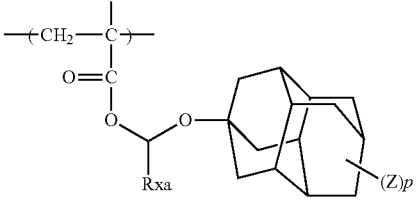

24

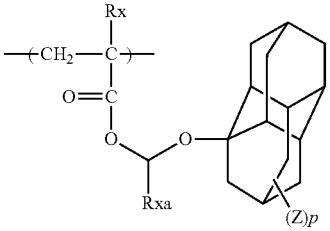

25

The content of the repeating unit having a group that decomposes by the action of an acid to generate a carboxyl group is preferably 15% to 90% by mole, more preferably 20% to 90% by mole, still more preferably 25% to 80% by mole, and even still more preferably 30% to 70% by mole with respect to all the repeating units of the resin (A).

It is preferable that the resin (A) further has a repeating unit containing a lactone group.

As the lactone group, any of groups which contain a lactone structure may be used, but a group having a 5- to 7-membered lactone structure containing a lactone structure is preferable, and a group in which another ring structure is fused to a group having a 5- to 7-membered lactone structure so as to form a bicyclo structure or a Spiro structure is more preferable.

Among those, it is more preferable that the resin (A) has a repeating unit which contains a group having a lactone structure represented by any one of General Formula (LC1-1), . . . , or (LC1-16). In addition, the group having a lactone structure may be directly bonded to a main chain. As the lactone structure, a group represented by General Formula (LC1-1), General Formula (LC1-4), General Formula (LC1-5), General Formula (LC1-6), General Formula (LC1-13), or General Formula (LC1-14) is preferable.

LC1-1
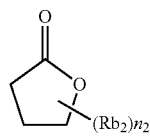

LC1-2
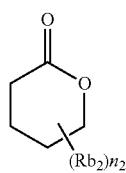

LC1-3
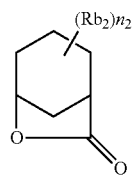

LC1-4
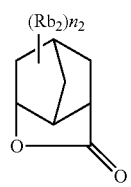

LC1-5
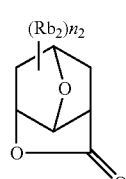

LC1-6
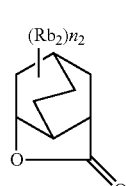

-continued

LC1-7
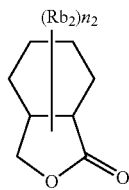

LC1-8
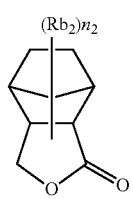

LC1-9
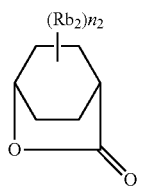

LC1-10
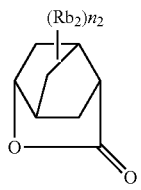

LC1-11
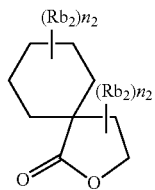

LC1-12
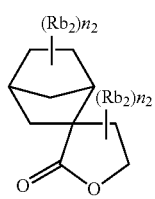

LC1-13
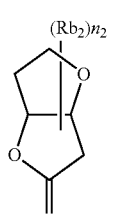

LC1-14
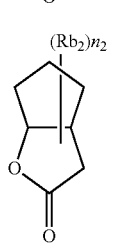

LC1-15

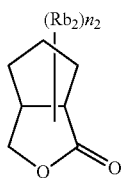

LC1-16

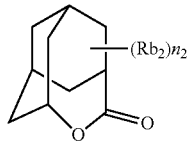

The lactone structure moiety may or may not have a substituent (Rb$_2$). As the substituent (Rb$_2$), an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, or an acid-decomposable group is preferable. n2 represents an integer of 0 to 4. In a case where n2 is 2 or more, Rb$_2$'s which are present in plural number may be the same as or different from each other, or Rb$_2$'s which are present in plural number may be bonded to each other to form a ring.

Examples of the repeating unit which contains a group having the lactone structure represented by any one of General Formula (LC1-1), . . . , or (LC1-16) include a repeating unit represented by General Formula (AI).

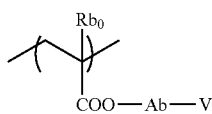

(AI)

In General Formula (AI), Rb$_0$ represents a hydrogen atom, a halogen atom, or an alkyl group having 1 to 4 carbon atoms.

Preferred examples of a substituent which may be contained in the alkyl group of Rb$_0$ include a hydroxyl group and a halogen atom.

Examples of the halogen atom of Rb$_0$ include a fluorine atom, a chlorine atom, a bromine atom, and an iodine atom. Rb$_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by a combination thereof. In particular, Ab is preferably a single bond or a linking group represented by -Ab$_1$-CO$_2$—. Ab$_1$ is a linear or branched alkylene group or a monocyclic or polycyclic cycloalkylene group, and preferably a methylene group, an ethylene group, a cyclohexylene group, an adamantylene group, or a norbornylene group.

V represents a group represented by any one of General Formula (LC1-1), . . . , or (LC1-16).

In the repeating unit which contains a group having a lactone structure, optical isomers are typically present, but any of the optical isomers may be used. In addition, one optical isomer may be used alone, or a mixture of a plurality of the optical isomers may be used. In a case where one optical isomer is mainly used, the optical purity (ee) thereof is preferably 90 or more, and more preferably 95 or more.

Specific examples of the repeating unit which contains a group having a lactone structure are shown below, but the present invention is not limited thereto.

(In the formulae, Rx represents H, CH$_3$, CH$_2$OH, or CF$_3$)

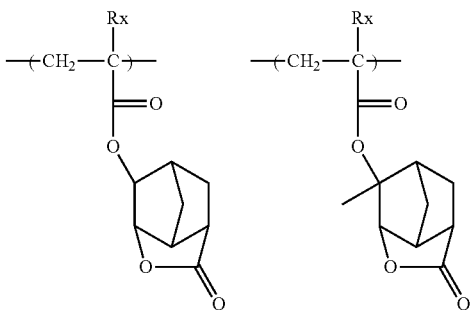

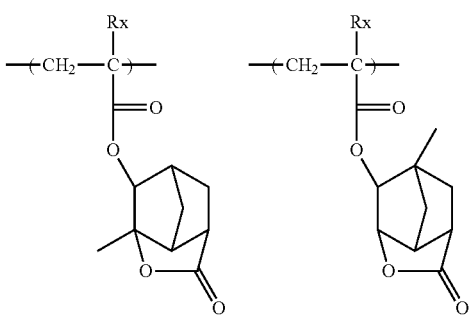

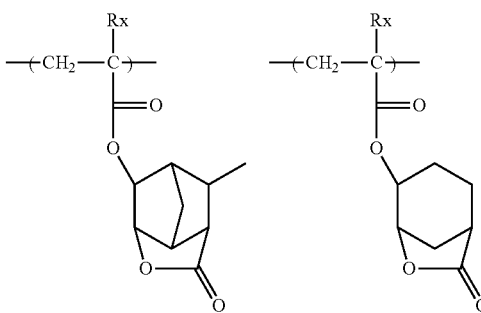

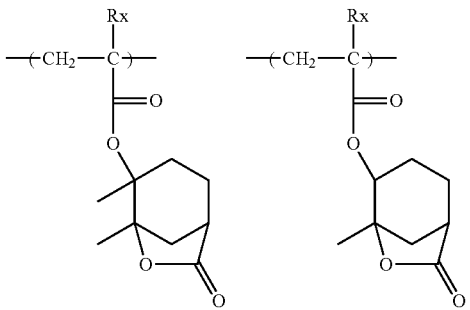

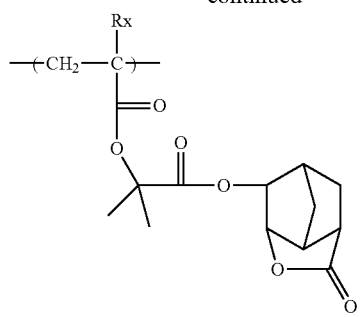
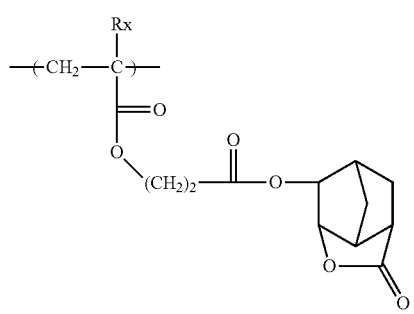
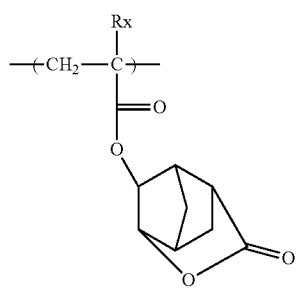
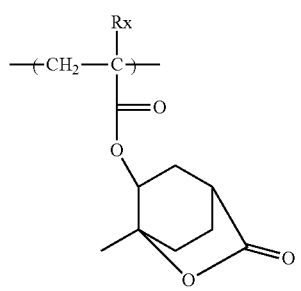
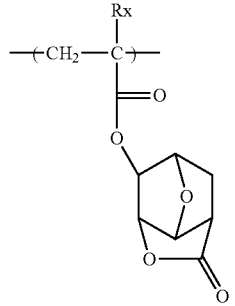
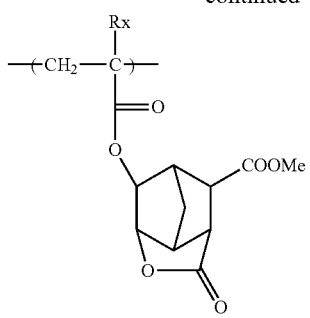
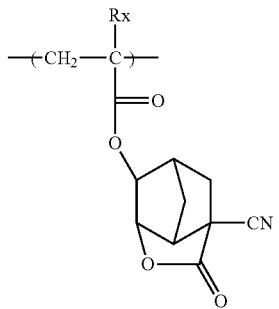
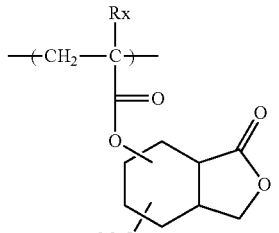
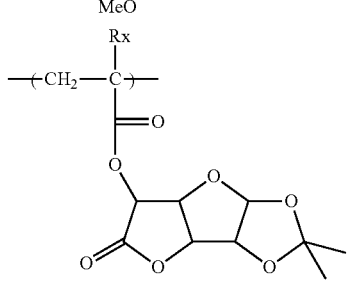
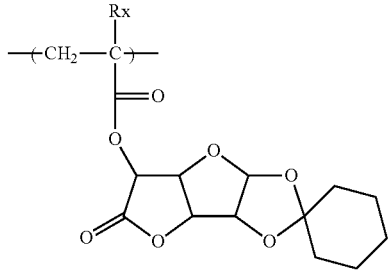
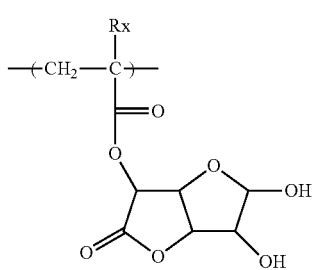

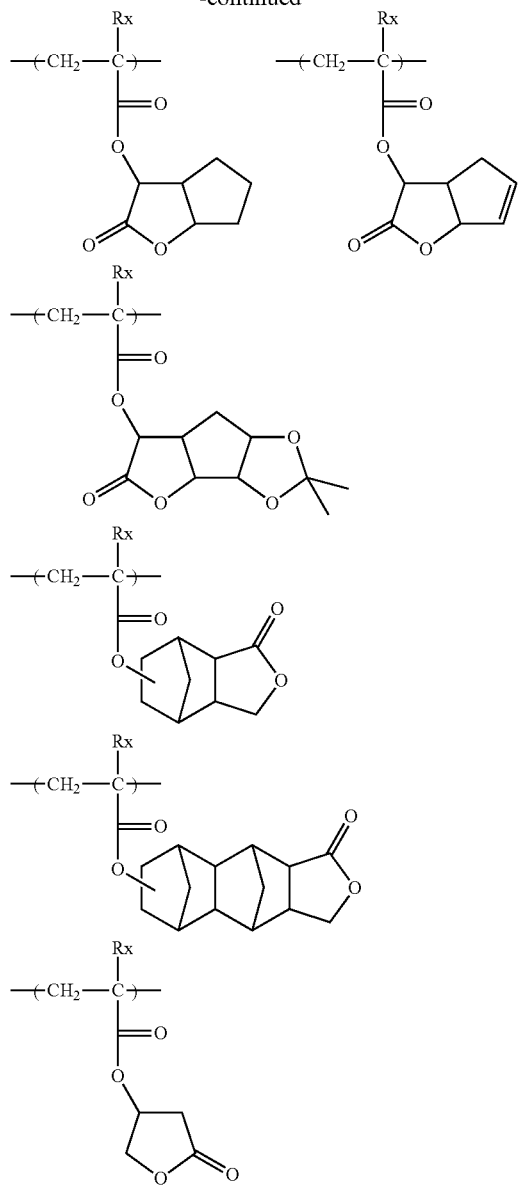

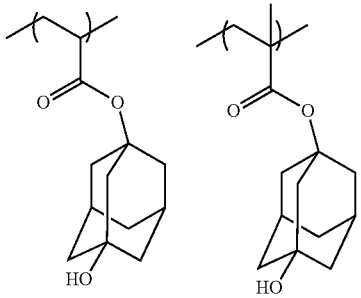

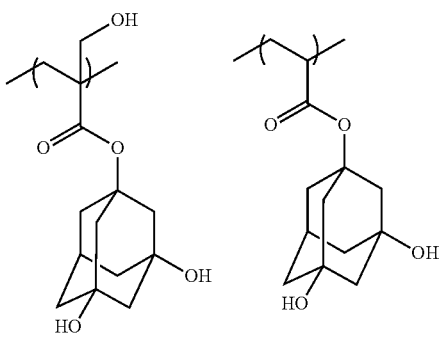

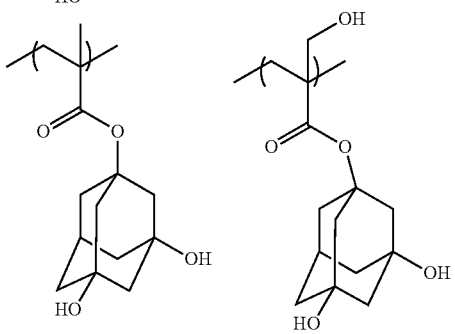

The content of the repeating unit having a lactone group is preferably 1% to 65% by mole, more preferably 1% to 30% by mole, still more preferably 5% to 25% by mole, and particularly preferably 5% to 20% by mole, with respect to all the repeating units in the resin (A)

The resin (A) may further have a repeating unit containing an organic group having a polar group, in particular, a repeating unit having an alicyclic hydrocarbon structure substituted with a polar group.

Thus, substrate adhesiveness and developer affinity are improved. As the alicyclic hydrocarbon structure of the alicyclic hydrocarbon structure substituted with a polar group, an adamantyl group, a diadamantyl group, or a norbornane group is preferable. As the polar group, a hydroxyl group or a cyano group is preferable.

Specific examples of the repeating unit having a polar group are shown below, but the present invention is not limited thereto.

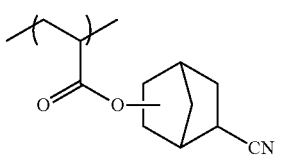

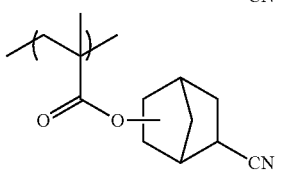

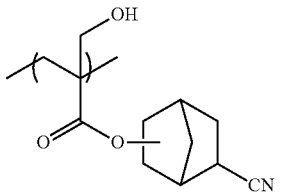

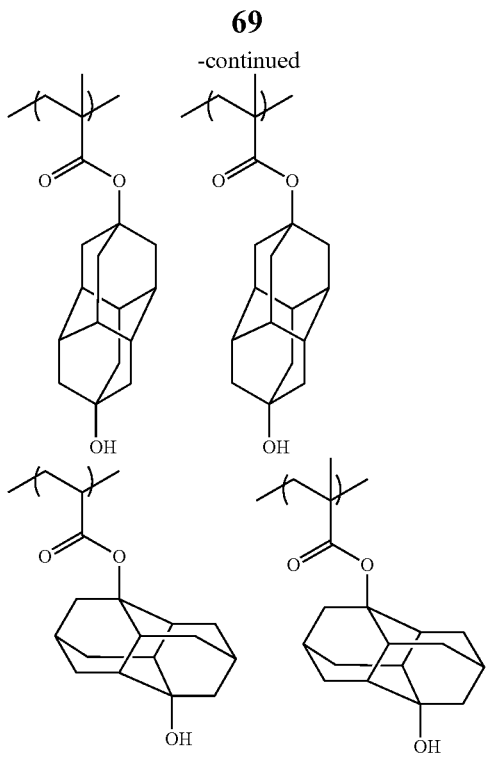

In a case where the resin (A) includes the repeating unit which contains an organic group having a polar group, the content of the repeating unit is preferably 1% to 50% by mole, more preferably 1% to 30% by mole, still more preferably 5% to 25% by mole, and particularly preferably 5% to 20% by mole, with respect to all the repeating units of the resin (A).

Furthermore, as a repeating unit other than the above-described repeating units, a repeating unit having a group (photoacid generating group) which generates an acid upon irradiation with actinic rays or radiation can also be included. In this case, it can be considered that the repeating unit having a photoacid generating group corresponds to a compound (B) that generates an acid upon irradiation with actinic rays or radiation, which will be described later.

Examples of such the repeating unit include a repeating unit represented by General Formula (4).

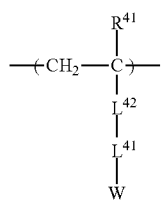

(4)

$R^{41}$ represents a hydrogen atom or a methyl group. $L^{41}$ represents a single bond or a divalent linking group. $L^{42}$ represents a divalent linking group. W represents a structural unit that decomposes to generate an acid in a side chain upon irradiation with actinic rays or radiation.

Specific examples of the repeating unit represented by General Formula (4) are shown below, but the present invention is not limited thereto.

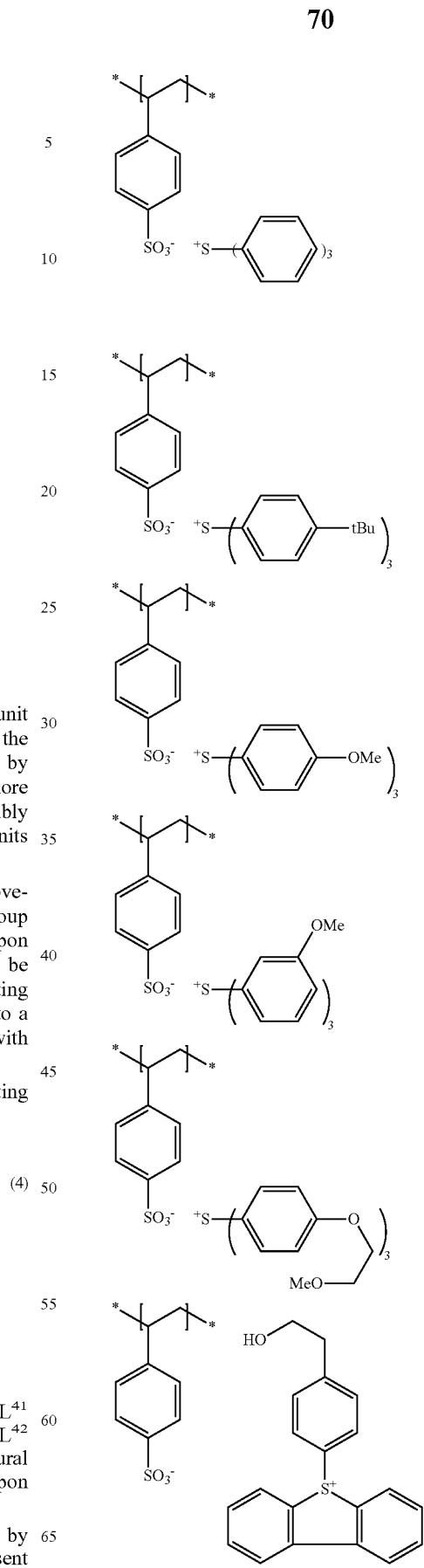

71
-continued
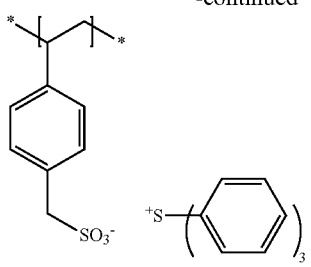
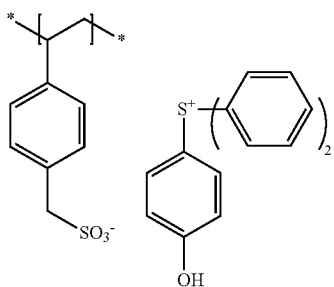
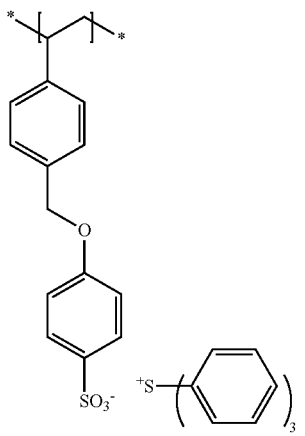
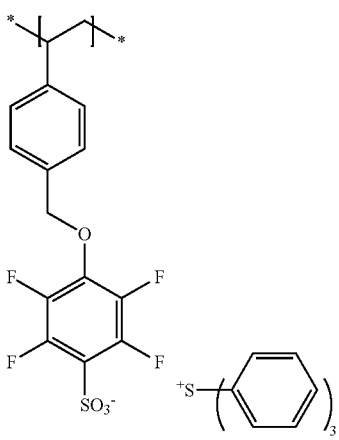
72
-continued
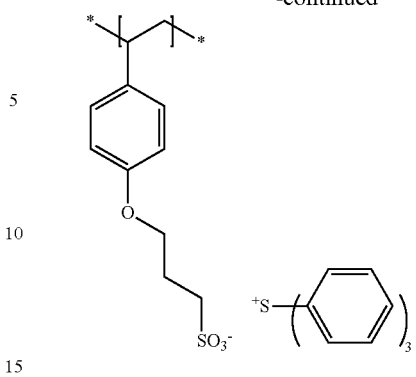
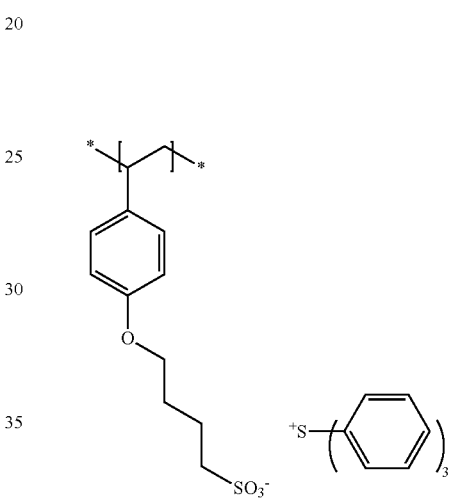
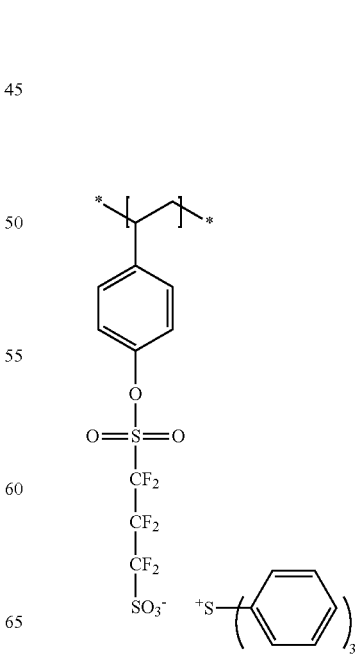

-continued

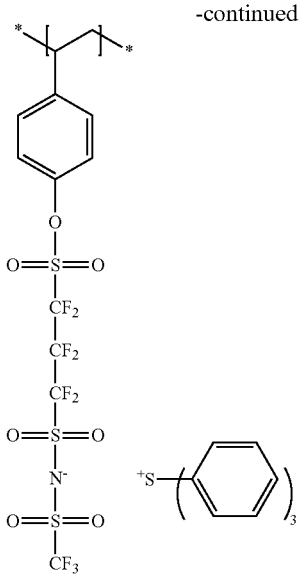

Other examples of the repeating unit represented by General Formula (4) include the repeating units described in paragraphs [0094] to [0105] of JP2014-041327A.

In a case where the resin (A) contains the repeating unit having a photoacid generating group, the content of the repeating unit having a photoacid generating group is preferably 1% to 40% by mole, more preferably 5% to 35% by mole, and still more preferably 5% to 30% by mole, with respect to all the repeating units of the resin (A).

The resin (A) can be synthesized using an ordinary method (for example, radical polymerization). Examples of the general synthesis method include a batch polymerization method in which a monomer species and an initiator are dissolved in a solvent, and the solution is heated to perform polymerization, and a dropping polymerization method in which a solution of a monomer species and an initiator are added dropwise to a heated solvent for 1 to 10 hours, with the dropping polymerization method being preferable.

Examples of the reaction solvent include ethers such as tetrahydrofuran, 1,4-dioxane, and diisopropyl ether, ketones such as methyl ethyl ketone and methyl isobutyl ketone, ester-based solvents such as ethyl acetate, amide-based solvents such as dimethyl formamide and dimethylacetamide, and solvents for dissolving an actinic ray-sensitive or radiation-sensitive resin composition, such as propylene glycol monomethyl ether acetate, propylene glycol monomethyl ether, and cyclohexanone, which will be described later. More desirably, it is preferable that the same solvent as that used in the actinic ray-sensitive or radiation-sensitive resin composition is used to perform polymerization. With such a use of the solvents, particle generation during storage can be suppressed.

It is preferable that the polymerization reaction is carried out in an inert gas atmosphere such as nitrogen and argon. In order to initiate the polymerization, a commercially available radical initiator (an azo-based initiator, a peroxide, and the like) is used as the polymerization initiator. As the radical initiator, an azo-based initiator is preferable, and an azo-based initiator having an ester group, a cyano group, or a carboxyl group is preferable. As the polymerization initiator, azobisisobutyronitrile, azobisdimethylvaleronitrile, or dimethyl 2,2'-azobis(2-methylpropionate) is more preferable.

The polymerization initiator is added or added in portion-wise, depending on the purposes, and after completion of the reaction, the reaction product is poured into a solvent, and then a desired polymer is recovered by a method such as powder or solid recovery. The reactant concentration is usually 5% to 50% by mass, and preferably 10% to 30% by mass.

The reaction temperature is usually 10° C. to 150° C., preferably 30° C. to 120° C., and still more preferably 60° C. to 100° C.

For purification, a typical method such as a liquid-liquid extraction method in which residual monomers and oligomer components are removed by combining water washing with an appropriate solvent, a purification method in a solid state such as ultrafiltration in which substances having a specific molecular weight or less are removed by filtration, a reprecipitation method in which residual monomers are removed by dropping a resin solution over a poor solvent to solidify the resin in the poor solvent, and a purification method in a solid state in which a resin slurry separated by filtration is washed with a poor solvent can be applied.

The weight-average molecular weight of the resin (A) is preferably 1,000 to 200,000, more preferably 3,000 to 20,000, and still more preferably 5,000 to 15,000 as a value in terms of polystyrene by a gel permeation chromatography (GPC) method. By adjusting the weight-average molecular weight to 1,000 to 200,000, deterioration in heat resistance or dry etching resistance can be prevented, and deterioration in developability or deterioration in film forming properties caused by an increase in viscosity can also be prevented.

In another particularly preferred embodiment, the weight-average molecular weight of the resin (A) is 3,000 to 9,500 as a value in terms of polystyrene by a GPC method. By adjusting the weight-average molecular weight to 3,000 to 9,500, in particular, a resist residue (hereinafter also referred to as "scum") is suppressed, and a more satisfactory pattern can thus be formed.

A dispersity (molecular weight distribution) in the range of usually 1 to 5, preferably 1 to 3, more preferably 1.2 to 3.0, and still more preferably 1.2 to 2.0 is used. As the dispersity of the resin decreases, a resolution and a resist shape are improved, and further, a side wall of a resist pattern is smooth and roughness properties are excellent.

In the actinic ray-sensitive or radiation-sensitive resin composition, the content of the resin (A) is preferably 50% to 99.9% by mass and more preferably 60% to 99.0% by mass in the total solid content.

In addition, in the actinic ray-sensitive or radiation-sensitive resin composition, the resin (A) may be used alone or in combination of a plurality thereof.

In addition, the resin (A) may include a repeating unit represented by General Formula (VI).

(VI)
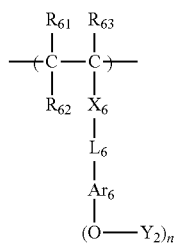

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents a (n+1)-valent aromatic ring group, and in a case where $Ar_6$ is bonded to $R_{62}$ to form a ring, $Ar_6$ represents a (n+2)-valent aromatic ring group.

In a case of $Y_2$'s each independently represent a hydrogen atom or a group that leaves by the action of an acid, provided that at least one of $Y_2$'s represents a group that leaves by the action of an acid.

n represents an integer of 1 to 4.

As the group that leaves by the action of an acid represented by $Y_2$, a structure represented by General Formula (VI-A) is more preferable.

$$\begin{array}{c} L_1 \\ | \\ -C-O-M-Q \\ | \\ L_2 \end{array} \quad (VI\text{-}A)$$

Here, $L_1$ and $L_2$ each independently represent a hydrogen atom, an alkyl group, a cycloalkyl group, an aryl group, or a group formed by a combination of an alkylene group and an aryl group.

M represents a single bond or a divalent linking group.

Q represents an alkyl group, a cycloalkyl group which may have a heteroatom, an aryl group which may include a heteroatom, an amino group, an ammonium group, a mercapto group, a cyano group, or an aldehyde group.

At least two of Q, M, or $L_1$ may be bonded to each other to form a ring (preferably a 5- or 6-membered ring).

The repeating unit represented by General Formula (VI) is preferably a repeating unit represented by General Formula (3).

$$*-(CH_2-\underset{Ar_3-O}{\overset{H}{C}})-* \quad \underset{R_3}{\overset{H}{|}}O-M_3-Q_3 \quad (3)$$

In General Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, or $R_3$ may be bonded to each other to form a ring.

The aromatic ring group represented by $Ar_3$ is the same as $Ar_6$ in General Formula (VI) in a case where n in General Formula (VI) represents 1, a phenylene group or a naphthylene group is preferable, and the phenylene group is more preferable.

Specific examples of the repeating unit represented by General Formula (VI) are shown below, but the present invention is not limited thereto.

(VI-6)
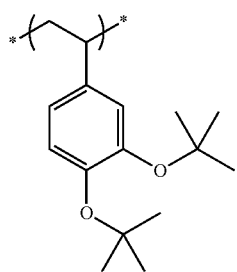
(VI-7)
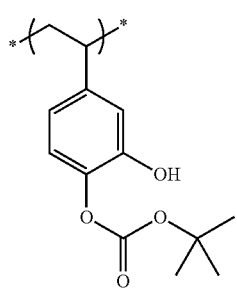
(VI-8)
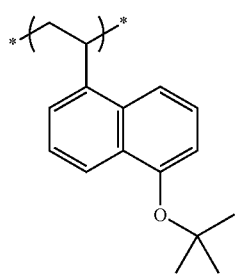
(VI-9)
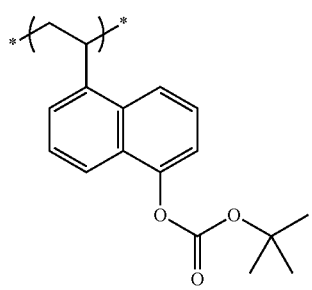
(VI-10)
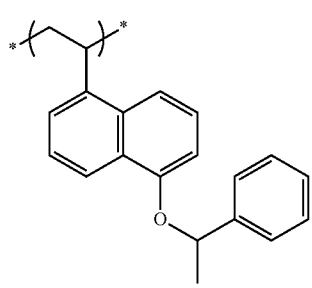
(VI-11)
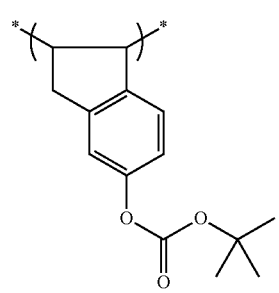
(VI-12)
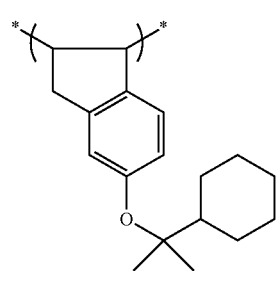
(VI-13)
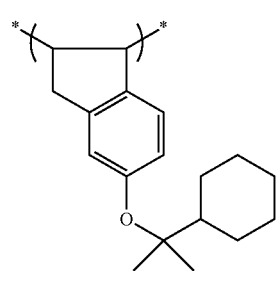
(VI-14)
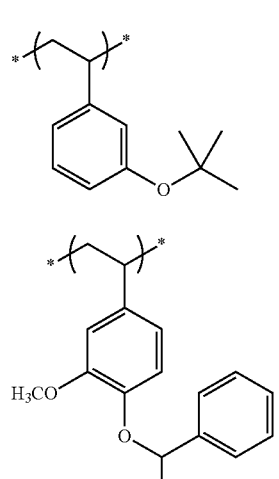
(VI-15)
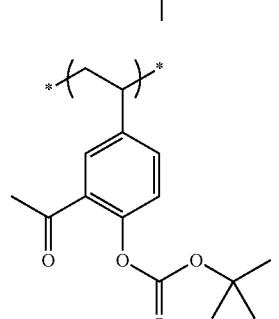
(VI-16)
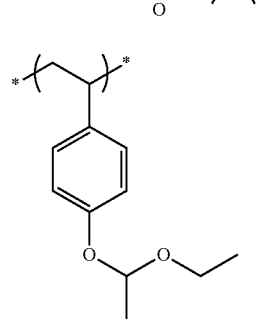

(VI-17) 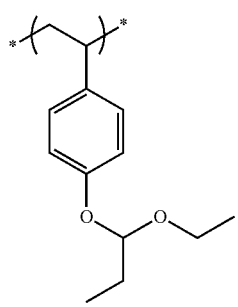
(VI-18) 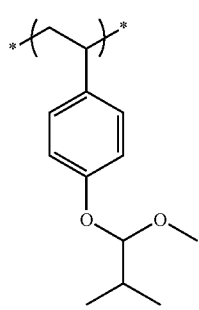
(VI-19) 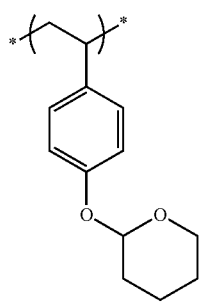
(VI-20) 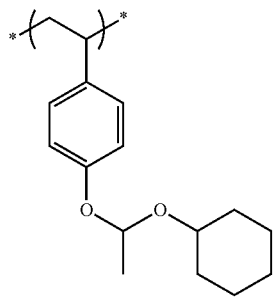
(VI-21) 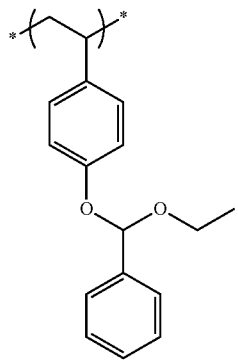
(VI-22) 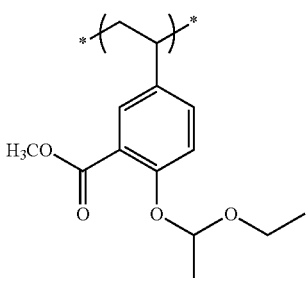
(VI-23) 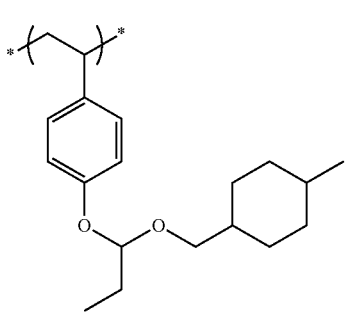
(VI-24) 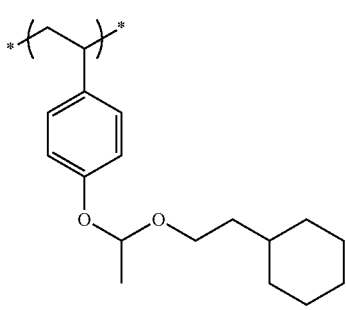
(VI-25) 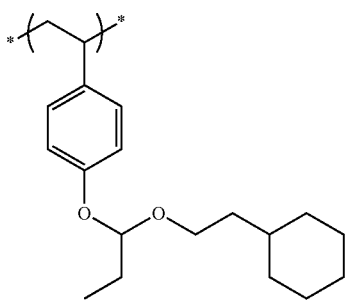
(VI-26) 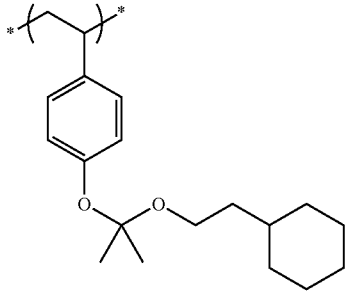

(VI-27) 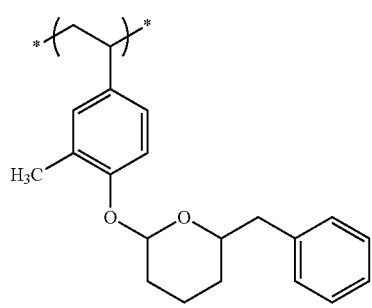
(VI-28) 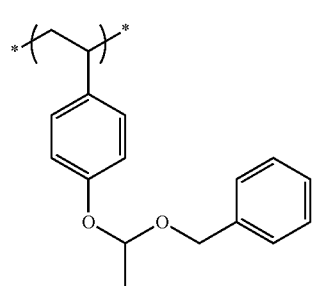
(VI-29) 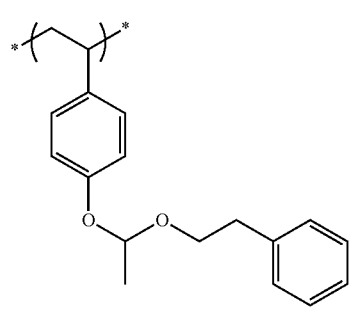
(VI-30) 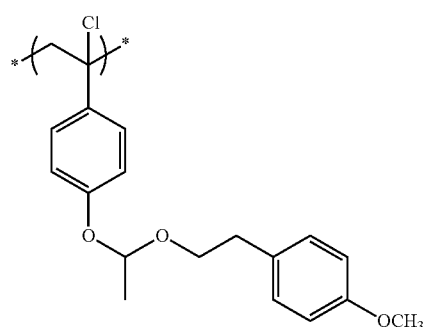
(VI-31) 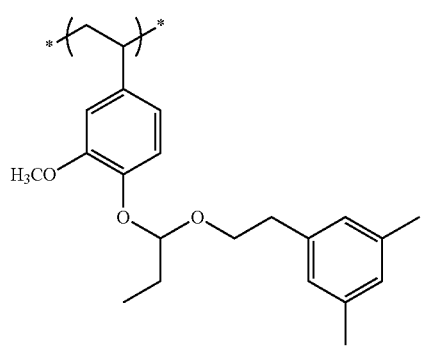
(VI-32) 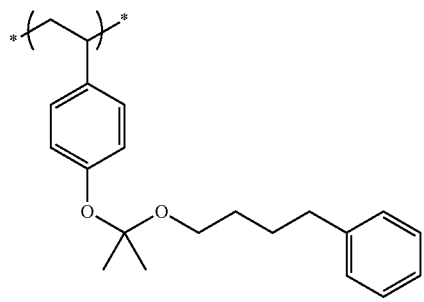
(VI-33) 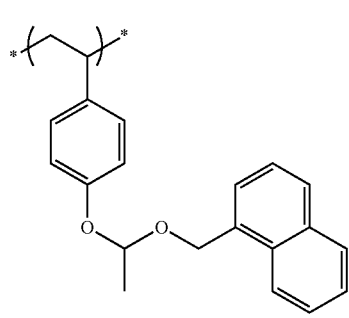
(VI-34) 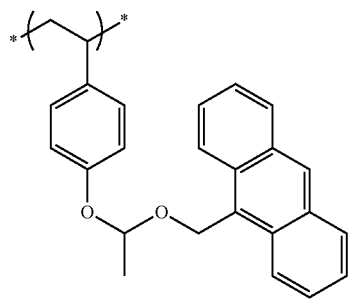
(VI-35) 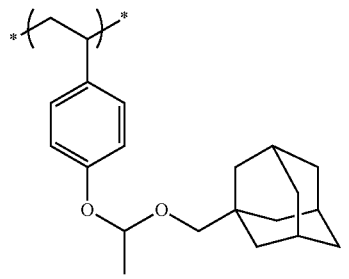
(VI-36) 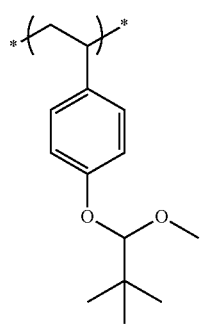
Furthermore, the resin (A) may include a repeating unit represented by General Formula (4).

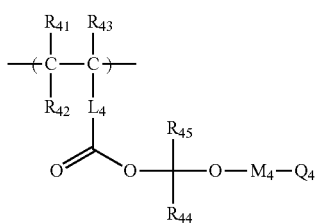

(4)

In General Formula (4), $R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring, and in this case, $R_{42}$ represents an alkylene group.

$L_4$ represents a single bond or a divalent linking group. In a case where $L_4$ and $R_{42}$ form a ring, $L_4$ represents a trivalent linking group.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, or $R_{44}$ may be bonded to each other to form a ring.

$R_{41}$, $R_{42}$, and $R_{43}$ have the same definitions and the same preferably ranges as $R_{51}$, $R_{52}$, and $R_{53}$ in General Formula (V).

$L_4$ has the same definition and the same preferably range as $L_5$ in General Formula (V).

$R_{44}$ and $R_{45}$ have the same definitions and the same preferably ranges as $R_3$ in General Formula (3).

$M_4$ has the same definition and the same preferably range as $M_3$ in General Formula (3).

$Q_4$ has the same definition and the same preferably range as $Q_3$ in General Formula (3).

Examples of a ring which is formed by at least two of $Q_4$, $M_4$, or $R_{44}$ being bonded to each other include the ring which is formed by at least two of $Q_3$, $M_3$, or $R_3$ being bonded to each other, and preferably ranges thereof are also the same.

Specific examples of the repeating unit represented by General Formula (4) are shown below, but the present invention is not limited thereto.

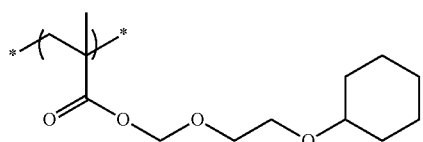

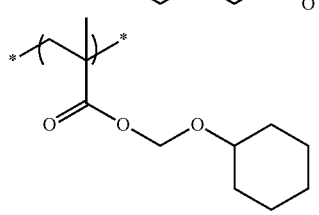

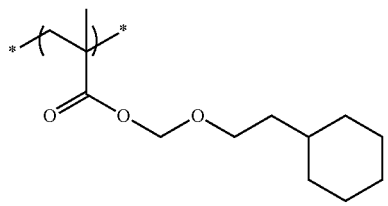

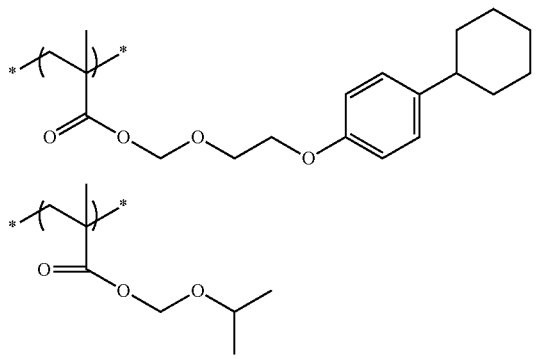

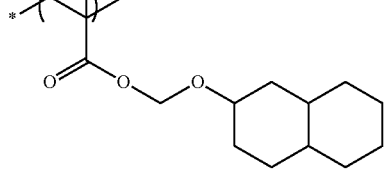

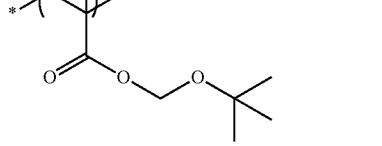

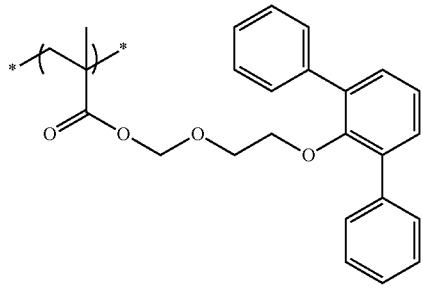

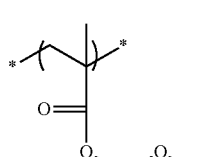

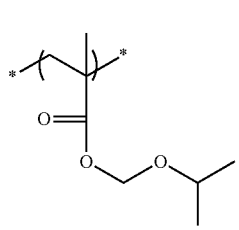

-continued

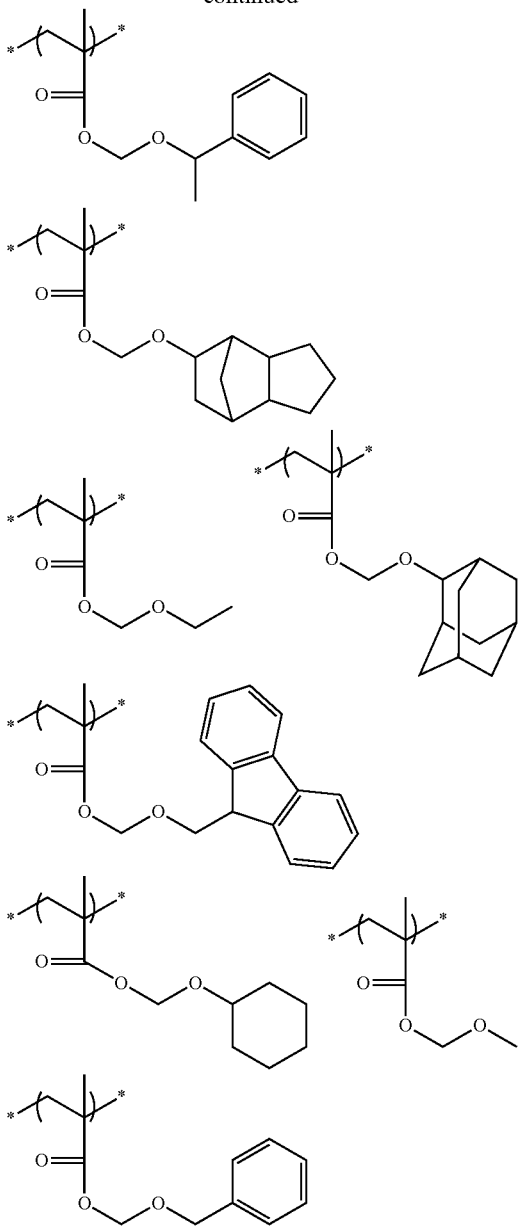

In addition, the resin (A) may include a repeating unit represented by General Formula (BZ).

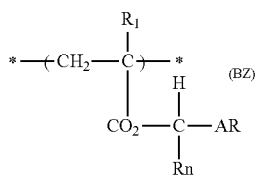

In General Formula (BZ), AR represents an aryl group. Rn represents an alkyl group, a cycloalkyl group, or an aryl group. Rn and AR may be bonded to each other to form a non-aromatic ring.

$R_1$ represents a hydrogen atom, an alkyl group, a cycloalkyl group, a halogen atom, a cyano group, or an alkyloxycarbonyl group.

Specific examples of the repeating unit represented by General Formula (BZ) are shown below, but the present invention is not limited thereto.

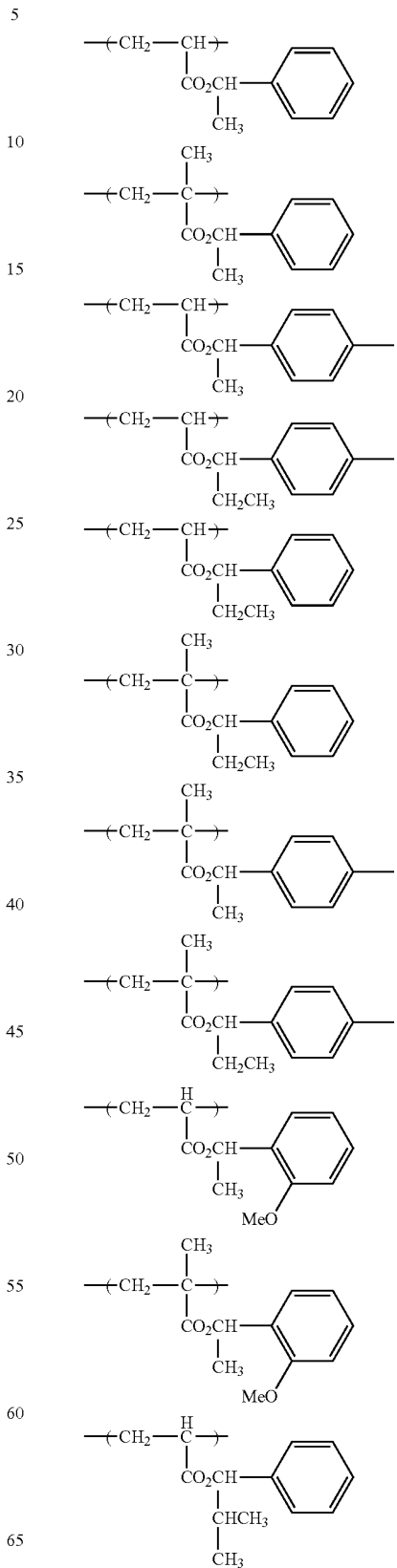

-continued

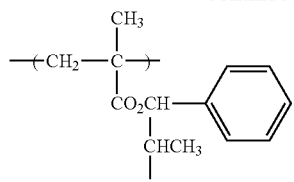
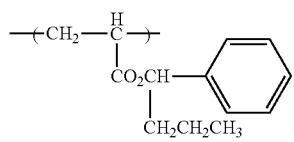
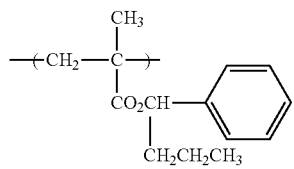
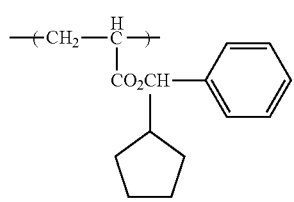
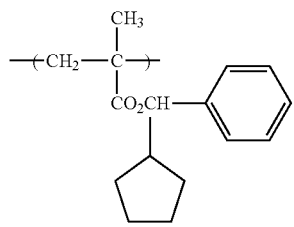
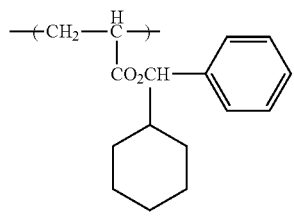
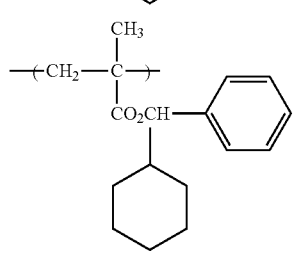
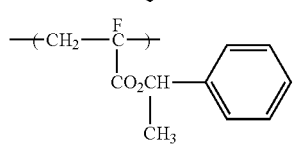
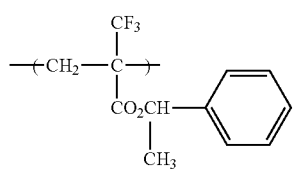

-continued

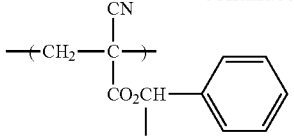
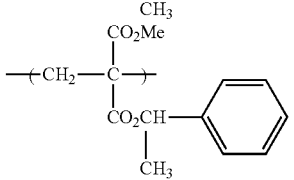

The repeating unit having an acid-decomposable group may be used alone or in combination of two or more kinds thereof.

The content of the repeating unit having an acid-decomposable group in the resin (A) (the total content thereof in a case where the resin (A) contains a plurality of repeating units having an acid-decomposable group) is preferably 5% to 80% by mole, more preferably 5% to 75% by mole, and still more preferably 10% to 65% by mole, with respect to all the repeating units of the resin (A).

The resin (A) may include a repeating unit represented by General Formula (V) or General Formula (VI).

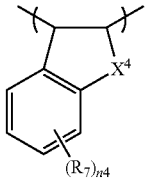

(V)

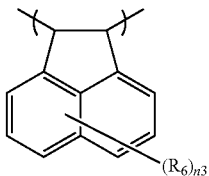

(VI)

In the formulae, $R_6$ and $R_7$ each independently represent a hydrogen atom, a hydroxyl group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ is a methylene group, an oxygen atom, or a sulfur atom.

Specific examples of the repeating unit represented by General Formula (V) or General Formula (VI) are shown below, but are not limited thereto.

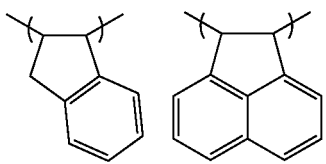

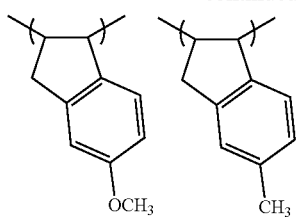

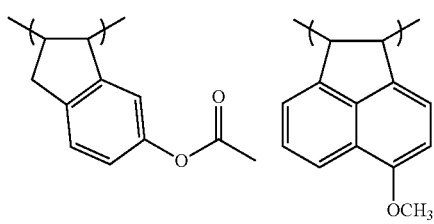

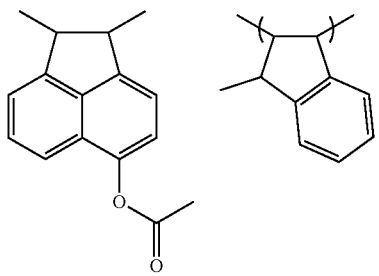

The resin (A) may further have a repeating unit having a silicon atom in a side chain.

Examples of the repeating unit having a silicon atom in a side chain include a (meth)acrylate-based repeating unit having a silicon atom and a vinyl-based repeating unit having a silicon atom. The repeating unit having a silicon atom in a side chain is usually a repeating unit having a group having a silicon atom in a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilylsilyl group, a methylbistrimethylsilylsilyl group, a methylbistrimethylsiloxysilyl group, a dimethyltrimethylsilylsilyl group, a dimethyltrimethylsiloxysilyl group, a cyclic or linear polysiloxane, and a cage-type or ladder-type or random-type silsesquioxane structure as described below. In the formulae, R and R$^1$ each independently represent a monovalent substituent. * represents a bond.

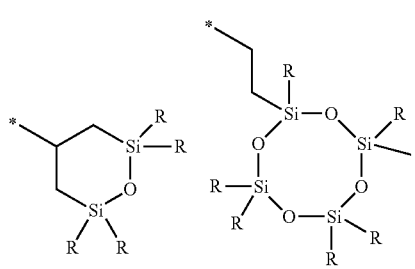

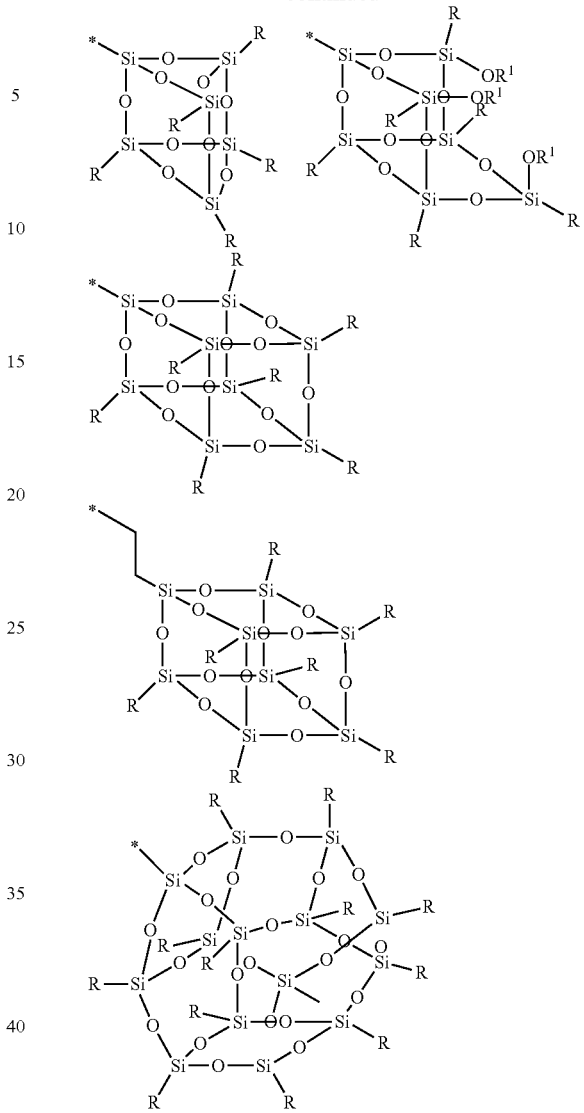

As the repeating units having the above-mentioned group, a repeating unit derived from an acrylate or methacrylate compound having the above-mentioned group, or a repeating unit derived from compound having the above-mentioned group and a vinyl group is preferable.

The repeating unit having a silicon atom is preferably a repeating unit having a silsesquioxane structure, whereby it is possible to express a very excellent collapse performance in the formation of an ultrafine pattern (for example, a pattern with a line width of 50 nm or less) having a cross-sectional shape of a high aspect ratio (for example, a ratio of film thickness/line width of 3 or more).

Examples of the silsesquioxane structure include a cage-type silsesquioxane structure, a ladder-type silsesquioxane structure, and a random-type silsesquioxane structure. Among those, the cage-type silsesquioxane structure is preferable.

Here, the cage-type silsesquioxane structure is a silsesquioxane structure having a cage-shaped skeleton. The cage-type silsesquioxane structure may be a complete cage-type silsesquioxane structure or an incomplete cage-type silsesquioxane structure, and the complete cage-type silsesquioxane structure is preferable.

Furthermore, the ladder-type silsesquioxane structure is a silsesquioxane structure having a ladder-shaped skeleton.

In addition, the random-type silsesquioxane structure is a silsesquioxane structure whose skeleton is random.

As the cage-type silsesquioxane structure, a siloxane structure represented by Formula (S) is preferable.

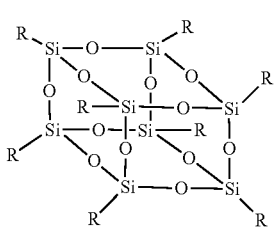

(S)

In Formula (S), R represents a monovalent organic group. R's which are present in plural number may be the same as or different from each other.

The organic group is not particularly limited, but specific examples thereof include a hydrocarbon group which may have a hydroxyl group, a nitro group, a carboxy group, an alkoxy group, an amino group, a mercapto group, a blocked mercapto group (for example, an acyl group-blocked (protected) mercapto group), an acyl group, an imido group, a phosphino group, a phosphinyl group, a silyl group, a vinyl group, or a heteroatom, a (meth)acrylic group-containing group, and an epoxy group-containing group.

Examples of the heteroatom in the hydrocarbon group which may have a heteroatom include an oxygen atom, a nitrogen atom, a sulfur atom, and a phosphorus atom.

Examples of the hydrocarbon group in the hydrocarbon group which may have a heteroatom include an aliphatic hydrocarbon group, an aromatic hydrocarbon group, and a group formed by a combination of these groups.

The aliphatic hydrocarbon group may be linear, branched or cyclic. Specific examples of the aliphatic hydrocarbon group include a linear or branched alkyl group (in particular, having 1 to 30 carbon atoms), a linear or branched alkenyl group (in particular, having 2 to 30 carbon atoms), and a linear or branched alkynyl group (in particular, having 2 to 30 carbon atoms).

Examples of the aromatic hydrocarbon group include aromatic hydrocarbon groups having 6 to 18 carbon atoms, such as a phenyl group, a tolyl group, a xylyl group, and a naphthyl group.

In the case where the resin (A) has a repeating unit having a silicon atom in the side chain, the content thereof is preferably 1% to 30% by mole, more preferably 5% to 25% by mole, and still more preferably 5% to 20% by mole, with respect to all repeating units in the resin (A).

(B) Compound that Generates Acid by Actinic Rays or Radiation (Photoacid Generator)

It is preferable that the actinic ray-sensitive or radiation-sensitive resin composition contains a compound that generates an acid by actinic rays or radiation (hereinafter also referred to as a "photoacid generator <<PAG>>").

The photoacid generator may be in a form of a low molecular compound or in a form incorporated into a part of a polymer. Further, a combination of the form of a low molecular compound and the form incorporated into a part of a polymer may also be used.

In a case where the photoacid generator is in the form of a low molecular compound, the molecular weight thereof is preferably 3,000 or less, more preferably 2,000 or less, and still more preferably 1,000 or less.

In a case where the photoacid generator is included in a part of a polymer, it may be included in a part of the resin (A) or in a resin other than the resin (A).

In the present invention, it is preferable that the photoacid generator is in the form of a low molecular compound.

The photoacid generator is not particularly limited as long as it is a known photoacid generator, but the photoacid generator is preferably a compound that generates an organic acid, for example, at least one of sulfonic acid, bis(alkylsulfonyl)imide, or tris(alkylsulfonyl)methide upon irradiation with actinic rays or radiation, and preferably electron beams or extreme ultraviolet rays.

As the photoacid generator, a compound represented by General Formula (ZI), General Formula (ZII), or General Formula (ZIII) is preferable.

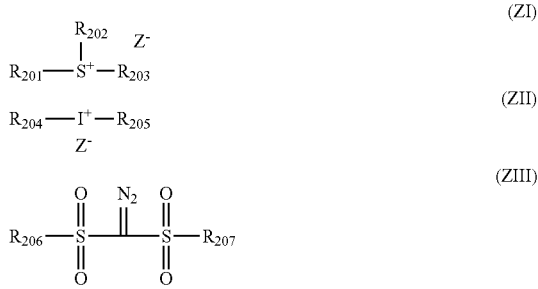

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30, and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group).

$Z^-$ represents a non-nucleophilic anion (anion having an extremely low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and is preferably a linear or branched alkyl group having 1 to 30 carbon atoms or a cycloalkyl group having 3 to 30 carbon atoms.

As the aromatic group in the aromatic sulfonate anion and the aromatic carboxylate anion, an aryl group having 6 to 14 carbon atoms is preferable, and examples thereof include a phenyl group, a tolyl group, and a naphthyl group.

The alkyl group, the cycloalkyl group, and the aryl group exemplified above may have a substituent. Specific examples of the substituent include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

For the aryl group and the ring structure which is contained in each group, further examples of the substituent include an alkyl group (preferably having 1 to 15 carbon atoms).

As the aralkyl group in the aralkyl carboxylate anion, an aralkyl group having 7 to 12 carbon atoms is preferable, and examples thereof include a benzyl group, a phenethyl group, a naphthylmethyl group, a naphthylethyl group, and a naphthylbutyl group.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of the substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and the fluorine atom or the alkyl group substituted with a fluorine atom is preferable.

In addition, the alkyl groups in the bis(alkylsulfonyl)imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom is preferable, a perfluoroaliphatic sulfonate anion (more preferably having 4 to 8 carbon atoms) or a fluorine atom-containing benzenesulfonate anion is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of the acid strength, it is preferable that the pKa of the acid generated is −1 or less so as to improve the sensitivity.

Moreover, as the non-nucleophilic anion, an anion represented by General Formula (AN1) is also preferable.

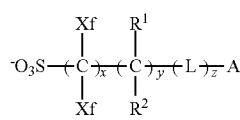

(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are present in plural numbers, they may be the same as or different from each other.

L represents a divalent linking group, and in a case where L's are present in plural number, they may be the same as or different from each other.

A represents a cyclic organic group.

x represents an integer of 1 to 20, y represent an integer of 0 to 10, and z represents an integer of 0 to 10.

General Formula (AN1) will be described in more detail.

As the alkyl group in the alkyl group substituted with a fluorine atom of Xf, an alkyl group having 1 to 10 carbon atoms is preferable, and an alkyl group having 1 to 4 carbon atoms is more preferable. In addition, as the alkyl group in the alkyl group substituted with a fluorine atom, of Xf, a perfluoroalkyl group is preferable.

Xf is preferably a fluorine atom or a perfluoroalkyl group having or 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2Cl_2F_5$, $CH_2CH_2Cl_2F_5$, $CH_2Cl_3F_7$, $CH_2CH_2Cl_3F_7$, $CH2C_4F_9$, and $CH_2CH_2Cl_4F_9$. Among those, the fluorine atom or $CF_3$ is preferable.

In particular, it is preferable that both Xf's are a fluorine atom.

The alkyl group of each of $R^1$ and $R^2$ may have a substituent (preferably a fluorine atom), and an alkyl group having 1 to 4 carbon atoms is preferable, and a perfluoroalkyl group having 1 to 4 carbon atoms is more preferable. Specific examples of the alkyl group having a substituent of each of $R^1$ and $R^2$ include $CF_3$, $C_2F_5$, $C_3F_7$, $C_4F_9$, $C_5F_1$, $C_6F_{13}$, $C_7F_{15}$, $C_8F_{17}$, $CH_2CF_3$, $CH_2CH_2CF_3$, $CH_2Cl_2F_5$, $CH_2CH_2Cl_2F_5$, $CH_2Cl_3F_7$, $CH_2CH_2Cl_3F_7$, $CH_2Cl_4F_9$, and $CH_2CH_2Cl_4F_9$, and among these, $CF_3$ is preferable.

As each of $R^1$ and $R^2$, a fluorine atom or $CF_3$ is preferable.

x is preferably 1 to 10, and more preferably 1 to 5.

y is preferably 0 to 4, and more preferably 0.

z is preferably 0 to 5, and more preferably 0 to 3.

The divalent linking group of L is not particularly limited, and examples thereof include —COO—, —OCO—, —CO—, —O—, —S—, —SO—, —SO₂—, an alkylene group, a cycloalkylene group, an alkenylene group, a linking group obtained by linking a plurality of these groups to each other, with the linking group having 12 or less carbon atoms in total being preferable. Among those, —COO—, —OCO—, —CO—, or —O— is more preferable, and —COO— or —OCO— is still more preferable.

In General Formula (AN1), as a combination of partial structures other than A include $SO^{3-}$—$CF_2$—$CH_2$—OCO—, $SO^{3-}$—$CF_2$—CHF—$CH_2$—OCO—, $SO^{3-}$—$CF_2$—COO—, $SO^{3-}$—$CF_2$—$CF_2$—$CH_2$—, or $SO^{3-}$—$CF_2$—$CH(CF_3)$—OCO— is preferable.

The cyclic organic group of A is not particularly limited as long as it has a cyclic structure, and examples thereof include an alicyclic group, an aryl group, a heterocyclic group (including not only an aromatic heterocyclic group but also a non-aromatic heterocyclic group).

The alicyclic group may be monocyclic or polycyclic, and a monocycloalkyl group such as a cyclopentyl group, a cyclohexyl group, and a cyclooctyl group, or a polycycloalkyl group such as a norbornyl group, a tricyclodecanyl group, a tetracyclodecanyl group, a tetracyclododecanyl group, and an adamantyl group is preferable. Among those, an alicyclic group with a bulky structure, having 7 or more carbon atoms, such as a norbornyl group, a tricyclodecanyl group, a tetracyclodecanyl group, a tetracyclododecanyl group, and an adamantyl group is preferable from the viewpoints the in-film diffusion in a heating step after exposure can be suppressed and a mask error enhancement factor (MEEF) is improved.

Examples of the aryl group include a benzene ring, a naphthalene ring, a phenanthrene ring, and an anthracene ring.

Examples of the heterocyclic group include a furan ring, a thiophene ring, a benzofuran ring, a benzothiophene ring, a dibenzofuran ring, a dibenzothiophene ring, and a group derived from a pyridine ring. Among those, a furan ring, a thiophene ring, or a group derived from a pyridine ring is preferable.

Moreover, examples of the cyclic organic group include a lactone structure, and specific examples thereof include lactone structures represented by General Formulae (LC1-1) to (LC1-17).

LC1-1

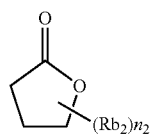

LC1-2

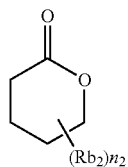

LC1-3

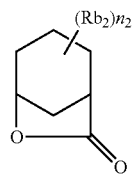

LC1-4

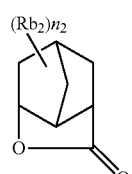

LC1-5

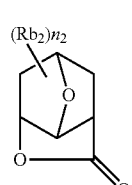

LC1-6

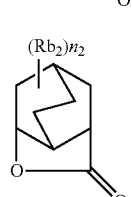

LC1-7

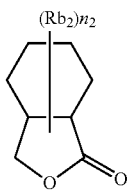

LC1-8

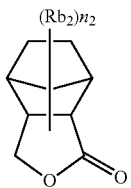

LC1-9

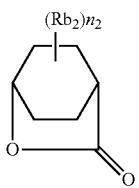

LC1-10

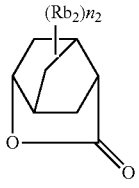

LC1-11

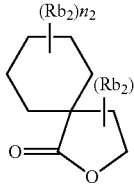

LC1-12

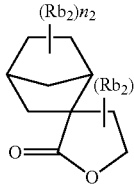

LC1-13

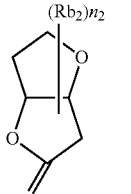

LC1-14

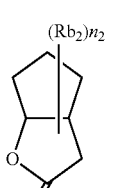

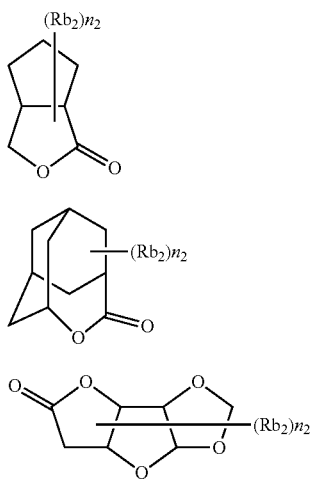

The cyclic organic group may have a substituent, and examples of the substituent include an alkyl group (which may be linear, branched, or cyclic, and preferably has 1 to 12 carbon atoms), a cycloalkyl group (which may be any of a monocycle, a polycycle, or a Spiro ring, and preferably has 3 to 20 carbon atoms), an aryl group (which may be linear, branched, or aryl, and preferably has 6 to 14 carbon atoms), a hydroxyl group, an alkoxy group, an ester group, an amido group, a urethane group, an ureido group, a thioether group, a sulfonamide group, and a sulfonate group. Incidentally, the carbon (carbon contributing to ring formation) constituting the cyclic organic group may be carbonyl carbon.

Furthermore, the substituent corresponds to $Rb_2$ in (LC1-1) to (LC1-17). Further, in (LC1-1) to (LC1-17), n2 represents an integer of 0 to 4. In a case where n2 is 2 or more, $Rb_2$'s which are present in plural number may be the same as or different from each other, and $Rb_2$'s which are present in plural number may be bonded to each other to form a ring.

In General Formula (ZI), examples of the organic group of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, or $R_{203}$ represent an aryl group. As the aryl group, not only a phenyl group or a naphthyl group but also a heteroaryl group such as an indole residue or a pyrrole residue may be used. As the alkyl group and the cycloalkyl group of $R_{201}$ to $R_{203}$, a linear or branched alkyl group having 1 to 10 carbon atoms or a cycloalkyl group having 3 to 10 carbon atoms is preferable. As the alkyl group, a methyl group, an ethyl group, a n-propyl group, an i-propyl group, or a n-butyl group is more preferable. As the cycloalkyl group, a cyclopropyl group, a cyclobutyl group, a cyclopentyl group, a cyclohexyl group, or a cycloheptyl group is more preferable. Each of the groups may further have a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the present invention is not limited thereto.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and a phenyl group is more preferable. The aryl group of each of $R_{204}$ to $R_{207}$ may be an aryl group having a heterocyclic structure having an oxygen atom, a nitrogen atom, a sulfur atom, or the like. Examples of the framework of the aryl group having a heterocyclic structure include pyrrole, furan, thiophene, indole, benzofuran, and benzothiophene.

Preferred examples of the alkyl group and the cycloalkyl group in each of $R_{204}$ to $R_{207}$ include a linear or branched alkyl group having 1 to 10 carbon atoms (for example, a methyl group, an ethyl group, a propyl group, a butyl group, and a pentyl group) and a cycloalkyl group having 3 to 10 carbon atoms (for example, a cyclopentyl group, a cyclohexyl group, and a norbornyl group).

The aryl group, the alkyl group, and the cycloalkyl group of each of $R_{204}$ to $R_{207}$ may have a substituent, and examples of the substituent which may be contained in the aryl group, the alkyl group, and the cycloalkyl group of $R_{204}$ to $R_{207}$ include an alkyl group (for example, an alkyl group having 1 to 15 carbon atoms), a cycloalkyl group (for example, a cycloalkyl group having 3 to 15 carbon atoms), an aryl group (for example, an aryl group having 6 to 15 carbon atoms), an alkoxy group (for example, an alkoxy group having 1 to 15 carbon atoms), a halogen atom, a hydroxyl group, and a phenylthio group.

Furthermore, in General Formula (ZII), $Z^-$ represents a non-nucleophilic anion, and specifically, it has the same definition and the same preferred embodiment as the one described as $Z^-$ in General Formula (ZI).

Specific examples of General Formulae (ZI) to (ZIII) are shown below, but are not limited thereto.

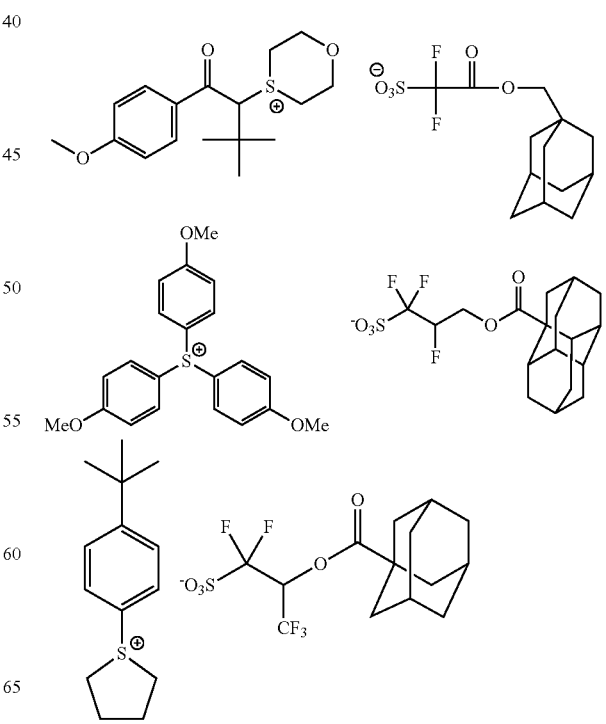

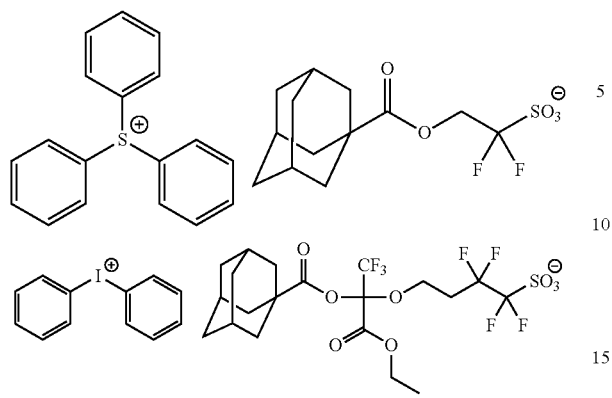

In the present invention, from the viewpoint that the diffusion of an acid generated upon exposure to a non-exposed area is suppressed to improve a resolution, the photoacid generator may be a compound which generates an acid (more preferably sulfonic acid) having a volume of 130 Å$^3$ or more upon irradiation with electron beams or extreme ultraviolet rays, preferably a compound which generates an acid (more preferably sulfonic acid) having a volume of 190 Å$^3$ or more, more preferably a compound which generates an acid (more preferably sulfonic acid) having a volume of 270 Å$^3$ or more, and still more preferably a compound which generates an acid (more preferably sulfonic acid) having a volume of 400 Å$^3$ or more. Meanwhile, from the viewpoint of a sensitivity or the solubility of a coating solvent, the volume is preferably 2,000 Å$^3$ or less, and more preferably 1,500 Å$^3$ or less. A value of the volume is obtained using "WinMOPAC" manufactured by FUJITSU. That is, a chemical structure of an acid according to each example is input, and then the most stable conformation of each acid is determined through a molecular field calculation using a MM3 method with the input chemical structure as an initial structure. Next, a molecular orbital calculation is carried out on the most stable conformation using a PM3 method, and as a result, "accessible volume" of each acid can be calculated.

In the present invention, the photoacid generators that generate an acid exemplified below upon irradiation with actinic rays or radiation are preferable. In some of the examples, calculated values of the volume are shown together (unit: Å$^3$). Further, the values as calculated herein are each a value of the volume of an acid in which a proton is bonded to the anion portion.

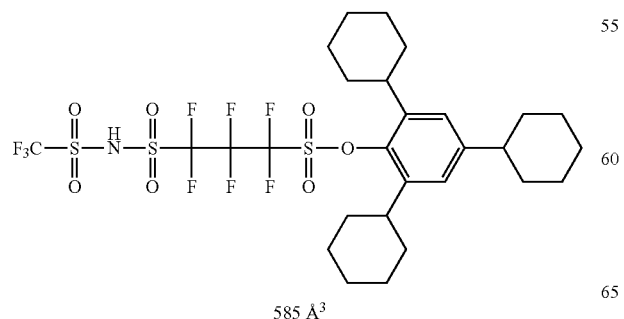

585 Å$^3$

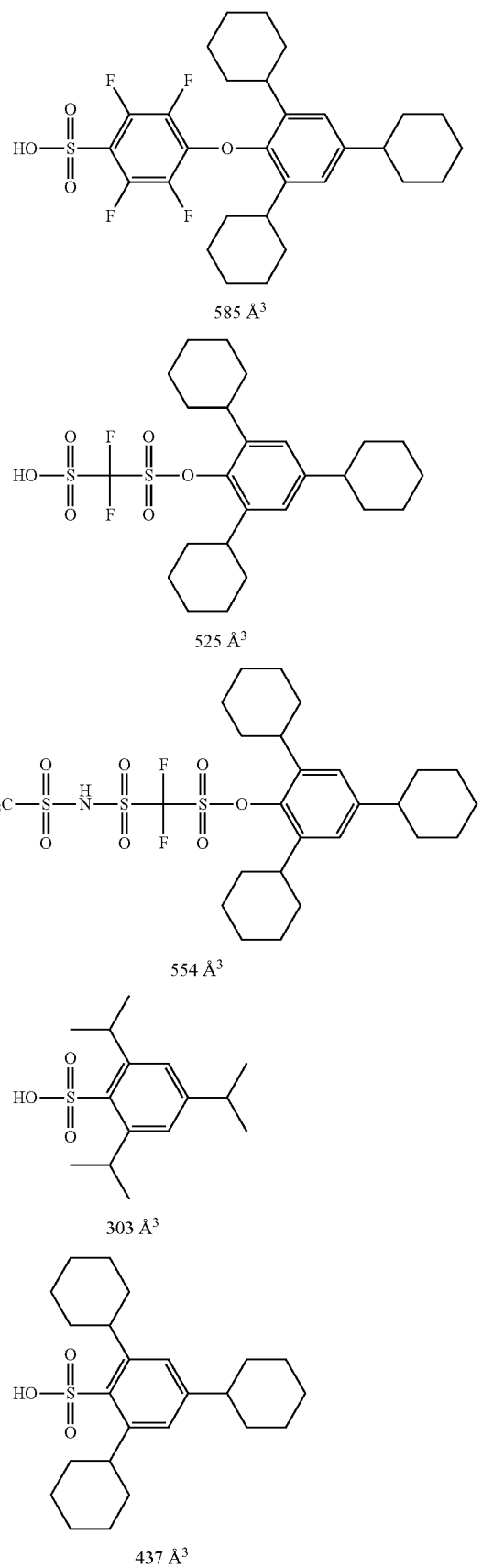

585 Å$^3$

525 Å$^3$

554 Å$^3$

303 Å$^3$

437 Å$^3$

101
-continued
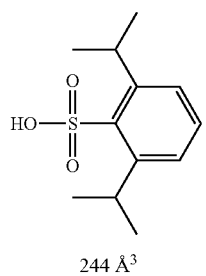
244 Å³
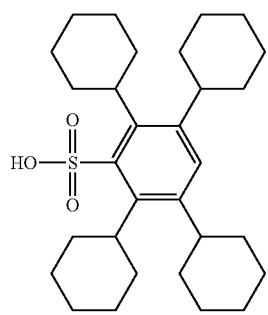
529 Å³
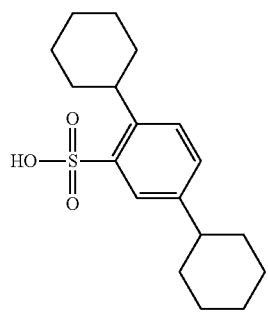
336 Å³
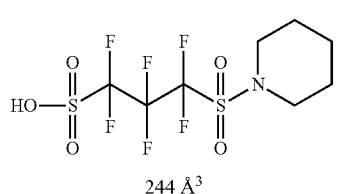
244 Å³
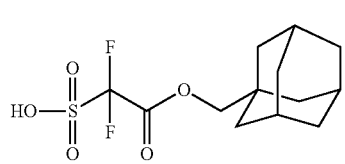
271 Å³
102
-continued
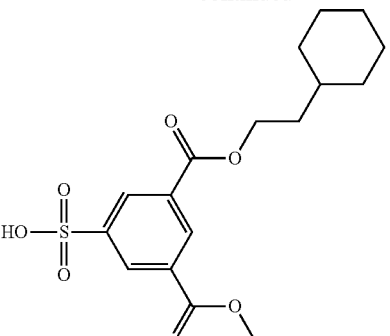
457 Å³
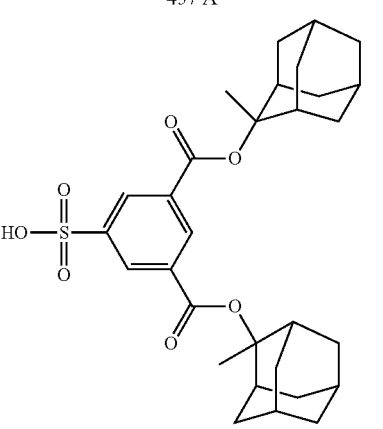
511 Å³
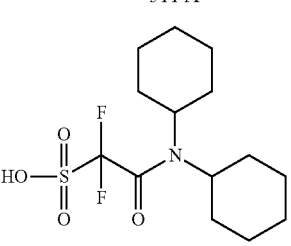
311 Å³      280 Å³
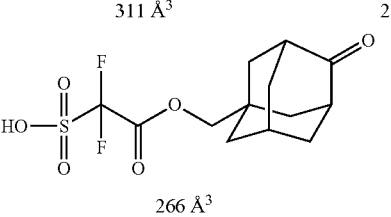
266 Å³
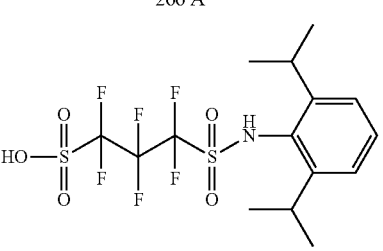
339 Å³

103
-continued
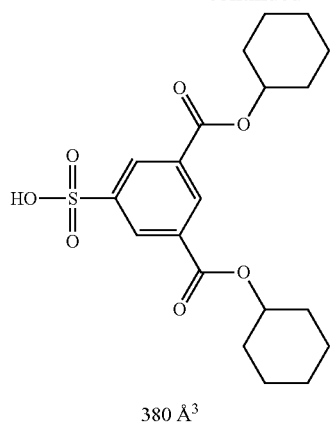
380 Å³
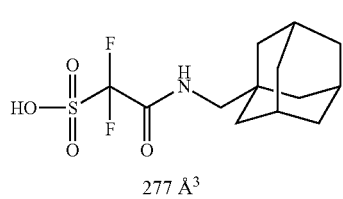
277 Å³
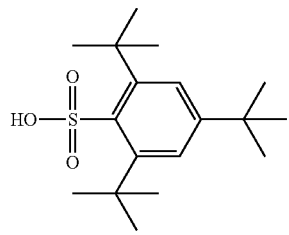
357 Å³
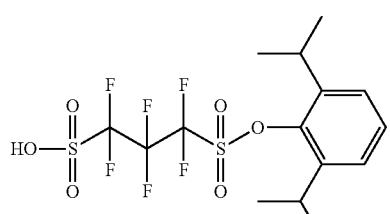
347 Å³
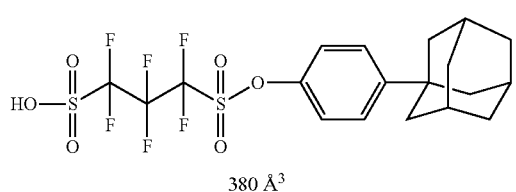
380 Å³
104
-continued
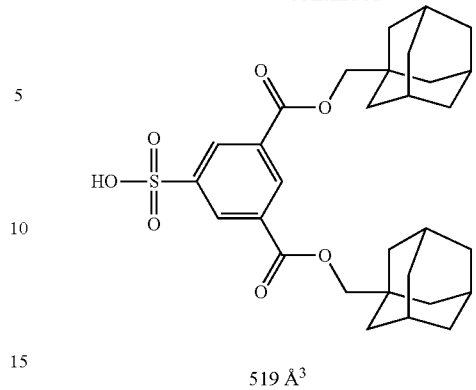
519 Å³
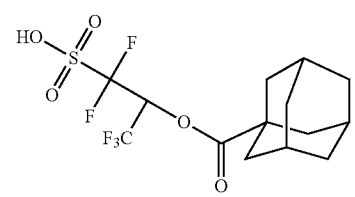
291 Å³
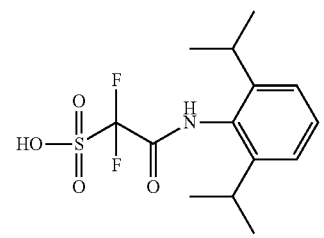
297 Å³
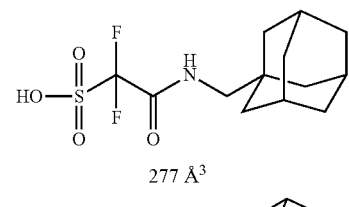
277 Å³
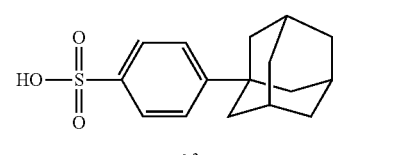
281 Å³
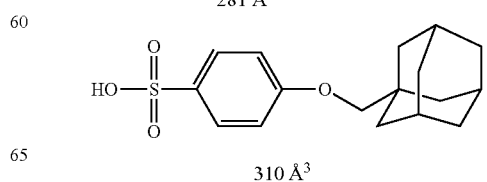
310 Å³

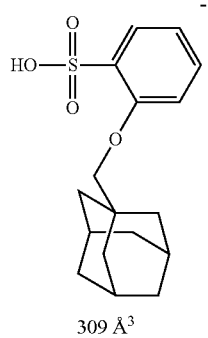
309 Å³
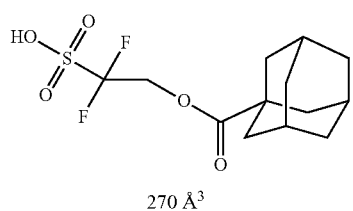
270 Å³
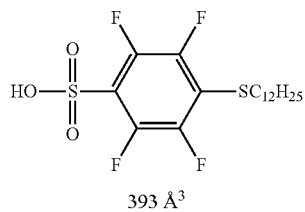
393 Å³
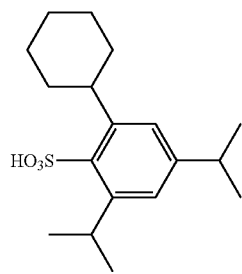
350 Å³
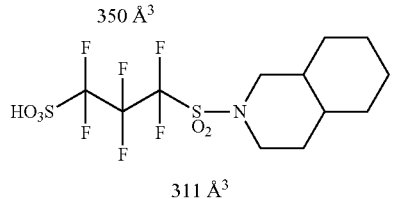
311 Å³
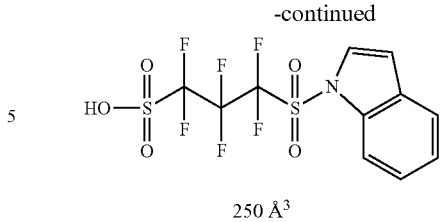
250 Å³
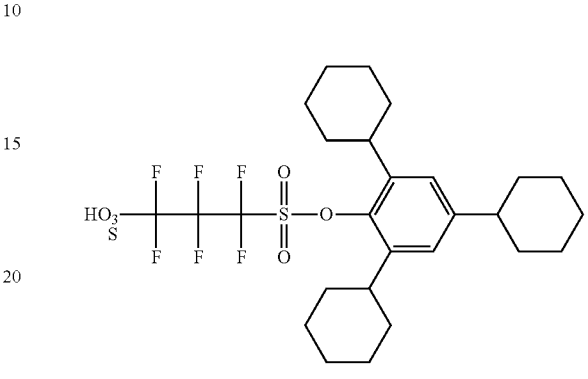
535 Å³
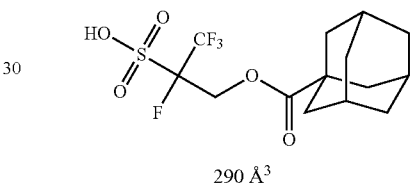
290 Å³
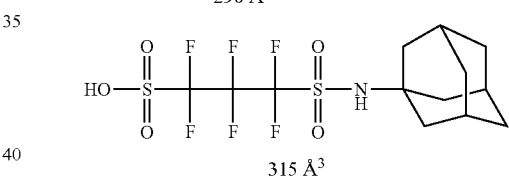
315 Å³
With regard to the photoacid generator, reference can be made to paragraphs [0368] to [0377] of JP2014-041328A and paragraphs [0240] to [0262] of JP2013-228681A ([0339] of the corresponding US2015/0004533A), the contents of which are incorporated herein by reference. In addition, specific preferred examples of the photoacid generator include, but are not limited to, the following compounds.
(z1)
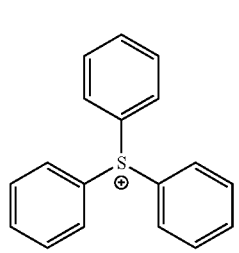 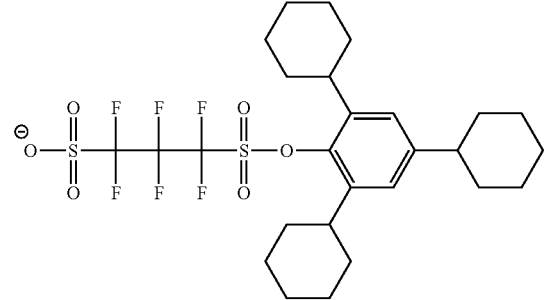

-continued
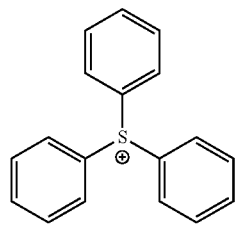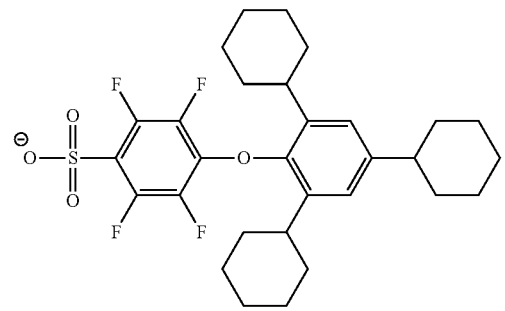
(z2)
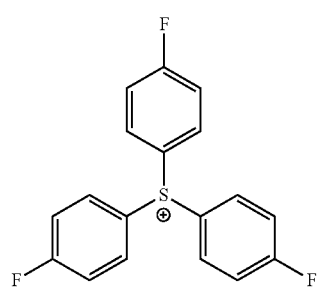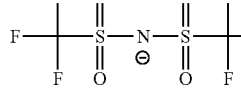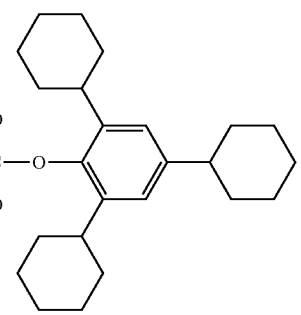
(z3)
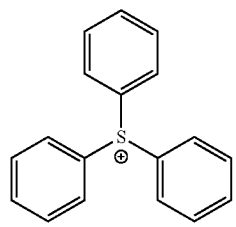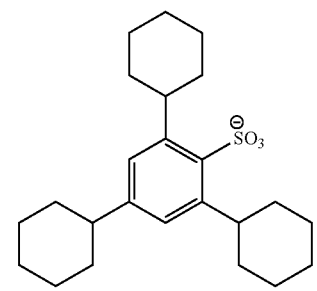
(z4)
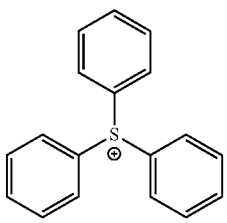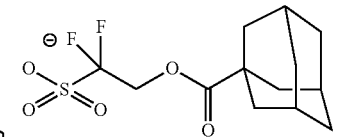
(z5)
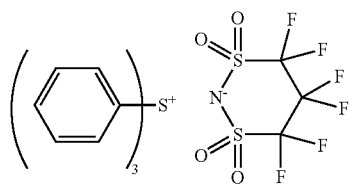
(z6)
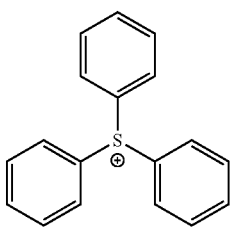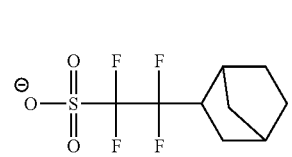
(z7)
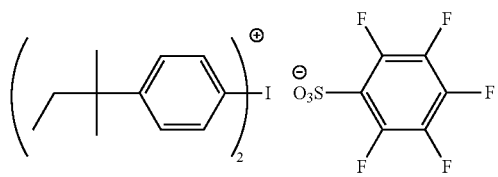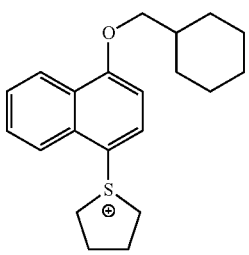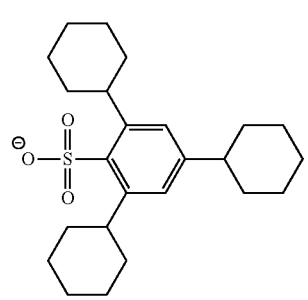
(z8)
(z9)
(z10)
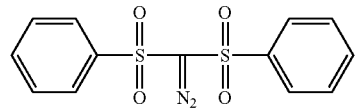

-continued
(z11)
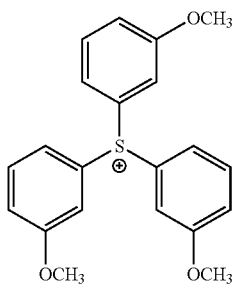 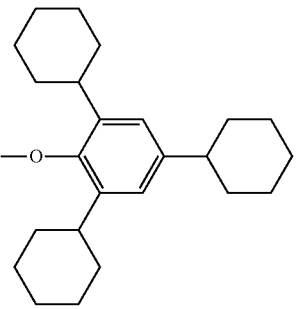
(z12)
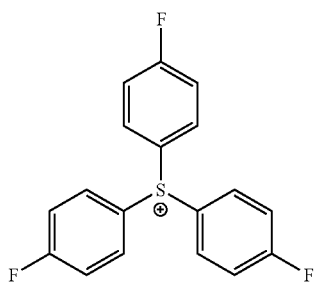 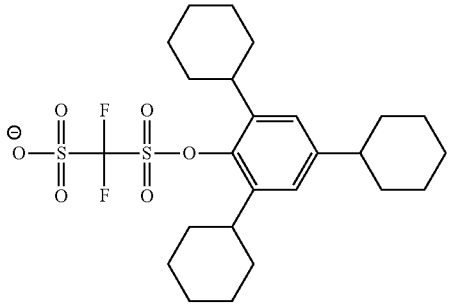
(z13) (z14)
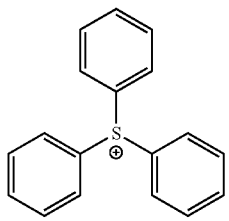 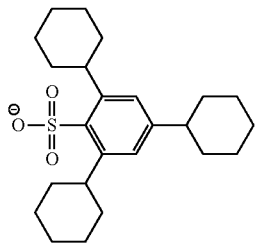
(z15) (z16)
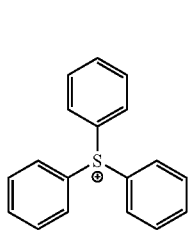 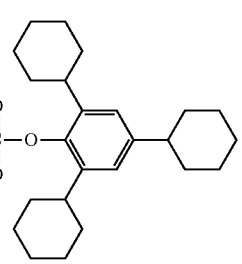
(z17)
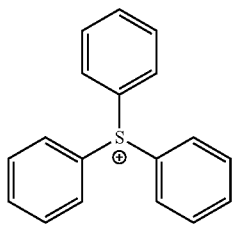
(z18)
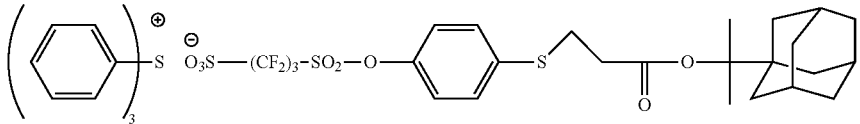

-continued
(z19)
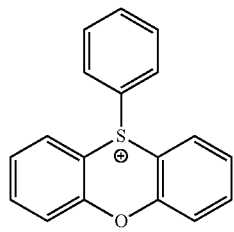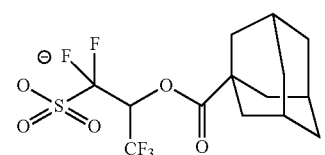
(z20)
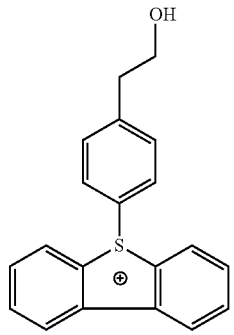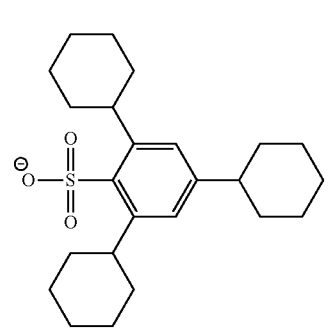
(z21)
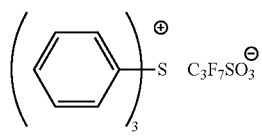
(z22)
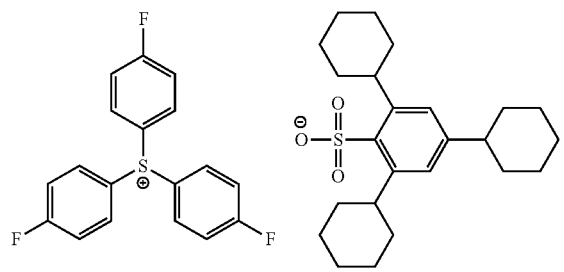
(z23)
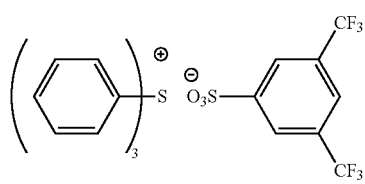
(z24)
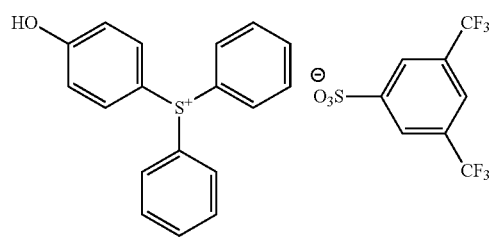
(z25)
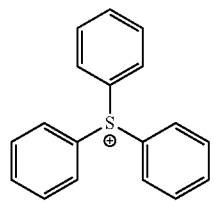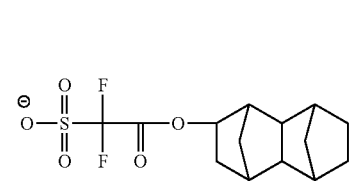
(z26)
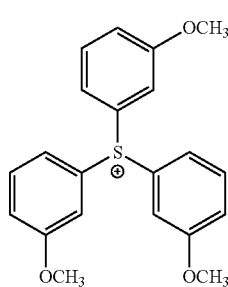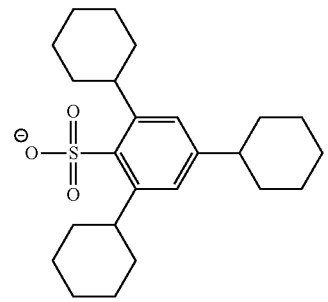
(z27)
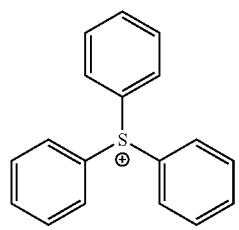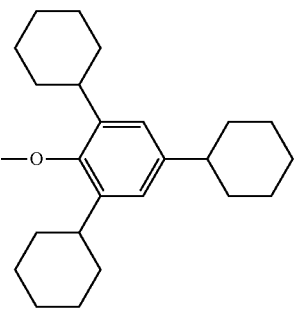

-continued
(z28)
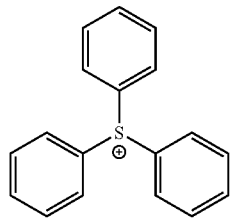
(z29)
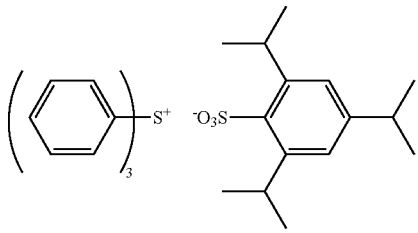
B-1
(z30)
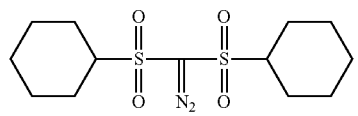
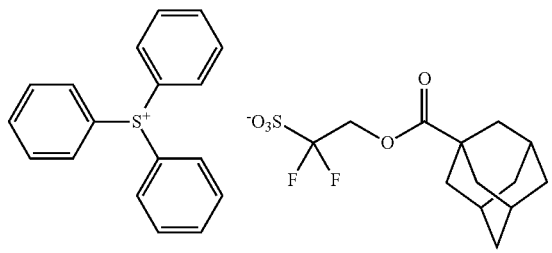
B-2
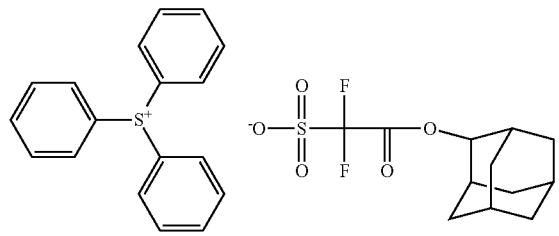
B-3
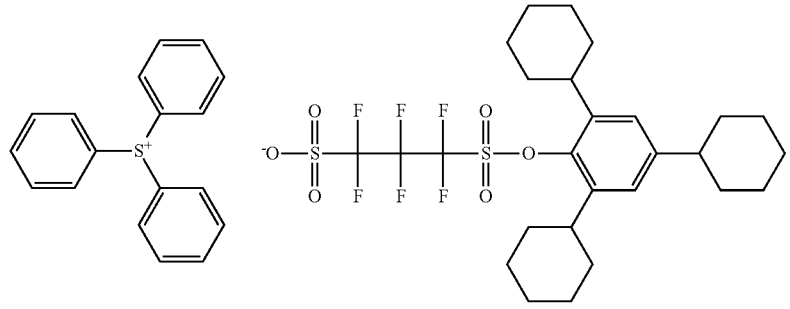
B-4
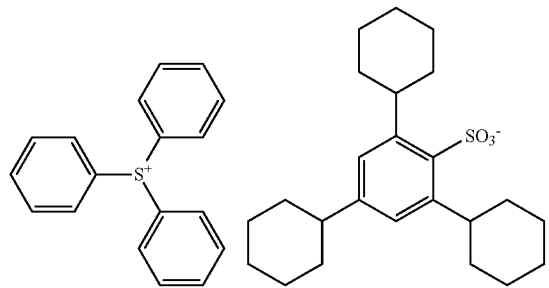
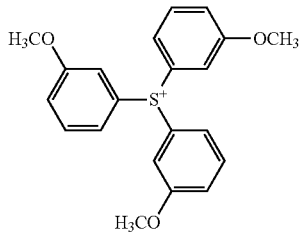
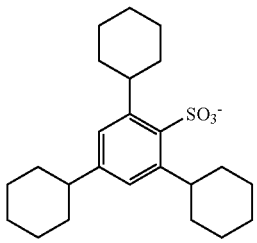
B-5
B-6
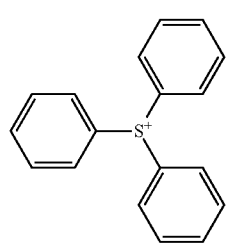
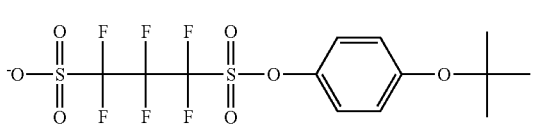

-continued

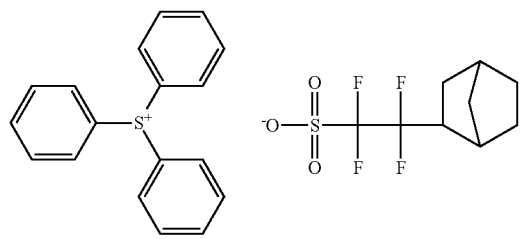
B-7

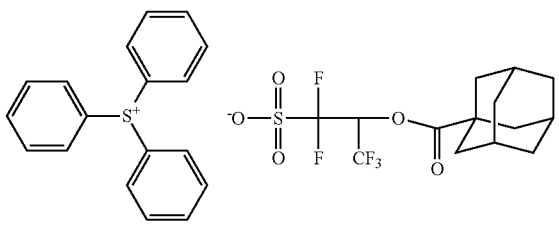
B-8

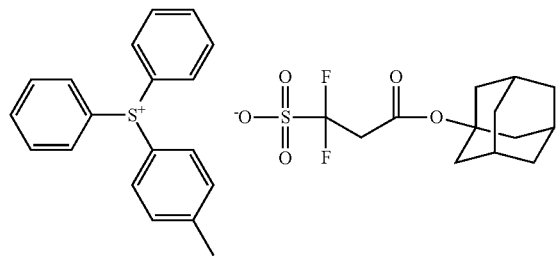
B-9

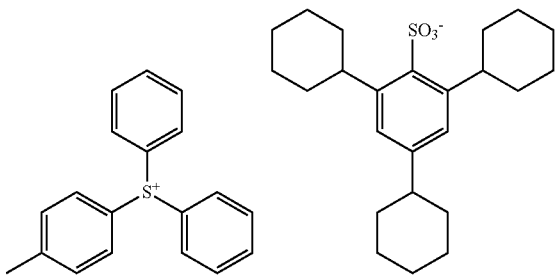
B-10

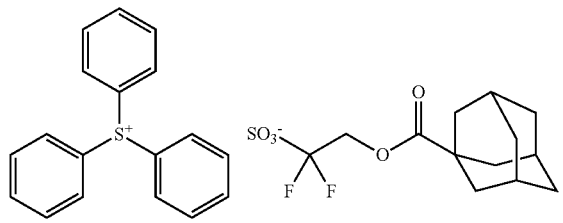
B-11

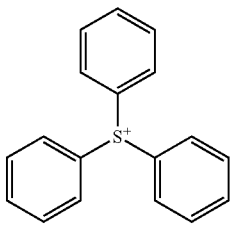

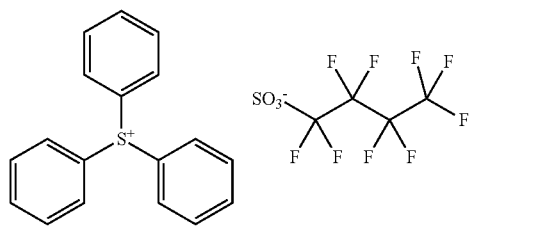
B-12

B-13

The photoacid generator may be used alone or in combination of two or more kinds thereof.

The content of the photoacid generator in the actinic ray-sensitive or radiation-sensitive resin composition is preferably 0.1% to 50% by mass, more preferably 5% to 50% by mass, and still more preferably 8% to 40% by mass with respect to the total solid content of the composition. In particular, in order to simultaneously realize high sensitivity and high resolution upon irradiation of electron beams or extreme ultraviolet rays, the content of the photoacid generator is preferably high, particularly preferably 10% to 40% by mass, and most preferably 10% to 35% by mass.

(C) Solvent

In order to dissolve the respective components to prepare the actinic ray-sensitive or radiation-sensitive resin composition, a solvent can be used. Examples of the usable solvent include alkylene glycol monoalkyl ether carboxylate, alkylene glycol monoalkyl ether, alkyl lactate, alkyl alkoxy propionate, cyclic lactone having 4 to 10 carbon atoms, a monoketone compound having 4 to 10 carbon atoms, which may include a ring, alkylene carbonate, alkyl alkoxy acetate, and alkyl pyruvate, As the alkylene glycol monoalkyl ether carboxylate, for example, propylene glycol monomethyl ether acetate, propylene glycol monoethyl ether acetate, propylene monoglycol propyl ether acetate, propylene glycol monobutyl ether acetate, propylene glycol monomethyl ether propionate, propylene glycol monoethyl ether propionate, ethylene glycol monomethyl ether acetate, or ethylene glycol monoethyl ether acetate is preferable.

As the alkylene glycol monoalkyl ether, for example, propylene glycol monomethyl ether, propylene glycol monoethyl ether, propylene glycol monopropyl ether, propylene glycol monobutyl ether, ethylene glycol monomethyl ether, or ethylene glycol monoethyl ether is preferable.

As the alkyl lactate, for example, methyl lactate, ethyl lactate, propyl lactate, or butyl lactate is preferable.

As the alkyl alkoxy propionate, for example, 3-ethyl ethoxypropionate, 3-methyl methoxypropionate, 3-methyl ethoxypropionate, or ethyl 3-methoxypropionate is preferable.

As the cyclic lactone having 4 to 10 carbon atoms, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone, or α-hydroxy-γ-butyrolactone is preferable.

As the monoketone compound having 4 to 10 carbon atoms, which may contain a ring, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methyl cyclopentanone, 2,2-dimethylcyclopentanone, 2,4,4-trimethylcyclopentanone, cyclohexanone, 3-methylcyclohexanone, 4-methyl cyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, or 3-methylcycloheptanone is preferable.

As the alkylene carbonate, for example, propylene carbonate, vinylene carbonate, ethylene carbonate, or butylene carbonate is preferable.

As the alkyl alkoxyacetate, for example, 2-methoxyethyl acetate, 2-ethoxyethyl acetate, 2-(2-ethoxyethoxy)ethyl acetate, 3-methoxy-3-methylbutyl acetate, or 1-methoxy-2-propyl acetate is preferable.

As the alkyl pyruvate, for example, methyl pyruvate, ethyl pyruvate, or propyl pyruvate is preferable.

As the solvent, a solvent having a boiling point of 130° C. or more at a normal temperature under a normal pressure is preferable. Specific examples of the solvent include cyclopentanone, γ-butyrolactone, cyclohexanone, ethyl lactate, ethylene glycol monoethyl ether acetate, propylene glycol monomethyl ether acetate, 3-ethyl ethoxypropionate, ethyl pyruvate, 2-ethoxyethyl acetate, 2-(2-ethoxyethoxy)ethyl acetate, and propylene carbonate.

In the present invention, the solvents may be used alone or in combination of two or more kinds thereof.

In the present invention, as the organic solvent, a mixed solvent in which a solvent containing a hydroxyl group in a structure is mixed with a solvent containing no hydroxyl group may be used.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether or ethyl lactate is preferable.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide, and among these, propylene glycol monomethyl ether acetate, ethyl ethoxypropionate, 2-heptanone, γ-butyrolactone, cyclohexanone, or butyl acetate is preferable, and propylene glycol monomethyl ether acetate, ethyl ethoxypropionate, or 2-heptanone is more preferable.

A mixing ratio (mass ratio) of, the solvent containing a hydroxyl group to the solvent containing no hydroxyl group is preferably 1/99 to 99/1, more preferably 10/90 to 90/10, and still more preferably 20/80 to 60/40 by mass. A mixed solvent containing 50% by mass or more of the solvent containing no hydroxyl group is particularly preferable from the viewpoint of coating uniformity.

It is preferable that the solvent is a mixed solvent containing two or more propylene glycol monomethyl ether acetates.

As the solvent, for example, the solvents described in paragraphs 0013 to 0029 of JP2014-219664A can also be used.

(E) Basic Compound

In order to reduce a change in performance with the lapse of time from exposure to heating, the actinic ray-sensitive or radiation-sensitive resin composition may have a basic compound (E).

As the basic compound, compounds having structures represented by Formulae (A) to (E) are preferable.

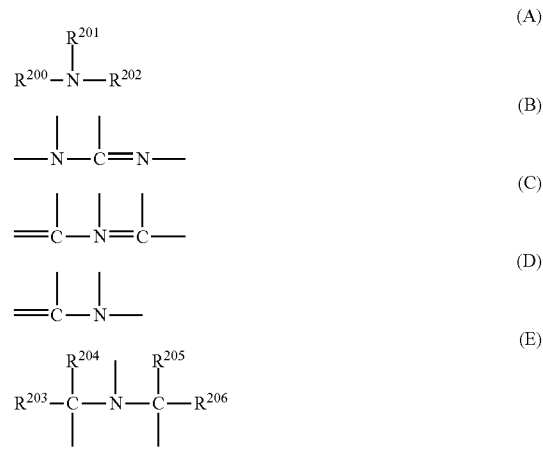

In General Formulae (A) and (E), $R^{200}$, $R^{201}$, and $R^{202}$ may be the same as or different from each other and each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). Here, $R^{201}$ and $R^{202}$ may be bonded to each other to form a ring.

Examples of the alkyl group include an alkyl group having a substituent, and for example, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other and each independently represent an alkyl group having 1 to 20 carbon atoms.

It is more preferable that the alkyl group in General Formulae (A) and (E) is unsubstituted.

Preferred examples of the compound include guanidine, aminopyrrolidine, pyrazole, pyrazoline, piperazine, aminomorpholine, aminoalkylmorpholine, and piperidine, and more preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole.

Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene.

Examples of the compound having an onium hydroxide structure include triarylsulfonium hydroxide, phenacyl sulfonium hydroxide, and sulfonium hydroxide having a 2-oxoalkyl group, and specific examples thereof include triphenylsulfonium hydroxide, tris(t-butylphenyl)sulfonium hydroxide, bis(t-butylphenyl)iodonium hydroxide, phenacyl thiophenium hydroxide, and 2-oxopropylthiophenium hydroxide.

The compound having an onium carboxylate structure is a compound obtained by carboxylation of the anionic moiety of a compound having an onium hydroxide structure, and examples thereof include acetate, adamantane-1-carboxylate, and perfluoroalkyl carboxylate.

Examples of the compound having a trialkylamine structure include tri-(n-butyl)amine and tri-(n-octyl)amine.

Examples of the compound having an aniline structure include 2,6-diisopropylaniline, N,N-dimethylaniline, N,N-dibutylaniline, and N,N-dihexylaniline.

Examples of the alkylamine derivative having a hydroxyl group and/or an ether bond include ethanolamine, diethanolamine, triethanolamine, and tris(methoxyethoxyethyl)amine.

Examples of the aniline derivative having a hydroxyl group and/or an ether bond include N,N-bis(hydroxyethyl)aniline.

As the basic compound, an amine compound having a phenoxy group or an ammonium salt compound having a phenoxy group is also preferable.

Examples of the amine compound include primary, secondary, and tertiary amine compounds, and the amine compound is preferably an amine compound in which at least one alkyl group is bonded to a nitrogen atom. The amine compound is more preferably a tertiary amine compound. In the amine compound, as long as at least one alkyl group (preferably having 1 to 20 carbon atoms) is bonded to a nitrogen atom, a cycloalkyl group (preferably having 3 to 20 carbon atoms) or an aryl group (preferably 6 to 12 carbon atoms), in addition to the alkyl group, may be bonded to a nitrogen atom.

In addition, it is preferable that the amine compound has an oxygen atom at an alkyl chain to form an oxyalkylene group. The number of oxyalkylene groups in a molecule is preferably 1 or more, more preferably 3 to 9, and still more preferably 4 to 6. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

Examples of the ammonium salt compound include primary, secondary, tertiary, and quaternary ammonium salt compounds, and the ammonium salt compound is preferably an ammonium salt compound in which at least one alkyl group is bonded to a nitrogen atom. In the ammonium salt compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the ammonium salt compound has an oxyalkylene group. The number of the oxyalkylene groups is preferably 1 or more, more preferably 3 to 9, and still more preferably 4 to 6 in a molecule. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

Examples of an anion of the ammonium salt compound include a halogen atom, a sulfonate, a borate, and a phosphate, and among these, a halogen atom or a sulfonate is preferable. As the halogen atom, a chloride, a bromide, or an iodide is preferable. As the sulfonate, an organic sulfonate having 1 to 20 carbon atoms is preferable. Examples of the organic sulfonate include an alkyl sulfonate having 1 to 20 carbon atoms and an aryl sulfonate. The alkyl group of the alkyl sulfonate may have a substituent, and examples of the substituent include fluorine, chlorine, bromine, an alkoxy group, an acyl group, and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group of the aryl sulfonate include a benzene ring, a naphthalene ring, and an anthracene ring. The benzene ring, the naphthalene ring, and the anthracene ring may have a substituent. As the substituent, a linear or branched alkyl group having 1 to 6 carbon atoms or a cycloalkyl group having 3 to 6 carbon atoms is preferable. Specific examples of the linear or branched alkyl group and the cycloalkyl group include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

Examples of the amine compound having a phenoxy group and the ammonium salt compound having a phenoxy group include a compound having a phenoxy group at a terminal on the side opposite to the nitrogen atom of the alkyl group of the amine compound or the ammonium salt compound. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group. The substitution position of the substituent may be any one of the 2- to 6-positions. The number of substituents is any number in the range of 1 to 5.

It is preferable that at least one oxyalkylene group is included between the phenoxy group and the nitrogen atom. The number of oxyalkylene groups is preferably 1 or more, more preferably 3 to 9, and still more preferably 4 to 6 in a molecule. Among the oxyalkylene groups, an oxyethylene group ($-CH_2CH_2O-$) or an oxypropylene group ($-CH(CH_3)CH_2O-$ or $-CH_2CH_2CH_2O-$) is preferable, and the oxyethylene group is more preferable.

The amine compound having a phenoxy group can be obtained by heating a primary or secondary amine having a phenoxy group and a haloalkyl ether to react with each other, adding an aqueous solution of a strong base (for example, sodium hydroxide, potassium hydroxide, and tetraalkylammonium) to the obtained reaction product, and carrying out extraction with an organic solvent (for example, ethyl acetate and chloroform). Alternatively, the amine compound having a phenoxy group can be obtained by heating a primary or secondary amine and haloalkyl ether having a phenoxy group at a terminal to react with each other, adding an aqueous solution of a strong base (for example, sodium hydroxide, potassium hydroxide, and tetraalkylammonium) to the obtained reaction product, and carrying out extraction with an organic solvent (for example, ethyl acetate and chloroform).

(Compound (PA) Having Proton-Accepting Functional Group, that Decomposes Upon Irradiation with Actinic Rays or Radiation to Generate Proton-Accepting Compound Exhibiting Deterioration in Proton-Accepting Properties, No Proton-Accepting Properties, or Change from Proton-Accepting Properties to Acidic Properties)

The composition according to the embodiment of the present invention may further include, as a basic compound, a compound [hereinafter also referred to as a "compound (PA)"] having a proton-accepting functional group, that decomposes upon irradiation with actinic rays or radiation to generate a compound exhibiting deterioration in proton-accepting properties, no proton-accepting properties, or a change from the proton-accepting properties to acidic properties.

The proton-accepting functional group means a functional group having a group or electron which is capable of electrostatically interacting with a proton, and is, for example, a functional group with a macrocyclic structure such as a cyclic polyether, or a functional group which has a nitrogen atom having an unshared electron pair not contributing to π-conjugation. The nitrogen atom having an unshared electron pair not contributing to π-conjugation is, for example, a nitrogen atom having a partial structure represented by the following general formula.

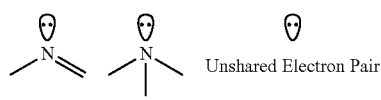

Unshared Electron Pair

Preferred examples of a partial structure of the proton-accepting functional group include a crown ether structure, an azacrown ether structure, primary to tertiary amine structures, a pyridine structure, an imidazole structure, and a pyrazine structure.

The compound (PA) decomposes upon irradiation with actinic rays or radiation to generate a compound exhibiting deterioration in proton-accepting properties, no proton-accepting properties, or a change from the proton-accepting properties to acidic properties. Here, deterioration in proton-accepting properties, no proton-accepting properties, or a change from the proton-accepting properties to acidic properties is a change in the proton accepting properties caused by adding a proton to the proton-accepting functional group, and specifically means a decrease in the equilibrium constant at chemical equilibrium in a case where a proton adduct is generated using the compound (PA) having a proton-accepting functional group and a proton.

Specific examples of the compound (PA) include the following compounds. Further, specific examples of the compound (PA) include compounds described in paragraphs 0421 to 0428 of JP2014-041328A and paragraphs 0108 to 0116 of JP2014-134686A, the contents of which are incorporated herein by reference.

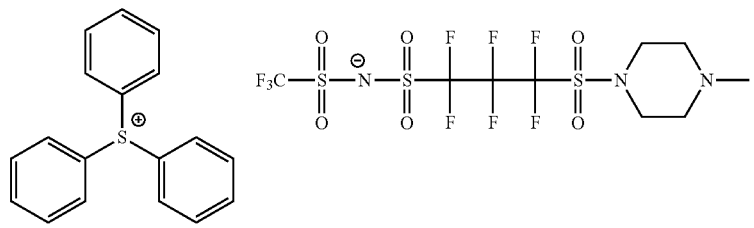

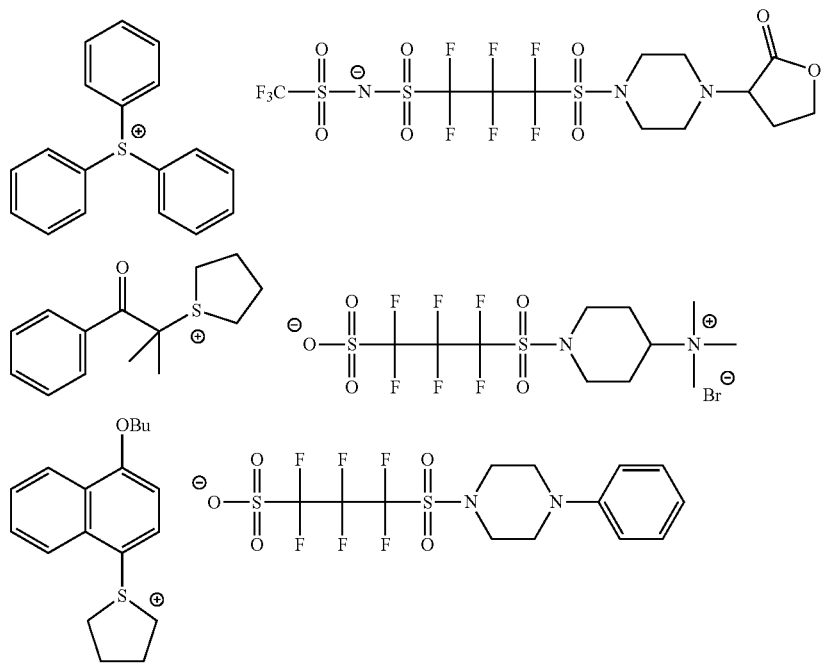

-continued
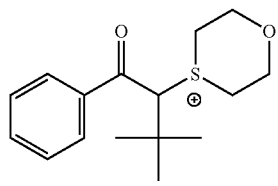
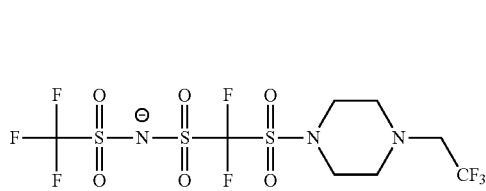
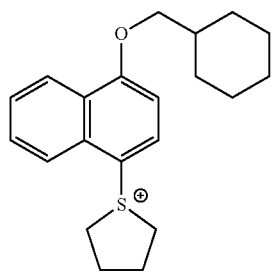
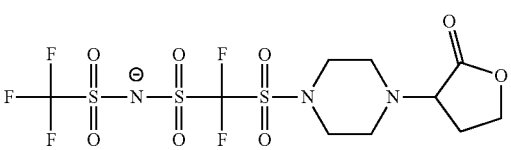
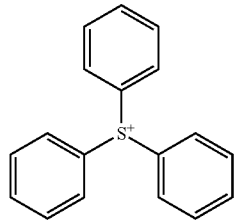
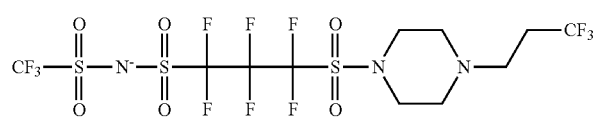
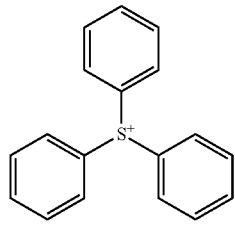
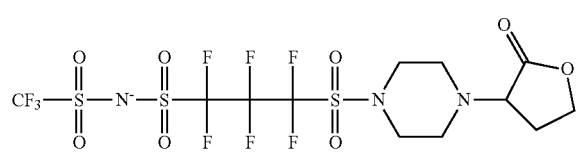
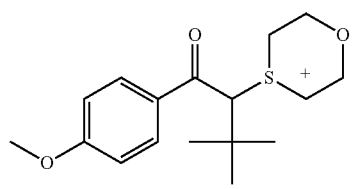
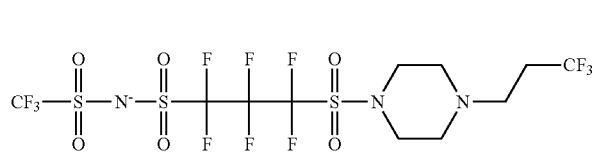
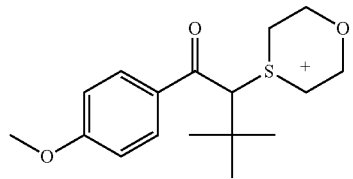
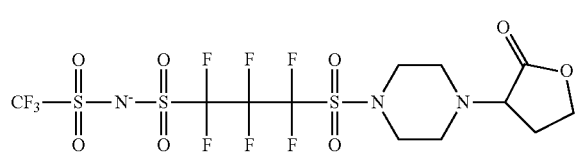
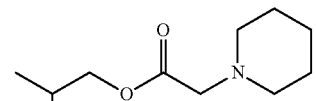
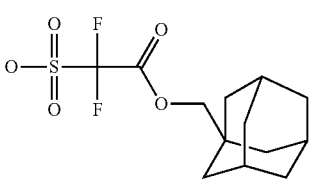

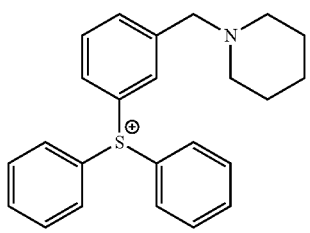
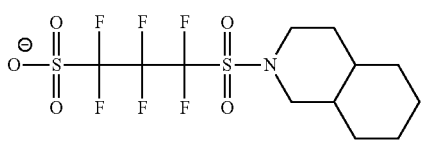

The basic compounds may be used alone or in combination of two or more kinds thereof.

The amount of the basic compound used is usually 0.001% to 10% by mass, and preferably 0.01% to 5% by mass, with respect to the solid content of the actinic ray-sensitive or radiation-sensitive resin composition.

It is preferable that a ratio (molar ratio; photoacid generator/basic compound) of the photoacid generator used to the basic compound used in the composition is 2.5 to 300. That is, the molar ratio is preferably 2.5 or more from the viewpoints of sensitivity and resolution, and is preferably 300 or less from the viewpoint of suppressing deterioration in resolution caused by thickening of a resist pattern with the lapse of time until a heating treatment after exposure. The photoacid generator/basic compound (molar ratio) is more preferably 5.0 to 200 and still more preferably 7.0 to 150.

Examples of the basic compound include the compounds (for example, an amine compound, an amido group-containing compound, a urea compound, and a nitrogen-containing heterocyclic compound) described in paragraphs 0140 to 0144 of JP2013-011833A.

(A') Hydrophobic Resin

The actinic ray-sensitive or radiation-sensitive resin composition may include a hydrophobic resin (A'), in addition to the resin (A).

It is preferable that the hydrophobic resin is designed to be localized on a surface of a resist film. Unlike the surfactant, the hydrophobic resin does not necessarily have a hydrophilic group in a molecule and does not necessarily contribute to uniform mixing with a polar/non-polar material.

Examples of an effect obtained by the addition of the hydrophobic resin include an effect of suppressing a static/dynamic contact angle of a resist film surface with respect to water and an effect of suppressing out gas.

From the viewpoint of localization on the film surface layer, the hydrophobic resin includes preferably one or more kinds and more preferably two or more kinds among "a fluorine atom", "a silicon atom", and "a CH$_3$ partial structure included in a side chain of the resin". In addition, it is preferable that the hydrophobic resin includes a hydrocarbon group having 5 or more carbon atoms. These groups may be present at the main chain or a side chain of the resin.

In a case where the hydrophobic resin includes a fluorine atom and/or a silicon atom, the fluorine atom and/or the silicon atom in the hydrophobic resin may be included in the main chain or a side chain of the resin.

In a case where the hydrophobic resin includes a fluorine atom, it is preferable that the hydrophobic resin is a resin having an alkyl group having a fluorine atom, a cycloalkyl group having a fluorine atom, or an aryl group having a fluorine atom as the partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

Examples of the aryl group having a fluorine atom include an aryl group, such as a phenyl group and a naphthyl group, in which at least one hydrogen atom is substituted with a fluorine atom, and may further have a substituent other than a fluorine atom.

Examples of the repeating unit having a fluorine atom or a silicon atom include those exemplified in paragraph 0519 of US2012/0251948A1.

Moreover, it is also preferable that the hydrophobic resin includes a CH$_3$ partial structure in a side chain moiety as described above.

Here, examples of the CH$_3$ partial structure contained in a side chain moiety of the hydrophobic resin include a CH$_3$ partial structure such as an ethyl group or a propyl group.

On the other hand, a methyl group (for example, an α-methyl group of a repeating unit having a methacrylic acid structure) which is directly bonded to a main chain of the hydrophobic resin has little contribution to the surface localization of the hydrophobic resin caused by the effect of the main chain, and thus is not included in examples of the CH$_3$ partial structure according to the present invention.

With regard to the hydrophobic resin, reference can be made to the descriptions in paragraphs [0348] to [0415] of JP2014-010245A, the contents of which are incorporated herein by reference.

In addition, as the hydrophobic resin, those described in JP2011-248019A, JP2010-175859A, and JP2012-032544A are also preferable.

(F) Surfactant

The actinic ray-sensitive or radiation-sensitive resin composition may further include a surfactant (F). By incorporation of the surfactant, in a case where an exposure light source having a wavelength of 250 nm or shorter, in particular, 220 nm or shorter is used, a pattern having adhesiveness and reduced development defects can be formed with high sensitivity and resolution.

As the surfactant, a fluorine-based surfactant and/or a silicon-based surfactant is preferable.

Examples of the fluorine-based surfactant and/or the silicon-based surfactant include the surfactants described in [0276] of US2008/0248425A. In addition, other examples of the surfactant include F-TOP EF301 or EF303 (manufactured by Shin Akita Chemical Co., Ltd.); FLUORAD FC430, 431, or 4430 (manufactured by Sumitomo 3M Ltd.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); F-TOP EF121, EF122A, EF122B, RF122C, EF125M, EF135M, EF351, EF352, EF801, EF802, or EF601 (manufactured by Gemco Inc.); PF636, PF656, PF6320, or PF6520 (manufactured by OMNOVA Corp.); and FTX-204G, 208G, 218G, 230G, 204D, 208D, 212D, 218D, or 222D (manufactured by Neos Co., Ltd.). Other examples of the silicon-based surfactant include Polysiloxane Polymer KP-341 (manufactured by Shin-Etsu Chemical Co., Ltd.).

In addition, in addition to the known surfactants as shown above, a surfactant may be synthesized using a fluoro aliphatic compound manufactured using a telomerization method (also referred to as a telomer method) or an oligomerization method (also referred to as an oligomer method). Specifically, a polymer including a fluoro aliphatic group derived from fluoro aliphatic compound may be used as the surfactant. This fluoro aliphatic compound can be synthesized, for example, by the method described in JP2002-090991A.

In addition, a surfactant other than the fluorine-based surfactant and/or the silicon-based surfactant described in [0280] of US2008/0248425A may be used.

These surfactants may be used alone or in combination of two or more kinds thereof.

In a case where the actinic ray-sensitive or radiation-sensitive resin composition includes the surfactant, the content of the surfactant is preferably 0% to 2% by mass, more preferably 0.0001% to 2% by mass, and still more preferably 0.0005% to 1% by mass, with respect to the total solid content of the composition.

(G) Other Additives

The actinic ray-sensitive or radiation-sensitive resin composition may further include a dissolution inhibiting compound, a dye, a plasticizer, a photosensitizer, a light absorber, and/or a compound for promoting solubility in the developer (for example, a phenol compound having a molecular weight of 1,000 or less, or an aliphatic or alicyclic compound having a carboxy group).

The actinic ray-sensitive or radiation-sensitive resin composition may further include a dissolution inhibiting compound.

Here, the "dissolution inhibiting compound" is a compound having a molecular weight of 3,000 or less, which decomposes by the action of an acid such that the solubility in the organic developer decreases.

[Upper Layer Film (Topcoat Film)]

In the pattern forming method of the embodiment of the present invention, an upper layer film (topcoat film) may be formed on the upper layer of the resist film.

It is preferable that the upper layer film is not mixed with the resist film, and can be uniformly applied onto the upper layer of the resist film.

The upper layer film is not particularly limited, and upper layer films known in the related art can be formed by the methods known in the related art, and the upper layer film can be formed in accordance with, for example, the description in paragraphs 0072 to 0082 of JP2014-059543A. As a material for forming the upper layer film, a hydrophobic resin or the like can also be used, in addition to the polymers described in paragraph 0072 of JP2014-059543A. As the hydrophobic resin, for example, the above-mentioned hydrophobic resin (A') can be used.

In a case where a developer containing an organic solvent is used in the developing step, it is preferable that an upper layer film containing a basic compound as described in JP2013-061648A, for example, is formed on the resist film. Specific examples of the basic compound which can be included in the upper layer film include the above-mentioned basic compound (E).

Furthermore, the upper layer film preferably includes a compound at least one of a group or bond selected from the group consisting of an ether bond, a thioether bond, a hydroxyl group, a thiol group, a carbonyl bond, and an ester bond.

In addition, the upper layer film may include a photoacid generator. Examples of the photoacid generator include the same ones as the photoacid generator (for example, the above-mentioned photoacid generator (B)) which can be included in the actinic ray-sensitive or radiation-sensitive resin composition.

Hereinafter, a resin which is preferably used in the upper layer film (topcoat film) will be described.

(Resin)

It is preferable that the composition for forming an upper layer film contains a resin. Examples of the resin which can be contained in the composition for forming an upper layer film include, but are not limited to, the same ones as for the hydrophobic resin (for example, the above-mentioned hydrophobic resin (A')) which can, be included in the actinic ray-sensitive or radiation-sensitive resin composition.

With regard to the hydrophobic resin, reference can be made to the descriptions in [0017] to [0023] of JP2013-061647A ([0017] to [0023] of the corresponding US2013/0244438A), and [0016] to [0165] of JP2014-056194A, the contents of which is incorporated herein by reference.

In the present invention, it is preferable that the composition for forming an upper layer film includes a resin containing a repeating unit having an aromatic ring. By the incorporation of the repeating unit having an aromatic ring, particularly upon irradiation with electron beams or EUV exposure, secondary electron-generating efficiency, and acid-generating efficiency from a compound that generates an acid by actinic rays or radiation increase, and thus effects of realizing high sensitivity and high resolution in the formation of a pattern can be expected.

The weight-average molecular weight of the resin is preferably 3,000 to 100,000, more preferably 3,000 to 30,000, and still more preferably 5,000 to 20,000. The blend amount of the resin in the composition for forming an upper layer film is preferably 50% to 99.9% by mass, more preferably 60% to 99.0% by mass, still more preferably 70% to 99.7% by mass, and particularly preferably 80% to 99.5% by mass, in the total solid content.

In a case where the compositions (topcoat compositions) for forming an upper layer film includes a plurality of resins, the composition preferably includes at least one resin (XA) having a fluorine atom and/or a silicon atom.

As for a preferred range of the content of the fluorine atom and the silicon atom included in the resin (XA), the content of the repeating unit including a fluorine atom and/or a silicon atom is preferably 10% to 100% by mole, more preferably 10% to 99% by mole, and still more preferably 20% to 80% by mole, with respect to all the repeating units in the resin (XA).

Furthermore, it is preferable that the composition for forming an upper layer film includes at least one kind of the resin (XA) having fluorine atoms and/or silicon atoms and a resin (XB) having a smaller content of the fluorine atoms and/or the silicon atoms than that of the resin (XA). Thus, in the formation of the upper layer film, the resin (XA) is unevenly distributed on the surface of the upper layer film, and therefore, it is possible to improve performance such as developing characteristics and immersion liquid tracking properties.

The content of the resin (XA) is preferably 0.01% to 30% by mass, more preferably 0.1% to 10% by mass, still more preferably 0.1% to 8% by mass, and particularly preferably 0.1% to 5% by mass, with respect to the total solid content included in the composition for forming an upper layer film.

The content of the resin (XB) is preferably 50.0% to 99.9% by mass, more preferably 60% to 99.9% by mass, still more preferably 70% to 99.9% by mass, and particularly preferably 80% to 99.9% by mass, with respect to the total solid content included in the composition for forming an upper layer film.

An aspect in which the resin (XB) does not substantially contain fluorine atoms and silicon atoms is preferable, and in this case, specifically, the total content of the repeating unit having a fluorine atom and the repeating unit having a silicon atom is preferably 0% to 20% by mole, more preferably 0% to 10% by mole, still more preferably 0% to 5% by mole, particularly preferably 0% to 3% by mole, and ideally 0% by mole, that is, containing neither a fluorine atom nor a silicon atom, with respect to all the repeating units in the resin (XB).

<Method for Preparing Composition for Forming Upper Layer Film (Topcoat Composition)>

It is preferable that the composition for forming an upper layer film is prepared by dissolving the respective components in a solvent, and filtered using a filter. A pore size of the filter is preferably 0.1 µm or less, more preferably 0.05 µm or less, and still more preferably 0.03 µm or less. Further, the filter is preferably a polytetrafluoroethylene-, polyethylene- or nylon-made filter. Incidentally, a plurality of kinds of the filters may be connected in series or in parallel, and used. In addition, the composition for forming an upper layer film may be filtered in plural times, and a step of filtering plural times may be a circulatory filtration step. Incidentally, the composition for forming an upper layer film may be subjected to a deaeration treatment before and after the filtration using a filter. It is preferable that the composition for forming an upper layer film does not include impurities such as a metal. The content of the metal components included in these materials is preferably 10 ppm or less, more preferably 5 ppm or less, and still more preferably 1 ppm or less, but the material not having substantially metal components (within a detection limit or less of a determination device) is particularly preferable.

In a case where the exposure is liquid immersion exposure in the above-mentioned <Exposing Step>, the upper layer film is arranged between the actinic ray-sensitive or radiation-sensitive film and the immersion liquid, and also functions as a layer which does not bring the actinic ray-sensitive or radiation-sensitive film into direct contact with the immersion liquid. In this case, preferred characteristics required for the upper layer film (composition for forming an upper layer film) are coating suitability onto the actinic ray-sensitive or radiation-sensitive film, radiation, transparency, particularly to light at 193 nm, and poor solubility in an immersion liquid (preferably water). Further, it is preferable that the upper layer film is not mixed with the actinic ray-sensitive or radiation-sensitive film, and can be uniformly applied onto the surface of the actinic ray-sensitive or radiation-sensitive film.

Moreover, in order to uniformly apply the composition for forming an upper layer film onto the surface of the actinic ray-sensitive or radiation-sensitive film while not dissolving the actinic ray-sensitive or radiation-sensitive film, it is preferable that the composition for forming an upper layer film contains a solvent in which the actinic ray-sensitive or radiation-sensitive film is not dissolved. It is more preferable to use a solvent of components other than a developer (organic developer) containing an organic solvent as the solvent in which the actinic ray-sensitive or radiation-sensitive film is not dissolved.

A method for applying the composition for forming an upper layer film is not particularly limited, and examples thereof include a spin coating method, a spray method, a roll coating method, and a dip method, which are known in the related art.

The thickness of the upper layer film is not particularly limited, but from the viewpoint of transparency to an exposure light source, it is usually 5 to 300 urn, preferably 10 to 300 nm, more preferably 20 to 200 nm, and still more preferably 30 to 100 nm.

After forming the upper layer film, the substrate is heated (PB), as desired.

From the viewpoint of resolution, it is preferable that the refractive index of the upper layer film is close to that of the actinic ray-sensitive or radiation-sensitive film.

The upper layer film is preferably insoluble in an immersion liquid, and more preferably insoluble in water.

With regard to the receding contact angle of the upper layer film, the receding contact angle (23° C.) of the immersion liquid with respect to the upper layer film is preferably 50° to 100°, and more preferably 80° to 100°, from the viewpoint of immersion liquid tracking properties.

In the liquid immersion exposure, in a view that the immersion liquid needs to move on a wafer following the movement of an exposure head that is scanning the wafer at a high speed and forming an exposure pattern, the contact angle of the immersion liquid with respect to the actinic ray-sensitive or radiation-sensitive film in a dynamic state is important, and in order to obtain better resist performance, it is preferable that the immersion liquid has a receding contact angle in the above range.

During the release of the upper layer film, an organic developer may be used, and another release agent may also be used. As the release agent, a solvent hardly permeating the actinic ray-sensitive or radiation-sensitive film is preferable. In a view that the release of the upper layer film can be carried out simultaneously with the development of the actinic ray-sensitive or radiation-sensitive film, the upper layer film is preferably releasable with an organic developer. The organic developer used for the release is not particularly limited as long as it makes it possible to dissolve and remove a less exposed area of the actinic ray-sensitive or radiation-sensitive film.

From the viewpoint of the release using an organic developer, the dissolution rate of the upper layer film in the organic developer is preferably 1 to 300 nm/sec, and more preferably 10 to 100 nm/sec.

Here, the dissolution rate of an upper layer film in the organic developer refers to a film thickness decreasing rate in a case where the upper layer film is exposed to a developer after film formation, and is a rate in a case where the upper layer film is immersed in butyl acetate at 23° C. in the present invention.

An effect of reducing development defects after developing an actinic ray-sensitive or radiation-sensitive film is accomplished by adjusting the dissolution rate of an upper layer film in the organic developer to 1 nm/sec or more, and preferably 10 nm/sec or more. Further, an effect that the line edge roughness of a pattern after the development of the actinic ray-sensitive or radiation-sensitive film becomes better is accomplished as an effect of reducing the exposure unevenness during liquid immersion exposure by setting the dissolution rate to 300 nm/sec or less, and preferably 100 run/sec.

The upper layer film may also be removed using other known developers (for example, an aqueous alkali solution). Specific examples of the usable aqueous alkali solution include an aqueous tetramethylammonium hydroxide solution.

[Allowable Content of Impurities]

It is preferable that various materials (for example, the treatment liquid (for example, the developer and the rinsing liquid) of the embodiment of the present invention, a resist solvent, a composition for forming an antireflection film, and a composition for forming an upper layer film) used in the actinic ray-sensitive or radiation-sensitive resin composition and the pattern forming method according to the embodiments of the present invention do not include impurities such as a metal, a metal salt including halogen, an acid, an alkali, a sulfur-containing compound, and a phosphorous-containing compound. The content of the impurities included in these materials is preferably 1 ppm or less, more preferably 1 ppb or less, still more preferably 100 ppt or less, and particularly preferably 10 ppt or less, but the material not having substantially metal components (within a detection limit or less of a determination device) is the most preferable.

Examples of a method for removing impurities such as a metal from the various materials include filtration using a filter. As for the filter pore diameter, the pore size is preferably 10 nm or less, more preferably 5 nm or less, and still more preferably 3 nm or less. As the materials of a filter, a polytetrafluoroethylene-, polyethylene-, or nylon-made filter is preferable. The filter may be formed of a composite material formed by combining this material with an ion exchange medium. As the filter, a filter which has been washed with an organic solvent in advance may be used. In the step of filtration using a filter, a plurality of kinds of filters may be connected in series or in parallel, and used. In a case of using a plurality of kinds of filters, a combination of filters having different pore diameters and/or materials may be used. In addition, various materials may be filtered plural times, and a step of filtering plural times may be a circulatory filtration step.

Moreover, examples of the method for reducing the impurities such as a metal included in the various materials include a method of selecting raw materials having a low content of metals as raw materials constituting various materials, a method of subjecting raw materials constituting various materials to filtration using a filter, and a method of carrying out distillation under the condition for suppressing the contamination as much as possible by, for example, lining the inside of a device with TEFLON (registered trademark). The preferred conditions for filtration using a filter, which is performed for raw materials constituting various materials, are the same as the above-described conditions.

The removal of impurities using an adsorbent may performed besides the filtration using a filter, or a combination of filtration using a filter and an adsorbent may be used. Examples of the adsorbent include known adsorbents, such as inorganic adsorbents such as silica gel and zeolite, and organic adsorbents such as activated carbon.

EXAMPLES

Hereinafter, the present invention will be specifically described with reference to Examples, but the present invention is not limited to the following Examples as long as it does not depart from the scope of the present invention. Unless otherwise specified, "parts" and "%" are given on the basis of mass.

Furthermore, for the treatment liquid (the treatment liquid described in each table) used in the developing treatment or the rinsing treatment in the following paragraphs, quantitative analysis of sulfur-containing compounds (measured by, for example, the method defined in JIS K2541-6:2013 "Determination of Sulfur Content (Ultraviolet Fluorescence Method)") and quantitative analysis of phosphorous compounds (measured by spectrophotometry in terms of a total of phosphorous, based on the method defined in JIS K 0102:2013), and as a result, it could be confirmed that these compounds had not been substantially included.

In addition, an expression "not substantially containing" as used herein means that none is detected in a case where the content (concentration) of these compounds is measured by a measurable method (less than a detection limit value).

1. EUV Exposure (Examples 1-1 to 1-104, Examples 1-110 to 120, and Comparative Examples 1-1 to 1-11)

Resin (A) and the Like (Synthesis Example 1) Synthesis of Resin (A-1)

600 g of cyclohexanone was put into a 2-L flask and purged with nitrogen for 1 hour at a flow rate of 100 mL/min. Thereafter, 4.60 g (0.02 mol) of a polymerization initiator V-601 (manufactured by Wako Pure Chemical Industries, Ltd.) was put into the flask and the flask was warmed until the internal temperature reached 80° C. Next, the following monomers and 4.60 g (0.02 mol) of the polymerization initiator V-601 (manufactured by Wako Pure Chemical Industries, Ltd.) were dissolved in 200 g of cyclohexanone to prepare a monomer solution. The monomer solution was added dropwise to the flask which had been heated to 80° C. for 6 hours. After completion of the dropwise addition, the obtained solution was further reacted at 80° C. for 2 hours.

4-Acetoxystyrene: 48.66 g (0.3 mol)

1-Ethylcyclopentyl methacrylate: 109.4 g (0.6 mol)

Monomer 1: 22.2 g (0.1 mol)

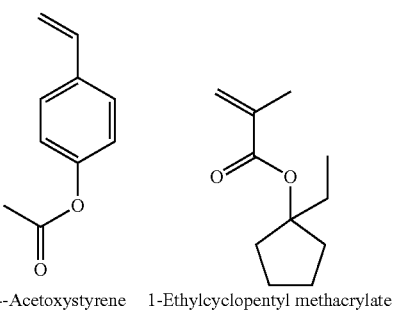

4-Acetoxystyrene 1-Ethylcyclopentyl methacrylate

-continued

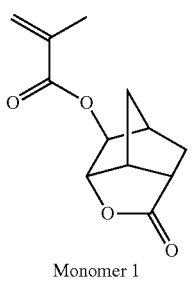

Monomer 1

The reaction solution was cooled to room temperature and added dropwise to 3 L of hexane to precipitate a polymer. A solid obtained by filtration was dissolved in 500 mL of acetone, the obtained solution was added dropwise again to 3 L of hexane, and then a solid obtained by filtration was dried under reduced pressure to obtain 160 g of a 4-acetoxystyrene/1-ethylcyclopentyl methacrylate/monomer 1 copolymer resin (A-1).

10 g of the polymer thus obtained, 40 mL of methanol, 200 mL of 1-methoxy-2-propanol, and 1.5 mL of concentrated hydrochloric acid were added to a reaction vessel, heated to 80° C., and stirred for 5 hours. The reaction solution was left to be cooled to room temperature and added dropwise to 3 L of distilled water. A solid obtained by filtration was dissolved in 200 mL of acetone, the solution was added dropwise again to 3 L of distilled water, and then, a solid obtained by filtration was dried under reduced pressure to obtain a resin (A-1) (8.5 g). As measured by gel permeation chromatography (GPC) (solvent: tetrahydrofuran (THF)) in terms of standard polystyrene, the weight-average molecular weight (Mw) was 11,200 and the molecular weight dispersity (Mw/Mn) was 1.45.

Resins (A-2) to (A-19) and (A-24) to (A-50) having the structures shown in Table 3 were synthesized by the same method as in Synthesis Example 1, except that the monomers to be used were changed.

In Table 3, the compositional ratio (molar ratio) of the resin was calculated by $^1$H-NMR (nuclear magnetic resonance) measurement. The weight-average molecular weight (Mw: in terms of polystyrene) and the dispersity (Mw/Mn) of the resin were calculated by GPC (solvent: THF) measurement. In addition, the weight-average molecular weights and the dispersities of the other resins shown in Examples were also measured by the same method.

TABLE 3

| Table 3 | Structure | | | Compositional ratio (molar ratio) From left | Mw | Mw/Mn |
|---|---|---|---|---|---|---|
| Resin A-1 | 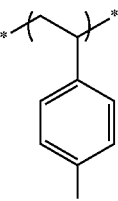 | 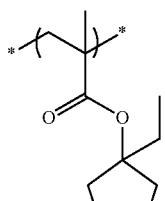 | 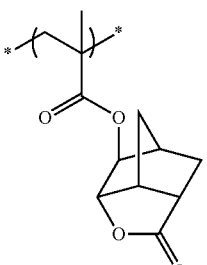 | 30/60/10 | 11,200 | 1.45 |
| Resin A-2 | 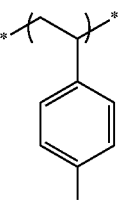 | 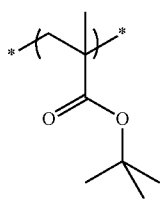 | 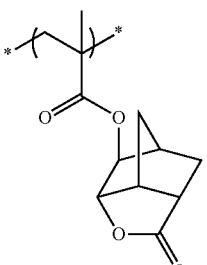 | 30/60/10 | 12,300 | 1.51 |
| Resin A-3 | 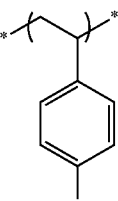 | 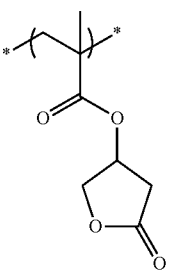 | 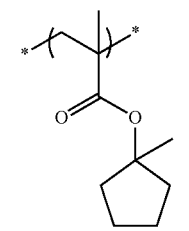 | 40/20/40 | 9,200 | 1.68 |

TABLE 3-continued

| Table 3 | Structure | Compositional ratio (molar ratio) From left | Mw | Mw/Mn |
|---|---|---|---|---|
| Resin A-4 | | 30/60/10 | 12,300 | 1.51 |
| Resin A-5 | | 20/80 | 12,500 | 1.52 |
| Resin A-6 | | 50/50 | 13,000 | 1.56 |
| Resin A-7 | | 70/30 | 12,500 | 1.43 |
| Resin A-8 | | 20/80 | 18,000 | 1.12 |

TABLE 3-continued

| Table 3 | Structure | Compositional ratio (molar ratio) From left | Mw | Mw/Mn |
|---|---|---|---|---|
| Resin A-9 | (structures) | 5/15/30/50 | 11,000 | 1.56 |
| Resin A-10 | (structures) | 50/50 | 11,000 | 1.45 |
| Resin A-11 | (structures) | 35/65 | 12,300 | 1.51 |
| Resin A-12 | (structures) | 60/40 | 12,500 | 1.68 |

TABLE 3-continued
| Table 3 | Structure | Compositional ratio (molar ratio) From left | Mw | Mw/Mn |
|---|---|---|---|---|
| Resin A-13 | 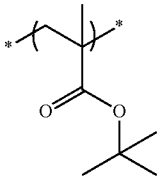 | 70/30 | 13,000 | 1.51 |
| Resin A-14 | 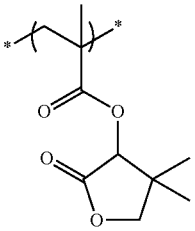 | 20/40/40 | 11,000 | 1.45 |
| Resin A-15 | 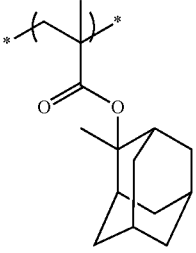 | 30/70 | 12,300 | 1.51 |
| Resin A-16 | 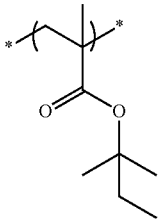 | 50/20/30 | 14,500 | 1.68 |
| Resin A-17 | 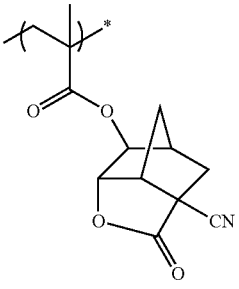 | 30/50/10/10 | 12,100 | 1.53 |

TABLE 3-continued
| Table 3 | Structure | Compositional ratio (molar ratio) From left | Mw | Mw/Mn |
|---|---|---|---|---|
| | 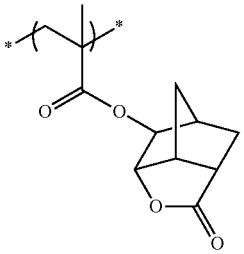 | | | |
| Resin A-18 | 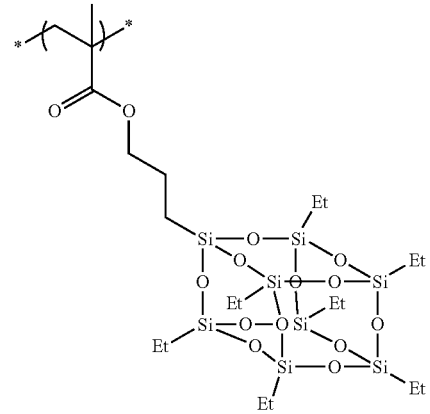 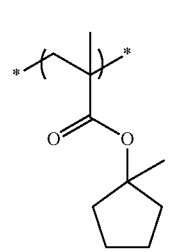 | 50/35/15 | 11,100 | 1.61 |
| Resin A-19 | 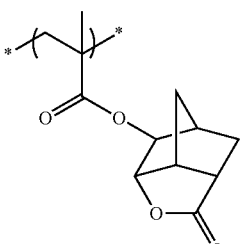 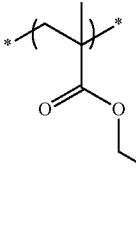 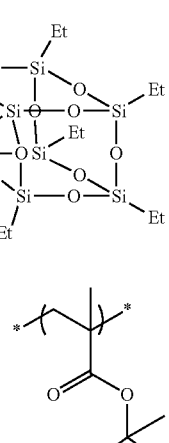 | 30/45/15/10 | 11,500 | 1.49 |

TABLE 3-continued

| Table 3 | Structure | Compositional ratio (molar ratio) From left | Mw | Mw/Mn |
|---|---|---|---|---|
| Resin A-24 | | 30/20/50 | 14,000 | 1.55 |
| Resin A-25 | | 30/15/55 | 13,000 | 1.51 |
| Resin A-26 | | 30/10/60 | 15,000 | 1.64 |
| Resin A-27 | | 30/15/55 | 18,000 | 1.41 |

TABLE 3-continued

| Table 3 | Structure | | | Compositional ratio (molar ratio) From left | Mw | Mw/Mn |
|---|---|---|---|---|---|---|
| Resin A-28 | | | | 20/20/60 | 17,000 | 1.59 |
| Resin A-29 | | | | 35/5/60 | 11,000 | 1.51 |
| Resin A-30 | | | | 35/15/50 | 13,000 | 1.54 |
| Resin A-31 | | | | 30/20/50 | 10,000 | 1.45 |
| Resin A-32 | | | | 40/10/50 | 15,000 | 1.71 |

TABLE 3-continued

| Table 3 | Structure | Compositional ratio (molar ratio) From left | Mw | Mw/Mn |
|---|---|---|---|---|
| Resin A-33 | | 40/15/45 | 22,000 | 1.63 |
| Resin A-34 | | 30/20/50 | 14,000 | 1.55 |
| Resin A-35 | | 30/15/55 | 13,000 | 1.51 |
| Resin A-36 | | 25/20/55 | 15,000 | 1.64 |
| Resin A-37 | | 30/10/60 | 9,000 | 1.51 |

TABLE 3-continued

| Table 3 | Structure | Compositional ratio (molar ratio) From left | Mw | Mw/Mn |
|---|---|---|---|---|
| Resin A-38 | | 30/25/45 | 19,000 | 1.63 |
| Resin A-39 | | 25/30/45 | 17,000 | 1.48 |
| Resin A-40 | | 30/30/40 | 22,000 | 1.66 |
| Resin A-41 | | 25/25/50 | 25,000 | 1.71 |
| Resin A-42 | | 35/25/40 | 16,000 | 1.55 |

TABLE 3-continued

| Table 3 | Structure | Compositional ratio (molar ratio) From left | Mw | Mw/Mn |
|---|---|---|---|---|
| Resin A-43 | | 40/10/50 | 22,000 | 1.72 |
| Resin A-44 | | 35/20/45 | 25,000 | 1.64 |
| Resin A-45 | | 25/25/50 | 13,000 | 1.47 |
| Resin A-46 | | 35/25/40 | 19,000 | 1.53 |
| Resin A-47 | | 30/15/55 | 9,000 | 1.59 |

TABLE 3-continued

| Table 3 | Structure | Compositional ratio (molar ratio) From left | Mw | Mw/Mn |
|---|---|---|---|---|
| Resin A-48 | | 35/15/50 | 21,000 | 1.63 |
| Resin A-49 | | 20/25/55 | 9,000 | 1.55 |
| Resin A-50 | | 25/15/60 | 20,000 | 1.51 |

<Hydrophobic Resin (A')>
As the hydrophobic resin, the following ones were used.
[Table 11]
TABLE 4
|  | Compositional ratio (molar ratio) | | | | Mw | Mw/Mn |
| --- | --- | --- | --- | --- | --- | --- |
| Resin (1b) | 50 | 45 | 5 | — | 7,000 | 1.30 |
| Resin (2b) | 40 | 40 | 20 | — | 18,600 | 1.57 |
| Resin (3b) | 50 | 50 | — | — | 25,400 | 1.63 |
| Resin (4b) | 30 | 65 | 5 | — | 28,000 | 1.70 |
| Resin (5b) | 10 | 10 | 30 | 50 | 12,500 | 1.65 |
Specific structural formulae of the resins (1b) to (5b) described in the table are shown below.
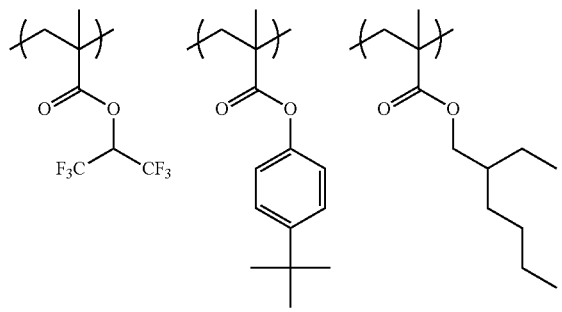
(1b)
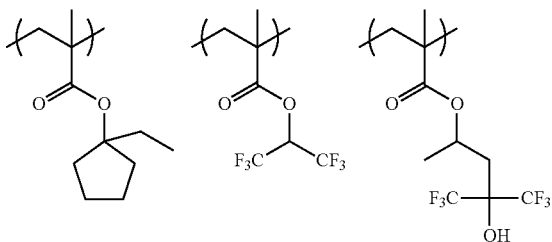
(2b)
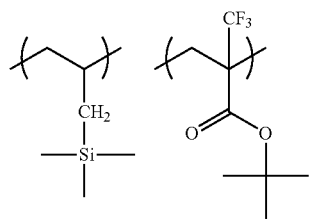
(3b)
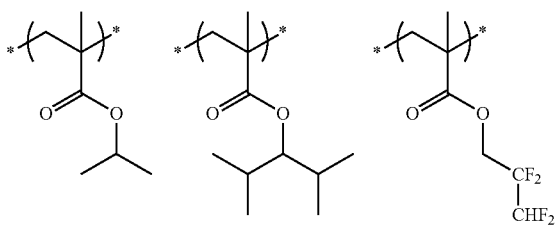
(4b)
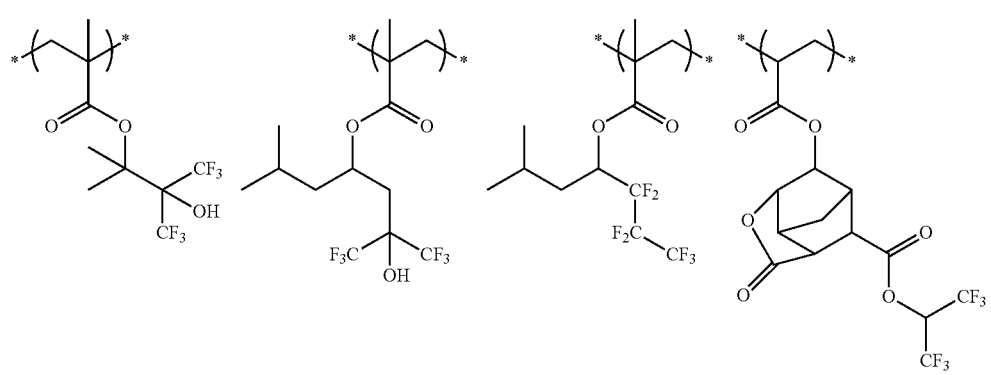
(5b)

<Photoacid Generator (B)>
As the photoacid generator, the following ones were used.
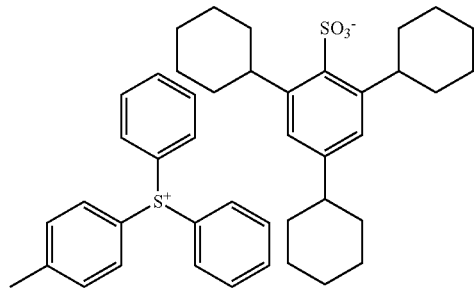
(B-1)
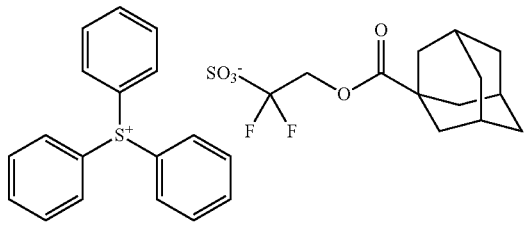
(B-2)
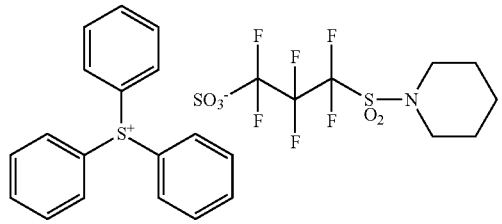
(B-3)
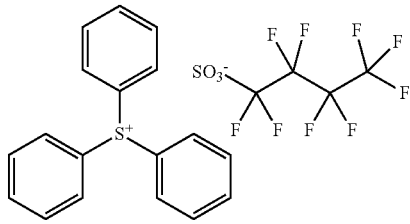
(B-4)
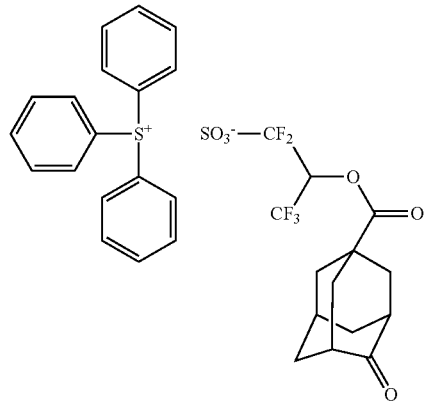
(B-5)
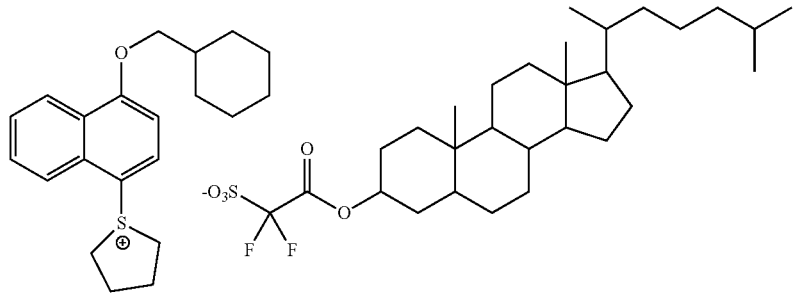
(B-6)

-continued
(B-7) 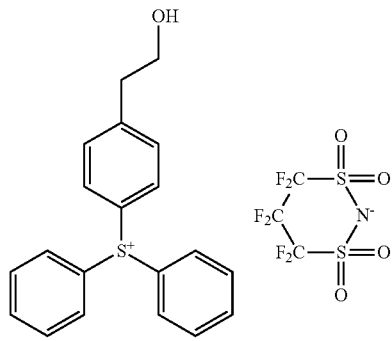 (B-8) 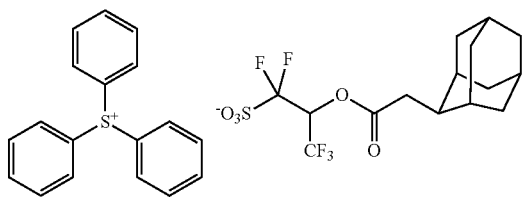
(B-9) 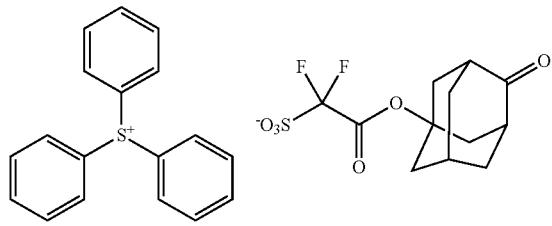 (B-10) 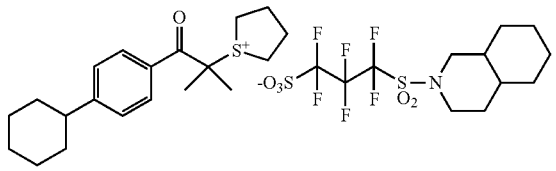
<Basic Compound (E)>
As the basic compound, the following ones were used.
(E-1) 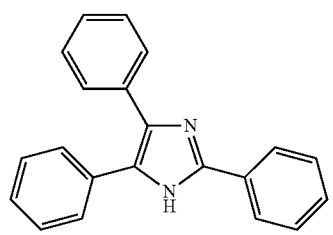 (E-2) 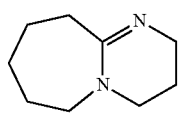
(E-3) 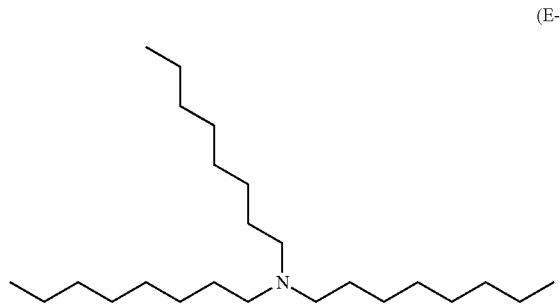 (E-4) 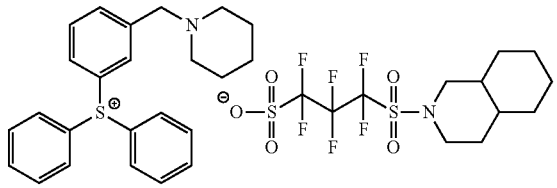
(E-5) 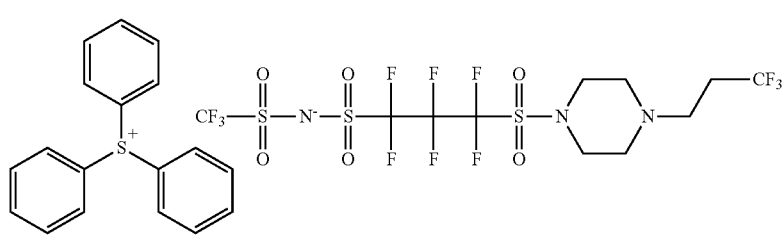

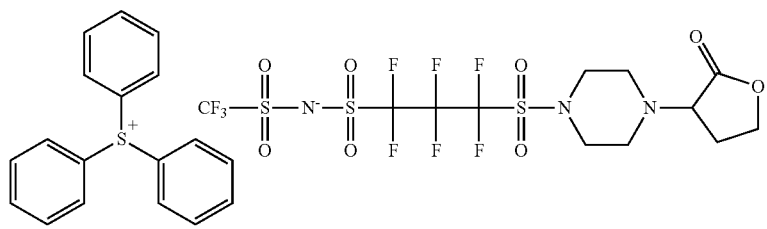
(E-6)
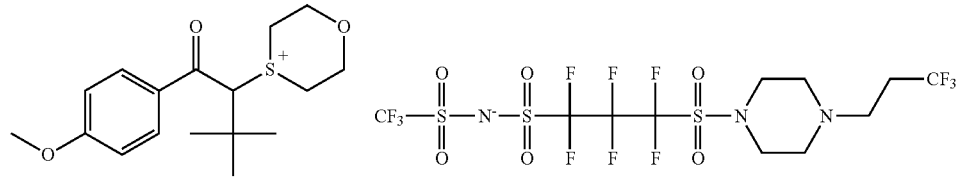
(E-7)
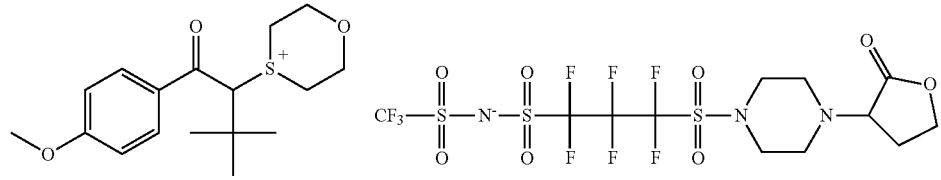
(E-8)
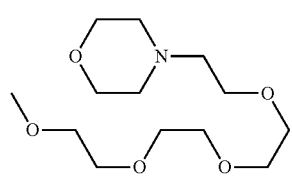
(E-9)
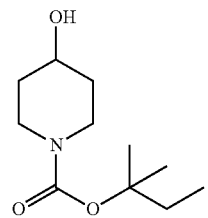
(E-10)
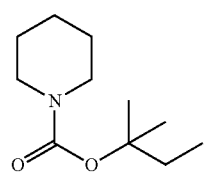
(E-11)
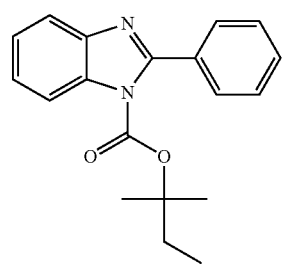
(E-12)
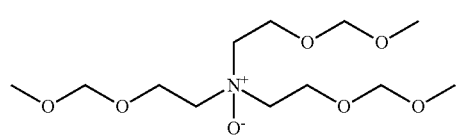
(E-13)
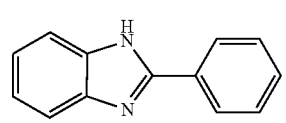
(E-14)

<Solvent (C)>
As the resist solvent, the following ones were used.
C-1: Propylene glycol monomethyl ether acetate
C-2: Propylene glycol monomethyl ether
C-3: Ethyl lactate
C-4: Cyclohexanone
C-5: Anisole <Resist Composition>
The respective components shown in Table 5 below were dissolved in a solvent shown in the same table. The solution was filtered through a polyethylene filter having a pore size of 0.03 μm to obtain a resist composition.

TABLE 5

| | Resin (A) | Photoacid generator (B) | Basic compound (E) | Solvent (C) | | | Hydrophobic resin (A') |
|---|---|---|---|---|---|---|---|
| Resist composition 1 | A-1<br>0.77 g | B-1<br>0.2 g | E-3<br>0.03 g | C-1<br>67.5 g | C-3<br>7.5 g | — | — |
| Resist composition 2 | A-2<br>0.79 g | B-2<br>0.18 g | E-1<br>0.03 g | C-1<br>45 g | C-2<br>30 g | — | — |
| Resist composition 3 | A-3<br>0.79 g | B-2<br>0.18 g | E-1<br>0.03 g | C-1<br>45 g | C-2<br>30 g | — | — |
| Resist composition 4 | A-4<br>0.79 g | B-2<br>0.18 g | E-1<br>0.03 g | C-1<br>60 g | C-3<br>15 g | — | — |
| Resist composition 5 | A-5<br>0.78 g | B-3<br>0.19 g | E-3<br>0.03 g | C-1<br>67.5 g | C-3<br>7.5 g | — | — |
| Resist composition 6 | A-6<br>0.79 g | B-2<br>0.18 g | E-1<br>0.03 g | C-1<br>67.5 g | C-3<br>7.5 g | — | — |
| Resist composition 7 | A-6/A-7<br>0.395 g/0.395 g | B-4<br>0.2 g | E-4<br>0.01 g | C-1<br>45 g | C-4<br>30 g | — | — |
| Resist composition 8 | A-8<br>0.79 g | B-1<br>0.18 g | E-1<br>0.03 g | C-1<br>45 g | C-2<br>30 g | — | — |
| Resist composition 9 | A-1/A-2<br>0.395 g/0.395 g | B-2<br>0.18 g | E-1/E-5<br>0.015 g/0.015 g | C-1<br>45 g | C-2<br>30 g | — | — |
| Resist composition 10 | A-2<br>0.79 g | B-2<br>0.18 g | E-6<br>0.03 g | C-1<br>45 g | C-2<br>30 g | — | — |
| Resist composition 11 | A-2<br>0.79 g | B-2<br>0.18 g | E-7<br>0.03 g | C-1<br>45 g | C-2<br>30 g | — | — |
| Resist composition 12 | A-2<br>0.79 g | B-2<br>0.18 g | E-8<br>0.03 g | C-1<br>45 g | C-2<br>30 g | — | — |
| Resist composition 13 | A-9<br>0.76 g | B-5<br>0.18 g | E-9<br>0.03 g | C-1<br>45 g | C-2<br>15 g | C-4<br>15 g | 5b<br>0.03 g |
| Resist composition 14 | A-7<br>0.787 g | B-5<br>0.18 g | E-9<br>0.03 g | C-1<br>45 g | C-2<br>15 g | C-4<br>15 g | 4b<br>0.003 g |
| Resist composition 15 | A-6<br>0.785 g | B-4<br>0.18 g | E-10<br>0.03 g | C-1<br>45 g | C-2<br>15 g | C-4<br>15 g | 3b<br>0.005 g |
| Resist composition 16 | A-10<br>0.78 g | B-3<br>0.18 g | E-11<br>0.03 g | C-1<br>45 g | C-2<br>15 g | C-4<br>15 g | 2b<br>0.01 g |
| Resist composition 17 | A-11<br>0.72 g | B-6/B-2<br>0.15 g/0.09 g | E-12<br>0.03 g | C-1<br>45 g | C-2<br>15 g | C-4<br>15 g | 1b<br>0.01 g |
| Resist composition 18 | A-12<br>0.76 g | B-7<br>0.18 g | E-13<br>0.03 g | C-1<br>45 g | C-2<br>30 g | — | 5b<br>0.03 g |
| Resist composition 19 | A-13<br>0.787 g | B-8<br>0.18 g | E-14<br>0.03 g | C-1<br>30 g | C-2<br>45 g | — | 4b<br>0.003 g |
| Resist composition 20 | A-14<br>0.785 g | B-9<br>0.18 g | E-2<br>0.03 g | C-1<br>45 g | C-4<br>30 g | — | 3b<br>0.005 g |
| Resist composition 21 | A-15<br>0.78 g | B-10/B-2<br>0.09 g/0.09 g | E-13<br>0.03 g | C-1<br>30 g | C-4<br>45 g | — | 2b<br>0.01 g |
| Resist composition 22 | A-16<br>0.71 g | B-6<br>0.25 g | E-14<br>0.03 g | C-1<br>50 g | C-2<br>10 g | — | 1b<br>0.01 g |
| Resist composition 23 | A-17<br>0.79 g | B-2<br>0.18 g | E-1<br>0.03 g | C-1<br>60 g | C-3<br>15 g | — | — |
| Resist composition 24 | A-18<br>0.79 g | B-2<br>0.18 g | E-1<br>0.03 g | C-1<br>60 g | C-3<br>15 g | — | — |
| Resist composition 25 | A-19<br>0.79 g | B-2<br>0.18 g | E-1<br>0.03 g | C-1<br>60 g | C-3<br>15 g | — | — |
| Resist composition 41 | A-1<br>0.79 g | B-2<br>0.18 g | E-1<br>0.03 | C-1<br>60 g | C-4<br>15 g | — | — |
| Resist composition 42 | A-24<br>0.75 g | B-2<br>0.22 g | E-1<br>0.03 | C-1<br>60 g | C-4<br>15 g | — | — |
| Resist composition 43 | A-25<br>0.79 g | B-6/B-2<br>0.10/0.08 g | E-1<br>0.03 | C-1<br>60 g | C-4<br>15 g | — | — |
| Resist composition 44 | A-26<br>0.71 g | B-2<br>0.25 g | E-1<br>0.03 | C-1<br>60 g | C-4<br>15 g | — | — |
| Resist composition 45 | A-27<br>0.76 g | B-2<br>0.21 g | E-1<br>0.03 | C-1<br>60 g | C-4<br>15 g | — | — |
| Resist composition 46 | A-28<br>0.79 g | B-6/B-2<br>0.10/0.08 g | E-1<br>0.03 | C-1<br>60 g | C-4<br>15 g | — | — |
| Resist composition 47 | A-29<br>0.81 g | B-2<br>0.16 g | E-1<br>0.03 | C-1<br>60 g | C-4<br>15 g | — | — |
| Resist composition 48 | A-30<br>0.77 g | B-2<br>0.20 g | E-1<br>0.03 | C-1<br>60 g | C-4<br>15 g | — | — |
| Resist composition 49 | A-31<br>0.79 g | B-2<br>0.18 g | E-1<br>0.03 | C-1<br>60 g | C-4<br>15 g | — | — |

TABLE 5-continued

| | Resin (A) | Photoacid generator (B) | Basic compound (E) | Solvent (C) | | Hydrophobic resin (A') |
|---|---|---|---|---|---|---|
| Resist composition 50 | A-32 0.79 g | B-2 0.18 g | E-1 0.03 | C-1 60 g | C-4 15 g | |
| Resist composition 51 | A-33 0.81 g | B-2 0.16 g | E-1 0.03 | C-1 60 g | C-4 15 g | |
| Resist composition 52 | A-34 0.79 g | B-10/B-2 0.10/0.08 g | E-1 0.03 | C-1 60 g | C-4 15 g | |
| Resist composition 53 | A-35 0.72 g | B-2 0.26 g | E-1 0.03 | C-1 60 g | C-4 15 g | |
| Resist composition 54 | A-36 0.72 g | B-2 0.26 g | E-1 0.03 | C-1 60 g | C-4 15 g | |
| Resist composition 55 | A-37 0.79 g | B-6/B-2 0.10/0.08 g | E-1 0.03 | C-1 60 g | C-4 15 g | |
| Resist composition 56 | A-38 0.80 g | B-2 0.19 g | E-1 0.03 | C-1 60 g | C-4 15 g | |
| Resist composition 57 | A-39 0.77 g | B-2 0.20 g | E-1 0.03 | C-1 60 g | C-4 15 g | |
| Resist composition 58 | A-40 0.79 g | B-2 0.18 g | E-1 0.03 | C-1 60 g | C-4 15 g | |
| Resist composition 59 | A-41 0.75 g | B-2 0.22 g | E-1 0.03 | C-1 60 g | C-4 15 g | |
| Resist composition 60 | A-42 0.73 g | B-6/B-2 0.10/0.08 g | E-1 0.03 | C-1 60 g | C-4 15 g | |
| Resist composition 61 | A-43 0.81 g | B-2 0.16 g | E-1 0.03 | C-1 60 g | C-4 15 g | |
| Resist composition 62 | A-44 0.79 g | B-2 0.18g | E-1 0.03 | C-1 60 g | C-4 15 g | |
| Resist composition 63 | A-45 0.82 g | B-2 0.15 g | E-1 0.03 | C-1 60 g | C-4 15 g | |
| Resist composition 64 | A-46 0.79 g | B-6/B-2 0.10/0.08 g | E-1 0.03 | C-1 60 g | C-4 15 g | |
| Resist composition 65 | A-47 0.78 g | B-2 0.22 g | E-1 0.03 | C-1 60 g | C-4 15 g | |
| Resist composition 66 | A-48 0.81 g | B-2 0.20 g | E-1 0.03 | C-1 60 g | C-4 15 g | |
| Resist composition 67 | A-49 0.79 g | B-6/B-2 0.10/0.08 g | E-1 0.03 | C-1 60 g | C-4 15 g | |
| Resist composition 68 | A-50 0.79 g | B-2 0.18 g | E-1 0.03 | C-1 60 g | C-4 15 g | |

<Composition for Forming Upper Layer Film>

The respective components shown in Table 6 below were dissolved in a solvent shown in the same table. The solution was filtered through a polyethylene filter having a pore size of 0.03 μm to obtain a composition for forming an upper layer film. Incidentally, "MIBC" in the following table represents methyl isobutyl carbinol.

[Table 15]

TABLE 6

| Composition for forming upper layer film | Resin | Photoacid generator | Additive | Solvent (mixing ratio (mass ratio)) |
|---|---|---|---|---|
| T-1 | V1 1.0 g | — | — | MIBC-decane 30/70 |
| T-2 | V1 1.0 g | B-2 0.02 g | — | MIBC-decane 50/50 |
| T-3 | V1 1.0 g | — | E-11 0.02 g | MIBC-decane 30/70 |
| T-4 | V1 1.0 g | — | X1 0.02 g | MIBC-decane 30/70 |
| T-5 | V1 1.0 g | B-2 0.02 g | X1 0.02 g | MIBC-decane 30/70 |
| T-6 | V2 1.0 g | — | — | MIBC-decane 30/70 |
| T-7 | V3 1.0 g | — | — | MIBC-decane 30/70 |
| T-8 | V4 1.0 g | — | — | MIBC-decane 30/70 |

TABLE 6-continued

| Composition for forming upper layer film | Resin | Photoacid generator | Additive | Solvent (mixing ratio (mass ratio)) |
|---|---|---|---|---|
| T-9 | V1:1b 0.9 g:0.1 g | — | — | 20/80 |

The resins V-1 to V-4, and 1b, and the additive X1 used are shown below. The other additives are the same as described above.

The compositional ratios, the weight-average molecular weights, and the dispersities of the resins V-1 to V-4, and 1b are shown in another table (Table 7).

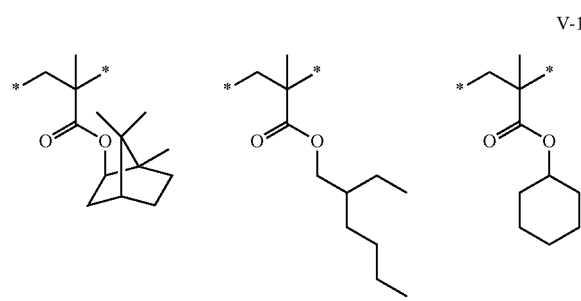

V-1

-continued

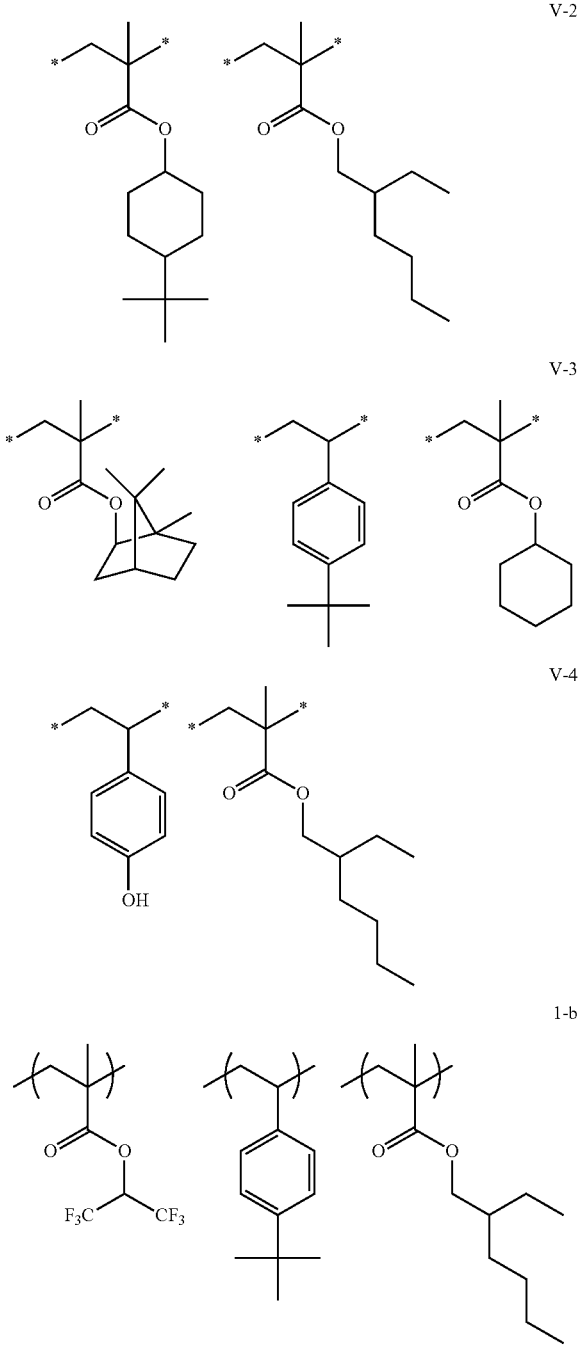

<Evaluation of EUV Exposure>

Using the resist composition described in Table 5, the defect performance and the pattern forming performance after development of the resist were evaluated through the following operations.

[Application and Post-Application Baking (PB) of Resist Composition]

Each of the resist compositions obtained as above was applied on a 12-inch silicon wafer and the coating film formed on the silicon wafer was baked for 60 seconds under the conditions of 90° C. to 180° C., thereby forming a resist film having a film thickness of 40 nm.

[Application and Post-Application Baking (PB) of Composition for Forming Upper Layer Film]

With regard to Examples of Table 9 shown below, the composition (topcoat composition) for forming an upper layer film shown in Table 6 above was applied onto the baked resist film, and then baked at a PB temperature (unit: ° C.) shown in Table 9 below over 60 seconds, thereby forming an upper layer film (topcoat film) having a film thickness of 40

[Exposure]

(Evaluation of Defect Performance after Development)

The wafer manufactured above was subjected to EUV exposure with a numerical aperture (NA) of 0.25 and a dipole illumination (Dipole 60×, an outer sigma of 0.81, an inner sigma of 0.43). Specifically, for the negative tone resist, entire-surface exposure was performed at an expose dose of 1 mJ/cm$^2$, not through a mask, and for the positive tone resist, entire-surface exposure was performed at an expose dose of 200 mJ/cm$^2$, not through a mask.

(Evaluation of L/S Pattern)

The wafer manufactured above was subjected to EUV exposure with a numerical aperture (NA) of 0.25 and a dipole illumination (Dipole 60×, an outer sigma of 0.81, an inner sigma of 0.43). The entire wafer surface was subjected to pattern exposure through a mask including a pattern (evaluation of L/S bridge) for forming a line-and-space pattern in a wafer dimension with a pitch of 60 nm and a line width of 40 nm, at an exposure dose for completion of a line width of 40 nm and a space width of 20 nm.

[Post-Exposure Baking (PEB)]

After the irradiation, the wafer was taken out from the EUV exposure device, and immediately thereafter baked for 60 seconds under the conditions of 85° C. to 130° C.

[Development]

Thereafter, development was performed by spray-discharging a developer (23° C.) for 30 seconds at a flow rate of 200 mL/min while rotating the wafer at 50 rotations (rpm), using a shower-type developing device (ADE3000S, manufactured by ACTES Kyosan, Inc.). Further, any one of the treatment liquids described in Table 8 was used as the developer.

The developers used in the respective Examples and Comparative Examples are the treatment liquids shown in Table 8. Further, as the organic solvent, a product obtained by purifying the organic solvent which will be described later was used.

TABLE 7

| Resin for forming upper layer film | Compositional ratio (molar ratio) | Weight-average molecular weight | Dispersity |
|---|---|---|---|
| V-1 | 40/40/20 | 11,000 | 1.45 |
| V-2 | 60/40 | 9,500 | 1.59 |
| V-3 | 40/40/20 | 9,300 | 1.67 |
| V-4 | 30/70 | 12,000 | 1.33 |
| 1b | 40/50/10 | 11,000 | 1.45 |

In addition, each of the treatment liquids included a trace amount of impurities (metal components, an organic compound having a boiling point of 300° C. or higher, and the like), but was substantially constituted with an organic solvent. A term "substantially" is intended to indicate that the content of the organic solvent is 99% by mass or more with respect to the total mass of the treatment liquid.

[Rinsing]

Thereafter, a rinsing treatment was performed by spray-discharging a rinsing liquid (23° C.) for 15 seconds at a flow rate of 200 mL/min while rotating the wafer at 50 rotations (rpm).

Lastly, the wafer was dried by rotating the wafer at a high speed for 60 seconds at 2,500 rotations (rpm). Further, any one of the treatment liquids described in Table 8 was used as the rinsing liquid.

Furthermore, in Table 8, "<0.001" is intended to mean a value of less than 0.001.

TABLE 8

| Treatment liquid | First organic solvent Type | First organic solvent SP value (MPa$^{1/2}$) | First organic solvent Boiling point (° C.) | Second organic solvent Type | Second organic solvent SP value (MPa$^{1/2}$) | Second organic solvent Boiling point (° C.) | Other organic solvent or added component Type | Other organic solvent or added component SP value (MPa$^{1/2}$) | Other organic solvent or added component Boiling point (° C.) | Mixing ratio (first:second:others = wt %:wt %:wt %) |
|---|---|---|---|---|---|---|---|---|---|---|
| S-1 | Butyl acetate | 17.8 | 126 | Dimethyl formamide | 21.2 | 153 | | | | 90:10:— |
| S-3 | 1-Methyl-butyl acetate | 17.4 | 137 | 1-Hexanol | 21.5 | 157 | | | | 80:20:— |
| S-4 | Butyl acetate | 17.8 | 126 | 1-Hexanol | 21.5 | 157 | 2-Heptanone | 18.1 | 151 | 80:10:10 |
| S-5 | Butyl acetate | 17.8 | 126 | 3-Methyl-1-butanol | 22 | 132 | | | | 90:10:— |
| S-6 | Butyl acetate | 17.8 | 126 | 2-Octanol | 20.7 | 174 | | | | 80:20:— |
| S-7 | Butyl acetate | 17.8 | 126 | Decane | 15.8 | 174 | | | | 90:10:— |
| S-8 | Butyl acetate | 17.8 | 126 | Nonane | 15.7 | 151 | | | | 70:30:— |
| S-9 | Butyl acetate | 17.8 | 126 | Propylene glycol monomethyl ether acetate | 17.9 | 145 | | | | 90:10:— |
| S-10 | Butyl acetate | 17.8 | 126 | Propylene glycol monomethyl ether acetate | 17.9 | 145 | PGME | 23 | 121 | 80:10:10 |
| S-11 | Butyl acetate | 17.8 | 126 | Isoamyl acetate | 17.4 | 142 | | | | 90:10:— |
| S-12 | Butyl acetate | 17.8 | 126 | Isoamyl acetate | 17.4 | 142 | | | | 70:30:— |
| S-13 | Butyl acetate | 17.8 | 126 | Pentyl propionate | 17.8 | 169 | | | | 90:10:— |
| S-14 | Butyl acetate | 17.8 | 126 | Dibutyl ether | 15.9 | 142 | | | | 60:40:— |
| S-15 | 1-Methyl-butyl acetate | 17.4 | 137 | Propylene glycol monomethyl ether | 23 | 121 | | | | 90:10:— |
| S-16 | 1-Methyl-butyl acetate | 17.4 | 137 | Propylene glycol monomethyl ether | 23 | 121 | | | | 90:10:— |
| S-17 | 1-Methyl-butyl acetate | 17.4 | 137 | Propylene glycol monomethyl ether | 23 | 121 | Nonane | 15.7 | 151 | 80:10:10 |

TABLE 8-continued

| | Solvent 1 | | | Solvent 2 | | | Solvent 3 | | | Ratio |
|---|---|---|---|---|---|---|---|---|---|---|
| S-18 | 1-Methyl-butyl acetate | 17.4 | 137 | Propyl isopentyl ether | 15.6 | 131 | | | | 90:10:— |
| S-19 | 1-Methyl-butyl ether | 17.4 | 137 | 3-Methoxy-3-methylbutanol | 21.5 | 174 | | | | 95:5:— |
| S-20 | Butyl acetate | 17.8 | 126 | Cyclohexanone | 20 | 156 | | | | 90:10:— |
| S-21 | Butyl acetate | 17.8 | 126 | Cyclohexanone | 20 | 156 | | | | 80:20:— |
| S-22 | Butyl acetate | 17.8 | 126 | Cyclohexanone | 20 | 156 | Dibutyl ether | 15.9 | 142 | 80:10:10 |
| S-23 | Propylene glycol monomethyl ether acetate | 17.9 | 145 | Diisobutyl ketone | 17.4 | 156 | | | | 90:10:— |
| S-24 | Propylene glycol monomethyl ether acetate | 17.9 | 145 | 2-Heptanone | 18.1 | 151 | | | | 50:50:— |
| S-25 | Propylene glycol monomethyl ether acetate | 17.9 | 145 | Nonane | 15.7 | 151 | | | | 80:20:— |
| S-26 | Isoamyl acetate | 17.4 | 142 | 1-Hexanol | 21.5 | 157 | | | | 90:10:— |
| S-27 | Isoamyl acetate | 17.4 | 142 | 1-Hexanol | 21.5 | 157 | | | | 80:20:— |
| S-28 | Isoamyl acetate | 17.4 | 142 | 1-Hexanol | 21.5 | 157 | 2-Heptanone | 18.1 | 151 | 80:10:10 |
| S-29 | Isoamyl acetate | 17.4 | 142 | Cyclohexanone | 20 | 156 | | | | 90:10:— |
| S-30 | Isoamyl acetate | 17.4 | 142 | Cyclohexanone | 20 | 156 | | | | 80:20:— |
| S-31 | Isoamyl acetate | 17.4 | 142 | Cyclohexanone | 20 | 156 | Dibutyl ether | 15.9 | 142 | 80:10:10 |
| S-32 | 2-Heptanone | 18.1 | 151 | 1-Hexanol | 21.5 | 157 | | | | 90:10:— |
| S-33 | 2-Heptanone | 18.1 | 151 | 1-Hexanol | 21.5 | 157 | | | | 80:20:— |
| S-34 | 2-Heptanone | 18.1 | 151 | 1-Hexanol | 21.5 | 157 | Dibutyl ether | 15.9 | 142 | 80:10:10 |
| S-35 | 2-Heptanone | 18.1 | 151 | Cyclohexanone | 20 | 156 | | | | 90:10:— |
| S-36 | 2-Heptanone | 18.1 | 151 | Cyclohexanone | 20 | 156 | | | | 80:20:— |
| S-37 | 2-Heptanone | 18.1 | 151 | Cyclohexanone | 20 | 156 | Decane | 15.8 | 174 | 80:10:10 |
| S-61 | Butyl acetate | 17.8 | 126 | Cyclohexanone | 20 | 156 | | | | 90:10:— |
| S-62 | Butyl acetate | 17.8 | 126 | Cyclohexanone | 20 | 156 | Decane | 15.8 | 174 | 80:10:10 |
| S-63 | Butyl acetate | 17.8 | 126 | 1-Hexanol | 21.5 | 157 | 2-Heptanone | 18.1 | 151 | 80:10:10 |
| S-64 | Butyl acetate | 17.8 | 126 | Propylene glycol monomethyl ether acetate | 17.9 | 145 | PGME | 23 | 121 | 80:10:10 |

TABLE 8-continued

| | Solvent 1 | | | Solvent 2 | | | Solvent 3 | | | Ratio |
|---|---|---|---|---|---|---|---|---|---|---|
| S-65 | Butyl acetate | 17.8 | 126 | Cyclohexanone | 20 | 156 | | | | 90:10:— |
| S-66 | Butyl acetate | 17.8 | 126 | Propylene glycol monomethyl ether acetate | 17.9 | 145 | PGME | 23 | 121 | 80:10:10 |
| S-67 | Butyl acetate | 17.8 | 126 | Cyclohexanone | 20 | 156 | | | | 90:10:— |
| S-68 | Butyl acetate | 17.8 | 126 | Propylene glycol monomethyl ether acetate | 17.9 | 145 | PGME | 23 | 121 | 80:10:10 |
| S-69 | Butyl acetate | 17.8 | 126 | Cyclohexanone | 20 | 156 | | | | 90:10:— |
| S-70 | Butyl acetate | 17.8 | 126 | Propylene glycol monomethyl ether acetate | 17.9 | 145 | PGME | 23 | 121 | 80:10:10 |
| S-71 | Butyl acetate | 17.8 | 126 | Cyclohexanone | 20 | 156 | | | | 90:10:— |
| SA-1 | Butyl acetate | 17.8 | 126 | N-Methyl-pyrrolidone | 22.2 | 202 | | | | 90:10:— |
| SA-2 | Butyl acetate | 17.8 | 126 | Dodecane | 16.1 | 216 | | | | 90:10:— |
| SA-3 | Butyl acetate | 17.8 | 126 | Propylene carbonate | 23.6 | 240 | | | | 90:10:— |
| SA-4 | Isoamyl acetate | 17.4 | 142 | N-Methyl-pyrrolidone | 22.2 | 202 | | | | 90:10:— |
| SA-5 | Isoamyl acetate | 17.4 | 142 | Diethylene glycol monomethyl ether | 23 | 194 | | | | 95:5:— |
| SA-6 | Isoamyl acetate | 17.4 | 142 | Propylene carbonate | 23.6 | 240 | | | | 90:10:— |
| SA-7 | 2-Heptanone | 18.1 | 151 | N-Methyl-pyrrolidone | 22.2 | 202 | | | | 90:10:— |
| SA-8 | 2-Heptanone | 18.1 | 151 | dodecane | 16.1 | 216 | | | | 90:10:— |
| SA-9 | 2-Heptanone | 18.1 | 151 | Propylene carbonate | 23.6 | 240 | | | | 90:10:— |
| SA-12 | Butyl acetate | 17.8 | 126 | | | | | | | 100:—:— |
| SA-13 | Isoamyl acetate | 17.4 | 142 | | | | | | | 100:—:— |
| SA-14 | 2-Heptanone | 18.1 | 151 | | | | | | | 100:—:— |
| SA-15 | Isoamyl acetate | 17.4 | 142 | Propylene carbonate | 23.6 | 240 | | | | 90:10:— |
| SA-16 | 2-Heptanone | 18.1 | 151 | N-Methyl-pyrrolidone | 22.2 | 202 | | | | 90:10:— |
| SA-17 | Isoamyl acetate | 17.4 | 142 | Diethylene glycol monomethyl ether | 23 | 194 | | | | 95:5:— |
| SA-18 | Isoamyl acetate | 17.4 | 142 | Propylene carbonate | 23.6 | 240 | | | | 90:10:— |

TABLE 8-continued

| Treatment liquid | Purifying method | | | Metal component (ppt by mass) | | | | | Organic compound having boiling point of 300° C. or higher (ppm by mass) | Moisture content (ppm by mass) |
|---|---|---|---|---|---|---|---|---|---|---|
| | Purifying device | Number of circulation | Purification procedure | Fe | Cr | Ni | Pb | Total | | |
| S-1 | 200 | 3 | Purification after liquid preparation | 2 | 21 | 2 | 5 | 30 | DINP 1 ppm | 67 |
| S-3 | 200 | 3 | Purification after liquid preparation | 5 | 5 | 5 | 2 | 17 | DBP <0.001 ppm | 43 |
| S-4 | 200 | 3 | Purification after liquid preparation | 3 | 2 | 4 | 9 | 18 | DBP 0.5 ppm | 34 |
| S-5 | 200 | 3 | Purification after liquid preparation | 1 | 2 | 8 | 8 | 19 | DOA 0.03 ppm | 31 |
| S-6 | 200 | 3 | Purification after liquid preparation | 0.2 | 6 | 5 | 12 | 23.2 | DBP 0.5 ppm | 111 |
| S-7 | 200 | 3 | Purification after liquid preparation | 0.5 | 4 | 5 | 5 | 14.5 | DINP 0.023 ppm | 21 |
| S-8 | 200 | 3 | Purification after liquid preparation | 5 | 5 | 4 | 2 | 16 | DBP 0.5 ppm | 32 |
| S-9 | 100 | 5 | Purification after liquid preparation | 8 | 6 | 1 | 5 | 20 | DBP 0.005 ppm | 9 |
| S-10 | 100 200 | 4 1 | Purification after liquid preparation | 2 | 8 | 0.5 | 4 | 14.5 | DINP 1 ppm | 61 |
| S-11 | 200 | 5 | Purification after liquid preparation | 0.1 | 0.2 | 0.05 | 0.02 | 0.37 | DOA 0.2 ppm | 43 |
| S-12 | 200 | 5 | Purification after liquid preparation | 0.01 | 0.1 | 0.2 | 0.2 | 0.51 | DBP 0.5 ppm | 47 |
| S-13 | 100 | 3 | Purification after liquid preparation | 1 | 5 | 6 | 8 | 20 | DINP 4 ppm | 123 |
| S-14 | 100 | 3 | Purification after liquid preparation | 13 | 6 | 8 | 12 | 39 | DINP 2 ppm | 87 |

TABLE 8-continued

| | | | | | | | | | | |
|---|---|---|---|---|---|---|---|---|---|---|
| S-15 | 200 | 5 | Purification after liquid preparation | 7 | 18 | 1 | 7 | 33 | DOA 0.01 ppm | 22 |
| S-16 | 200 | 5 | Purification after liquid preparation | 5 | 2 | 4 | 3 | 14 | DOA 0.02 ppm | 23 |
| S-17 | 200 | 3 | Purification after liquid preparation | 9 | 1 | 5 | 5 | 20 | DINP 0.1 ppm | 42 |
| S-18 | 100 | 3 | Purification after liquid preparation | 12 | 7 | 6 | 4 | 29 | DBP 2 ppm | 98 |
| S-19 | 200 | 5 | Purification after liquid preparation | 2 | 2 | 4 | 5 | 13 | DBP 0.5 ppm | 45 |
| S-20 | 100 | 3 | Purification after liquid preparation | 0.01 | 0.05 | 0.05 | 0.02 | 0.13 | DINP 0.1 ppm | 18 |
| S-21 | 200 | 3 / 5 | Purification of each solvent and then purification of liquid prepared | 0.001 | <0.001 | <0.001 | <0.001 | <0.001 | DOA 0.06 ppm | 28 |
| S-22 | 200 | 5 | Purification after liquid preparation | 0.01 | 0.5 | 0.5 | 0.1 | 1.11 | DBP 0.3 ppm | 55 |
| S-23 | 100 | 5 | Purification after liquid preparation | 3 | 5 | 1 | 1 | 10 | DINP 15 ppm | 134 |
| S-24 | 200 | 5 | Purification after liquid preparation | 3 | 2 | 1 | 1 | 7 | DINP 3 ppm | 105 |
| S-25 | 300 | 3 | Purification after liquid preparation | 315 | 18 | 131 | 75 | 539 | DINP 25 ppm | 188 |
| S-26 | 100 | 1 | Purification after liquid preparation | 5 | 10 | 3 | 1 | 19 | DBP 152 ppm | 215 |
| S-27 | 200 | 2 | Purification after liquid preparation | 6 | 1 | 8 | 1 | 16 | DINP 0.2 ppm | 55 |
| S-28 | 100 | 2 | Purification after liquid preparation | 9 | 5 | 5 | 12 | 31 | DBP 2 ppm | 111 |
| S-29 | 200 | 5 | Purification after liquid preparation | 0.5 | 0.02 | 0.05 | 0.05 | 0.02 | DOA 0.3 ppm | 63 |
| S-30 | 200 | 5 | Purification after liquid preparation | 0.1 | 0.1 | 0.1 | 0.05 | 0.35 | DBP 0.1 ppm | 40 |

TABLE 8-continued

| | | | | | | | | | | |
|---|---|---|---|---|---|---|---|---|---|---|
| S-31 | 200 | 5 | Purification after liquid preparation | 0.5 | 0.1 | 0.1 | 0.05 | 0.75 | DINP 1 ppm | 67 |
| S-32 | 100 | 2 | Purification after liquid preparation | 7 | 18 | 12 | 18 | 55 | DBP 5 ppm | 92 |
| S-33 | 100 | 2 | Purification after liquid preparation | 15 | 15 | 5 | 4 | 39 | DINP 10 ppm | 175 |
| S-34 | 100 | 3 | Purification after liquid preparation | 3 | 30 | 9 | 5 | 47 | DBP 2 ppm | 132 |
| S-35 | 200 | 5 | Purification after liquid preparation | 2 | 8 | 2 | 6 | 18 | DBP 0.5 ppm | 51 |
| S-36 | 200 | 5 | Purification after liquid preparation | 2 | 2 | 5 | 12 | 21 | DINP 0.2 ppm | 45 |
| S-37 | 100 | 2 | Purification after liquid preparation | 5 | 5 | 2 | 5 | 17 | DOA 3 ppm | 113 |
| S-61 | 300 | 8 | Purification after liquid preparation | 0.01 | 0.05 | 0.05 | 0.02 | 0.13 | DINP 0.1 ppm | 703 |
| S-62 | 300 | 6 | Purification after liquid preparation | 5 | 5 | 2 | 5 | 17 | DOA 3 ppm | 955 |
| S-63 | 300 | 6 | Purification after liquid preparation | 3 | 2 | 4 | 9 | 18 | DBP 0.5 ppm | 1145 |
| S-64 | 100 | 5 | Purification after liquid preparation | 2 | 8 | 0.5 | 4 | 14.5 | DOP 1.7 ppm | 61 |
| S-65 | 100 200 | 5 1 | Purification after liquid preparation | 0.01 | 0.05 | 0.05 | 0.02 | 0.13 | OLA 2.1 ppm | 18 |
| S-66 | 100 200 | 3 2 | Purification after liquid preparation | 2 | 8 | 0.5 | 4 | 14.5 | OLA 0.6 ppm | 61 |
| S-67 | 100 200 | 4 2 | Purification after liquid preparation | 0.01 | 0.05 | 0.05 | 0.02 | 0.13 | DOP 0.5 ppm | 18 |
| S-68 | 100 200 | 2 3 | Purification after liquid preparation | 2 | 8 | 0.5 | 4 | 14.5 | OLA 0.02 ppm | 61 |
| S-69 | 100 200 | 2 4 | Purification after liquid preparation | 0.01 | 0.05 | 0.05 | 0.02 | 0.13 | DOP 0.03 ppm | 18 |

TABLE 8-continued

| | | | | | | | | | | |
|---|---|---|---|---|---|---|---|---|---|---|
| S-70 | 100<br>200 | 1<br>4 | Purification of each solvent and then purification of liquid prepared | 2 | 8 | 0.5 | 4 | 14.5 | OLA<br>0.007 ppm | 61 |
| S-71 | 100<br>200 | 1<br>5 | Purification of each solvent and then purification of liquid prepared | 0.01 | 0.05 | 0.05 | 0.02 | 0.13 | DOP<br>0.003 ppm | 18 |
| SA-1 | 100 | 1 | Purification after liquid preparation | 3 | 9 | 1 | 9 | 22 | DINP<br>10 ppm | 168 |
| SA-2 | 100 | 1 | Purification after liquid preparation | 5 | 8 | 2 | 7 | 22 | DINP<br>8 ppm | 144 |
| SA-3 | 100 | 1 | Purification after liquid preparation | 15 | 12 | 7 | 9 | 43 | DOA<br>15 ppm | 168 |
| SA-4 | 300 | 1 | Purification after liquid preparation | 250 | 18 | 30 | 75 | 373 | DOA<br>2 ppm | 91 |
| SA-5 | 100 | 5 | Purification after liquid preparation | 15 | 7 | 8 | 8 | 38 | DBP<br>0.5 ppm | 54 |
| SA-6 | 100 | 3 | Purification after liquid preparation | 12 | 67 | 5 | 11 | 95 | DINP<br>4 ppm | 111 |
| SA-7 | 100 | 5 | Purification after liquid preparation | 4 | 15 | 15 | 24 | 58 | DBP<br>10 ppm | 158 |
| SA-8 | 100 | 5 | Purification after liquid preparation | 16 | 23 | 7 | 31 | 77 | DINP<br>5 ppm | 121 |
| SA-9 | 100 | 5 | Purification after liquid preparation | 11 | 15 | 21 | 24 | 71 | DINP<br>8 ppm | 135 |
| SA-12 | 200 | 5 | Purification after liquid preparation | 0.002 | 0.05 | 0.02 | 0.008 | 0.08 | DINP<br>2 ppm | 85 |
| SA-13 | 200 | 5 | Purification after liquid preparation | 0.08 | 0.1 | 0.02 | 0.05 | 0.25 | DBP<br>0.5 ppm | 58 |
| SA-14 | 300 | 1 | Purification after liquid preparation | 120 | 130 | 140 | 150 | 540 | DBP<br>12 ppm | 122 |
| SA-15 | 100 | 1 | Purification after liquid preparation | 15 | 12 | 7 | 9 | 43 | DOA<br>15 ppm | 644 |

TABLE 8-continued

| | | | | | | | | | | |
|---|---|---|---|---|---|---|---|---|---|---|
| SA-16 | 100 | 1 | Purification after liquid preparation | 250 | 18 | 75 | 373 | | DOA 210 ppm | 1,250 |
| SA-17 | 200 | 5 | Purification after liquid preparation | 15 | 7 | 8 | 38 | | DBP 0.5 ppm | 333 |
| SA-18 | 300 | 4 | Purification after liquid preparation | 12 | 67 | 11 | 95 | | DINP 24 ppm | 1,500 |

| Treatment liquid | First organic solvent | | | Second organic solvent | | | Mixing ratio (first:second:others = wt %:wt %:wt %) |
|---|---|---|---|---|---|---|---|
| | Type | SP value ($MPa^{1/2}$) | Boiling point (°C.) | Type | SP value ($MPa^{1/2}$) | Boiling point (°C.) | |
| S-38 | Isoamyl acetate | 17.4 | 142 | Methyl isobutyl carbinol | 21.2 | 132 | 97:3:— |
| S-39 | Isoamyl acetate | 17.4 | 142 | Methyl isobutyl carbinol | 21.2 | 132 | 95:5:— |
| S-40 | Isoamyl acetate | 17.4 | 142 | Methyl isobutyl carbinol | 21.2 | 132 | 90:10:— |
| S-41 | Butyl acetate | 17.8 | 126 | Methyl isobutyl carbinol | 21.2 | 132 | 97:3:— |
| S-42 | Butyl acetate | 17.8 | 126 | Methyl isobutyl carbinol | 21.2 | 132 | 95:5:— |
| S-43 | Butyl acetate | 17.8 | 126 | Methyl isobutyl carbinol | 21.2 | 132 | 90:10:— |
| S-44 | Butyl acetate | 17.8 | 126 | Propylene glycol monomethyl ether acetate | 17.9 | 145 | 97:3:— |
| S-45 | Butyl acetate | 17.8 | 126 | Propylene glycol monomethyl ether acetate | 17.9 | 145 | 95:5:— |
| S-46 | Butyl acetate | 17.8 | 126 | Propylene glycol monomethyl ether acetate | 17.9 | 145 | 90:10:— |
| S-47 | Butyl acetate | 17.8 | 126 | Cyclohexanone | 20 | 156 | 99:1:— |
| S-48 | Butyl acetate | 17.8 | 126 | Cyclohexanone | 20 | 156 | 98:2:— |
| S-49 | Isoamyl acetate | 17.4 | 142 | Methyl isobutyl carbinol | 21.2 | 132 | 95:5:— |

TABLE 8-continued

| | | Purifying method | | | | | | |
|---|---|---|---|---|---|---|---|---|
| | | | | | | | | |
| S-50 | Butyl acetate | 17.8 | 126 | Methyl isobutyl carbinol | 21.2 | 132 | | 97:3:— |
| S-51 | Isoamyl acetate | 17.4 | 142 | Methyl isobutyl carbinol | 21.2 | 132 | | 95:5:— |
| S-52 | Butyl acetate | 17.8 | 126 | Methyl isobutyl carbinol | 21.2 | 132 | | 97:3:— |
| S-53 | Isoamyl acetate | 17.4 | 142 | Methyl isobutyl carbinol | 21.2 | 132 | | 95:5:— |
| S-54 | Butyl acetate | 17.8 | 126 | Methyl isobutyl carbinol | 21.2 | 132 | | 97:3:— |
| S-55 | Isoamyl acetate | 17.4 | 142 | Methyl isobutyl carbinol | 21.2 | 132 | | 95:5:— |
| S-56 | Butyl acetate | 17.8 | 126 | Methyl isobutyl carbinol | 21.2 | 132 | | 97:3:— |

| Treatment liquid | Purifying method | | | metal component (ppt by mass) | | | | | Organic compound having boiling point of 300° C. or higher (ppm by mass) | Moisture content (ppm by mass) |
|---|---|---|---|---|---|---|---|---|---|---|
| | Purifying device | Number of circulation | Purification procedure | Fe | Cr | Ni | Pb | Total | | |
| S-38 | 100 | 3 | Purification after liquid preparation | 26.3 | 5.7 | 9.7 | 4.6 | 46.3 | DOA 1.23 ppm | 21 |
| S-39 | 100 | 5 | Purification after liquid preparation | 23.5 | 4 | 9.9 | 3.1 | 40.5 | DOA 2 ppm | 55 |
| S-40 | 100 | 3 | Purification after liquid preparation | 4.4 | 9.3 | 0.7 | 2.2 | 16.6 | DOA 8.74 ppm | 89 |
| S-41 | 100 | 5 | Purification after liquid preparation | 3.5 | 2.9 | 1.4 | 2.3 | 10.1 | DBP 5.27 | 18 |
| S-42 | 200 | 3 | Purification after liquid preparation | 22.6 | 0.1 | 6.5 | 9.7 | 38.9 | DBP 0.38 ppm | 13 |
| S-43 | 200 | 3 | Purification after liquid preparation | 14.4 | 8.1 | 5.3 | 7.3 | 35. | DBP 1.27 ppm | 42 |
| S-44 | 100 | 3 | Purification after liquid preparation | 10.7 | 0.7 | 0.3 | 2.4 | 14.1 | DINP 2.4 ppm | 83 |

TABLE 8-continued

| | | | | | | | | | | |
|---|---|---|---|---|---|---|---|---|---|---|
| S-45 | 100 | 2 | Purification after liquid preparation | 15.1 | 9.5 | 6.4 | 3.5 | 34.5 | DINP 3.82 ppm | 75 |
| S-46 | 100 | 3 | Purification after liquid preparation | 13 | 7.7 | 2.8 | 1.7 | 25.2 | DINP 6.5 ppm | 98 |
| S-47 | 100 | 3 | Purification after liquid preparation | 3.6 | 7.1 | 1 | 0.8 | 12.5 | DBP 6.69 ppm | 111 |
| S-48 | 100 | 3 | Purification after liquid preparation | 21.3 | 3.2 | 6.3 | 7.5 | 38.3 | DBP 3.81 ppm | 61 |
| S-49 | 100 200 | 1 3 | Purification after liquid preparation | 23.5 | 4 | 9.9 | 3.1 | 40.5 | OLA 0.02 ppm | 55 |
| S-50 | 100 200 | 1 3 | Purification after liquid preparation | 3.5 | 2.9 | 1.4 | 2.3 | 10.1 | DOP 0.03 ppm | 18 |
| S-51 | 100 200 | 2 2 | Purification after liquid preparation | 23.5 | 4 | 9.9 | 3.1 | 40.5 | OLA 0.5 ppm | 55 |
| S-52 | 100 200 | 2 2 | Purification after liquid preparation | 3.5 | 2.9 | 1.4 | 2.3 | 10.1 | DOP 0.7 ppm | 18 |
| S-53 | 100 200 | 3 1 | Purification after liquid preparation | 23.5 | 4 | 9.9 | 3.1 | 40.5 | OLA 1.5 ppm | 55 |
| S-54 | 100 200 | 3 1 | Purification after liquid preparation | 3.5 | 2.9 | 1.4 | 2.3 | 10.1 | DOP 1.8 ppm | 18 |
| S-55 | 200 | 4 | Purification after liquid preparation | 23.5 | 4 | 9.9 | 3.1 | 40.5 | OLA 0.01 ppm | 55 |
| S-56 | 200 | 4 | Purification after liquid preparation | 3.5 | 2.9 | 1.4 | 2.3 | 10.1 | DOP 0.01 ppm | 18 |

[Purification of Organic Solvent]

Each of the treatment liquid was purified.

Figure 2:
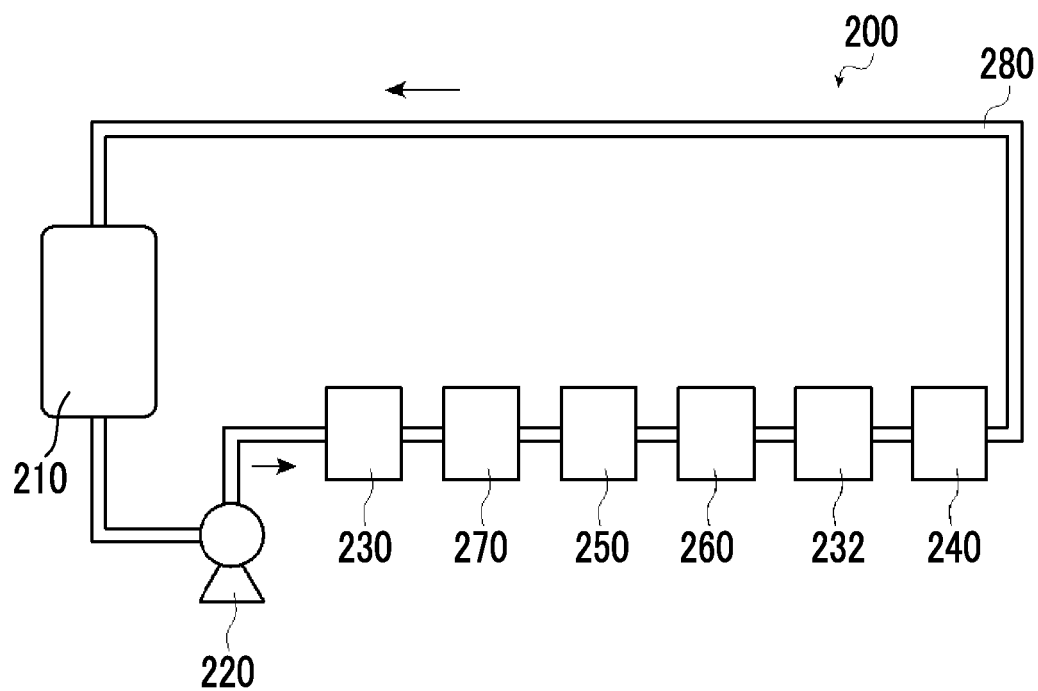
FIG. 2 is a schematic view showing an organic solvent purifying device used in the section of Examples.
Figure 3:
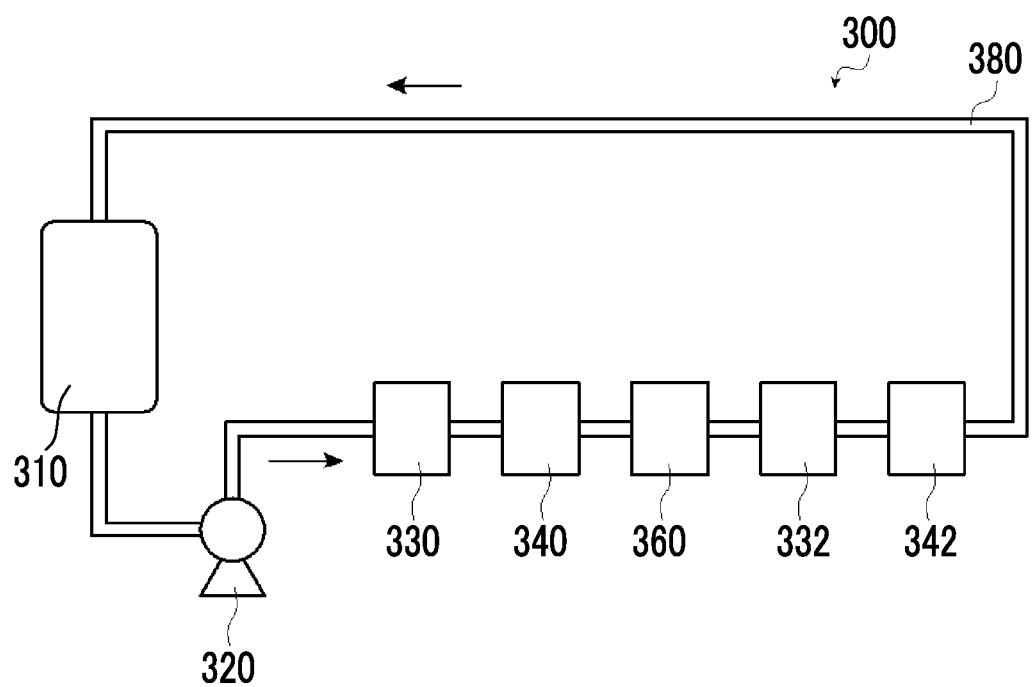
FIG. 3 is a schematic view showing an organic solvent purifying device used in the section of Examples.

For the purification of the treatment liquid or the organic solvent included in the treatment liquid, at least one selected from an organic solvent purifying device 100 in FIG. 1, an organic solvent purifying device 200 in FIG. 2, or an organic solvent purifying device 300 in FIG. 3 was used.

Furthermore, in the present Examples, the organic solvent purifying devices of FIGS. 1 to 3 were used, but in a case where the content of each of the components included in the purified treatment liquid can be set to a desired numerical value, another organic solvent purifying device having a change in the type and the arrangement of the respective members may be used.

In the organic solvent purifying device 100 in FIG. 1, each of the members is connected through a supply pipe 80. The overview of each of the members is shown below.

Tank 10: Tank in which a liquid contact part made of stainless steel is coated with PTFE Pump 20: Pump in which a liquid contact part is coated with PTFE Metal ion adsorption filter 30: 15-nm IEX PTFE manufactured by Entegris Inc. (Filter having a pore diameter of 15 nm, having a sulfo group on a surface of a PTFE-made base material)

Metal ion adsorption filter 32: 15-nm IEX PTFE manufactured by Entegris Inc. (Filter having a pore diameter of 15 nm, having a sulfo group on a surface of a PTFE-made base material)

Filtering member 40: 12-nm PTFE manufactured by Entegris Inc. (PTFE-made filter having a diameter of a particle to be removed of 12 nm)

Filtering member 42: 12-nm PTFE manufactured by Entegris Inc. (PTFE-made filter having a diameter of a particle to be removed of 12 nm)

Organic impurity adsorption member 50: Filter in which activated carbon adheres to non-woven fabric described in JP2013-150979A Distillation unit 60: Distillation tower having a shelf stage system made of SUS316 as a material (number of shelf boards of 12)

Dehydration member 70: Zeolite pervaporation membrane (manufactured by Mitsubishi Chemical Co., Ltd.) module Supply pipe 80: PFA-made tube having an outer diameter of 12 mm In the organic solvent purifying device 200 in FIG. 2, each of the members is connected through a supply pipe 280. The overview of each of the members is shown below.

Tank 210: Tank in which a liquid contact part made of stainless steel is coated with PTFE Pump 220: Pump in which a liquid contact part is coated with PTFE Metal ion adsorption filter 230: Nylon filter having a pore diameter of 20 nm, manufactured by Nihon Pall Ltd.

Metal ion adsorption filter 232: 15-nm IEX PTFE manufactured by Entegris Inc. (Filter having a pore diameter of 15 nm, having a sulfo group on a surface of a PTFE-made base material)

Filtering member 240: 10-nm PTFE manufactured by Entegris Inc. (PTFE-made filter having a diameter of a particle to be removed of 10 nm)

Organic impurity adsorption member 250: Filter in which activated carbon adheres to non-woven fabric described in JP2013-150979A Distillation unit 260: Distillation tower having a shelf stage system made of SUS316 as a material (number of shelf boards of 18)

Dehydration member 270: Zeolite pervaporation membrane (manufactured by Mitsubishi Chemical Co., Ltd.) module Supply pipe 280: PFA-made tube with an outer diameter of 12 mm In the organic solvent purifying device 300 in FIG. 3, each of the members is connected through a supply pipe 380. The overview of each of the members is shown below.

Tank 310: Tank in which a liquid contact part made of stainless steel is coated with PTFE Pump 320: Pump in which a liquid contact part is coated with PTFE Metal ion adsorption filter 330: Nylon filter having a pore diameter of 40 nm, manufactured by Nihon Pall Ltd.

Metal ion adsorption filter 332: Nylon filter having a pore diameter of 20 nm, manufactured by Nihon Pall Ltd.

Filtering member 340: 10-nm UPE manufactured by Entegris Inc. (high-density polyethylene filter having a diameter of a particle to be removed of 10 nm)

Filtering member 342: 10-nm UPE manufactured by Entegris Inc. (high-density polyethylene filter having a diameter of a particle to be removed of 10 nm)

Distillation unit 360: Distillation tower having a shelf stage system made of SUS316 as a material (number of shelf boards of 10)

Supply pipe 380: PFA-made tube having an outer diameter of 12 mm

Each of the organic solvents described in Table 8 was filled in the tank 10 of FIG. 1, the tank 210 of FIG. 2, and the tank 280 of FIG. 3, and then substances to be purified were subjected to a purifying treatment by circulating them predetermined times according to the direction of the arrows in FIGS. 1 to 3, thereby obtaining a treatment liquid or an organic solvent included in the treatment liquid.

In addition, the type, the number of circulations, and the purification procedure of the organic solvent purifying device to be used (simply described as "Purifying device" in the tables) are shown in Table 8. Further, in Table 8, for the examples shown together with the organic solvent purifying device, circulation was performed predetermined times using the organic solvent purifying device in the upper section, and circulation was performed predetermined times using the organic solvent purifying device in the lower section.

Here, the purifying step means a step of performing a purification treatment after preparing a treatment liquid (simply described as "Purification after liquid preparation" in the table), or a step of performing a purifying treatment for each of organic solvents, and then performing a purifying treatment of a treatment liquid prepared using the organic solvent after the purifying treatment (simply described as "Purification of each solvent and then purification of liquid prepared").

<Method for Measuring Content And the Like of Each of Components Included in Treatment Liquid>

For the measurement of the content and the like of each of the components included in the treatment liquid produced in each of Examples and Comparative Examples, the following methods were used. Further, all of the following measurements were performed in a clean room at a level satisfying International Standards Organization (ISO) Class 2 or lower. In order to improve the measurement precision, in a case where the value is lower than a detection limit in normal measurements in the measurement of each of the components, the measurement is performed after performing concentration to 1/100 based on volume, and then the value was converted into a content of the organic solvent before the concentration for the calculation of contents.

[Measurement of Metal Component (Metal Impurities)]

The content of the metal atoms included in the metal impurities in the treatment liquid produced in each of Examples and Comparative Examples was measured using Agilent 8800 Triple Quadrupole ICP-MS (#200, semiconductor analysis).

(Measurement Conditions)

For a sample introduction system, a quartz torch, a coaxial PFA (perfluoroalkoxyalkane) nebulizer (for self-suction), and a platinum interface cone were used. Measurement parameters for cool plasma conditions are as follows.

Radio frequency (RF) output (W): 600
Carrier gas flow rate (L/min): 0.7
Makeup gas flow rate (L/min): 1
Sampling depth (mm): 18

[Measurement of Organic Compound Having Boiling Point of 300° C. or Higher]

The content of the organic compound having a boiling point of 300° C. or higher was measured with direct-injection mass spectrometry (DI-MS).

Here, in Table 8, the SP value of the organic solvent was calculated using the Fedors method described in "Properties of Polymers, 2" edition, published in 1976" (unit: $MPa^{1/2}$).

[Measurement of Content of Water (Moisture Content)]

The content of water in each of the treatment liquids was measured. For the measurement, a Karl Fischer moisture meter (trade name: 'MKC-710M', manufactured by Kyoto Electronics Manufacturing Co., Ltd., Karl Fischer coulometric titration) (an analysis method by an area percentage method) was used.

[Evaluation Test]

For the next items, performance evaluation was performed on a wafer which had been subjected to exposing and developing treatment. Details of the results are shown in Table 9.

<Evaluation of Defect after Development>

The number of particles having a diameter of 19 nm or more (hereinafter also referred to as "defects") present on the wafer surface for evaluation of defects after development, manufactured above, was counted by a surface inspection device on a wafer (SP-5; manufactured by KLA-Tencor Corporation), and then elemental analysis was performed by means of energy dispersive analysis of X-rays (EDAX). Herein, incorporation of a metal component was defined as metal particles, and defects only with organic materials without incorporation of the metal component were defined as organic residues. For the "organic residues" and the "metal particles" including the metal component, the number of the obtained defects was evaluated based on the following standard. A smaller number of defects indicates better performance good, and in the following standard, evaluation as "C" or higher indicates that a defect level required for a process for manufacturing a semiconductor device is achieved.

"A": The number of defects is 200 or less.
"B": The number of defects is more than 200 and 500 or less
"C": The number of defects is more than 500 and 750 or less.
"D": The number of defects is more than 750 and 1,000 or less.
"E": The number of defects is more than 1,000 and 1,500 or less.
"F": The number of defects is more than 1,500.

(Evaluation of L/S Bridge Performance)

A pattern resolved with a line width of 40 nm and a space width of 20 nm was observed at a magnification of 200 k using a scanning electron microscope (S-9380II manufactured by Hitachi Ltd.). A 200 shot division in total from an exposure shot on the entire wafer surface was observed, and it was evaluated whether bridge defects between the patterns occurred in one field. A case where the bridge defects did not occur at all on the entire wafer surface indicates that the performance was good, and a case where the bridge defects occurred the entire or partial wafer surface indicates that the performance was poor.

(Evaluation of Pattern Roughness after Etching Treatment)

A wafer having a pattern formed on a resist film formed from each of the resist compositions on a 12-inch silicon wafer in which an oxide film having a thickness of 80 nm had been prepared on the surface layer was prepared by the same method as for the patterned wafer prepared in Evaluation of EUV Exposure and Evaluation of ArF Liquid Immersion Exposure which will be described later. Further, for the pattern, a pattern in a shot size of 25 mm×32 mm was exposed on the entire wafer surface, thereby preparing resist pattern.

An oxide film pattern was obtained on the wafer by performing sequential treatments under the conditions of the following etching conditions 1 and 2 using the prepared pattern as an etching mask.

For the formed resist pattern and the oxidized pattern after the etching treatment, an 80 shot division on the wafer was observed at a magnification of 200 k using a scanning electron microscope (S-9380II manufactured by Hitachi Ltd.), the line edge roughness (LER) of a line formed in the observed field of view was determined, and an average value of all the shots was taken as an LER value of the sample. A difference between the LER of the resist pattern and the LER of the pattern formed after etching as defined as ΔLER, and a change in a pattern roughness after the etching treatment (After Etched Image (AEI) roughness) was determined.

(Etching Conditions)
Device: AMAT Centura/e-Max Oxide Etcher
(Etching Condition 1)
Source/bias: 250 W/20 W
Pressure: 7.2 mTorr
Substrate temperature: 25° C.
$CHF_3/SF_6/Ar=40/5/55$ sccm
Time: 50 seconds
(Etching Condition 2)
Source/bias: 250 W/25 W
Pressure: 7.2 mTorr
Substrate temperature: 25° C.
O2/Ar=20/60 sccm
Time: 60 seconds The obtained ΔLER values were evaluated as A to E in accordance with the following standard.

A ΔLER≤−0.1 nm (The roughness was decreased)
B −0.1 nm<ΔLER≤0.1 nm (The roughness had almost no change)
C 0.1 nm<ΔLER≤50.3 nm (The roughness was slightly increased)
D 0.3 nm<ΔLER≤0.5 nm (The roughness was increased)
E 0.5 nm<ΔLER (The roughness was significantly increased)

TABLE 9

| | | PB (60 seconds) | Upper layer film | PB (60 seconds) of upper layer film | PEB | Development | Rinsing | Evaluation of defects after development Organic residue | Evaluation of defects after development Metal particles | Bridge performance | AEI roughness |
|---|---|---|---|---|---|---|---|---|---|---|---|
| Example 1-1 | Resist composition 1 | 120° C. | | | 90° C. | S-1 | | B | B | Bridge defects not seen | A |
| Example 1-3 | Resist composition 3 | 90° C. | | | 110° C. | S-3 | | B | C | Bridge defects not seen | A |
| Example 1-4 | Resist composition 4 | 130° C. | | | 85° C. | S-4 | | A | B | Bridge defects not seen | B |
| Example 1-5 | Resist composition 5 | 110° C. | | | 110° C. | S-5 | | B | B | Bridge defects not seen | B |
| Example 1-6 | Resist composition 6 | 90° C. | | | 85° C. | S-6 | | C | B | Bridge defects not seen | B |
| Example 1-7 | Resist composition 7 | 130° C. | | | 120° C. | S-7 | | C | B | Bridge defects not seen | A |
| Example 1-8 | Resist composition 8 | 110° C. | | | 110° C. | S-8 | | B | B | Bridge defects not seen | A |
| Example 1-9 | Resist composition 9 | 120° C. | | | 90° C. | S-9 | | A | B | Bridge defects not seen | B |
| Example 1-10 | Resist composition 10 | 120° C. | | | 110° C. | S-10 | | B | B | Bridge defects not seen | B |
| Example 1-11 | Resist composition 11 | 110° C. | | | 110° C. | S-11 | | A | A | Bridge defects not seen | B |
| Example 1-12 | Resist composition 12 | 90° C. | | | 90° C. | S-12 | | A | A | Bridge defects not seen | A |
| Example 1-13 | Resist composition 13 | 130° C. | | | 90° C. | S-13 | | C | B | Bridge defects not seen | B |
| Example 1-14 | Resist composition 1 | 110° C. | | | 120° C. | S-14 | | A | B | Bridge defects not seen | A |
| Example 1-15 | Resist composition 2 | 90° C. | | | 100° C. | S-15 | | A | B | Bridge defects not seen | B |
| Example 1-16 | Resist composition 3 | 120° C. | | | 130° C. | S-16 | S-8 | B | B | Bridge defects not seen | A |
| Example 1-17 | Resist composition 4 | 110° C. | | | 110° C. | S-17 | | C | B | Bridge defects not seen | B |
| Example 1-18 | Resist composition 5 | 90° C. | | | 130° C. | S-18 | | B | B | Bridge defects not seen | A |
| Example 1-19 | Resist composition 6 | 130° C. | | | 130° C. | S-19 | | C | B | Bridge defects not seen | A |
| Example 1-20 | Resist composition 7 | 110° C. | | | 110° C. | S-20 | | A | A | Bridge defects not seen | A |
| Example 1-21 | Resist composition 8 | 90° C. | | | 90° C. | S-21 | | B | C | Bridge defects not seen | B |
| Example 1-22 | Resist composition 9 | 130° C. | | | 90° C. | S-22 | | A | A | Bridge defects not seen | B |
| Example 1-23 | Resist composition 10 | 120° C. | | | 100° C. | S-23 | | B | B | Bridge defects not seen | B |
| Example 1-26 | Resist composition 9 | 110 | | | 110° C. | S-26 | S-14 | D | C | Bridge defects not seen | C |
| Example 1-27 | Resist composition 3 | 90° C. | | | 90° C. | S-27 | S-17 | B | B | Bridge defects not seen | A |
| Example 1-28 | Resist composition 4 | 130° C. | | | 100° C. | S-28 | S-22 | B | B | Bridge defects not seen | B |
| Example 1-29 | Resist composition 5 | 90° C. | | | 100° C. | S-29 | S-25 | A | C | Bridge defects not seen | B |
| Example 1-30 | Resist composition 3 | 130° C. | T-1 | 90° C. | 85° C. | S-30 | | B | A | Bridge defects not seen | B |
| Example 1-31 | Resist composition 4 | 180° C. | T-2 | 120° C. | — | S-31 | | B | A | Bridge defects not seen | B |
| Example 1-32 | Resist composition 5 | 110° C. | T-3 | 90° C. | — | S-32 | | A | C | Bridge defects not seen | B |
| Example 1-33 | Resist composition 3 | — | T-4 | 120° C. | — | S-33 | | B | B | Bridge defects not seen | B |
| Example 1-34 | Resist composition 4 | 120° C. | T-5 | 120° C. | 85° C. | S-34 | S-22 | B | B | Bridge defects not seen | B |
| Example 1-35 | Resist composition 5 | 110° C. | T-6 | 120° C. | 95° C. | S-35 | S-25 | A | C | Bridge defects not seen | B |
| Example 1-36 | Resist composition 5 | 120° C. | T-7 | 120° C. | 120° C. | S-36 | | B | B | Bridge defects not seen | A |
| Example 1-37 | Resist composition 4 | 120° C. | T-8 | 120° C. | 120° C. | S-37 | | B | B | Bridge defects not seen | B |
| Example 1-38 | Resist composition 4 | 120° C. | | | 120° C. | S-4 | | B | B | Bridge defects not seen | B |
| Example 1-39 | Resist composition 23 | 110° C. | | | 120° C. | S-23 | | B | A | Bridge defects not seen | B |

TABLE 9-continued

| | Resist composition | | | | | | | | |
|---|---|---|---|---|---|---|---|---|---|
| Example 1-40 | Resist composition 24 | 120° C. | | | 100° C. | S-24 | C | C | Bridge defects not seen | B |
| Example 1-41 | Resist composition 25 | 120° C. | | | 100° C. | S-25 | B | C | Bridge defects not seen | B |
| Example 1-42 | Resist composition 25 | 120° C. | T-1 | 90° C. | 95° C. | S-25 | B | C | Bridge defects not seen | C |
| Example 1-43 | Resist composition 4 | 120° C. | T-9 | 120° C. | 120° C. | S-4 | B | B | Bridge defects not seen | A |
| Example 1-44 | Resist composition 25 | 120° C. | T-9 | 90° C. | 90° C. | S-25 | B | C | Bridge defects not seen | C |
| Example 1-110 | Resist composition 7 | 110° C. | | | 110° C. | S-61 | A | A | Bridge defects not seen | C |
| Example 1-111 | Resist composition 4 | 120° C. | T-8 | 120° C. | 120° C. | S-62 | B | B | Bridge defects not seen | C |
| Example 1-112 | Resist composition 4 | 130° C. | | | 85° C. | S-63 | A | B | Bridge defects not seen | C |
| Example 1-113 | Resist composition 10 | 120° C. | | | 110° C. | S-64 | C | B | Bridge defects not seen | B |
| Example 1-114 | Resist composition 7 | 110° C. | | | 110° C. | S-65 | C | A | Bridge defects not seen | A |
| Example 1-115 | Resist composition 10 | 120° C. | | | 110° C. | S-66 | B | B | Bridge defects not seen | B |
| Example 1-116 | Resist composition 7 | 110° C. | | | 110° C. | S-67 | B | A | Bridge defects not seen | A |
| Example 1-117 | Resist composition 10 | 120° C. | | | 110° C. | S-68 | A | B | Bridge defects not seen | B |
| Example 1-118 | Resist composition 7 | 110° C. | | | 110° C. | S-69 | A | A | Bridge defects not seen | A |
| Example 1-119 | Resist composition 10 | 120° C. | | | 110° C. | S-70 | A | B | Bridge defects not seen | B |
| Example 1-120 | Resist composition 7 | 110° C. | | | 110° C. | S-71 | A | A | Bridge defects not seen | A |
| Comparative Example 1-8 | Resist composition 6 | 90° C. | | | 120° C. | SA-15 | E | E | Bridge unevenly distributed in wafer edge | D |
| Comparative Example 1-9 | Resist composition 6 | 90° C. | | | 120° C. | SA-16 | F | D | Bridge unevenly distributed in wafer edge | E |
| Comparative Example 1-10 | Resist composition 6 | 90° C. | | | 120° C. | SA-17 | E | E | Bridge unevenly distributed in wafer edge | D |
| Comparative Example 1-11 | Resist composition 6 | 90° C. | | | 120° C. | SA-18 | F | D | Bridge unevenly distributed in wafer edge | E |

| | Resist composition | PB (60 seconds) | PEB (60 seconds) | Development | Rinsing | Evaluation of defects after development Organic residue | Evaluation of defects after development Metal particles | Bridge performance | AEI roughness |
|---|---|---|---|---|---|---|---|---|---|
| Example 1-45 | Resist composition 41 | 90° C. | 90° C. | SA-13 | S-38 | B | B | Bridge defects not seen | A |
| Example 1-46 | Resist composition 41 | 90° C. | 90° C. | SA-13 | S-39 | B | B | Bridge defects not seen | B |
| Example 1-47 | Resist composition 41 | 90° C. | 90° C. | SA-13 | S-40 | B | B | Bridge defects not seen | B |
| Example 1-48 | Resist composition 42 | 100° C. | 90° C. | SA-13 | S-41 | B | B | Bridge defects not seen | B |
| Example 1-49 | Resist composition 42 | 100° C. | 90° C. | SA-13 | S-42 | B | B | Bridge defects not seen | A |
| Example 1-50 | Resist composition 42 | 100° C. | 90° C. | SA-13 | S-43 | B | B | Bridge defects not seen | B |
| Example 1-51 | Resist composition 42 | 100° C. | 90° C. | SA-13 | S-44 | B | B | Bridge defects not seen | B |

TABLE 9-continued

| Example 1-52 | Resist composition 42 | 100° C. | 90° C. | SA-13 | S-45 | B | B | Bridge defects not seen | A |
|---|---|---|---|---|---|---|---|---|---|
| Example 1-53 | Resist composition 42 | 100° C. | 90° C. | SA-13 | S-46 | B | B | Bridge defects not seen | B |
| Example 1-54 | Resist composition 43 | 90° C. | 90° C. | SA-13 | S-41 | B | B | Bridge defects not seen | A |
| Example 1-55 | Resist composition 43 | 90° C. | 90° C. | SA-13 | S-42 | B | B | Bridge defects not seen | B |
| Example 1-56 | Resist composition 43 | 90° C. | 90° C. | SA-13 | S-43 | B | B | Bridge defects not seen | B |
| Example 1-57 | Resist composition 44 | 90° C. | 100° C. | S-11 | S-41 | A | B | Bridge defects not seen | B |
| Example 1-58 | Resist composition 44 | 90° C. | 100° C. | S-11 | S-42 | B | B | Bridge defects not seen | B |
| Example 1-59 | Resist composition 45 | 90° C. | 100° C. | S-11 | S-41 | A | B | Bridge defects not seen | B |
| Example 1-60 | Resist composition 45 | 90° C. | 100° C. | S-11 | S-42 | A | B | Bridge defects not seen | B |
| Example 1-61 | Resist composition 45 | 90° C. | 100° C. | S-11 | S-43 | B | B | Bridge defects not seen | A |
| Example 1-62 | Resist composition 46 | 90° C. | 100° C. | S-11 | S-41 | A | B | Bridge defects not seen | B |
| Example 1-63 | Resist composition 47 | 100° C. | 100° C. | S-11 | S-41 | B | B | Bridge defects not seen | B |
| Example 1-64 | Resist composition 47 | 100° C. | 100° C. | S-11 | S-42 | B | B | Bridge defects not seen | B |
| Example 1-65 | Resist composition 47 | 100° C. | 100° C. | S-11 | S-43 | B | B | Bridge defects not seen | A |
| Example 1-66 | Resist composition 48 | 100° C. | 100° C. | S-11 | S-41 | A | A | Bridge defects not seen | B |
| Example 1-67 | Resist composition 48 | 100° C. | 100° C. | S-11 | S-42 | A | A | Bridge defects not seen | A |
| Example 1-68 | Resist composition 48 | 100° C. | 100° C. | S-11 | S-43 | B | B | Bridge defects not seen | B |
| Example 1-69 | Resist composition 49 | 100° C. | 100° C. | S-11 | S-42 | B | B | Bridge defects not seen | B |
| Example 1-70 | Resist composition 50 | 100° C. | 100° C. | S-11 | S-41 | A | A | Bridge defects not seen | A |
| Example 1-71 | Resist composition 50 | 100° C. | 100° C. | S-11 | S-42 | A | A | Bridge defects not seen | B |
| Example 1-72 | Resist composition 50 | 100° C. | 95° C. | S-11 | S-43 | B | B | Bridge defects not seen | B |
| Example 1-73 | Resist composition 51 | 100° C. | 95° C. | S-11 | S-42 | A | B | Bridge defects not seen | B |
| Example 1-74 | Resist composition 52 | 100° C. | 95° C. | S-11 | S-42 | A | B | Bridge defects not seen | A |
| Example 1-75 | Resist composition 53 | 90° C. | 100° C. | S-11 | S-44 | A | B | Bridge defects not seen | A |
| Example 1-76 | Resist composition 53 | 90° C. | 100° C. | S-11 | S-45 | A | B | Bridge defects not seen | B |
| Example 1-77 | Resist composition 53 | 90° C. | 100° C. | S-11 | S-46 | B | A | Bridge defects not seen | B |

TABLE 9-continued

| Example | Composition | | | | | | | | |
|---|---|---|---|---|---|---|---|---|---|
| Example 1-78 | Resist composition 54 | 100° C. | 105° C. | S-11 | S-42 | B | A | Bridge defects not seen | A |
| Example 1-79 | Resist composition 54 | 100° C. | 105° C. | S-11 | S-45 | A | B | Bridge defects not seen | B |
| Example 1-80 | Resist composition 55 | 100° C. | 95° C. | S-11 | S-47 | A | B | Bridge defects not seen | B |
| Example 1-81 | Resist composition 55 | 100° C. | 95° C. | S-11 | S-48 | B | B | Bridge defects not seen | B |
| Example 1-82 | Resist composition 56 | 100° C. | 100° C. | S-11 | S-42 | B | A | Bridge defects not seen | A |
| Example 1-83 | Resist composition 57 | 100° C. | 100° C. | S-11 | S-42 | B | A | Bridge defects not seen | B |
| Example 1-84 | Resist composition 58 | 100° C. | 100° C. | S-11 | S-45 | B | A | Bridge defects not seen | A |
| Example 1-85 | Resist composition 59 | 100° C. | 100° C. | S-11 | S-45 | B | B | Bridge defects not seen | B |
| Example 1-86 | Resist composition 60 | 100° C. | 100° C. | S-11 | S-42 | B | A | Bridge defects not seen | B |
| Example 1-87 | Resist composition 61 | 95° C. | 95° C. | S-11 | S-41 | A | A | Bridge defects not seen | B |
| Example 1-88 | Resist composition 61 | 95° C. | 95° C. | S-11 | S-42 | A | A | Bridge defects not seen | A |
| Example 1-89 | Resist composition 61 | 95° C. | 95° C. | S-11 | S-43 | B | B | Bridge defects not seen | B |
| Example 1-90 | Resist composition 62 | 95° C. | 100° C. | S-11 | S-42 | B | A | Bridge defects not seen | A |
| Example 1-91 | Resist composition 63 | 95° C. | 100° C. | S-11 | S-42 | B | A | Bridge defects not seen | B |
| Example 1-92 | Resist composition 64 | 95° C. | 100° C. | S-11 | S-45 | B | A | Bridge defects not seen | A |
| Example 1-93 | Resist composition 65 | 100° C. | 90° C. | S-11 | S-42 | B | A | Bridge defects not seen | A |
| Example 1-94 | Resist composition 66 | 100° C. | 90° C. | S-11 | S-45 | B | A | Bridge defects not seen | B |
| Example 1-95 | Resist composition 67 | 100° C. | 90° C. | S-11 | S-42 | B | A | Bridge defects not seen | B |
| Example 1-96 | Resist composition 68 | 100° C. | 90° C. | S-11 | S-45 | B | A | Bridge defects not seen | A |
| Example 1-97 | Resist composition 41 | 90° C. | 90° C. | SA-13 | S-49 | A | B | Bridge defects not seen | B |
| Example 1-98 | Resist composition 48 | 100° C. | 100° C. | S-11 | S-50 | A | A | Bridge defects not seen | A |
| Example 1-99 | Resist composition 41 | 90° C. | 90° C. | SA-13 | S-51 | B | B | Bridge defects not seen | B |
| Example 1-100 | Resist composition 48 | 100° C. | 100° C. | S-11 | S-52 | B | A | Bridge defects not seen | B |
| Example 1-101 | Resist composition 41 | 90° C. | 90° C. | SA-13 | S-53 | B | B | Bridge defects not seen | B |
| Example 1-102 | Resist composition 48 | 100° C. | 100° C. | S-11 | S-54 | B | A | Bridge defects not seen | B |
| Example 1-103 | Resist composition 41 | 90° C. | 90° C. | SA-13 | S-55 | A | B | Bridge defects not seen | B |

TABLE 9-continued

| Example 1-104 | Resist composition 48 | 100° C. | 100° C. | S-11 | S-56 | A | A | Bridge defects not seen | A |
|---|---|---|---|---|---|---|---|---|---|

2. ArF Liquid Immersion Exposure (Examples 2-1 to 2-47 and Comparative Examples 2-1 to 2-12)

<Evaluation of ArF Liquid Immersion Exposure>

Using the resist composition described in Table 5, a resist pattern was formed by the following operation.

[Application and Post-Application Baking (PB) of Resist Composition]

Each of the resist compositions obtained as above was applied onto a 12-inch silicon wafer, and the coating film formed on the silicon wafer was baked at 90° C. to 120° C. for 60 seconds to form a resist film having a film thickness of 40 nm.

Furthermore, in a case where CH and L/S pattern evaluation is carried out, a composition for forming an organic antireflection film, ARC29SR (manufactured by Brewer Science, Inc.), was applied onto the silicon wafer before applying the resist film, and the coating film was baked at 205° C. for 60 seconds to form an antireflection film having a film thickness of

[Application and Post-Application Baking (PB) of Composition for Forming Upper Layer Film]

The composition (topcoat composition) for forming an upper layer film shown in Table 6 was applied onto the baked resist film and then baked at a PB temperature (unit: ° C.) shown in Table 10 below over 60 seconds to form an upper layer film (topcoat film) having a film thickness of 40 nm.

[Exposure]

(Evaluation of Post-Development Bridge Performance)

The wafer prepared above was subjected to entire-surface exposure at an expose dose of 1 mJ/cm$^2$, using an ArF excimer laser liquid immersion scanner (manufactured by ASML; XT1700i, NA 1.20, C-Quad, outer sigma of 0.750, inner sigma of 0.650, and Y deflection), not through a mask.

[Evaluation Test]

With regard to the same item as in "Evaluation of EUV Exposure" as described above, the number of particles (hereinafter also referred to as "defects") having a diameter of 19 nm or more present on the wafer surface for evaluating defects after development, prepared above, was counted by a surface inspection device on a wafer (SP-5; manufactured by KLA-Tencor Corporation), and then each of the defects was subjected to elemental analysis by means of EDAX. From the obtained results, the defects after development (organic residues) and the particle defects containing metal elements were counted and evaluated in accordance with the same standard as in "Evaluation of EUV Exposure" as described above.

(Evaluation of L/S Pattern)

For the wafer prepared above, the entire wafer surface was subjected to pattern exposure through a 6% halftone mask including a pattern (evaluation of L/S bridge) for forming a 1:1 line-and-space pattern in a wafer dimension with a pitch of 120 nm and a line width of 80 nm, using an ArF excimer laser liquid immersion scanner (manufactured by ASML; XT1700i, NA 1.20, C-Quad, outer sigma of 0.750, inner sigma of 0.650, and Y deflection), at an exposure dose completed with a line width of 80 nm and a space width of 40 nm. Ultrapure water was used as an immersion liquid. Thereafter, heating (post-exposure baking; PEB) was performed for 60 seconds under the condition of 90° C. to 120° C. Subsequently, puddle-development was performed for 30 seconds with a developer described in Table 10 below, using a developing device (manufactured by SOKUDO Co., Ltd.; RF3). Thereafter, rinsing was performed for 15 seconds with a rinsing liquid described in Table 10 below while rotating the wafer at 50 rotations (rpm), and subsequently, the wafer was rotated for 30 seconds at a rotation speed of 2,000 rpm to obtain a line-and-space pattern.

[Evaluation Test]

With regard to the same item as in "Evaluation of EUV Exposure" as described above, the resist pattern was evaluated by the same method, using "S-93801I" (manufactured by Hitachi, Ltd.) as a scanning electron microscope. Details of the results are shown in Table 10.

TABLE 10

| | | PB (60 seconds) | Upper layer film | PB (60 seconds) of upper layer film | PEB | Development | Rinsing | Evaluation of defects after development Organic residue | Evaluation of defects after development Metal particles | Bridge performance | AEI roughness |
|---|---|---|---|---|---|---|---|---|---|---|---|
| Example 2-1 | Resist composition 14 | 120° C. | | | 90° C. | S-2 | | B | B | Bridge defects not seen | A |
| Example 2-2 | Resist composition 15 | 110° C. | | | 110° C. | S-3 | | B | B | Bridge defects not seen | B |
| Example 2-3 | Resist composition 16 | 90° C. | | | 110° C. | S-4 | | A | B | Bridge defects not seen | A |
| Example 2-4 | Resist composition 17 | 130° C. | | | 85° C. | S-9 | | B | B | Bridge defects not seen | A |
| Example 2-5 | Resist composition 18 | 110° C. | | | 110° C. | S-10 | | A | B | Bridge defects not seen | B |
| Example 2-6 | Resist composition 19 | 90° C. | | | 85° C. | S-11 | | B | A | Bridge defects not seen | B |
| Example 2-7 | Resist composition 20 | 130° C. | | | 120° C. | S-12 | | A | A | Bridge defects not seen | B |
| Example 2-8 | Resist composition 21 | 110° C. | | | 110° C. | S-2 | S-14 | B | B | Bridge defects not seen | A |

TABLE 10-continued

| | | PB (60 seconds) | Upper layer film | PB (60 seconds) of upper layer film | PEB | Development | Rinsing | Evaluation of defects after development Organic residue | Evaluation of defects after development Metal particles | Bridge performance | AEI roughness |
|---|---|---|---|---|---|---|---|---|---|---|---|
| Example 2-9 | Resist composition 22 | 120° C. | | | 90° C. | S-3 | S-17 | B | B | Bridge defects not seen | B |
| Example 2-10 | Resist composition 14 | 120° C. | | | 110° C. | S-4 | S-25 | A | C | Bridge defects not seen | B |
| Example 2-11 | Resist composition 15 | 110° C. | | | 110° C. | S-9 | S-14 | B | B | Bridge defects not seen | A |
| Example 2-12 | Resist composition 16 | 90° C. | | | 90° C. | S-10 | S-17 | A | B | Bridge defects not seen | B |
| Example 2-13 | Resist composition 17 | 130° C. | | | 90° C. | S-11 | S-22 | B | A | Bridge defects not seen | B |
| Example 2-14 | Resist composition 18 | 110° C. | | | 120° C. | S-12 | S-25 | A | C | Bridge defects not seen | A |
| Example 2-15 | Resist composition 19 | 90° C. | | | 100° C. | S-15 | | B | B | Bridge defects not seen | A |
| Example 2-16 | Resist composition 20 | 120° C. | | | 130° C. | S-20 | | A | A | Bridge defects not seen | B |
| Example 2-17 | Resist composition 20 | 120° C. | | | 130° C. | S-21 | | B | B | Bridge defects not seen | A |
| Example 2-18 | Resist composition 21 | 110° C. | | | 110° C. | S-20 | S-14 | A | B | Bridge defects not seen | B |
| Example 2-19 | Resist composition 22 | 90° C. | | | 130° C. | S-22 | | B | A | Bridge defects not seen | B |
| Example 2-20 | Resist composition 16 | 130° C. | | | 130° C. | S-29 | | B | A | Bridge defects not seen | A |
| Example 2-21 | Resist composition 17 | 110° C. | | | 110° C. | S-31 | | A | A | Bridge defects not seen | A |
| Example 2-22 | Resist composition 14 | 90° C. | | | 90° C. | S-35 | | A | B | Bridge defects not seen | A |
| Example 2-23 | Resist composition 19 | 130° C. | | | 90° C. | S-35 | S-14 | A | B | Bridge defects not seen | A |
| Example 2-24 | Resist composition 20 | 120° C. | | | 100° C. | S-37 | | B | B | Bridge defects not seen | B |
| Example 2-25 | Resist composition 20 | 90° C. | T-1 | 90° C. | 90° C. | S-11 | | B | A | Bridge defects not seen | B |
| Example 2-26 | Resist composition 20 | 130° C. | T-2 | 120° C. | 100° C. | S-12 | | A | A | Bridge defects not seen | B |
| Example 2-27 | Resist composition 20 | 110° C. | T-3 | 90° C. | 110° C. | S-15 | | B | B | Bridge defects not seen | B |
| Example 2-28 | Resist composition 24 | 90° C. | T-4 | 120° C. | 90° C. | S-20 | | A | A | Bridge defects not seen | A |
| Example 2-29 | Resist composition 20 | 130° C. | T-5 | 90° C. | 100° C. | S-20 | S-14 | A | B | Bridge defects not seen | A |
| Example 2-30 | Resist composition 20 | 90° C. | T-6 | 120° C. | 100° C. | S-22 | | B | A | Bridge defects not seen | A |
| Example 2-31 | Resist composition 20 | 130° C. | T-7 | 90° C. | 85° C. | S-29 | | B | A | Bridge defects not seen | B |
| Example 2-32 | Resist composition 20 | 180° C. | T-8 | 120° C. | 110° C. | S-31 | | A | A | Bridge defects not seen | B |
| Example 2-33 | Resist composition 24 | 110° C. | — | — | 85° C. | S-35 | | A | B | Bridge defects not seen | A |
| Example 2-34 | Resist composition 20 | 110° C. | T-4 | 120° C. | 110° C. | S-35 | S-14 | A | B | Bridge defects not seen | B |
| Example 2-35 | Resist composition 20 | 120° C. | T-5 | 120° C. | 85° C. | S-37 | | B | B | Bridge defects not seen | B |
| Example 2-36 | Resist composition 24 | 120° C. | T-5 | 120° C. | 85° C. | S-36 | S-14 | A | B | Bridge defects not seen | B |
| Example 2-37 | Resist composition 20 | 120° C. | | | 130° C. | S-61 | | B | B | Bridge defects not seen | C |
| Example 2-38 | Resist composition 20 | 120° C. | | | 100° C. | S-62 | | A | B | Bridge defects not seen | C |
| Example 2-39 | Resist composition 16 | 90° C. | | | 110° C. | S-63 | | B | A | Bridge defects not seen | C |
| Example 2-40 | Resist composition 18 | 110° C. | | | 110° C. | S-64 | | C | B | Bridge defects not seen | B |
| Example 2-41 | Resist composition 24 | 90° C. | T-4 | 120° C. | 90° C. | S-65 | | C | A | Bridge defects not seen | A |
| Example 2-42 | Resist composition 18 | 110° C. | | | 110° C. | S-66 | | B | B | Bridge defects not seen | B |
| Example 2-43 | Resist composition 24 | 90° C. | T-4 | 120° C. | 90° C. | S-67 | | B | A | Bridge defects not seen | A |
| Example 2-44 | Resist composition 18 | 110° C. | | | 110° C. | S-68 | | A | B | Bridge defects not seen | B |

TABLE 10-continued

| | | PB (60 seconds) | Upper layer film | PB (60 seconds) of upper layer film | PEB | Development | Rinsing | Evaluation of defects after development Organic residue | Evaluation of defects after development Metal particles | Bridge performance | AEI roughness |
|---|---|---|---|---|---|---|---|---|---|---|---|
| Example 2-45 | Resist composition 24 | 90° C. | T-4 | 120° C. | 90° C. | S-69 | | A | A | Bridge defects not seen | A |
| Example 2-46 | Resist composition 18 | 110° C. | | | 110° C. | S-70 | | A | B | Bridge defects not seen | B |
| Example 2-47 | Resist composition 24 | 90° C. | T-4 | 120° C. | 90° C. | S-71 | | A | A | Bridge defects not seen | A |
| Comparative Example 2-1 | Resist composition 14 | 120° C. | | | 120° C. | SA-1 | | E | D | Bridge defects unevenly distributed on wafer edge | B |
| Comparative Example 2-2 | Resist composition 15 | 90° C. | | | 90° C. | SA-4 | | E | E | Bridge defects unevenly distributed on wafer edge | B |
| Comparative Example 2-3 | Resist composition 16 | 120° C. | | | 120° C. | SA-5 | | F | E | Bridge defects unevenly distributed on wafer edge | B |
| Comparative Example 2-4 | Resist composition 17 | 90° C. | | | 90° C. | SA-6 | | F | D | Bridge defects unevenly distributed on wafer edge | B |
| Comparative Example 2-5 | Resist composition 14 | 120° C. | | | 120° C. | SA-7 | | F | D | Bridge defects unevenly distributed on wafer edge | B |
| Comparative Example 2-6 | Resist composition 15 | 90° C. | | | 120° C. | SA-8 | | E | E | Bridge defects unevenly distributed on wafer edge | A |
| Comparative Example 2-7 | Resist composition 17 | 90° C. | | | 90° C. | SA-9 | | E | E | Bridge defects unevenly distributed on wafer edge | B |
| Comparative Example 2-8 | Resist composition 14 | 120° C. | | | 120° C. | SA-9 | | F | E | Bridge defects unevenly distributed on wafer edge | B |
| Comparative Example 2-9 | Resist composition 15 | 90° C. | | | 120° C. | SA-12 | | F | D | Bridge defects not seen | B |
| Comparative Example 2-10 | Resist composition 16 | 120° C. | | | 90° C. | SA-13 | | F | D | Bridge defects not seen | A |
| Comparative Example 2-11 | Resist composition 15 | 90° C. | | | 120° C. | SA-15 | | E | E | Bridge defects unevenly distributed on wafer edge | D |
| Comparative Example 2-12 | Resist composition 15 | 90° C. | | | 120° C. | SA-16 | | F | E | Bridge defects unevenly distributed on wafer edge | E |

3. Evaluation Results

As shown in each of Examples in Tables 9 and 10, in all cases where any of the exposure light sources were used, occurrence of defects on the pattern was suppressed and bridge defects were not seen in a case of using the treatment liquid including mixed solvents, as compared with a case of using the treatment liquid including only one solvent.

Furthermore, from the results of Example 1-3, Example 1-26, and the other Examples, it was found that the content of the organic compound having a boiling point of 300° C. or higher was 0.001 to 30.0 ppm by mass, the effect was more excellent.

Moreover, from the results of Example 1-21, Example 1-29, Example 1-32, Example 1-35, Example 1-41, Example 1-42, Example 1-44, and the other Examples, it was found that the content (total content) of the metal component containing an element selected from the group consisting of Fe, Cr, Ni, Cu, Zn, and Pb was 0.001 to 50 ppt by mass with respect to the total mass of the treatment liquid, the effect was more excellent.

In addition, from the results of Example 1-6, Example 1-7, Example 1-13, Example 1-19, and the other Examples, it was found that a difference between the boiling point of the organic solvent having the highest boiling point and the boiling point of the organic solvent having the lowest boiling point among the two or more organic solvents was less than 35° C., the effect was more excellent.

A reason therefor is presumed to be as follows: by using a predetermined treatment liquid, the resin can be efficiently solvated in the resist component, and thus, re-precipitation of the resin in the developer, and the like hardly occur, whereby generation of residues can be suppressed.

Moreover, it was found that in a case where a treatment liquid having a small difference in the boiling points of two kinds of organic solvents was used, occurrence in bridge defects was suppressed in the outer periphery of the wafer, as compared with a case where a treatment liquid having a big difference in the boiling points was used. In a case of the treatment liquid having a big difference in the boiling points, a developer having a low boiling point is volatilized, and thus, the composition of the developer is changed in the process of the developing step. Accordingly, it is considered that the solubility of the resin dissolved in the developer was changed once and re-precipitated, and therefore, heterogeneous bridge occurred in the wafer plane. In contrast, in a case of the treatment liquid having a small difference in the boiling points, it is considered that such a change in the composition due to volatilization hardly occurred, and therefore, the bridge in the outer periphery was reduced.

Moreover, it could be confirmed that the treatment liquid of the embodiment of the present invention can be applied to any of a negative tone resin and a positive tone resin.

In a case where the treatment liquid according to the embodiment of the present invention was stored in a FluoroPurePFA composite drum (inner surface in contact with liquid; PFA resin lining) manufactured by Entegris Inc., Inc., and a steel-made drum can manufactured by JFE Steel Corporation (inner surface in contact with liquid; zinc phosphate-coated film) at normal temperature for 14 days, using the method described in JP2014-112176A, and then subjected to analysis of concentrations of wet particles and organic impurities, and analysis of concentration of metal impurities were carried out, better results could be obtained from the FluoroPurePFA composite drum manufactured by Entegris Inc., Inc. (inner surface in contact with liquid; PFA resin lining) than from the steel-made drum can manufactured by JFE Steel Corporation (inner surface in contact with liquid; zinc phosphate-coated film).

EXPLANATION OF REFERENCES 10, 210, 310: tank
20, 220, 320: pump
30, 32, 230, 232, 330, 332: metal ion adsorption filter
40, 42, 240, 340, 342: filtering member
50, 250: organic impurity adsorption member
60, 260, 360: distillation unit
70, 270: dehydration member
80, 280, 380: supply pipe
100, 200, 300: organic solvent purifying device

What is claimed is:

1. A pattern forming method comprising:
    forming a resist film on a substrate using a resist composition including at least a resin whose polarity increases by the action of an acid, a photoacid generator, and a solvent;
    exposing the resist film; and
    treating the exposed resist film with a treatment liquid to form a pattern,
    wherein the treatment liquid includes two or more organic solvents,
    a boiling point of at least one organic solvent of the two or more organic solvents is 120° C. to 155° C.,
    a content of the organic solvent having a boiling point of 120° C. to 155° C. is 45% by mass or more with respect to the total mass of the treatment liquid,
    a difference between the boiling point of the organic solvent having the highest boiling point and the boiling point of the organic solvent having the lowest boiling point among the two or more organic solvents is less than 49° C., and
    a content of an organic compound having a boiling point of 300° C. or higher than 300° C. in the treatment liquid is 0.001 to 30.0 ppm by mass, wherein the organic compound having a boiling point of 300° C. or higher than 300° C. is selected from the group consisting of dioctyl phthalate, diisononyl phthalate, dioctyl adipate, dibutyl phthalate, oleamide, and ethylene propylene rubber.

2. The pattern forming method according to claim 1, wherein an SP value of at least one organic solvent of the two or more organic solvents is 17.0 to 18.2 MPa$^{1/2}$.

3. The pattern forming method according to claim 2, wherein at least one organic solvent of the two or more organic solvents is an ester-based solvent.

4. The pattern forming method according to claim 1, wherein at least one organic solvent of the two or more organic solvents is an ester-based solvent.

5. The pattern forming method according to claim 4, wherein the ester-based solvent is selected from the group consisting of butyl acetate, amyl acetate, isoamyl acetate, 2-methylbutyl acetate, 1-methylbutyl acetate, hexyl acetate, pentyl propionate, hexyl propionate, heptyl propionate, isobutyl isobutanoate, and butyl butanoate.

6. The pattern forming method according to claim 1, wherein at least one organic solvent of the two or more organic solvents is a ketone-based solvent.

7. The pattern forming method according to claim 6, wherein the ketone-based solvent is a ketone-based solvent having 5 to 9 carbon atoms.

8. The pattern forming method according to claim wherein the treatment liquid is used as a developer or a rinsing liquid.

9. The pattern forming method according to claim 1, wherein the exposure is performed using KrF excimer laser or ArF excimer laser.

10. The pattern forming method according to claim 1, wherein the exposure is performed using EUV light.

11. The pattern forming method according to claim 1, wherein a moisture content of the treatment liquid is 500 ppm by mass or less.

12. A treatment liquid for use in the pattern forming method according to claim 1,
    wherein the treatment liquid includes the two or more organic solvents,
    a boiling point of at least one organic solvent of the two or more organic solvents is 120° C. to 155° C.,
    a content of the organic solvent having a boiling point of 120° C. to 155° C. is 45% by mass or more with respect to the total mass of the treatment liquid,
    a difference between the boiling point of the organic solvent having the highest boiling point and the boiling point of the organic solvent having the lowest boiling point among the two or more organic solvents is less than 49° C., and
    a content of the organic compound having a boiling point of 300° C. or higher than 300° C. in the treatment liquid is 0.001 to 30.0 ppm by mass, wherein the organic compound having a boiling point of 300° C. or higher than 300° C. is selected from the group consisting of dioctyl phthalate, diisononyl phthalate, dioctyl adipate, dibutyl phthalate, oleamide, and ethylene propylene rubber.

13. The treatment liquid according to claim 12, wherein an SP value of at least one organic solvent of the two or more organic solvents is 17.0 to 18.2 MPa$^{1/2}$.

14. The treatment liquid according to claim 12,
wherein at least one organic solvent of the two or more organic solvents is an ester-based solvent.

15. The treatment liquid according to claim 12,
wherein at least one organic solvent of the two or more organic solvents is a ketone-based solvent.

16. The treatment liquid according to claim 12,
wherein a moisture content is 500 ppm by mass or less.

17. The treatment liquid according to claim 12,
wherein a content of a metal component containing an element selected from the group consisting of Fe, Cr, Ni, Cu, Zn, and Pb is 0.001 to 50 ppt by mass with respect to the total mass of the treatment liquid.

18. The treatment liquid according to claim 12, which is purified through at least one of a distilling step or a filtering step.

19. The treatment liquid according to claim 12, wherein the organic compound having a boiling point of 300° C. or higher than 300° C. comprises a plasticizer.

20. The treatment liquid according to claim 12, wherein the content of the organic compound having a boiling point of 300° C. or higher than 300° C. in the treatment liquid is 0.003 to 25 ppm by mass.

21. The treatment liquid according to claim 12, wherein a content of a surfactant in the treatment liquid is 0.001% to 0.5% by mass with respect to the total mass of the treatment liquid.

22. The pattern forming method according to claim 1, wherein the organic compound having a boiling point of 300° C. or higher than 300° C. comprises a plasticizer.

23. The pattern forming method according to claim 1, wherein the content of the organic compound having a boiling point of 300° C. or higher than 300° C. in the treatment liquid is 0.003 to 25 ppm by mass.

24. The treatment liquid according to claim 1, wherein a content of a surfactant in the treatment liquid is 0.001% to 0.5% by mass with respect to the total mass of the treatment liquid.

* * * * *